US012568754B2

(12) United States Patent
Fukagawa et al.

(10) Patent No.: US 12,568,754 B2
(45) Date of Patent: Mar. 3, 2026

(54) LAMINATE COMPRISING A WAVELENGTH-CONVERSION MATERIAL AND A WAVELENGTH-SELECTIVE ABSORPTION LAYER, DISPLAY DEVICE, AND ORGANIC ELECTROLUMINESCENT DISPLAY DEVICE

(71) Applicant: FUJIFILM Corporation, Tokyo (JP)

(72) Inventors: Nobutaka Fukagawa, Kanagawa (JP); Hiroki Kuwahara, Kanagawa (JP); Daisuke Sasaki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 676 days.

(21) Appl. No.: 17/853,228

(22) Filed: Jun. 29, 2022

(65) Prior Publication Data

US 2023/0012898 A1 Jan. 19, 2023

Related U.S. Application Data

(63) Continuation of application No. PCT/JP2021/005368, filed on Feb. 12, 2021.

(30) Foreign Application Priority Data

Feb. 13, 2020 (JP) ................................ 2020-022571
Mar. 24, 2020 (JP) ................................ 2020-053383
(Continued)

(51) Int. Cl.
*B32B 27/08* (2006.01)
*B32B 27/30* (2006.01)
(Continued)

(52) U.S. Cl.
CPC ......... *H10K 59/8792* (2023.02); *B32B 27/08* (2013.01); *B32B 27/302* (2013.01);
(Continued)

(58) Field of Classification Search
CPC ................................ H10K 59/30; B32B 27/08
See application file for complete search history.

(56) References Cited

U.S. PATENT DOCUMENTS

2010/0140502 A1* 6/2010 Guckian ................ C09D 11/03 428/447
2012/0197026 A1* 8/2012 Maeda ................ C07D 209/12 548/455
(Continued)

FOREIGN PATENT DOCUMENTS

JP 11-193352 A 7/1999
JP 2008-203436 A 9/2008
(Continued)

OTHER PUBLICATIONS

Translation JP-2023007438 A (Year: 2023).*
(Continued)

*Primary Examiner* — Hoa (Holly) Le
(74) *Attorney, Agent, or Firm* — Edwards Neils LLC; Jean C. Edwards, Esq.

(57) ABSTRACT

A display device including a laminate includes a wavelength selective absorption layer containing a resin, a dye including at least one of four specific dyes A to D, and an antifading agent for a dye, and includes a gas barrier layer, and a wavelength conversion material; the laminate includes a wavelength selective absorption layer containing a resin, a dye, and an electron migration-type antifading agent in which the energy level of the highest occupied molecular orbital and the lowest unoccupied molecular orbital satisfy a specific relational expression in relation to the dye, and includes the gas barrier layer; an organic electroluminescent display device includes this laminate. The gas barrier layer contains a crystalline resin, has a layer thickness of 0.1 μm to 10 μm, has a layer oxygen permeability of 60
(Continued)

cc/m$^2$·day·atm or less, and is directly arranged on at least one surface of the wavelength selective absorption layer.

15 Claims, 1 Drawing Sheet

(30) Foreign Application Priority Data

Apr. 8, 2020 (JP) ................................ 2020-070036
Apr. 28, 2020 (JP) ................................ 2020-078900
Feb. 12, 2021 (JP) ................................ 2021-021142

(51) Int. Cl.

*B32B 27/32* (2006.01)
*C07F 17/02* (2006.01)
*C09B 23/04* (2006.01)
*C09B 57/00* (2006.01)
*G02B 5/22* (2006.01)
*H10K 59/80* (2023.01)
*H10K 85/10* (2023.01)
*H10K 85/30* (2023.01)
*H10K 85/60* (2023.01)
*H10K 50/115* (2023.01)
*H10K 59/38* (2023.01)

(52) U.S. Cl.

CPC ............ *B32B 27/325* (2013.01); *C07F 17/02* (2013.01); *C09B 23/04* (2013.01); *C09B 57/00* (2013.01); *C09B 57/007* (2013.01); *G02B 5/223* (2013.01); *H10K 85/111* (2023.02); *H10K 85/331* (2023.02); *H10K 85/615* (2023.02); *H10K 85/654* (2023.02); *H10K 85/657* (2023.02); *H10K 85/6572* (2023.02); *B32B 2250/24* (2013.01); *B32B 2307/418* (2013.01); *B32B 2307/71* (2013.01); *B32B 2307/7244* (2013.01); *B32B 2457/20* (2013.01); *H10K 50/115* (2023.02); *H10K 59/38* (2023.02)

(56) References Cited

U.S. PATENT DOCUMENTS

2012/0206935 A1 8/2012 Seo et al.
2013/0059139 A1* 3/2013 Ackermann ............ C23C 14/24
428/522
2014/0367633 A1 12/2014 Bibl et al.
2015/0331285 A1* 11/2015 Bibl ........................ H01L 33/54
362/84
2016/0161801 A1* 6/2016 Watano ................ G02B 5/3083
349/71
2017/0137444 A1 5/2017 Sasaki et al.
2020/0110033 A1 4/2020 Nakagawa et al.
2020/0217993 A1* 7/2020 Fukagawa .............. G02B 5/208
2021/0005673 A1 1/2021 Naito et al.
2022/0308265 A1* 9/2022 Fukagawa ................. G09F 9/30
2023/0125712 A1* 4/2023 Fukagawa ............... C08L 25/06
359/885
2025/0116897 A1* 4/2025 Fukagawa .......... H10K 59/8792

FOREIGN PATENT DOCUMENTS

| | | | | | |
|---|---|---|---|---|---|
| JP | 2011-075691 | A | | 4/2011 | |
| JP | 2012-137647 | A | | 7/2012 | |
| JP | 2012-169271 | A | | 9/2012 | |
| JP | 2014-089408 | A | | 5/2014 | |
| JP | 2015-036734 | A | | 2/2015 | |
| JP | 2019-119831 | A | | 7/2019 | |
| JP | 2023007438 | A | * | 1/2023 | |
| WO | WO-2014069314 | A1 | * | 5/2014 | ........... H10F 77/331 |
| WO | 2014/204694 | A1 | | 12/2014 | |
| WO | 2016/031810 | A1 | | 3/2016 | |
| WO | 2017/014272 | A1 | | 1/2017 | |
| WO | 2019/013360 | A1 | | 1/2019 | |
| WO | 2019/066043 | A1 | | 4/2019 | |
| WO | 2019/189463 | A1 | | 10/2019 | |

OTHER PUBLICATIONS

Translation WO-2014069314 (Year: 2014).*
Office Action, issued by the Japanese Patent Office on Jul. 19, 2022 in connection with Japanese Patent Application No. 2022-500484.
International Search Report issued in PCT/JP2021/005368 on Apr. 13, 2021.
Written Opinion issued in PCT/JP2021/005368 on Apr. 13, 2021.
International Preliminary Report on Patentability completed by WIPO on Aug. 11, 2022 in connection with International Patent Application No. PCT/JP2021/005368.

* cited by examiner

LAMINATE COMPRISING A WAVELENGTH-CONVERSION MATERIAL AND A WAVELENGTH-SELECTIVE ABSORPTION LAYER, DISPLAY DEVICE, AND ORGANIC ELECTROLUMINESCENT DISPLAY DEVICE

CROSS-REFERENCE TO RELATED APPLICATIONS

This application is a Continuation of PCT International Application No. PCT/JP2021/005368 filed on Feb. 12, 2021, which was published under PCT Article 21(2) in Japanese, and which claims priority under 35 U.S.C. § 119 (a) to Japanese Patent Application No. 2020-022571 filed in Japan on Feb. 13, 2020, Japanese Patent Application No. 2020-053383 filed in Japan on Mar. 24, 2020, Japanese Patent Application No. 2020-070036 filed in Japan on Apr. 8, 2020, Japanese Patent Application No. 2020-078900 filed in Japan on Apr. 28, 2020, and Japanese Patent Application No. 2021-021142 filed in Japan on Feb. 12, 2021. The above applications are hereby expressly incorporated by reference, in their entirety, into the present application.

BACKGROUND OF THE INVENTION

1. Field of the Invention

The present invention relates to a laminate, a display device, and an organic electroluminescent display device.

2. Description of the Related Art

In recent years, the demand for higher image quality has further increased in the flat panel display market, and it has been required to increase the resolution to 4K and even 8K and to realize a color gamut exceeding 90% of the BT2020 standard of the color gamut. For the color gamut expansion, a method of obtaining a sharp emission spectrum using quantum dots is effective. For example, JP2012-169271A discloses a method of arranging a layer containing quantum dots between a blue light emitting diode (LED) and a light guide plate and then converting the light of the blue LED into red light and green light to realize the high brightness and the improvement of color reproducibility. Further, WO2014/204694A discloses a method of using a blue micro LED as a light-emitting light source and carrying out the conversion of wavelengths into green light and red light with quantum dots, and moreover, JP2019-119831A discloses a method of using quantum dots themselves as a light source.

On the other hand, with the increase in the size of displays and the spread of tablet PCs and smartphones, the environment in which displays are used has become more diverse, and thus it has become increasingly important to improve the visibility in bright places, for example, directly under sunlight or bright indoor lighting. In general, an antireflection function is provided in the display screen of the display so that an observer can easily see the image. Such a function is realized by an antireflection film or an antiglare film. Examples of the general antireflection film include an antireflection (AR) film or a low reflection (LR) film, in which a film having a refractive index different from that of a base material is formed on the surface of the base material to reduce reflection by the effect of interference between the light reflected on the surface of the base material and the light reflected on the surface of the formed film. In addition, examples of the general antiglare film include an antiglare (AG) film in which a film having a fine uneven pattern is formed on the surface of a base material to prevent the reflected glare of the image by using the light scattering effect.

However, a part of the light incident on the display is transmitted through the antireflection film or the antiglare film on the surface and then is reflected on the surface of the electrode, wire, or the like, or the glass surface of the cell. This is called internal reflection. In association with the increase in resolution of displays, the proportion of metal parts such as electrodes or wires in the entire panel area increases, and thus the prevention of the above-described internal reflection is a particularly important factor in ensuring high-quality display performance.

As a means for preventing the internal reflection, as described in JP2008-203436A, there is known a method of providing a λ/4 phase difference plate or a λ/2 phase difference plate between a polarizing element of a polarizing plate and an internal reflection place and causing it to function as a circularly polarizing plate. However, the method disclosed in JP2008-203436A has a problem that the transmittance of the display light is reduced to about 40% and that depolarization occurs and thus a sufficient antireflection effect cannot be obtained in a case where scattering particles or the above-described quantum dots are present between the circularly polarizing plate and the internal reflection place.

On the other hand, JP2015-36734A discloses a method of adding an absorbent material having specific light absorption characteristics, to a polarizing plate on a viewer side, to prevent the reflection of external light. This method disclosed in JP2015-36734A is a promising method in a display device (including a display) such as a liquid crystal display device, in which the use of a polarizing plate is indispensable. However, display devices (including a display, hereinafter, also referred to as a "self-luminous display device" in the present invention) using self-luminescence, such as an organic electroluminescent diode (organic light emitting diode, OLED) element, a micro LED element, and a quantum dot element, the absorbent material is not covered with the polarizing element, which causes a problem that the absorbent material is easily deteriorated by light, and thus the improvement has been required.

Here, the organic electroluminescent (OLED) display device is a device that displays an image by utilizing self-luminescence of an OLED element. As a result, the OLED display device has advantages that a high contrast ratio, a high color reproducibility, a wide viewing angle, a high-speed responsiveness, and a reduction in thickness and weight can be achieved, as compared with various display devices such as a liquid crystal display device and a plasma display device. In addition to these advantages, research and development are being actively carried out as a next-generation display device in terms of flexibility as well.

In the development of OLED display devices, the research has been underway on the color correction filter for the intended purpose of absorbing light of unnecessary wavelengths emitted from white light emitting diodes (LEDs) to block such light thereby improving the color reproducibility of display devices. In addition, a technique in which the color correction filter has light resistance to withstand continuous exposure has been studied as well.

For example, WO2019/013360A discloses a resin filter as a color correction filter for a white organic electroluminescent light source, in which a specific coloring agent of which the absorption maximum wavelength is in a range of 560 to 620 nm or 460 to 520 nm is contained and the moisture content is 0.5% or less.

Further, WO2017/014272A discloses a color correction filter as a color correction filter to be applied to a white LED, in which a coloring agent (A) of which the absorption maximum is in a wavelength range of 550 nm to 650 nm, a coloring agent (B) of which the absorption maximum is in a wavelength range of 420 nm to 520 nm, and a resin are contained.

On the other hand, as described above, in a case w-here the OLED display device is used in an external light environment such as outdoors, external light is reflected by metal electrodes or the like constituting the OLED display device, which results in a display defect such as a decrease in contrast. Although a technique of suppressing external light reflection by providing a circularly polarizing plate equipped with an optically anisotropic layer such as a λ/4 phase difference film is known, the technique causes a problem that brightness decreases.

In recent years, as an antireflection unit for an OLED display device instead of the circularly polarizing plate, a technique of suppressing the brightness decrease while suppressing external light reflection by providing a wavelength selective absorption layer capable of absorbing external light has been studied.

SUMMARY OF THE INVENTION

As a result of further repeated studies by the inventors of the present invention, it was found that a wavelength selective absorption filter including four kinds of dyes each having a main absorption wavelength band in a specific different wavelength range in which an absorbance Ab (λ) at a wavelength λ nm satisfies a specific relational expression can achieve both suppression of external light reflection and the suppression of brightness decrease required for application to a self-luminous display device, and further, an influence on an original tint of a display image can be sufficiently suppressed.

However, in the self-luminous display device of the OLED display device, in a case where the wavelength selective absorption filter is used as an antireflection unit instead of a circularly polarizing plate, a configuration is made such that a polarizing plate does not exist on an outside of the wavelength selective absorption filter. Therefore, a dye in the wavelength selective absorption filter is required to have a high light resistance.

As a result of studies by the inventors of the present invention, it was found that in a case where such a color correction filter as described in WO2019/0133360A is used as an antireflection unit instead of the circularly polarizing plate, the light resistance cannot be said to be sufficient in an exposure environment such as the use in an external light environment such as outdoors and there is room for improvement.

Further, WO2017/014272A discloses that a gas barrier layer is provided in order to suppress a decrease in absorption intensity of a coloring agent due to light irradiation. Specifically, it discloses a color correction filter in which a gas barrier layer consisting of an inorganic material $SiO_x$ or $SiN_x$ is provided. Among materials having gas barrier properties, an inorganic material can exhibit more excellent gas barrier properties, because an oxygen permeability coefficient is lower and hygroscopicity is also lower than an organic material.

On the other hand, the gas barrier layer consisting of the inorganic material is unsuitable from the viewpoint of industrial productivity. That is, since the gas barrier layer of the inorganic material is obtained by laminating the inorganic material, such as a plasma-enhanced chemical vapor deposition (plasma CVD) method, a sputtering method, or a vapor deposition method, a production step is complicated and the cost also increases, compared to an organic material with which the gas barrier layer can be produced by a coating method, film bonding, or the like. In addition, production efficiency is also inferior. For example, in a case where a gas barrier laver consisting of an inorganic material is formed by a sputtering method, it takes time about 100 to 1000 times to provide a layer having the same thickness as a gas barrier layer of an organic material to be obtained by a coating method, which is not suitable for mass production.

In consideration of these problems, an object of the present invention is to provide a display device including a laminate equipped with a gas barrier layer on a wavelength selective absorption layer and a wavelength conversion material, where the display device includes the laminate instead of a circularly polarizing plate as an antireflection unit of the display device and the wavelength selective absorption layer equipped in the laminate exhibits an excellent light resistance.

In addition, an object of the present invention is to provide a laminate including a gas barrier layer on a wavelength selective absorption layer, exhibiting excellent light resistance even in a case of being used instead of a circularly polarizing plate as an antireflection unit of an OLED display device, and also being excellent in productivity and an organic electroluminescent display device containing the same.

As a result of intensive studies in consideration of the above object, the inventors of the present invention found that it is not always possible to obtain a desired light resistance simply by combining a wavelength selective absorption layer containing a dye and an antifading agent for a dye and a gas barrier layer containing an organic material having a gas barrier properties but that excellent light resistance can be obtained in a case of a configuration in which the gas barrier layer has a crystalline resin and have a specific thickness. Further studies have been carried out based on these findings, whereby the present invention has been completed.

That is, the above object has been achieved by the following means.

<1> A display device comprising:

a laminate; and a wavelength conversion material, in which the laminate includes a wavelength selective absorption layer containing a resin, a dye including at least one of the following dyes A to D, and an antifading agent for a dye, and includes a gas barrier layer directly arranged on at least one surface of this wavelength selective absorption layer, the gas barrier layer contains a crystalline resin, a thickness of this gas barrier layer is 0.1 μm to 10 μm, and an oxygen permeability of this gas barrier layer is 60 $cc/m^2 \cdot day \cdot atm$ or less, the dye A: a dye having a main absorption wavelength band at a wavelength of 390 to 435 nm, the dye B: a dye having a main absorption wavelength band at a wavelength of 480 to 520 nm, the dye C: a dye having a main absorption wavelength band at a wavelength of 580 to 620 nm, and the dye D: a dye having a main absorption wavelength band at a wavelength of 680 to 780 nm.

<2> The display device according to <1>, in which a degree of crystallinity of the crystalline resin contained in the gas barrier layer is 25% or more.

<3> The display device according to <1> or <2>, in which the oxygen permeability of the gas barrier layer is 0.001 $cc/m^2 \cdot day \cdot atm$ or more and 60 $cc/m^2 \cdot day \cdot atm$ or less.

<4> The display device according to any one of <1> to <3>, in which at least one of the dyes B or C is a squarine-based coloring agent represented by General Formula (1), General Formula (1)

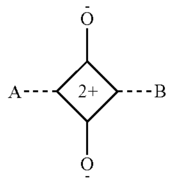

in the formula, A and B each independently represent an aryl group which may have a substituent, a heterocyclic group which may have a substituent, or —CH=G, and G represents a heterocyclic group which may have a substituent.

<5> The display device according to any one of <1> to <4>, in which the dye A is a coloring agent represented by General Formula (A1).

General Formula (A1)

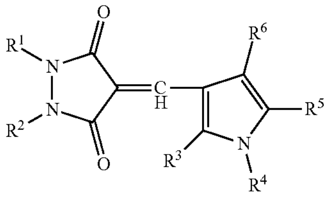

in the formula, $R^1$ and $R^2$ each independently represent an alkyl group or an aryl group, $R^3$ to $R^5$ each independently represent a hydrogen atom or a substituent, and $R^5$ and $R^6$ may be bonded to each other to form a 6-membered ring.

<6> The display device according to any one of <1> to <5>, in which the dye D is at least one of a coloring agent represented by General Formula (D1) or a coloring agent represented by General Formula (1), General Formula (D1)

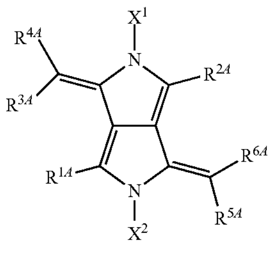

in the formula, $R^{1A}$ and $R^{2A}$ each independently represent an alkyl group, an aryl group, or a heteroaryl group, $R^{4A}$ and $R^{A}$ each independently represent a heteroaryl group, and $R^{3A}$ and $R^{6A}$ each independently represent a substituent, $X^1$ and $X^2$ each independently represent $—BR^{21a}R^{22a}$, where $R^{21a}$ and $R^{22a}$ each independently represent a substituent, and $R^{21a}$ and $R^{22a}$ may be bonded to each other to form a ring, General Formula (1)

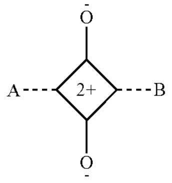

in the formula, A and B each independently represent an aryl group which may have a substituent, a heterocyclic group which may have a substituent, or —CH=G, and G represents a heterocyclic group which may have a substituent.

<7> The display device according to any one of <1> to <6>, in which the antifading agent is represented by General Formula (IV), General Formula (IV)

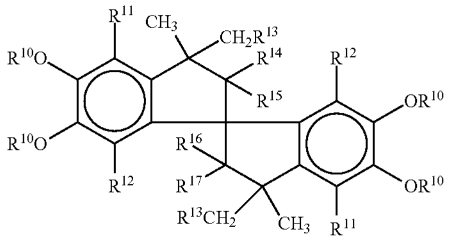

in the formula, $R^{10}$'s each independently represent an alkyl group, an alkenyl group, an aryl group, a heterocyclic group, or a group represented by $R^{18}CO—$, $R^{19}SO_2—$, or $R^{20}NHCO—$, where $R^{18}$, $R^{19}$, and $R^{20}$ each independently represent an alkyl group, an alkenyl group, an aryl group, or a heterocyclic group, $R^{11}$ and $R^{12}$ each independently represent a hydrogen atom, a halogen atom, an alkyl group, an alkenyl group, an alkoxy group, or an alkenyloxy group, and $R^{13}$ to $R^{17}$ each independently represent a hydrogen atom, an alkyl group, an alkenyl group, or an aryl group.

<8> The display device according to any one of <1> to <7>, in which the resin in the wavelength selective absorption layer includes a polystyrene resin.

<9> The display device according to any one of <1> to <7>, in which the resin in the wavelength selective absorption layer includes a cyclic polyolefin resin.

<10> The display device according to any one of <1> to <9>, in which the wavelength selective absorption layer contains all of the four dyes A to D.

<11> The display device according to any one of <1> to <10>, in which the laminate includes an ultraviolet absorption layer arranged on a side of the gas barrier layer opposite to the wavelength selective absorption layer and at least one layer of a pressure sensitive adhesive layer or an adhesive layer, and any difference in a refractive index between adjacent layers in this laminate is 0.05 or less.

<12> The display device according to any one of <1> to <11>, in which the wavelength conversion material is a quantum dot.

<13> The display device according to any one of <1> to <12>, in which the display device includes a light emitting element, and this light emitting element is a micro light emitting diode.

<14> The display device according to any one of <1> to <12>, in which the display device includes a light emitting element, and this light emitting element is a quantum dot having an electroluminescence function.

<15> A laminate comprising a wavelength selective absorption layer containing a resin, a dye, and an electron migration-type antifading agent that satisfies Relational Expression [A-1] or [A-2]: and a gas barrier layer directly arranged on at least one surface of this wavelength selective absorption layer, in which the gas barrier layer contains a crystalline resin, a film thickness of this gas barrier layer is 0.1 to 10 μm, and an oxygen permeability of this gas barrier layer is 60 cc/m$^2$·day·atm or less, $E_{Hd}>E_{Hq}>E_{Ld}$, or Relational Expression [A-1]:

$E_{Hd}>E_{Lq}>E_{Ld}$ Relational Expression [A-2]:

where $E_{Hd}$, $E_{Hq}$, $E_{Ld}$, and $E_{Lq}$ respectively represent the following values, $E_{Hd}$: an energy level of a highest occupied molecular orbital of the dye, $E_{Hq}$: an energy level of a highest occupied molecular orbital of the electron migration-type antifading agent, $E_{Ld}$: an energy level of a lowest unoccupied molecular orbital of the dye, and $E_{Lq}$: an energy level of a lowest unoccupied molecular orbital of the electron migration-type antifading agent.

<16> The laminate according to <15>, in which the electron migration-type antifading agent is a metallocene compound represented by General Formula (L), General Formula (L)

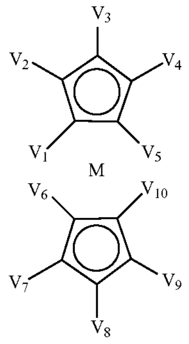

in the formula, M represents Fe, Ti, V, Cr, Co, Ni, Ru, Os, or Pd, and $V_1$, $V_2$, $V_3$, $V_4$, $V_5$, $V_6$, $V_7$, $V_8$, $V_9$, and $V_{10}$ each independently represent a hydrogen atom or a monovalent substituent.

<17> The laminate according to <16>, in which the M is Fe.

<18> The laminate according to any one of <15> to <17>, in which the resin in the wavelength selective absorption layer includes a polystyrene resin.

<19> An organic electroluminescent display device comprising the laminate according to any one of <15> to <18>.

In the present invention, in a case where there are a plurality of substituents, linking groups, and the like (hereinafter, referred to as substituents and the like) represented by specific reference numerals or formulae, or in a case where a plurality of substituents and the like are defined at the same time, the respective substituents and the like may be the same or different from each other unless otherwise specified. The same applies to the definition of the number of substituents or the like. In addition, in a case where a plurality of substituents and the like are close to each other (particularly in a case where the substituents and the like are adjacent to each other), the substituents and the like may also be linked to each other to form a ring unless otherwise specified. In addition, unless otherwise specified, rings, for example, alicyclic rings, aromatic rings, and heterocyclic rings may be further fused to form a fused ring.

In the present invention, unless otherwise specified, one kind of each of components (such as a dye, a resin, an antifading agent for a dye, an electron migration-type antifading agent, and other components in addition to these) capable of constituting the wavelength selective absorption layer may be contained in the wavelength selective absorption layer, or two or more kinds thereof may be contained therein. Similarly, unless otherwise specified, one kind of each of components (a crystalline resin and the like) constituting the gas barrier layer may be contained in the gas barrier layer, or two or more kinds thereof may be contained therein.

In the present invention, in a case where an E type double bond and a Z type double bond are present in a molecule, the double bond may be any one thereof or may be a mixture thereof, unless otherwise specified.

In the present invention, the representation of a compound (including a complex) is used to mean not only the compound itself but also a salt thereof, and an ion thereof. In addition, it is meant to include those in which a part of the structure is changed, as long as the effect of the present invention is not impaired. Furthermore, it is meant that a compound, which is not specified to be substituted or unsubstituted, may have any substituent, as long as the effect of the present invention is not impaired. The same applies to the definition of a substituent or a linking group.

In addition, in the present invention, the numerical range indicated by using "to" means a range including the numerical values before and after "to" as the lower limit value and the upper limit value, respectively.

In the present invention, the "composition" includes a mixture in which the component concentration varies within a range in which a desired function is not impaired, in addition to a mixture in which the component concentration is constant (each component is uniformly dispersed).

In the present invention, the description of "having a main absorption wavelength band at a wavelength XX to YY nm" means that a wavelength at which the maximum absorption is exhibited (that is, the maximal absorption wavelength) is present in the wavelength range of XX to YY nm.

Therefore, in a case where the maximal absorption wavelength is present in the above-described wavelength range, the entire absorption band including this wavelength may be in the above-described wavelength range or may also extend up to the outside of the above-described wavelength range. In addition, in a case where there are a plurality of maximal absorption wavelengths, it suffices that a maximal absorption wavelength at which the highest absorbance is exhibited is present in the above-described wavelength range. That is, the maximal absorption wavelength other than the maximal absorption wavelength at which the highest absorbance is exhibited may be present either inside or outside the above-described wavelength range of XX to YY nm.

The display device of the present invention includes a laminate equipped with a gas barrier layer on a wavelength selective absorption layer and a wavelength conversion material, where the display device includes the laminate instead of a circularly polarizing plate as an antireflection unit of the display device and the wavelength selective absorption layer equipped in the laminate can exhibit an excellent light resistance.

In addition, the laminate according to the embodiment of the present invention is a laminate including a gas barrier layer on a wavelength selective absorption layer, and can exhibit excellent light resistance even in a case of being used instead of a circularly polarizing plate as an antireflection unit of an OLED display device. In addition, since the laminate of the present invention has a gas barrier layer containing an organic material, it is also excellent in productivity.

Further, the organic electroluminescent display device according to an embodiment of the present invention includes the laminate of the present invention instead of a circularly polarizing plate as an antireflection unit of an OLED display device, and a wavelength selective absorption layer equipped in the laminate can exhibit an excellent light resistance.

DESCRIPTION OF THE PREFERRED EMBODIMENTS

Figure 1:
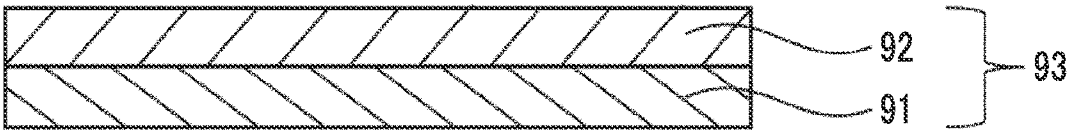
FIG. 1 is a schematic cross-sectional view illustrating an example of a laminate that is used in the display device of the present invention or a laminate of the present invention.

[Laminate that is used in Present Invention]

A laminate (hereinafter, also simply referred to as a "laminate that is used in the present invention") that is used in a display device according to the embodiment of the present invention includes a wavelength selective absorption layer containing a resin, a dye, and an antifading agent for a dye; and a gas barrier layer directly arranged on at least one surface of the wavelength selective absorption layer.

In the laminate that is used in the present invention, the dye contained in the wavelength selective absorption layer contains at least one of dyes A to D to be described later each having a main absorption wavelength band in a different wavelength range.

The gas barrier layer in the laminate that is used in the present invention contains a crystalline resin, has a layer thickness of 0.1 μm to 10 μm, and has a layer oxygen permeability of 60 $cc/m^2 \cdot day \cdot atm$ or less.

In the present invention, the main absorption wavelength band of the dye refers to a main absorption wavelength band of the dye measured in a state where the laminate including the wavelength selective absorption layer and the gas barrier layer. Specifically, in Examples to be described later, the measurement is carried out in the state where the laminate includes the wavelength selective absorption layer and the gas barrier layer under conditions described in the section of Maximal Absorption Value of Light Resistance Evaluation Film.

The laminate that is used in the present invention can improve the light resistance of the dye contained in the wavelength selective absorption layer, by providing the gas barrier layer. The presumable reason for this is thought to be as follows.

In the dye contained in the wavelength selective absorption layer in the laminate that is used in the present invention, an absorbance may decrease due to light irradiation. The main cause of this phenomenon is that a singlet oxygen generated by a transfer of excitation energy due to the light irradiation to oxygen molecules decomposes molecules of the dye. The laminate that is used in the present invention can suppress the decomposition of the dye due to the singlet oxygen generated as described above, by containing the dye and an antifading agent for a dye in the wavelength selective absorption layer.

Moreover, by providing the gas barrier layer at least at a place near an air interface in the wavelength selective absorption laver, permeation of the oxygen molecules (oxygen gas) can be suppressed, and as a result, the decomposition of the dye in the wavelength selective absorption layer can be suppressed.

Further, in addition to the above configuration, the laminate that is used in the present invention includes the gas barrier layer directly on at least one surface of the wavelength selective absorption layer, and the gas barrier layer contains a crystalline resin and exhibits a specific oxygen permeability. The laminate that is used in the present invention, having such a configuration, can suppress the permeation of oxygen molecules at a desired level and is excellent in productivity. However, in a case where the gas barrier layer becomes too thick, the amount of the antifading agent moving to an amorphous portion in the crystalline resin increases. As a result, although the oxygen permeability of the gas barrier layer can be reduced by thickening the gas barrier layer, a problem that the desired effect of improving the light resistance cannot be obtained, or conversely, the effect of improving the light resistance is reduced occurs. It is conceived that the laminate that is used in the present invention can realize the effect of suppressing the decrease in light resistance, due to the antifading agent and the gas barrier layer, at an excellent level by allowing the gas barrier layer to have a specific thickness.

<<Wavelength Selective Absorption Layer>>

The wavelength selective absorption layer in the laminate that is used in the present invention contains a resin, a dye including at least one of the following dyes A to D each having a main absorption wavelength band in a different wavelength range, and an antifading agent for a dye.

the dye A: a dye having a main absorption wavelength band at a wavelength of 390 to 435 nm, the dye B: a dye having a main absorption wavelength band at a wavelength of 480 to 520 nm, the dye C: a dye having a main absorption wavelength band at a wavelength of 580 to 620 nm, and the dye D: a dye having a main absorption wavelength band at a wavelength of 680 to 780 nm.

In the wavelength selective absorption layer, the "dye" is dispersed (preferably dissolved) in the resin to make the wavelength selective absorption layer a layer exhibiting a specific absorption spectrum derived from the dye. Further, the above-described "antifading agent for a dye" is dispersed (preferably dissolved) in the resin to capture radicals such as singlet oxygen and to be oxidized instead of the dye, and can effectively suppress the fading of the dye.

<Dye>

The wavelength selective absorption layer is a layer containing at least one of the dye A, the dye B, the dye C, or the dye D.

The dye A that can be contained in the wavelength selective absorption layer may one kind or two or more kinds. Similar to the above-described dye A, the dyes B to D that can be contained in the wavelength selective absorption layer may be each independently one kind or two or more kinds.

The wavelength selective absorption layer can contain a dye other than the dyes A to D.

The form of the wavelength selective absorption layer in the laminate that is used in the present invention may be adopted as long as the dye in the wavelength selective absorption layer can exhibit an absorption spectrum, may be adopted as long as preferably, both suppression of external light reflection and suppression of brightness decrease can be realized and more preferably, it is less likely to affect the original tint of the display image. Examples of one form of the wavelength selective absorption layer include a form in which at least one of the dyes A to D is dispersed (preferably dissolved) in the resin. The dispersion may be any type of dispersion, such as a random type or a regular type.

In the wavelength selective absorption layer, the dyes A to D have main absorption wavelength bands in 390 to 435 nm, 480 to 520 nm, 580 to 620 nm, and 680 to 780 nm, which are wavelength ranges other than B (Blue, 440 nm to 470 nm), G (Green, 520 nm to 560 nm), and R (Red, 620 nm to 660 nm) which are used as light emitting sources of the self-luminous display device, respectively. Therefore, by containing at least one of these dyes A to D, the wavelength selective absorption layer can suppress the external light reflection without impairing the color reproduction range of light emitted from the light emitting element.

In particular, from the viewpoint of using a wavelength selective absorption layer exhibiting an absorption spectrum having a negative correlation with the emission spectrum of the light emitting source and drawing out the original tint of the image of the self-luminous display device, at least two of the dye A, the dye B, the dye C, and the dye D contained in the wavelength selective absorption layer are preferably used in combination, at least three thereof are more preferably used in combination, and all of the four dyes are still more preferably contained.

In a case where two or more kinds of the dyes A to D are contained in the wavelength selective absorption layer as described above, there may be a problem that the light resistance is lowered due to the mixing of the dyes due to the chain transfer of radicals generated at the time of dye decomposition. Even for such a problem, the laminate that is used in the present invention can exhibit an excellent level of light resistance that exceeds the decrease in light resistance due to the mixing of dyes, by providing a specific gas barrier layer described later and containing dyes and an antifading agent for a dye in the wavelength selective absorption layer.

Above all, from the viewpoint of drawing out the original tint of the image of the self-luminous display device, it is preferable that the wavelength selective absorption layer contains all of the four dyes A to D and satisfies Relational Expressions (I) to (VI). The wavelength selective absorption layer having such a configuration can satisfy the suppression of external light reflection and the suppression of brightness decrease, and moreover, can maintain the original tint of an image of the self-luminous display device at an excellent level.

$$Ab(450)/Ab(430)<1.0 \quad \text{Relational Expression (I)}$$

$$Ab(450)/Ab(500)<1.0 \quad \text{Relational Expression (II)}$$

$$Ab(540)/Ab(500)<1.0 \quad \text{Relational Expression (III)}$$

$$Ab(540)/Ab(600)<1.0 \quad \text{Relational Expression(IV)}$$

$$Ab(630)/Ab(600)\leq 0.5 \quad \text{Relational Expression(V)}$$

$$Ab(630)/Ab(700)<1.0 \quad \text{Relational Expression(VI)}$$

In addition, an absorbance ratio described in Relational Expressions (I) to (VI) is a value calculated according to using a value of the absorbance Ab (λ) at the wavelength λ nm, measured in a state where the laminate includes the wavelength selective absorption layer and the gas barrier layer under conditions disclosed in the section of "Maximal Absorption Value Of Light Resistance Evaluation Film", in Examples to be described later.

In ranges specified by Relational Expressions (I) to (VI), a preferred range is as follows.

An upper limit value of Ab (450)/Ab (430) in Relational Expression (1) is preferably 0.90 or less, more preferably 0.85 or less, still more preferably 0.80 or less, and particularly preferably 0.60 or less. A lower limit value thereof is not particularly limited, and it is practically 0.05 or more, preferably 0.10 or more, and more preferably 0.20 or more.

An upper limit value of Ab (450)/Ab (500) in Relational Expression (II) is preferably 0.90 or less, more preferably 0.80 or less, still more preferably 0.75 or less, particularly preferably 0.65 or less, and among them, it is preferably particularly preferably 0.60 or less and most preferably 0.50 or less. A lower limit value thereof is not particularly limited, and it is practically 0.05 or more, preferably 0.10 or more, and more preferably 0.20 or more.

An upper limit value of Ab (540)/Ab (500) in Relational Expression (III) is preferably 0.90 or less, more preferably 0.80 or less, still more preferably 0.75 or less, particularly preferably 0.70 or less, and among them, it is preferably particularly preferably 0.50 or less and most preferably 0.20 or less. A lower limit value thereof is not particularly limited, and it is practically 0.01 or more, preferably 0.02 or more, and more preferably 0.05 or more.

An upper limit value of Ab (540)/Ab (600) in Relational Expression (IV) is preferably 0.90 or less, more preferably 0.85 or less, still more preferably 0.80 or less, particularly preferably 0.70 or less, and among them, it is preferably particularly preferably 0.50 or less and most preferably 0.25 or less. A lower limit value thereof is not particularly limited, and it is practically 0.01 or more, preferably 0.02 or more, and more preferably 0.05 or more.

An upper limit value of Ab (630)/Ab (600) in Relational Expression (V) is preferably 0.40 or less, more preferably 0.30 or less, still more preferably 0.20 or less, and particularly preferably 0.15 or less. A lower limit value thereof is not particularly limited, and it is practically 0.01 or more, preferably 0.02 or more, and more preferably 0.05 or more.

An upper limit value of Ab (630)/Ab (700) in Relational Expression (VI) is preferably 0.95 or less, more preferably 0.90 or less, still more preferably 0.80 or less, and particularly preferably 0.75 or less. A lower limit value thereof is not particularly limited, and it is practically 0.01 or more, preferably 0.03 or more, more preferably 0.10 or more, still more preferably 0.40 or more, and particularly preferably 0.50 or more.

In a case where Relational Expressions (I) to (VI) satisfy the above-described preferred range, providing the laminate that is used in the present invention can reduce a change in tint, and the original tint of the image of the self-luminous display device can be further drawn out. As a result, it is preferable that the dyes A to D have a sharp absorption waveform in the main absorption wavelength band.

For example, in a case where the dye B is a squarine-based coloring agent represented by General Formula (I) described later, in the laminate that is used in the present invention the present invention, Relational Expressions (II) and (III) can satisfy the above-described preferred range, and the original tint of the image of the self-luminous display device can be maintained at a more excellent level. This is conceived to be because the absorbance at a wavelength near the absorption maximum (534 nm) of a green visual pigment of human cones is low.

In addition, in a case where the dye C is a squarine-based coloring agent represented by General Formula (I) described later, in the laminate that is used in the present invention the present invention, Relational Expressions (I) to (IV) can satisfy the above-described preferred range, and the original tint of the image of the self-luminous display device can be maintained at a more excellent level. This is also conceived to be because the absorbance at a wavelength near the absorption maximum (534 nm) of a green visual pigment of human cones is low, as described above.

In particular, satisfying Relational Expression (V) is important in terms of not affecting the original tint of the image of the self-luminous display device. It is conceived that Relational Expression (V) can suppress a change of a*, and as a result, the tint can be maintained at an excellent level.

(Dye A)

The dye A is not particularly limited as long as the dye has the main absorption wavelength band in a wavelength of 39% to 435 nm in the laminate, and various dyes can be used.

As the dye A, a coloring agent represented by General Formula (A1) is preferable in that an absorption waveform in the main absorption wavelength band is sharp.

General Formula (A1)

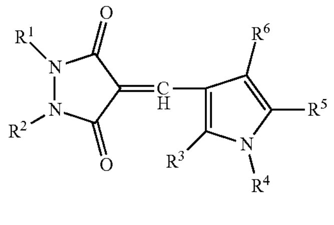

In General Formula (A1), $R^1$ and $R^2$ each independently represent an alkyl group or an aryl group, $R^3$ to $R^6$ each independently represent a hydrogen atom or a substituent, and $R^5$ and $R^6$ may be bonded to each other to form a 6-membered ring.

The alkyl group that can be employed as $R^1$ and $R^2$ may be any one of an unsubstituted alkyl group or a substituted alkyl group having a substituent, may be linear or branched, and may have a cyclic structure.

Examples of the unsubstituted alkyl group include a methyl group, an ethyl group, a normal propyl group, an isopropyl group, and a cyclohexyl group. The number of carbon atoms in the unsubstituted alkyl group is preferably 1 to 12 and more preferably 1 to 6.

Examples of the substituent that can be employed by the substituted alkyl group include a substituent included in the substituent group A below.

(Substituent Group A)

A halogen atom, an alkyl group, a cycloalkyl group, an aralkyl group, an alkenyl group, an alkynyl group, an aryl group, a heterocyclic group, a cyano group, a hydroxy group, a nitro group, and a carboxyl group (may be in the form of a salt), an alkoxy group, an aryloxy group, a silyloxy group, a heterocyclic oxy group, an acyloxy group, a carbamoyloxy group, a sulfonyloxy group, an alkoxycarbonyloxy group, an aryloxycarbonyloxy group, and an amino group (containing a substituted amino group represented by $-NR^a_2$ in addition to $-NH_2$, $R^a$ each independently represent a hydrogen atom, an alkyl group, an aryl group, or a heteroaryl group, where at least one R is an alkyl group, an aryl group, or a heteroaryl group), an acylamino group, an aminocarbonylamino group, an alkylcarbonylamino group, an alkoxycarbonylamino group, an aryloxycarbonylamino group, a sulfamoylamino group, an alkylsulfonylamino group, an arylsulfonylamino group, a sulfonamide group, a mercapto group, an alkylthio group, an arylthio group, a heterocyclic thio group, a sulfamoyl group, and a sulfo group (may be in the form of a salt), an alkylsulfinyl group, an arylsulfinyl group, an alkylsulfonyl group, an arylsulfonyl group, an acyl group, an aryloxycarbonyl group, an alkoxycarbonyl group, a carbamoyl group, an imide group, a phosphino group, a phosphinyl group, a phosphinyloxy group, a phosphinylamino group, or a silyl group, and a monovalent group in which at least two of these are linked.

In the substituent group A, preferred examples of the substituent that can be contained in the substituted alkyl group include a halogen atom, an aryl group, an alkoxy group, an acyl group, and a hydroxy group.

The total number of carbon atoms in the substituted alkyl group is preferably 1 to 12. Examples thereof include a benzyl group, a hydroxybenzyl group, a methoxyethyl group.

The total number of carbon atoms in the substituted alkyl group means the number of carbon atoms in the entire substituted alkyl group including the substituent that can be contained in the substituted alkyl group. Hereinafter, this will be used in the same meaning in regard to other groups as well.

In a case where both $R^1$ and $R^2$ represent an alkyl group, the alkyl groups may be the same or different from each other.

The aryl group that can be employed as $R^1$ and $R^2$ may be any one of an unsubstituted aryl group or a substituted aryl group having a substituent The unsubstituted aryl group is preferably an aryl group having 6 to 12 carbon atoms, and examples thereof include a phenyl group.

Examples of the substituent that can be employed by the substituted aryl group include a substituent included in the substituent group A below.

Among the substituent group A, preferred examples of the substituent that can be contained in the substituted aryl group include a halogen atom (for example, a chlorine atom, a bromine atom, or an iodine atom), a hydroxy group, a carboxy group, a sulfonamide group, or an amino group, (preferably, a substituted amino group represented by $-NR^a_2$, where $R^a$'s each independently represents a hydrogen atom or an alkyl group, provided that at least one $R^a$ is an alkyl group, and the amino group preferably has 1 to 4 carbon atoms), an alkyl group (preferably, an alkyl group having 1 to 4 carbon atoms; for example, methyl, ethyl, normal propyl, or isopropyl), an alkoxy group (preferably, an alkoxy group having 1 to 4 carbon atoms; for example, methoxy, ethoxy, normal propoxy, or isopropoxy), an alkoxycarbonyl group (preferably, an alkoxycarbonyl groups having 2 to 5 carbon atoms; for example, methoxycarbonyl, ethoxycarbonyl, normal propoxycarbonyl, or isopropoxycarbonyl), and a sulfonyloxy group, as well as a monovalent group in which at least the two thereof are linked to each other.

The substituted aryl group is preferably an aryl group having a total number of carbon atoms of 6 to 18.

For example, examples thereof include a 4-chlorophenyl group, a 2,5-dichlorophenyl group, a hydroxyphenyl group, a 4-carboxyphenyl group, a 3,5-dicarboxyphenyl group, a 4-methanesulfonamidephenyl group, a 4-methylphenyl group, a 4-methoxyphenyl group, a 4-(2-hydroxyethoxy) phenyl group, an N,N-dimethylaminophenyl group, a 4-(N-carboxymethyl-N-ethylamino)phenyl group, a 4-ethoxycarbonylphenyl group, and a 4-methanesulfonyloxyphenyl group.

In a case where both $R^1$ and $R^2$ represent an aryl group, the aryl groups may be the same or different from each other.

Examples of the substituent that can be employed as $R^3$, $R^4$, $R^5$, and $R^6$ include substituents included in the substituent group A.

Among the substituent group A, $R^3$, $R^5$, and $R^6$ are preferably an alkyl group or an aryl group. That is, $R^3$, $R^5$, and $R^6$ are each independently preferably a hydrogen atom, an alkyl group, or an aryl group.

In addition, in the substituent group A, $R^4$ is preferably an alkyl group or an aryl group. That is, $R^4$ is preferably a hydrogen atom, an alkyl group, or an aryl group.

The alkyl group that can be employed as $R^3$, $R^5$, and $R^6$ may be any of an unsubstituted alkyl group or a substituted alkyl group having a substituent, and any of linear or branched, and may have a cyclic structure.

Examples of the unsubstituted alkyl group that can be employed as $R^3$, $R^5$, and $R^6$ include a methyl group, an ethyl group, a normal propyl group, and an isopropyl group. The number of carbon atoms of the unsubstituted alkyl group that can be employed as $R^3$, $R^5$, and $R^6$ is preferably 1 to 8 and more preferably 1 to 4.

Examples of the substituent that can be contained in the substituted alkyl group as $R^3$, $R^5$, and $R^6$ include substituents included in the substituent group A.

Preferred examples of the substituent that can be contained in the substituted alkyl group as $R^3$, $R^5$, and $R^6$ include an aryl group (preferably a phenyl group), a carboxy group, and a hydroxy group.

The total number of carbon atoms in the substituted alkyl group that can be employed as $R^3$, $R^5$, and $R^6$ is preferably 1 to 8. For example, a benzyl group, a carboxymethyl group, and a hydroxymethyl group are exemplified.

In a case where all of $R^3$, $R^5$, and $R^6$ represent alkyl groups, the alkyl groups may be the same or different from each other.

The aryl group that can be employed as $R^3$, $R^5$, and $R^6$ may be any one of an unsubstituted aryl group or a substituted aryl group which has been substituted.

The unsubstituted aryl group that can be employed as $R^3$, $R^5$, and $R^6$ is preferably an aryl group having 6 to 10 carbon atoms, and examples thereof include a phenyl group.

Examples of the substituent that can be contained in the substituted aryl group as $R^3$, $R^5$, and $R^6$ include substituents included in the substituent group A.

Preferred examples of the substituent that can be contained in the substituted aryl group as $R^3$, $R^5$, and $R^6$ include a halogen atom (for example, a chlorine atom, a bromine atom, or an iodine atom), a hydroxy group, a carboxy group, an alkyl group (preferably an alkyl groups having 1 to 4 carbon atoms; for example, methyl, ethyl, normal propyl, or isopropyl).

The substituted aryl group that can be employed as $R^3$, $R^5$, and $R^6$ is preferably an aryl group having a total number of carbon atoms of 6 to 10. Examples thereof include a 4-chlorophenyl group, a 2,5-dichlorophenyl group, a hydroxyphenyl group, a carboxyphenyl group, a 3,5-dicarboxyphenyl group, and a 4-methylphenyl group.

In a case where both $R^3$ and $R^6$ are a substituent, $R^3$ is preferably a hydrogen atom from the viewpoint of light resistance and heat resistance.

In a case where $R^3$, $R^5$, and $R^6$ are all aryl groups, the aryl groups may be the same or different from each other.

The alkyl group that can be employed as $R^4$ may be any one of an unsubstituted alkyl group or a substituted alkyl group having a substituent, may be linear or branched, and may have a cyclic structure.

Examples of the unsubstituted alkyl group that can be employed as $R^4$ include a methyl group, an ethyl group, a normal propyl group, an isopropyl group, and a cyclohexyl group. The number of carbon atoms of the unsubstituted alkyl group that can be employed as $R^4$ is preferably 1 to 8 and more preferably 1 to 4.

Examples of the substituent that can be contained in the substituted alkyl group as $R^4$ include substituents included in the substituent group A. Preferred examples of the substituent that can be contained in the substituted alkyl group as $R^4$ include an aryl group (preferably, a phenyl group), a heterocyclic group, a carboxy group, a hydroxy group, an alkyl group (preferably, an alkyl group having 1 to 4 carbon atoms; for example, methyl, ethyl, normal propyl, or isopropyl), an alkoxy group (preferably, an alkoxy group having 1 to 4 carbon atoms; for example, methoxy, ethoxy, normal propoxy, or isopropoxy), an aryloxy group, an alkoxycarbonyl group (preferably, an alkoxycarbonyl groups having 2 to 5 carbon atoms; for example, methoxycarbonyl, ethoxycarbonyl, normal propoxycarbonyl, or isopropoxycarbonyl), an alkylamino group (preferably an alkylamino group having 1 to 4 carbon atoms; for example, a dimethylamino group), an alkylcarbonylamino group (preferably, an alkylcarbonylamino group having 1 to 4 carbon atoms; for example, a methylcarbonylamino group), a cyano group, and an acyl group, as well as a monovalent group in which at least the two thereof are linked to each other.

The total number of carbon atoms in the substituted alkyl group that can be employed as $R^4$ is preferably 1 to 18.

For example, a benzyl group, a carboxybenzyl group, a hydroxybenzyl group, a methoxycarbonylethyl group, an ethoxycarbonylmethyl group, a 2-cyanoethyl group, a 2-propionylaminoethyl group, a dimethylaminomethyl group, a methylcarbonylaminopropyl group, a di(methoxycarbonylmethyl)aminopropyl group, and a phenacyl group are exemplified.

The aryl group that can be employed as $R^4$ may be any one of an unsubstituted aryl group or a substituted aryl group having a substituent.

The unsubstituted aryl group that can be employed as $R^4$ is preferably an aryl group having 6 to 12 carbon atoms, and examples thereof include a phenyl group.

Examples of the substituent that can be contained in the substituted aryl group as R include substituents included in the substituent group A Preferred examples of the substituent that can be contained in the substituted aryl group as $R^4$ include a halogen atom (for example, a chlorine atom, a bromine atom, or an iodine atom), a hydroxy group, a carboxy group, a sulfonamide group, an amino group, an alkyl group (preferably, an alkyl group having 1 to 4 carbon atoms: for example, methyl, ethyl, normal propyl, or isopropyl), an alkoxy group (preferably, an alkoxy group having 1 to 4 carbon atoms: for example, methoxy, ethoxy, normal propoxy, or isopropoxy), an alkoxycarbonyl group (preferably, an alkoxycarbonyl groups having 2 to 5 carbon atoms; for example, methoxycarbonyl, ethoxycarbonyl, normal propoxycarbonyl, or isopropoxycarbonyl), and a sulfonyloxy group, as well as a monovalent group in which at least the two thereof are linked to each other.

The amino group that can be contained in the substituted aryl group as $R^4$ may be any one of an unsubstituted amino group (—$NH_2$) or a substituted amino group having a substituent (—$NR^a_2$ in the substituent group A).

In the amino group (—$NR^a_2$) that can be contained in the substituted aryl group as $R^4$, examples of R include the same group as the substituted alkyl group as $R^4$.

The substituted amino group is preferably an alkylamino group in which one or two hydrogen atoms in the amino group are substituted with an alkyl group.

Examples of the alkylamino group include a methylamino group, a dimethylamino group, a diethylamino group, and a pyrrolidino group. The number of carbon atoms in the alkylamino group is preferably 1 to 8 and more preferably 1 to 4.

The substituted aryl group that can be employed as $R^4$ is preferably an aryl group having a total number of carbon atoms of 6 to 22. Examples thereof include a 4-chlorophenyl group, a 2,5-dichlorophenyl group, a hydroxyphenyl group, a 2,5-methoxyphenyl group, a 2-methoxy-5-ethoxycarbonylphenyl group, a 4-ethyloxycarbonylphenyl group, a 4-ethoxycarbonylphenyl group, a 4-butoxycarbonylphenyl group, a 4-octyloxycarbonylphenyl group, a 4-carboxyphenyl group, a 3,5-dicarboxyphenyl group, a 4-methanesulfonamidephenyl group, a 4-methylphenyl group, a 4-methoxyphenyl group, a 4-ethoxyphenyl group, a 4-(2-hydroxyethoxy)phenyl group, a N,N-dimethylaminophenyl group, a N,N-diethylaminophenyl group, a 4-(N-carboxymethyl-N-ethylamino)phenyl group, a 4-{N,N-di(ethoxycarbonylmethyl)amino}phenyl group, a 4-{di(ethoxycarbonylmethyl)amino}carbonylphenyl, a 4-ethoxycarbonylphenyl group, a 4-methanesulfonyloxyphenyl group, a 4-acetylsulfamoylphenyl, a 4-propionylsulfamoylphenyl, and a 4-methanesulfoneamidephenyl.

$R^5$ and $R^6$ may be bonded to each other to form a 6-membered ring.

The 6-membered ring formed by $R^5$ and $R^6$ being bonded to each other is preferably a benzene ring.

In particular, from the viewpoint of light resistance, among $R^1$ and $R^2$ in General Formula (A1), it is preferable that $R^1$ is an alkyl group, and it is more preferable that $R^1$ is an alkyl group and $R^2$ is an alkyl group or an aryl group. In addition, from the same viewpoint, it is still more preferable that both $R^1$ and $R^2$ are each independently an alkyl group, and it is particularly preferable that both $R^1$ and $R^2$ are an alkyl group having 1 to 8 carbon atoms.

Further, in terms of heat resistance and light resistance, it is also preferable that both $R^1$ and $R^2$ in General Formula (A1) are an aryl group.

In a case where $R^1$ and $R^2$ each independently represent an aryl group, it is preferable that $R^3$, $R^5$, and $R^6$ are each independently a hydrogen atom, an alkyl group, or an aryl group and that at least one of $R^3$ or $R^6$ is preferably a hydrogen atom. Among the above, from the viewpoint of heat resistance and light resistance, a case where $R^3$ represents a hydrogen atom, and $R^5$ and $R^6$ each independently represent an alkyl group or an aryl group is more preferable. A case where $R^3$ represents a hydrogen atom and $R^5$ and $R^6$ each independently represent an alkyl group is still more preferable. A case where $R^3$ represents a hydrogen atom, $R^5$ and $R^6$ each independently represent an alkyl group, and $R^5$ and $R^6$ are bonded to each other to form a ring and fused with a pyrrole ring to form an indole ring together with the pyrrole ring is particularly preferable. That is, the coloring agent represented by General Formula (A1) is particularly preferably a coloring agent represented by General Formula (A2).

General Formula (A2)

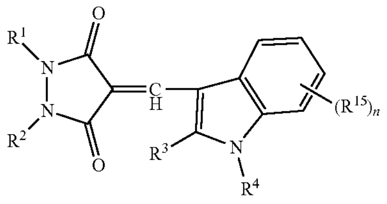

In General Formula (A2), $R^1$ to $R^4$ respectively have the same meanings as $R^1$ to $R^4$ in General Formula (A1), and the same applies to the preferred aspects thereof.

In General Formula (A2), $R^{15}$ represents a substituent. Examples of the substituent that can be employed as $R^{15}$ include substituents included in the substituent group A, $R^{15}$ is preferably an alkyl group, an aryl group, a halogen atom, an acyl group, or an alkoxycarbonyl group.

The alkyl group and the aryl group that can be employed as $R^{15}$ respectively have the same meanings as the alkyl group and the aryl group that can be employed as $R^3$, $R^5$, and $R^6$, respectively, and the same applies to each of the preferred aspects thereof.

Examples of the halogen atom that can be employed as $R^{15}$ include a chlorine atom, a bromine atom, and an iodine atom.

Examples of the acyl group that can be employed as $R^{15}$ include an acetyl group, a propionyl group, and a butyroyl group.

The alkoxycarbonyl group that can be employed as $R^{15}$, is preferably an alkoxycarbonyl group having 2 to 5 carbon atoms, and examples thereof include methoxycarbonyl, ethoxycarbonyl, normal propoxycarbonyl, and isopropoxycarbonyl.

In represents an integer of 0 to 4. n is not particularly limited, and is, for example, preferably 0 or 1.

Specific examples of the coloring agent represented by General Formula (A1) are shown below. However, the present invention is not limited thereto.

In the specific examples below, Me represents a methyl group.

-continued
E-1
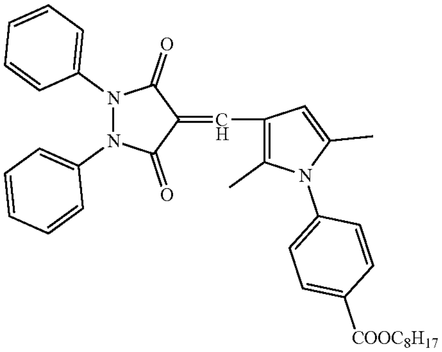
E-2
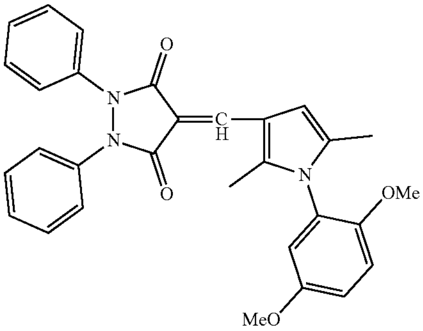
E-3
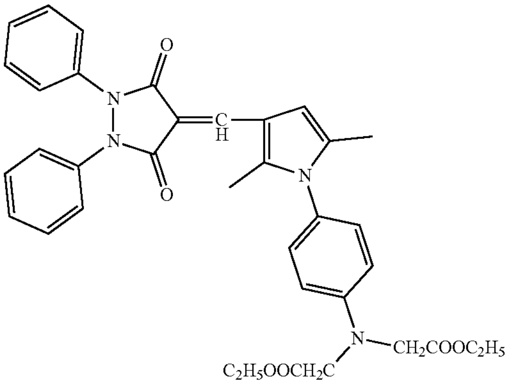
E-4
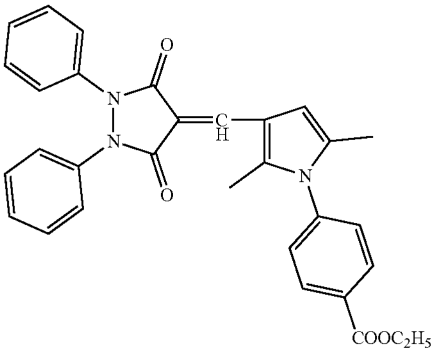
E-5
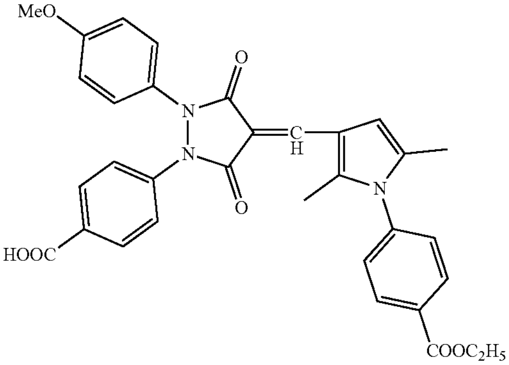
E-6
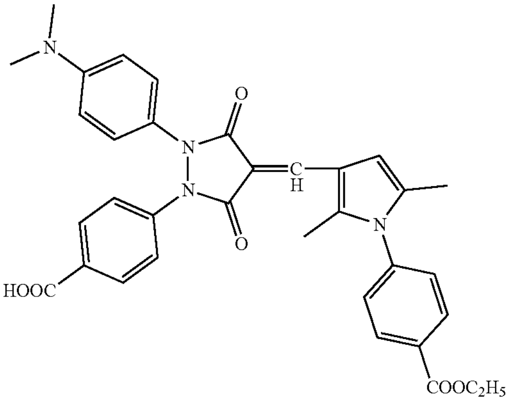
E-7
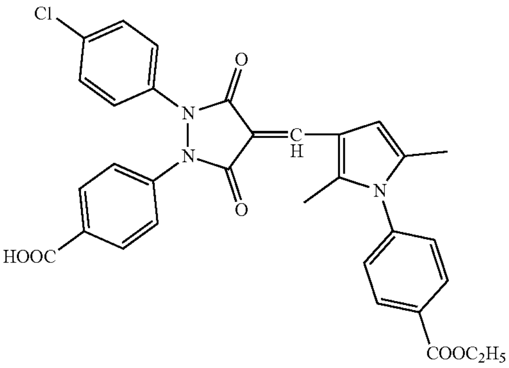
E-8
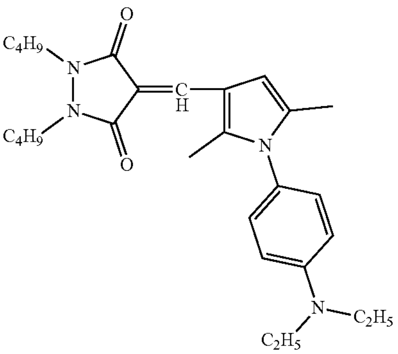

-continued
E-9
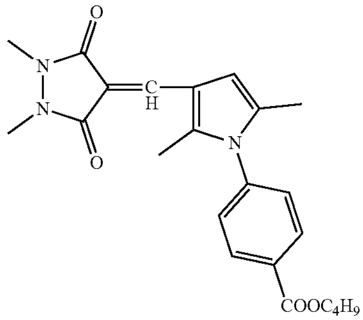
E-10
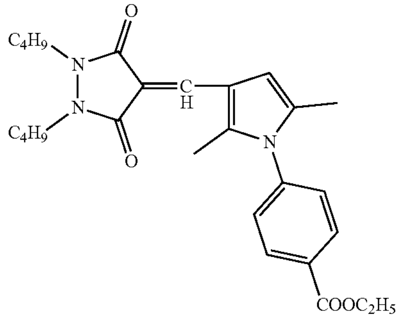
E-11
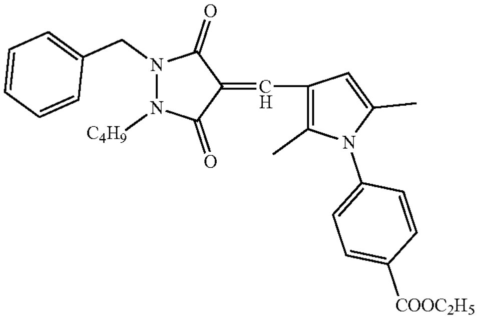
E-12
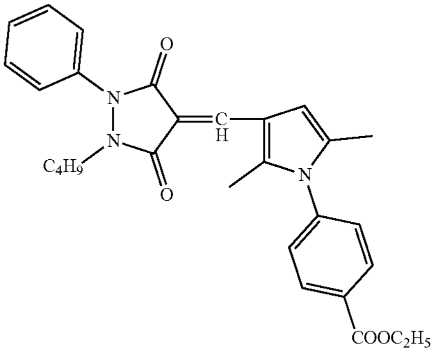
E-13
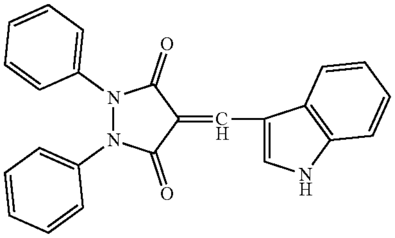
-continued
E-14
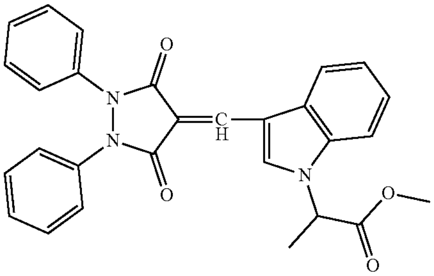
E-15
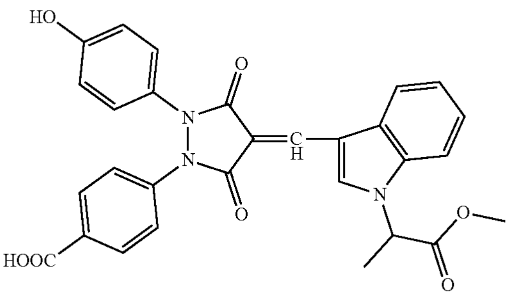
E-16
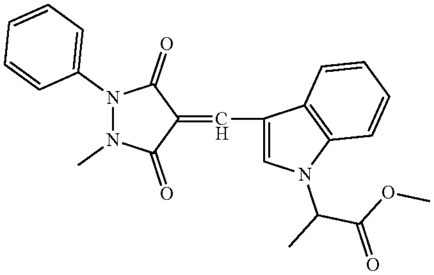
E-17
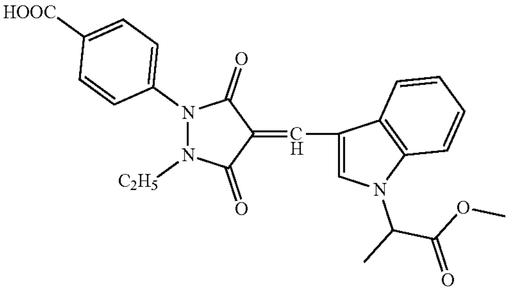
E-18
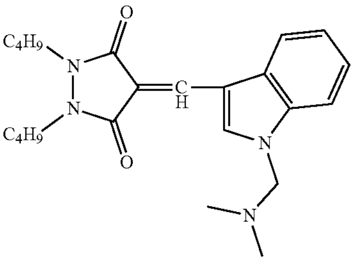

-continued
E-19
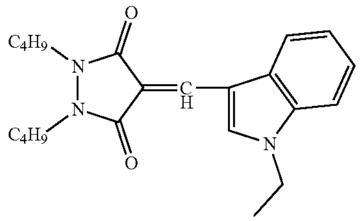
E-20
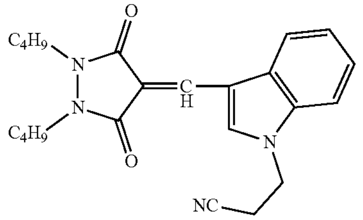
E-21
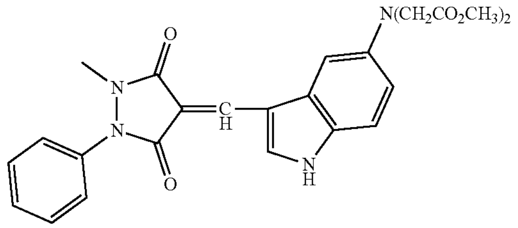
E-22
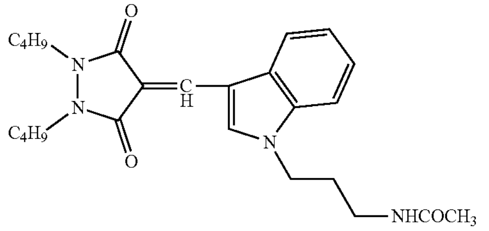
E-23
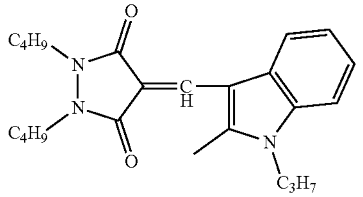
E-24
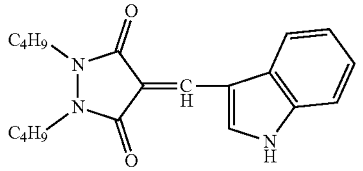
E-25
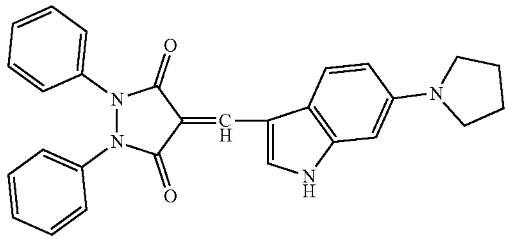
-continued
E-26
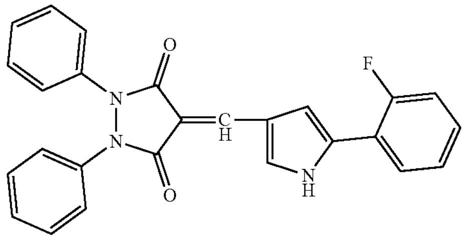
E-27
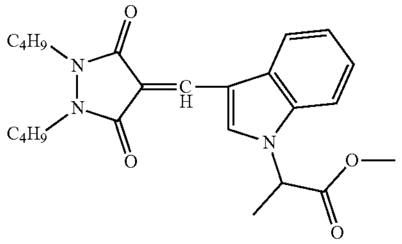
E-28
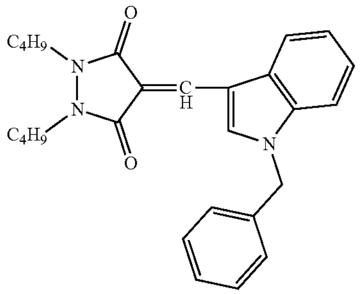
E-29
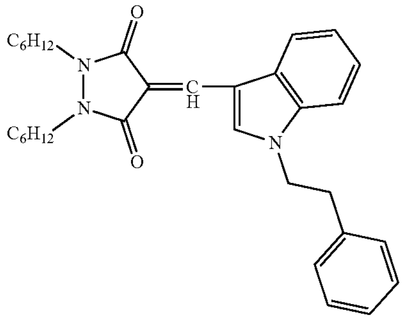
E-30
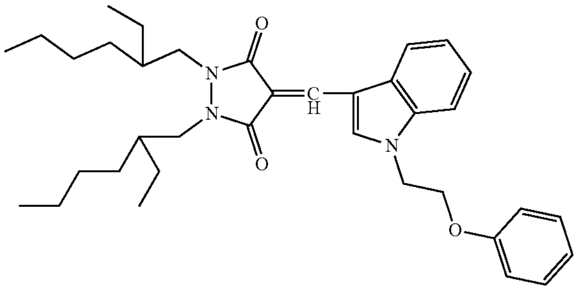

-continued

E-31

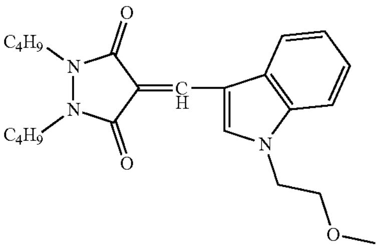

E-32

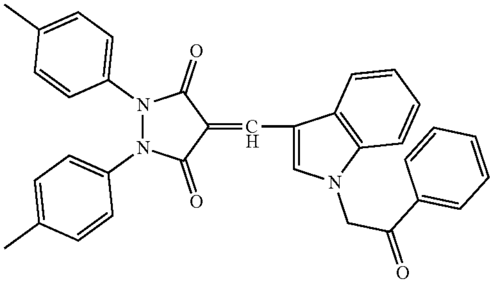

E-33

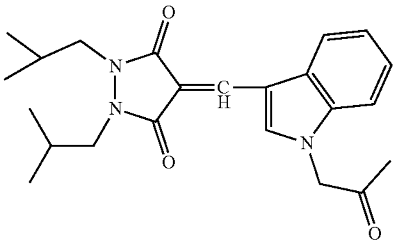

E-34

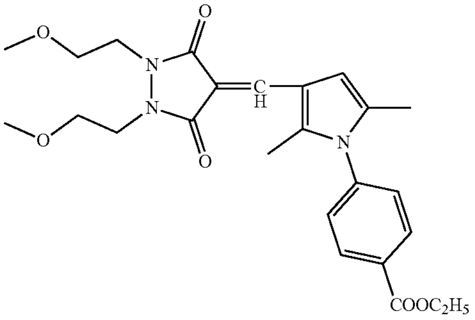

E-35

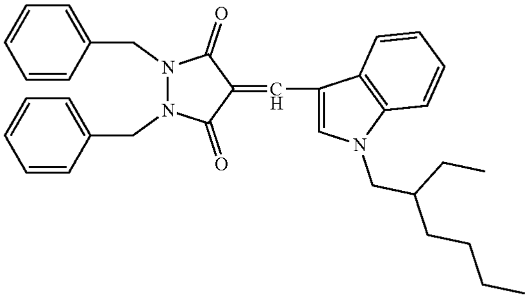

-continued

E-36

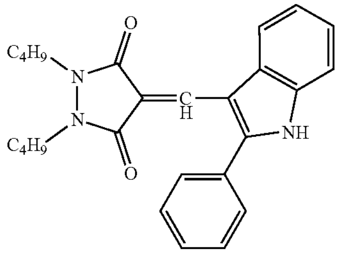

E-37

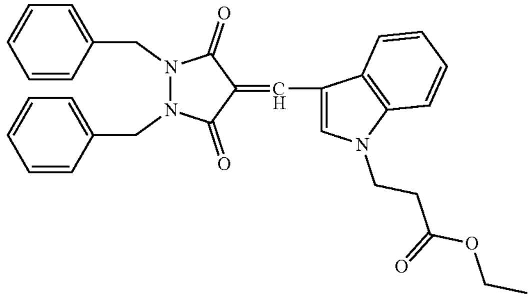

E-38

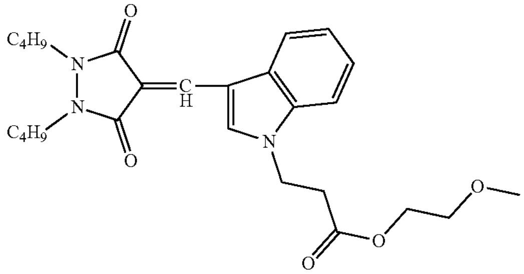

E-39

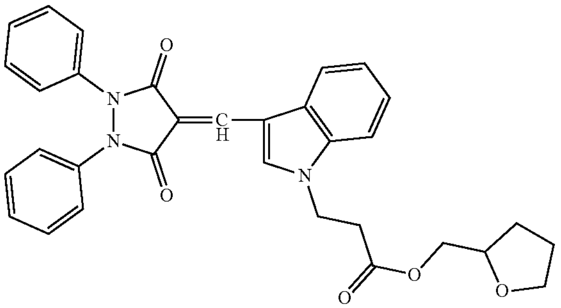

As the dye A, in addition to the coloring agent represented by General Formula (A1) or (A2), the compounds described in paragraphs [0012] to [0067] of JP2007-53241A (JP-H5-53241A) and the compounds described in paragraphs [0011] to [0076] of JP2707371B can also be preferably used.

(Dye B and Dye C)

The dye B is not particularly limited as long as the dye has the main absorption wavelength band in a wavelength of 480 to 520 nm in the laminate, and various dyes can be used.

The dye C is not particularly limited as long as the dye has the main absorption wavelength band in a wavelength of 580 to 620 nm in the laminate, and various dyes can be used.

Specific examples of the dye B include individual coloring agents (dyes) which are based on, for example, pyrrole methine (PM), rhodamine (RH), boron dipyrromethene (BODIPY), and squarine (SQ).

Specific examples of the dye C include individual coloring agents (dyes) which are based on, for example, tetraazaporphyrin (TAP), squarine, and cyanine (CY).

Among these, the dye B and the dye C are preferably a squarine-based coloring agent, and more preferably a squarine-based coloring agent represented by General Formula (1) in that the absorption waveform in the main absorption wavelength band is sharp. In a case where a coloring agent having a sharp absorption waveform as described above is used as the dye B and the dye C. Relational Expressions (I) to (VI) can be satisfied at a preferred level, and the original tint of the image of the self-luminous display device can be maintained at a more excellent level.

That is, in the wavelength selective absorption layer, from the viewpoint of suppressing a change in tint, it is preferable that at least one of the dye B or the dye C is a squarine-based coloring agent (preferably, a squarine-based coloring agent represented by General Formula (1)), and it is more preferable that both the dye B and the dye C are a squarine-based coloring agent (preferably, a squarine-based coloring agent represented by General Formula (1)).

In the present invention, in the coloring agent represented by each General Formula, a cation is present in a delocalized manner, and thus a plurality of tautomer structures are present. Therefore, in the present invention, in a case where at least one tautomer structure of a certain coloring agent matches with each general formula, the certain coloring agent shall be a coloring agent represented by the general formula. Therefore, a coloring agent represented by a specific general formula can also be said to be a coloring agent having at least one tautomer structure that can be represented by the specific general formula. In the present invention, a coloring agent represented by a general formula may have any tautomer structure as long as at least one tautomer structure of the coloring agent matches with the general formula.

General Formula (1)

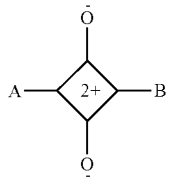

In General Formula (1), A and B each independently represent an aryl group which may have a substituent, a heterocyclic group which may have a substituent, or —CH=G. G represents a heterocyclic group which may have a substituent.

The aryl group that can be employed as A or B is not particularly limited and may be a group consisting of a monocyclic ring or a group consisting of a fused ring. The aryl group preferably has 6 to 30 carbon atoms, more preferably 6 to 20 carbon atoms, and still more preferably 6 to 12 carbon atoms. Examples of the aryl group include groups respectively consisting of a benzene ring and a naphthalene ring, and a group consisting of a benzene ring is more preferable.

The heterocyclic group that can be employed as A or B is not particularly limited, and examples thereof include a group consisting of an aliphatic heterocyclic ring or an aromatic heterocyclic ring. A group consisting of an aromatic heterocyclic ring is preferable. Examples of the heteroaryl group that is an aromatic heterocyclic group include a heteroaryl group that can be employed as a substituent X described below. The aromatic heterocyclic group that can be employed as A or B is preferably a group of a 5-membered ring or a 6-membered ring and more preferably a group of a nitrogen-containing 5-membered ring. Specific examples thereof suitably include a group consisting of any one of a pyrrole ring, a furan ring, a thiophene ring, an imidazole ring, a pyrazole ring, a thiazole ring, an oxazole ring, a triazole ring, an indole ring, an indolenine ring, an indoline ring, a pyridine ring, a pyrimidine ring, a quinoline ring, a benzothiazole ring, a benzoxazole ring, or a pyrazolotriazole ring. Among these, a group consisting of any one of a pyrrole ring, a pyrazole ring, a thiazole ring, a pyridine ring, a pyrimidine ring, or a pyrazolotriazole ring is preferable. The pyrazolotriazole ring consists of a fused ring of a pyrazole ring and a triazole ring and may be a fused ring obtained by fusing at least one pyrazole ring and at least one triazole ring. Examples thereof include fused rings in General Formulae (4) and (5) described below.

A and B may be bonded to a squaric acid moiety (the 4-membered ring represented by General Formula (1)) at any moiety (ring-constituting atom) without particular limitation and is preferable to be bonded to a carbon atom.

G in —CH=G that can be employed as A or B represents a heterocyclic group which may have a substituent, and examples thereof suitably include examples shown in the heterocyclic group that can be employed as A or B. Among these, a group consisting of any one of a benzoxazole ring, a benzothiazole ring, an indoline ring, or the like is preferable.

At least one of A or B may have a hydrogen bonding group that forms an intramolecular hydrogen bond.

Each of A, B, and G may have the substituent X, and, in a case where A, B, or G has the substituent X, adjacent substituents may be bonded to each other to further form a ring structure. In addition, a plurality of substituents X may be present.

Examples of the substituent X include the following groups:

- an alkyl group (it preferably has 1 to 20 carbon atoms, more preferably 1 to 15 carbon atoms, and still more preferably 1 to 8 carbon atoms; for example, methyl, ethyl, propyl, isopropyl, butyl, t-butyl, isobutyl, pentyl, hexyl, octyl, dodecyl, trifluoromethyl, cyclopentyl, or cyclohexyl);
- an alkenyl group (it preferably has 2 to 20 carbon atoms, more preferably 2 to 12 carbon atoms, and still more preferably 2 to 8 carbon atoms; for example, vinyl, or allyl);
- an alkynyl group (it preferably has 2 to 40 carbon atoms, more preferably 2 to 30 carbon atoms, and particularly preferably 2 to 25 carbon atoms, for example, ethynyl or propargyl);
- an aryl group (it preferably has 6 to 30 carbon atoms, more preferably 6 to 20 carbon atoms, and still more preferably 6 to 12 carbon atoms; for example, phenyl or naphthyl);
- a heterocyclic group (it includes an aromatic heterocyclic group and an aliphatic heterocyclic group; it includes a group consisting of a monocyclic ring or a fused ring, and it is preferably a monocyclic group or a group consisting of a fused ring having 2 to 8 rings, and more preferably a group consisting of a monocyclic ring or a fused ring having 2 to 4 rings; the number of heteroatoms constituting the ring is preferably 1 to 3, and examples of the heteroatom constituting the ring include a nitrogen atom, an oxygen atom, and a sulfur atom, where the ring is preferably a group consisting of a 5-membered ring or a 6-membered ring; the number of carbon atoms constituting the ring in the heteroaryl group is preferably 3 to 30, more preferably 3 to 18, and still more preferably 3 to 12; for example, furyl, thienyl, pyridyl, pyridazyl, pyrimidyl, pyrazil, triazil, imidazolyl, pyrazolyl, thiazolyl, benzimidazolyl, benzoxazolyl, quinazolyl, phthalazyl, pyrrolidyl, imidazolidyl, morpholyl, or oxazolidyl);

an aralkyl group (an alkyl portion in the aralkyl group is the same as the alkyl group described above; an aryl portion in the aralkyl group is the same as the aryl group described above; and the aralkyl group preferably has 7 to 40 carbon atoms, more preferably 7 to 30 carbon atoms, and still more preferably 7 to 25 carbon atoms);

a ferrocenyl group;

—$OR^{10}$ (examples thereof include a hydroxy group, an alkoxy group (methoxy, ethoxy, propyloxy, or the like), a cycloalkoxy group (cyclopentyloxy, cyclohexyloxy, or the like), an aryloxy group (phenoxy, naphthyloxy, or the like), and a heteroaryloxy group (an aromatic heterocyclic oxy group));

—$C(=O)R^{11}$ (examples thereof include acyl groups such as acetyl, ethylcarbonyl, propylcarbonyl, cyclohexylcarbonyl, octylcarbonyl, 2-ethylhexylcarbonyl, phenylcarbonyl, naphthylcarbonyl, and pyridylcarbonyl):

—$C(=O)OR^{12}$ (examples thereof include a carboxy group, an alkoxycarbonyl group (methyloxycarbonyl, ethyloxycarbonyl, butyloxycarbonyl, octyloxycarbonyl, or the like), and an aryloxycarbonyl group (phenyloxycarbonyl, naphthyloxycarbonyl, or the like);

—$OC(=O)R^{13}$ (examples thereof include acyloxy groups such as acetyloxy, ethylcarbonyloxy, butylcarbonyloxy, and octylcarbonyloxy, phenylcarbonyloxy):

—$NR^{14}R^{15}$ (examples thereof include amino groups such as amino (—$NH_2$), ethylamino, dimethylamino, butylamino, dibutylamino, cyclopentylamino, 2-ethylhexylamino, dodecylamino, anilino, naphthylamino, and 2-pyridylamino):

—$NHCOR^{16}$ (examples thereof include amid groups such as methylcarbonylamino, ethylcarbonylamino, dimethylcarbonylamino, propylcarbonylamino, pentylcarbonylamino, cyclohexylcarbonylamino, 2-ethylhexylcarbonylamino, octylcarbonylamino, dodecylcarbonylamino, and phenylcarbonylamino, naphthylcarbonylamino):

—$CONR^{17}R^{18}$ (examples thereof include carbamoyl groups such as aminocarbonyl, methylaminocarbonyl, dimethylaminocarbonyl, propylaminocarbonyl, pentylaminocarbonyl, cyclohexylaminocarbonyl, octylaminocarbonyl, 2-ethylhexylaminocarbonyl, dodecylaminocarbonyl, phenylaminocarbonyl, and naphthylaminocarbonyl, 2-pyridylaminocarbonyl):

—$NHCONR^{19}R^{20}$ (examples thereof include ureido groups such as methylureido, ethylureido, pentylureido, cyclohexylureido, octylureido, dodecylureido, phenylureido, naphthylureido, and 2-pyridyl amino ureido);

—$NHCOOR^{21}$;

—$SR^{22}$ (examples thereof include an alkylthio group (methylthio, ethylthio, propylthio, or the like), a cycloalkylthio group (cyclopentylthio, cyclohexylthio, or the like), an arylthio group (phenylthio, naphthylthio, or the like), and a heteroarylthio group (an aromatic heterocyclic thio group));

—$SO_2R^{23}$ (examples thereof include an alkylsulfonyl group (methylsulfonyl, ethylsulfonyl, butylsulfonyl, cyclohexylsulfonyl, 2-ethylhexylsulfonyl, or the like), and arylsulfonyl (phenylsulfonyl, naphthylsulfonyl, 2-pyridylsulfonyl, or the like));

—$OSO_2R^{24}$ (examples thereof include an alkylsulfonyloxy group such as methanesulfonyloxy); —$NHSO_2R^{25}$ (examples thereof include sulfonylamide groups such as methylsulfonylamino, octylsulfonylamino, 2-ethylhexylsulfonylamino, and trifluoromethylsulfonylamino);

—$SO_2NR^{26}R^{27}$ (examples thereof include sulfamoyl groups such as aminosulfonyl, methylaminosulfonyl, dimethylaminosulfonyl, butylaminosulfonyl, cyclohexylaminosulfonyl, octylaminosulfonyl, phenylaminosulfonyl, and 2-pyridylaminosulfonyl); —$P(=O)(OR^{28})_2$ (examples thereof include phosphoryl groups such as dimethoxyphosphoryl and diphenylphosphoryl);

a halogen atom (a fluorine atom, a chlorine atom, a bromine atom, or an iodine atom);

a cyano group; and a nitro group.

Further, it is also preferable that the substituent X has an electron migration-type antifading agent portion described later, in addition to the ferrocenyl group.

It is noted that $R^{10}$ to $R^{28}$ each independently represent a hydrogen atom, an aliphatic group, an aromatic group, or a heterocyclic group. The aliphatic group and the aromatic group, which can be employed as $R^{10}$ to $R^{28}$, are not particularly limited, and they can be appropriately selected from an alkyl group, an alkenyl group, and an alkynyl group, which are classified as the aliphatic group, and an aryl group which is classified as the aromatic group, in the substituent that can be employed as the substituent X. The heterocyclic group that can be employed as $R^{10}$ to $R^{28}$ may be aliphatic or aromatic, and it can be appropriately selected from, for example, the heterocyclic groups (the aromatic heterocyclic group and the aliphatic heterocyclic group) which can be employed as the substituent X.

Each of the alkyl group, the alkenyl group, and the alkynyl group, which can be employed as the substituent X, may be linear, branched, or cyclic, and it is preferably linear or branched.

It is noted that in a case where $R^{12}$ of —$COOR^{12}$ is a hydrogen atom (that is, a carboxy group), the hydrogen atom may be dissociated (that is, a carbonate group) or may be in a salt state. In addition, in a case where $R^{21}$ of —$SO_3R^{24}$ is a hydrogen atom (that is, a sulfo group), the hydrogen atom may be dissociated (that is, a sulfonate group) or may be in a salt state.

The substituent that can be employed as the substituent X may further have a substituent. Examples of the substituent which may be further contained include the substituent X.

In addition, in a case where adjacent substituents X are bonded to each other to further form a ring structure, the two substituents X may form a ring by interposing a heteroatom such as a boron atom therebetween. The boron atom may be further substituted with a substituent, and examples of the substituent include substituents such as an alkyl group and an aryl group. Examples of a ring formed by bonding two substituents X include a ring formed by bonding two —$NR^{14}R^{15}$ and a ring formed by bonding two —$NR^{14}R^{15}$'s by interposing a boron atom therebetween. The size of the ring to be formed is not particularly limited; however, the ring is preferably a 5-membered ring or a 6-membered ring. Further, the number of rings to be formed is not particularly limited, and it may be one or two or more.

The ferrocenyl group that can be employed as the substituent X is preferably represented by General Formula (2M).

General Formula (2M)

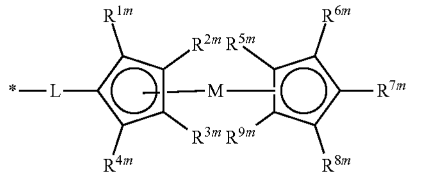

In General Formula (2M), L represents a single bond or a divalent linking group that does not conjugate with A, B, or G in General Formula (1), $R^{1m}$ to $R^{9m}$ each independently represent a hydrogen atom or a substituent. M represents an atom that can constitute a metallocene compound and represents Fe, Co, Ni, Ti, Cu, Zn, Zr, Cr, Mo, Os, Mn, Ru, Sn, Pd, Rh, V, or Pt. * represents a bonding site to A, B, or G.

In the present invention, in a case where L in General Formula (2M) is a single bond, a cyclopentadienyl ring directly bonded to A, B, or G (a ring having $R^{1m}$ in General Formula (2M)) is not included in the conjugated structure which conjugates with A, B, or G.

The divalent linking group that can be employed as L is not particularly limited as long as it is a linking group that does not conjugate with A, B, or G, and it may have a conjugated structure in the inside thereof or at a cyclopentadiene ring side end part in General Formula (2M). Examples of the divalent linking group include an alkylene group having 1 to 20 carbon atoms, an arylene group having 6 to 20 carbon atoms, a divalent heterocyclic group obtained by removing two hydrogens from the heterocyclic ring, —CH═CH—, —CO—, —CS—, —NR— (R represents a hydrogen atom or a monovalent substituent), —O—, —S—, —$SO_2$—, or —N═CH—, or a divalent linking group formed by combining a plurality (preferably, 2 to 6) of these groups. The divalent linking group is preferably a group selected from the group consisting of an alkylene group having 1 to 8 carbon atoms, an arylene group having 6 to 12 carbon atoms, —CH═CH—, —CO—, —NR— (R is as described above), —O—, —S—, —$SO_2$—, and —N═CH—, or a divalent linking group in which two or more (preferably 2 to 6) selected from the above group are combined, and it is particularly preferably a group selected from the group consisting of an alkylene group having 1 to 4 carbon atoms, a phenylene group, —CO—, —NH—, —O—, and —$SO_2$—, or a linking group in which two or more (preferably 2 to 6) selected from the above group are combined. The divalent linking group combined is not particularly limited, and is preferably a group containing —CO—, —NH—, —O—, or —$SO_2$—, and examples thereof include a linking group formed by combining two or more of —CO—, —NH—, —O—, or —$SO_2$—, or a linking group formed by combining at least one of —CO—, —NH—, —O—, or —$SO_2$— and an alkylene group or an arylene group. Examples of the linking group formed by combining two or more of —CO—, —NH—, —O—, or —$SO_2$— include —COO—, —OCO—, —CONH—, —NHCOO—, —NHCONH—, and —$SO_2$NH—. Examples of the linking group formed by combining at least one of —CO—, —NH—, —O—, or —$SO_2$— and an alkylene group or an arylene group include a group in which —CO—, —COO—, or —CONH— and an alkylene group or an arylene group are combined.

The substituent that can be employed as R is not particularly limited and has the same meaning as the substituent X.

L is preferably a single bond or a group selected from the group consisting of an alkylene group having 1 to 8 carbon atoms, an arylene group having 6 to 12 carbon atoms, —CH═CH—, —CO—, —NR— (R is as described above), —O—, —S—, —$SO_2$—, and —N═CH—, or a group in which two or more selected from the above group are combined.

L may have one or a plurality of substituents. The substituent which may be contained in L is not particularly limited, and for example, it has the same meaning as the substituent X. In a case where L has a plurality of substituents, the substituents bonded to adjacent atoms may be bonded to each other to further form a ring structure.

The alkylene group that can be employed as L may be linear, branched, or cyclic as long as the group has 1 to 20 carbon atoms, and examples thereof include methylene, ethylene, propylene, methylethylene, methylmethylene, dimethylmethylene, 1,1-dimethylethylene, butylene, 1-methylpropylene, 2-methylpropylene, 1,2-dimethylpropylene, 1,3-dimethylpropylene, 1-methylbutylene, 2-methylbutylene, 3-methylbutylene, 4-methylbutylene, 2,4-dimethylbutylene, 1,3-dimethylbutylene, pentylene, hexylene, heptylene, octylene, ethane-1,1-diyl, propane-2,2-diyl, cyclopropane-1,1-diyl, cyclopropane-1,2-diyl, cyclobutane-1,1-diyl, cyclobutane-1,2-diyl, cyclopentane-1,1-diyl, cyclopentane-1,2-diyl, cyclopentane-1,3-diyl, cyclohexane-1,1-diyl, cyclohexane-1,2-diyl, cyclohexane-1,3-diyl, cyclohexane-1,4-diyl, and methylcyclohexane-1,4-diyl.

In a case where a linking group containing at least one of —CO—, —CS—, —NR— (R is as described above), —O—, —S—, —$SO_2$—, or —N═CH— in the alkylene group is employed as L, the group such as —CO— may be incorporated at any site in the alkylene group, and the number of the groups incorporated is not particularly limited.

The arylene group that can be employed as L is not particularly limited as long as the group has 6 to 20 carbon atoms, and examples thereof include a group obtained by further removing one hydrogen atom from each group exemplified as the aryl group having 6 to 20 carbon atoms that can be employed as A in General Formula (1).

The heterocyclic group that can be employed as L is not particularly limited, and examples thereof include a group obtained by further removing one hydrogen atom from each group exemplified as the heterocyclic group that can be employed as A.

In General Formula (2M), the remaining partial structure excluding the linking group L corresponds to a structure (a metallocene structure portion) in which one hydrogen atom is removed from the metallocene compound. In the present invention, for the metallocene compound serving as the metallocene structure portion, a known metallocene compound can be used without particular limitation, as long as it is a compound conforming to the partial structure defined by General Formula (2M) (a compound in which a hydrogen atom is bonded instead of L). Hereinafter, the metallocene structure portion defined by General Formula (2M) will be specifically described.

In General Formula (2M), $R^{1m}$ to $R^{9m}$ each independently represent a hydrogen atom or a substituent. The substituents that can be employed as $R^{1m}$ to $R^{9m}$ are not particularly limited, and can be selected from, for example, the substituents that can be employed as the substituent X, $R^{1m}$ to $R^{9m}$ each are preferably a hydrogen atom, a halogen atom, an alkyl group, an acyl group, an alkoxy group, an amino group, or an amide group, more preferably a hydrogen atom, a halogen atom, an alkyl group, an acyl group, or an alkoxy group, still more preferably a hydrogen atom, a halogen atom, an alkyl group, or an acyl group, particularly preferably a hydrogen atom, a halogen atom, or an alkyl group, and most preferably a hydrogen atom.

Among the alkyl groups that can be employed as substitutent X, the alkyl group that can be employed as $R^{1m}$ to $R^{9m}$ is preferably an alkyl group having 1 to 8 carbon atoms, and examples thereof include methyl, ethyl, propyl, isopropyl, butyl, sec-butyl, tert-butyl, isobutyl, pentyl, tert-pentyl, hexyl, octyl, and 2-ethylhexyl.

This alkyl group may have a halogen atom as a substituent. Examples of the alkyl group substituted with a halogen atom include, for example, chloromethyl, dichloromethyl, trichloromethyl, bromomethyl, dibromomethyl, tribromomethyl, fluoromethyl, difluoromethyl, trifluoromethyl, 2,2,2-trifluoroethyl, perfluoroethyl, perfluoropropyl, perfluorobutyl.

In addition, in the alkyl group that can be employed as $R^{1m}$ or the like, at least one methylene group that forms a carbon chain may be substituted with —O— or —CO—. Examples of the alkyl group in which the methylene group is substituted with —O— include an alkyl group in which the end part methylene group of methoxy, ethoxy, propoxy, isopropoxy, butoxy, sec-butoxy, tert-butoxy, 2-methoxyethoxy, chloromethyloxy, dichloromethyloxy, trichloromethyloxy, bromomethyloxy, dibromomethyloxy, tribromomethyloxy, fluoromethyloxy, difluoromethyloxy, trifluoromethyloxy, 2,2,2-trifluoroethyloxy, perfluoroethyloxy, perfluoropropyloxy, or perfluorobutyloxy is substituted, as well as an alkyl group in which an internal methylene group of the carbon chain such as 2-methoxyethyl or the like is substituted. Examples of the alkyl group in which a methylene group is substituted with —CO— include, for example, acetyl, propionyl, monochloroacetyl, dichloroacetyl, trichloroacetyl, trifluoroacetyl, propane-2-one-1-yl, butane-2-one-1-yl.

In General Formula (2M), M represents an atom that can constitute a metallocene compound, and represents Fe, Co. Ni, Ti, Cu, Zn, Zr, Cr, Mo, Os, Mn, Ru, Sn, Pd, Rh, V, or Pt. Among these, M is preferably Fe, Ti, Co, Ni, Zr, Ru, or Os, more preferably Fe, Ti, Ni, Ru, or Os, still more preferably Fe or Ti, and most preferably Fe.

The group represented by General Formula (2M) is preferably a group formed by combining preferred ones of L, $R^{1m}$ to $R^{9m}$, and M. Examples thereof include a group formed by combining, as L, a single bond, or a group selected from the group consisting of an alkylene group having 2 to 8 carbon atoms, an arylene group having 6 to 12 carbon atoms, —CH=CH—, —CO—, —NR— (R is as described above), —O—, —S—, —$SO_2$—, and —N=CH—, or a group in which two or more selected from the above group are combined; as $R^{1m}$ to $R^{9m}$, a hydrogen atom, a halogen atom, an alkyl group, an acyl group, or an alkoxy group; and as M, Fe.

The alkyl group, the alkenyl group, the alkynyl group, the aralkyl group, the aryl group, and the heteroaryl group which can be employed as the substituent X and the aliphatic group, the aromatic group, and the heterocyclic group which can be employed as $R^{10}$ to $R^{28}$ each may further have a substituent or may be unsubstituted. The substituent which may be further contained therein is not particularly limited, and it is preferably a substituent selected from an alkyl group, an aryl group, an amino group, an alkoxy group, an aryloxy group, an aromatic heterocyclic oxy group, an acyl group, an alkoxycarbonyl group, an aryloxycarbonyl group, an acyloxy group, an acylamino group, an alkoxycarbonylamino group, an aryloxycarbonylamino group, a sulfonylamino group, an alkylthio group, an arylthio group, an aromatic heterocyclic thio group, a sulfonyl group, a ferrocenyl group, a hydroxy group, a mercapto group, a halogen atom, a cyano group, a sulfo group, or a carboxy group, and it is more preferably a substituent selected from an alkyl group, an aryl group, an alkoxy group, an aryloxy group, an aromatic heterocyclic oxy group, an acyl group, an alkoxycarbonyl group, an aryloxycarbonyl group, an acyloxy group, an alkylthio group, an arylthio group, an aromatic heterocyclic thio group, a sulfonyl group, a ferrocenyl group, a hydroxy group, a mercapto group, a halogen atom, a cyano group, a sulfo group, or a carboxy group. These group can be appropriately selected from the substituents that can be employed as the substituent X.

One preferred embodiment of the coloring agent represented by General Formula (1) includes a coloring agent represented by General Formula (2).

General Formula (2)

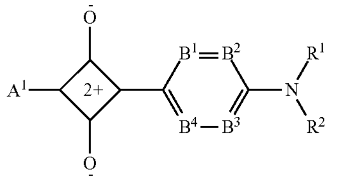

In General Formula (2), $A^1$ is the same as A in General Formula (1). Among these, a heterocyclic group which is a nitrogen-containing 5-membered ring is preferable.

In General Formula (2), $R^1$ and $R^2$ each independently represent a hydrogen atom or a substituent. $R^1$ and $R^2$ may be the same or different from each other, and they may be bonded together to form a ring.

The substituents that can be employed as $R^1$ and $R^2$ are not particularly limited, and examples thereof include substituents that can be employed as the substituent X.

Among these, an alkyl group, an alkenyl group, an aryl group, or a heteroaryl group is preferable, an alkyl group, an aryl group, or a heteroaryl group is more preferable, and an alkyl group is still more preferable.

The substituent that can be employed as $R^1$ and $R^2$ may further have a substituent. Examples of the substituent which may be further contained include the substituent X In addition, $R^1$ and $R^2$ may be bonded to each other to form a ring, and $R^1$ or $R^2$ and the substituent contained in $B^2$ or $B^3$ may be bonded to each other to form a ring.

The ring that is formed in this case is preferably a heterocyclic ring or a heteroaryl ring, and it is preferably a 5-membered ring or a 6-membered ring although the size of the ring to be formed is not particularly limited. Further, the number of rings to be formed is not particularly limited, and it may be one or two or more. Examples of the form in which two or more rings are formed include a form in which the substituents of $R^1$ and $B^2$ and the substituents of $R^2$ and $B^3$ are respectively bonded to each other to form two rings.

In General Formula (2), $B^1$, $B^2$, $B^3$, and $B^4$ each independently represent a carbon atom or a nitrogen atom. The ring including $B^1$, $B^2$, $B^3$, and $B^4$ is an aromatic ring. It is preferable that at least two or more of $B^1$ to $B^4$ are a carbon atom, and it is more preferable that all of $B^1$ to $B^4$ are a carbon atom.

The carbon atom that can be employed as $B^1$ to $B^4$ has a hydrogen atom or a substituent. Among carbon atoms that can be employed as $B^1$ to $B^4$, the number of carbon atoms having a substituent is not particularly limited: however, it is preferably zero, one, or two, and more preferably one. Particularly, it is preferable that $B^1$ and $B^4$ are a carbon atom and at least one of them has a substituent.

The substituent possessed by the carbon atom that can be employed as $B^1$ to $B^4$ is not particularly limited, and examples thereof include the substituent X. Among these, it is preferably an alkyl group, an alkoxy group, an alkoxycarbonyl group, an aryl group, an acyl group, an amide group, a sulfonylamide group, a carbamoyl group, an alkylsulfonyl group, an arylsulfonyl group, an amino group, a cyano group, a nitro group, a halogen atom, or a hydroxy group, and it is more preferably an alkyl group, an alkoxy group, an alkoxycarbonyl group, an aryl group, an acyl group, an amide group, a sulfonylamide group, a carbamoyl group, an amino group, a cyano group, a nitro group, a halogen atom, or a hydroxy group.

The substituent possessed by the carbon atom that can be employed as $B^1$ to $B^4$ may further have a substituent. Examples of this substituent which may be further contained include the substituent X.

Examples of the substituent that can be possessed by the carbon atom that can be employed as $B^1$ and $B^4$ still more preferably include an alkyl group, an alkoxy group, a hydroxy group, an amide group, a sulfonylamide group, or a carbamoyl group, and particularly preferably an alkyl group, an alkoxy group, a hydroxy group, an amide group, or a sulfonylamide group, and a hydroxy group, an amide group, or a sulfonylamide group is most preferable.

It is still more preferable that the substituent that can be possessed by the carbon atom that can be employed as $B^2$ and $B^3$ is an alkyl group, an alkoxy group, an alkoxycarbonyl group, an acyl group, an amino group, a cyano group, a nitro group, or a halogen atom, and it is particularly preferable that the substituent as any one of $B^2$ or $B^3$ is an electron withdrawing group (for example, an alkoxycarbonyl group, an acyl group, a cyano group, a nitro group, or a halogen atom).

The coloring agent represented by General Formula (2) is preferably a coloring agent represented by any one of General Formulae (3), (4), or (5).

General Formula (3)

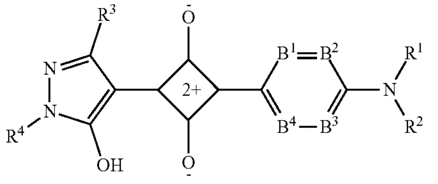

In General Formula (3), $R^1$ and $R^2$ each independently represent a hydrogen atom or a substituent, and they respectively have the same meanings as $R^1$ and $R^2$ in General Formula (2), where the same applies to the preferred ranges thereof.

In General Formula (3), $B^1$ to $B^4$ each independently represent a carbon atom or a nitrogen atom, and they have respectively the same meanings as $B^1$ to $B^4$ in General Formula (2), where the same applies to the preferred ranges thereof.

In General Formula (3), $R^3$ and $R^4$ each independently represent a hydrogen atom or a substituent. The substituent that can be employed as $R^3$ and $R^4$ is not particularly limited, and examples thereof include the same ones as the substituents that can be employed as $R^1$ and $R^2$.

However, the substituent that can be employed as $R^3$ is preferably an alkyl group, an alkoxy group, an amino group, an amide group, a sulfonylamide group, a cyano group, a nitro group, an aryl group, a heteroaryl group, a heterocyclic group, an alkoxycarbonyl group, a carbamoyl group, or a halogen atom, more preferably an alkyl group, an aryl group, or an amino group, and still more preferably an alkyl group.

The substituent that can be employed as $R^4$ is preferably an alkyl group, an aryl group, a heteroaryl group, a heterocyclic group, an alkoxy group, an alkoxycarbonyl group, an acyl group, an acyloxy group, an amide group, a carbamoyl group, an amino group, or a cyano group, more preferably an alkyl group, an alkoxycarbonyl group, an acyl group, a carbamoyl group, or an aryl group, and still more preferably an alkyl group.

The alkyl group that can be employed as $R^3$ and $R^4$ may be linear, branched, or cyclic, and it is preferably linear or branched. The alkyl group preferably has 1 to 12 carbon atoms and more preferably 1 to 8 carbon atoms. An example of the alkyl group is preferably a methyl group, an ethyl group, an n-propyl group, an isopropyl group, a t-butyl group, a 2-ethylhexyl group, or a cyclohexyl group, and more preferably a methyl group or a t-butyl group.

General Formula (4)

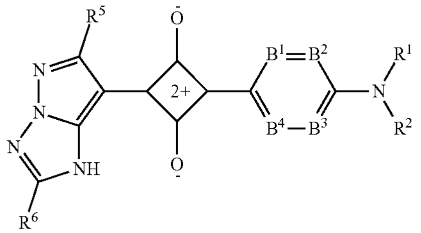

In General Formula (4), $R^1$ and $R^2$ each independently represent a hydrogen atom or a substituent, and they respectively have the same meanings as $R^1$ and $R^2$ in General Formula (2), where the same applies to the preferred ranges thereof.

In General Formula (4), $B^1$ to $B^4$ each independently represent a carbon atom or a nitrogen atom, and they have respectively the same meanings as $B^1$ to $B^4$ in General Formula (2), where the same applies to the preferred ranges thereof.

In General Formula (4), $R^5$ and $R^6$ each independently represent a hydrogen atom or a substituent. The substituent that can be employed as $R^5$ and $R^6$ is not particularly limited, and examples thereof include the same ones as the substituents that can be employed as $R^1$ and $R^2$.

However, the substituent that can be employed as $R^5$ is preferably an alkyl group, an alkoxy group, an aryloxy group, an amino group, a cyano group, an aryl group, a heteroaryl group, a heterocyclic group, an acyl group, an acyloxy group, an amide group, a sulfonylamide group, an ureido group, or a carbamoyl group, more preferably an alkyl group, an alkoxy group, an acyl group, an amide group, or an amino group, and still more preferably an alkyl group.

The alkyl group that can be employed as $R^5$ has the same meaning as the alkyl group that can be employed as $R^3$ in General Formula (3), and the same applies to the preferred range thereof.

In General Formula (4), the substituent that can be employed as $R^6$ is preferably an alkyl group, an alkenyl group, an aryl group, a heteroaryl group, a heterocyclic group, an alkoxy group, a cycloalkoxy group, an aryloxy group, an alkoxycarbonyl group, an acyl group, an acyloxy group, an amide group, a sulfonylamide group, an alkylsulfonyl group, an arylsulfonyl group, a carbamoyl group, an amino group, a cyano group, a nitro group, or a halogen atom, more preferably an alkyl group, an aryl group, a heteroaryl group, or a heterocyclic group, and still more preferably an alkyl group or an aryl group.

The alkyl group that can be employed as $R^6$ has the same meaning as the alkyl group that can be employed as $R^4$ in General Formula (3), and the same applies to the preferred range thereof.

The aryl group that can be employed as $R^6$ is preferably an aryl group having 6 to 12 carbon atoms, and more preferably a phenyl group. This aryl group may have a substituent, examples of the substituent include a group included in the following substituent group A, and an alkyl group, a sulfonyl group, an amino group, an acylamino group, a sulfonylamino group, or the like, which have 1 to 10 carbon atoms, is particularly preferable. This substituent may further have a substituent. Specifically, the substituent is preferably an alkylsulfonylamino group.

—Substituent Group A—

A halogen atom, an alkyl group, an alkenyl group, an alkynyl group, an aryl group, a heterocyclic group, a cyano group, a hydroxy group, a nitro group, a carboxy group, an alkoxy group, an aminooxy group, an aryloxy group, a silyloxy group, a heterocyclic oxy group, an acyloxy group, a carbamoyloxy group, an amino group, an acylamino group, an aminocarbonylamino group, an alkoxycarbonylamino group, an aryloxycarbonylamino group, a sulfamoylamino group, a sulfonylamino group (including an alkyl or arylsulfonylamino group), a mercapto group, an alkylthio group, an arylthio group, a heterocyclic thio group, a sulfamoyl group, a sulfo group, an alkyl or arylsulfonyl group, a sulfonyl group (including an alkyl or arylsulfinyl group), an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a silyl group.

General Formula (5)

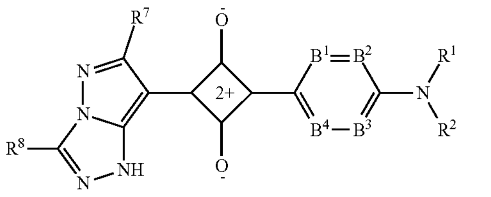

In General Formula (5), $R^1$ and $R^2$ each independently represent a hydrogen atom or a substituent, and they respectively have the same meanings as $R^1$ and $R^2$ in General Formula (2), where the same applies to the preferred ranges thereof.

In General Formula (5), $B^1$ to $B^4$ each independently represent a carbon atom or a nitrogen atom, and they have respectively the same meanings as $B^1$ to $B^4$ in General Formula (2), where the same applies to the preferred ranges thereof.

In General Formula (5), $R^7$ and $R^8$ each independently represent a hydrogen atom or a substituent. The substituent that can be employed as $R^7$ and $R^8$ is not particularly limited, and examples thereof include the same ones as the substituents that can be employed as $R^1$ and $R^2$.

However, the preferred range, the more preferred range, and the still more preferred range of the substituent that can be employed as $R^7$ are the same as those of the substituent that can be employed as R in General Formula (4). The alkyl group that can be employed as $R^5$ has the same meaning as the alkyl group that can be employed as $R^3$, and the same applies to the preferred range thereof.

In General Formula (5), the preferred range, the more preferred range, and the still more preferred range of the substituent that can be employed as $R^8$ are the same as those of the substituent that can be employed as $R^6$ in General Formula (4). The preferred ranges of the alkyl group and the aryl group that can be employed as $R^8$ have the same meaning as the alkyl group and the aryl group that can be employed as $R^6$ in General Formula (4), where the same applies to the preferred ranges thereof.

In the present invention, in a case where a squarine-based coloring agent is used as the dye C, any squarine-based coloring agent may be used without particular limitations as long as the squarine-based coloring agent is the squarine-based coloring agent represented by any one of General Formulae (1) to (5). Examples thereof include compounds described in, for example, JP2006-160618A, WO2004/005981A, WO2004/007447A, Dyes and Pigment, 2001, 49, p. 161 to 179, WO2008/090757A, WO2005/121098A, and JP2008-275726A.

Hereinafter, specific examples of the coloring agent represented by any one of General Formula (1) to General Formula (5) will be shown. However, the present invention is not limited thereto.

In the following specific examples, Me represents methyl, Et represents ethyl, Bu represents butyl, and Ph represents phenyl, respectively.

A-1

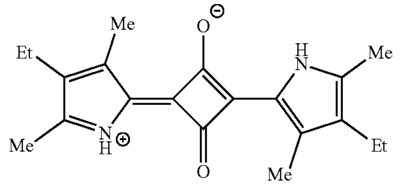

A-2

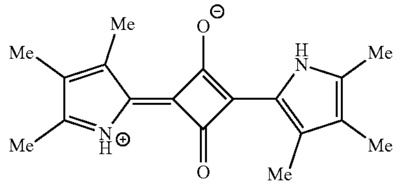

-continued
A-3
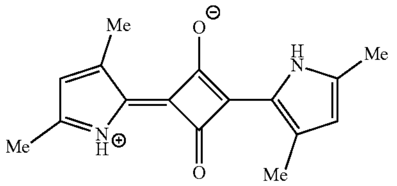
A-4
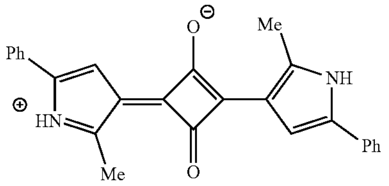
A-5
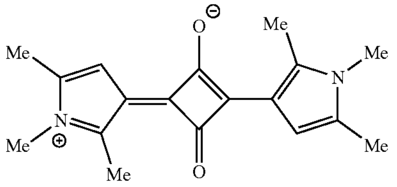
A-6
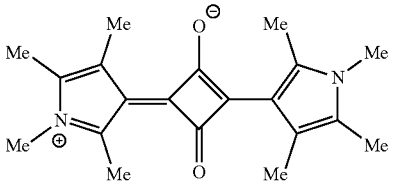
A-7
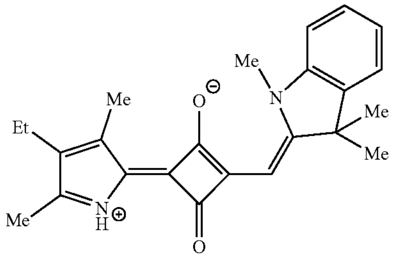
A-8
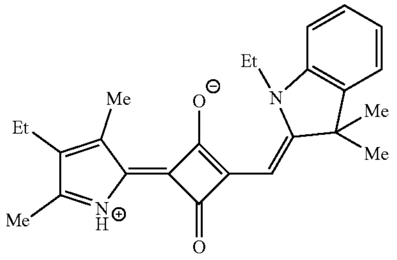
A-9
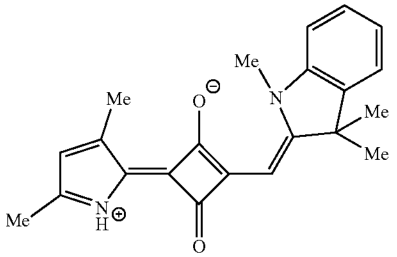
-continued
A-10
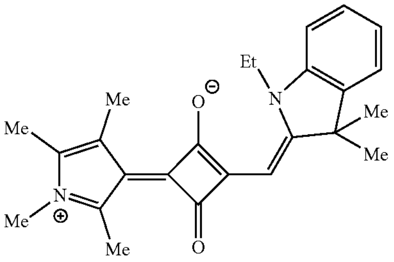
A-11
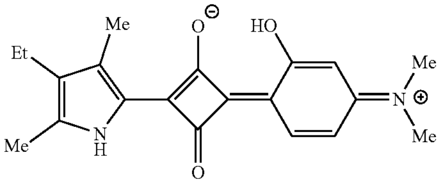
A-12
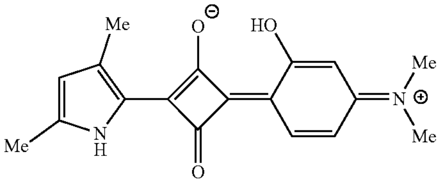
A-13
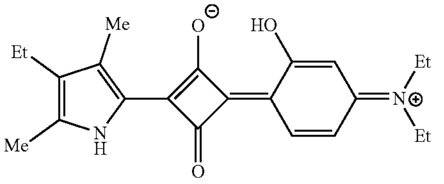
A-14
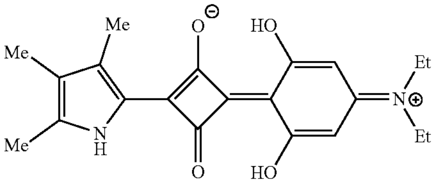
A-15
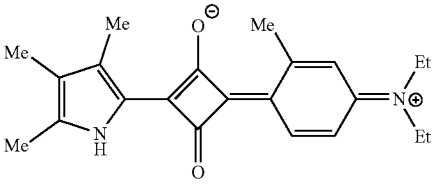
A-16
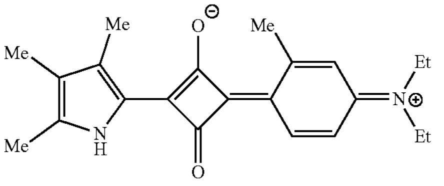
A-17
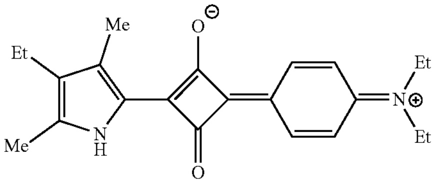

-continued
A-18
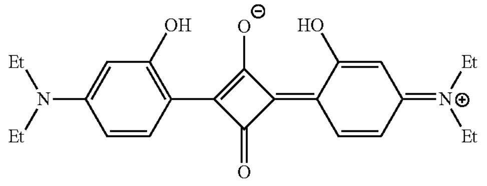
A-19
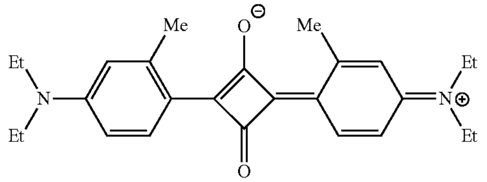
A-20
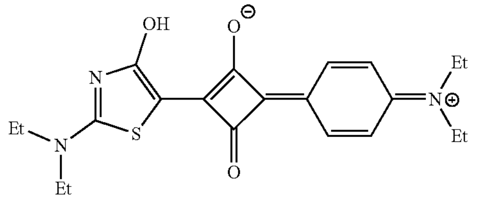
A-21
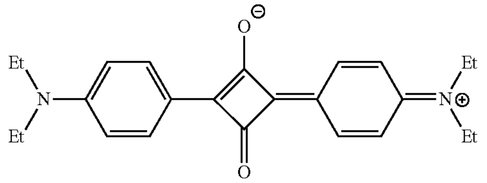
A-22
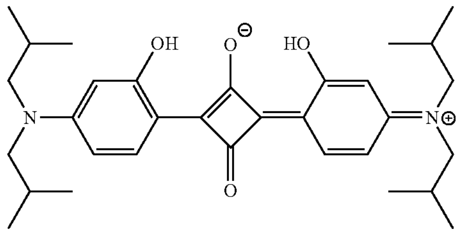
A-23
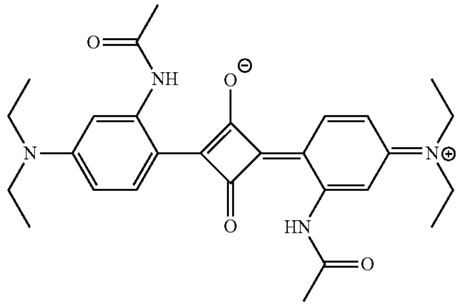
-continued
A-24
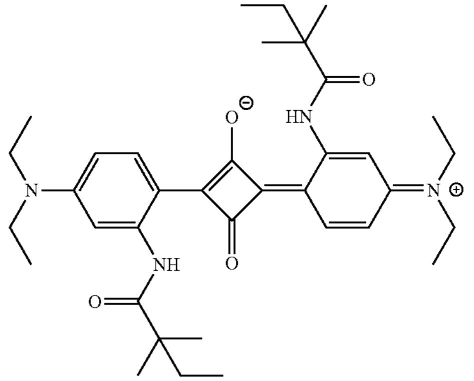
A-25
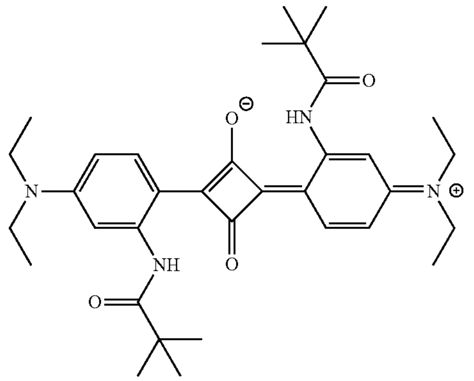
A-26
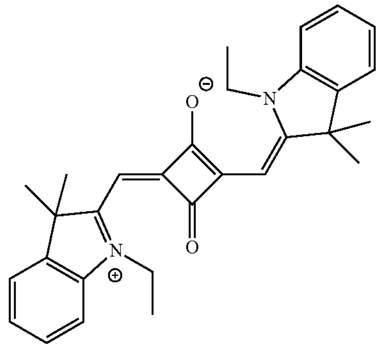
A-27
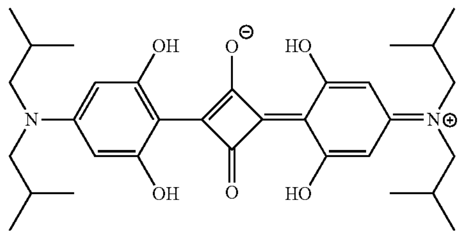

-continued
A-28
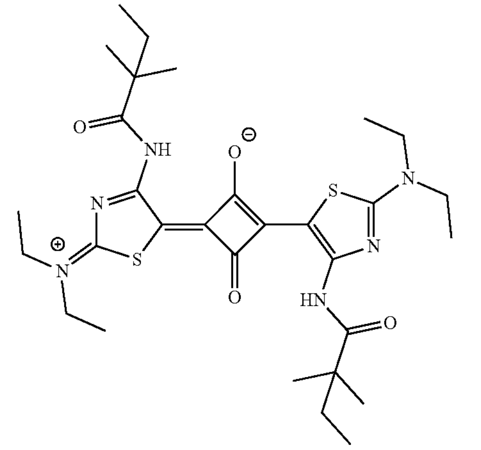
A-29
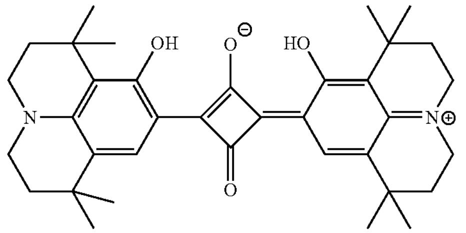
A-30
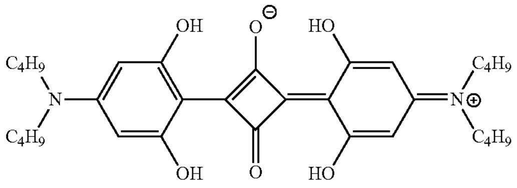
A-31
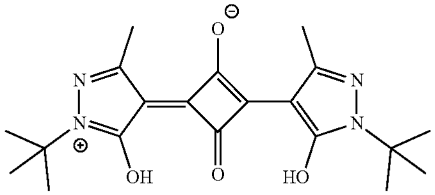
A-32
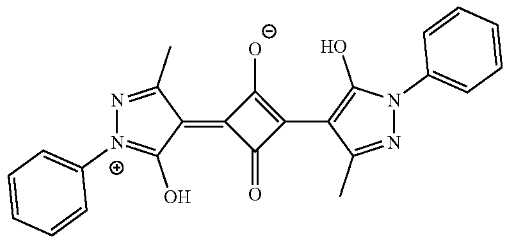
A-33
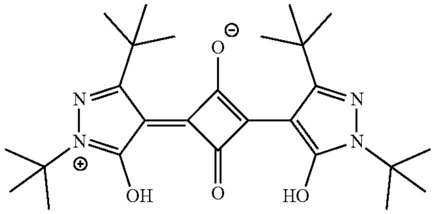
-continued
A-34
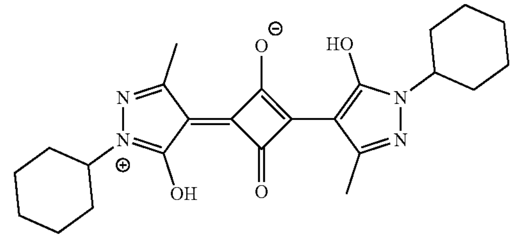
A-35
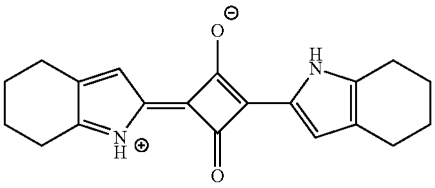
A-36
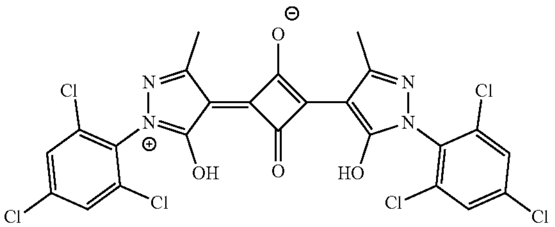
A-37
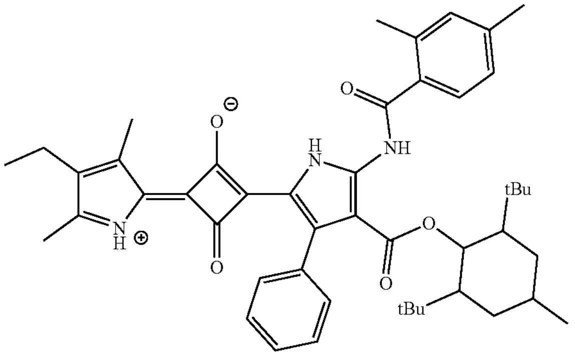
A-38
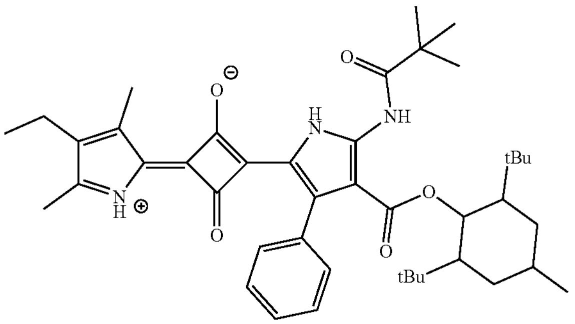

-continued
A-39
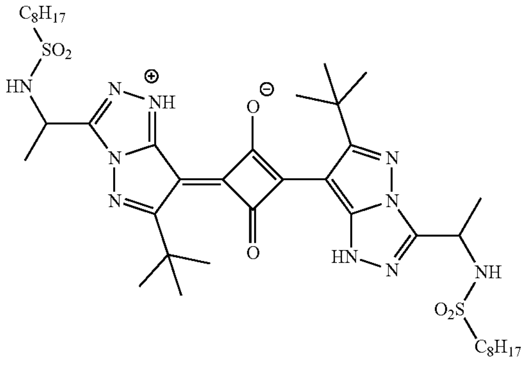
A-40
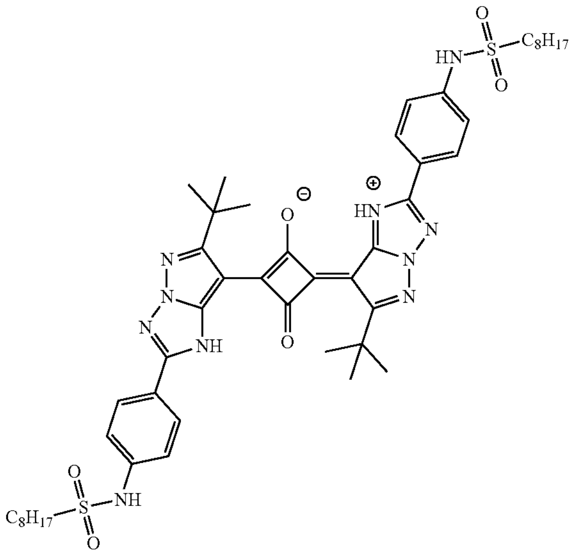
A-41
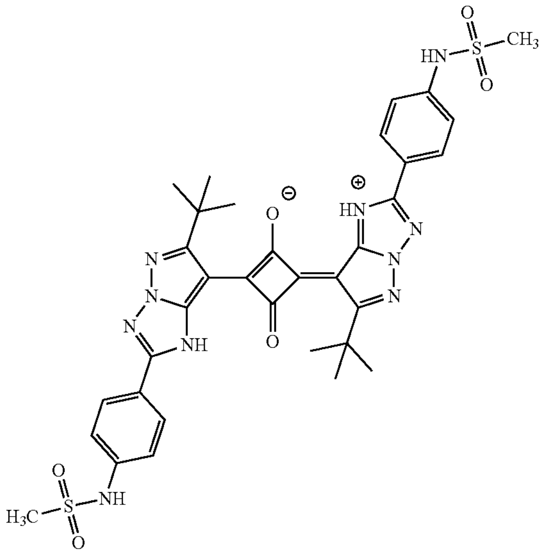
-continued
A-42
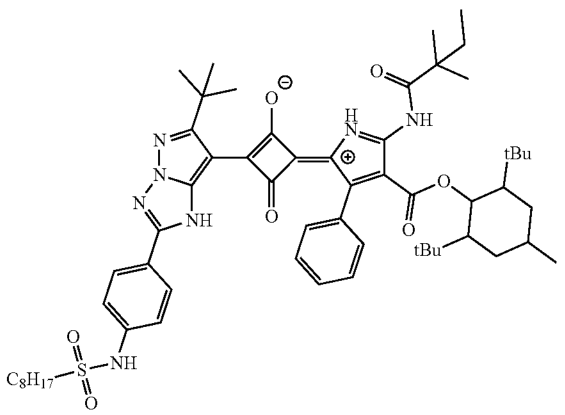
A-43
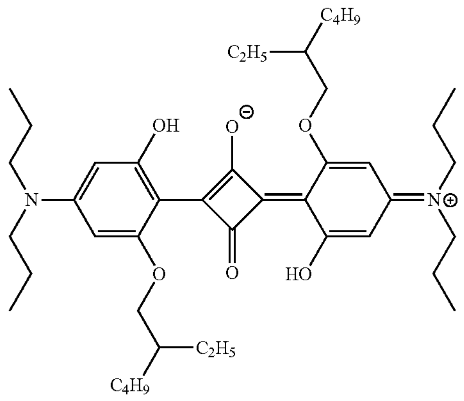
A-44
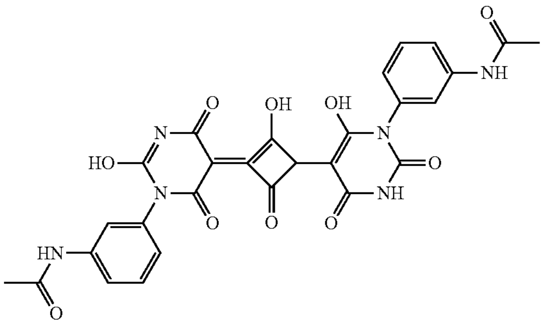
A-45
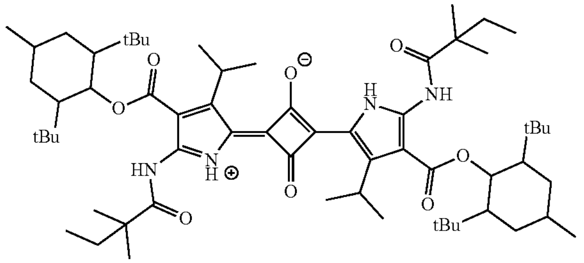

-continued

A-46

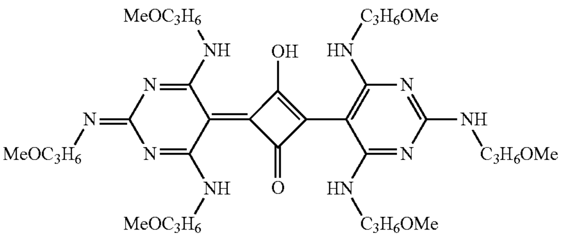

A-47

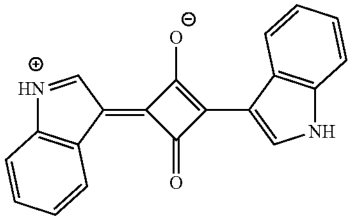

A-48

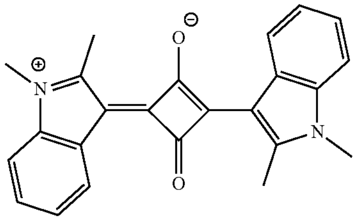

A-49

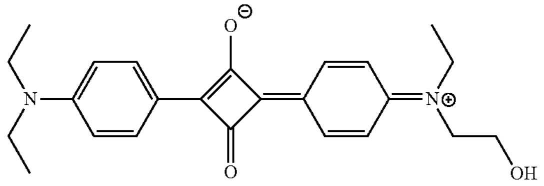

A-50

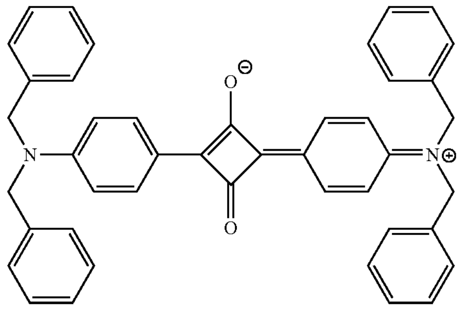

A-51

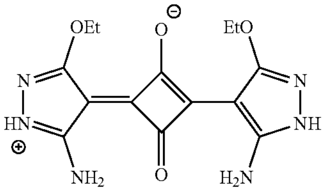

-continued

A-52

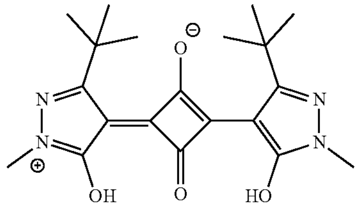

In addition to the above-described specific examples, specific examples of the coloring agents represented by any one of General Formulae (3) to (5) will be shown. The substituent B in the following tables represents the following structures. In the following structures and the following tables, Me represents methyl, Et represents ethyl, i-Pr represents i-propyl, Bu represents n-butyl, t-Bu represents t-butyl, and Ph represents phenyl, respectively. In the following structures, * indicates a bonding site to a 4-membered carbon ring in each General Formula.

B-1

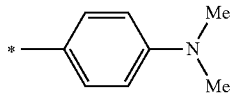

B-2

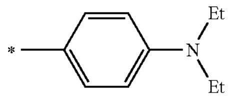

B-3

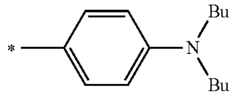

B-4

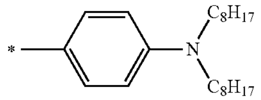

B-5

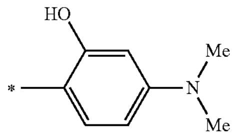

B-6

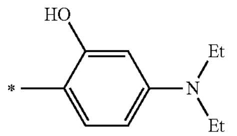

B-7

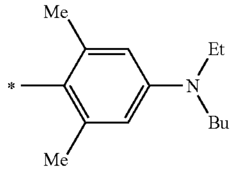

-continued
B-8
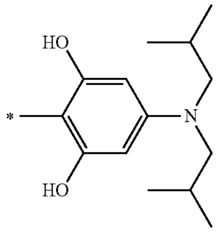
B-9
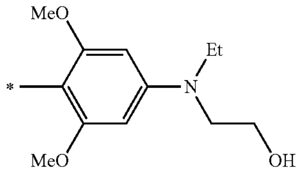
B-10
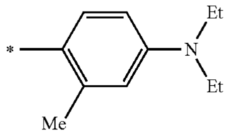
B-11
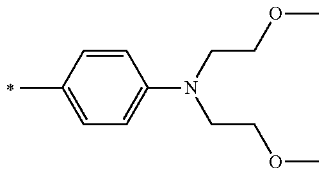
B-12
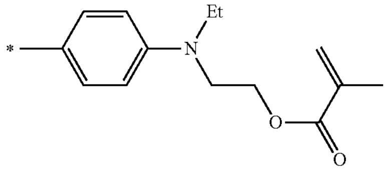
B-13
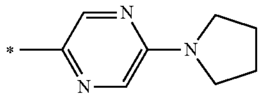
B-14
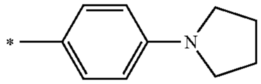
B-15
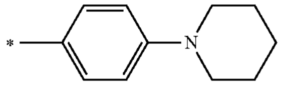
B-16
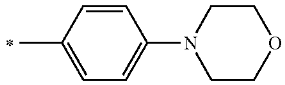
B-17
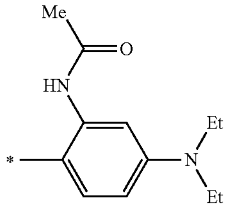
-continued
B-18
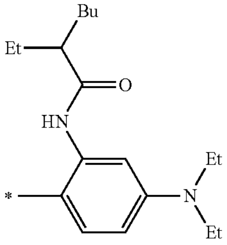
B-19
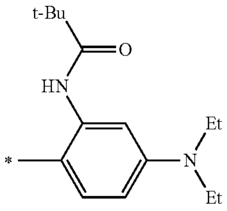
B-20
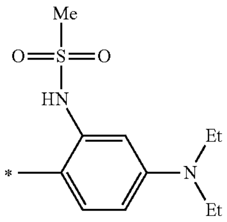
B-21
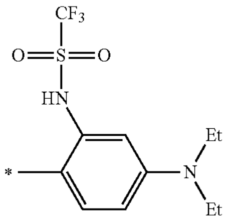
B-22
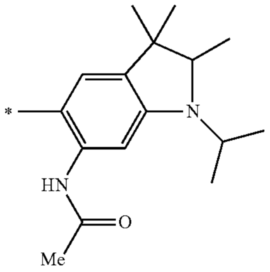
B-23
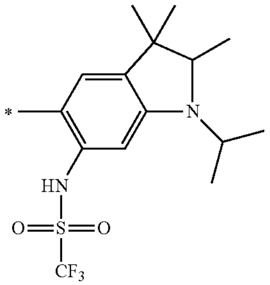

-continued
B-24
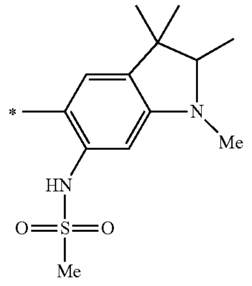
B-25
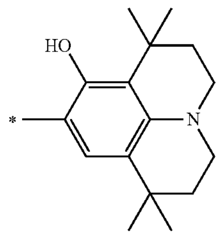
B-26
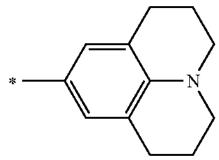
B-27
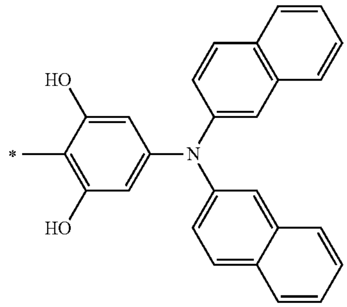
B-28
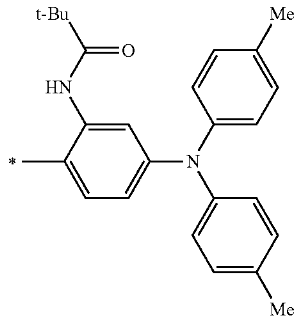
-continued
B-29
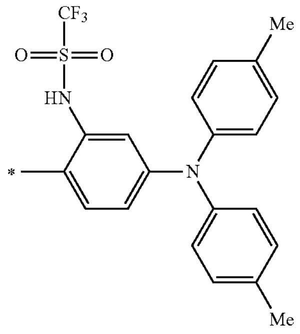
B-30
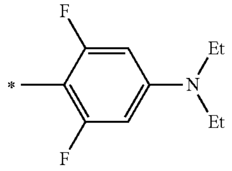
B-31
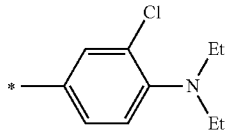
B-32
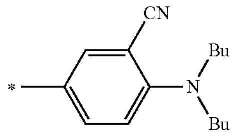
B-33
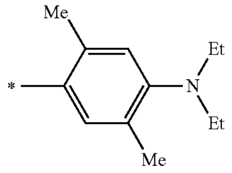
B-36
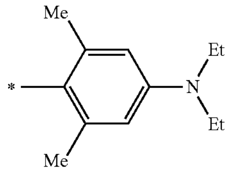
B-37
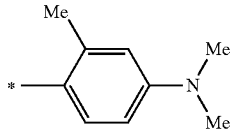
B-38
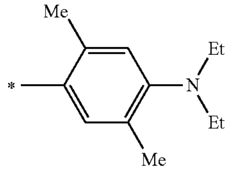

B-39
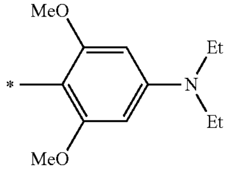
B-40
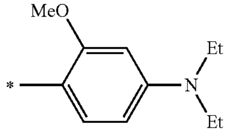
B-41
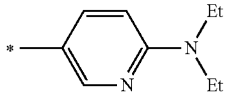
B-42
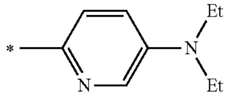
B-43
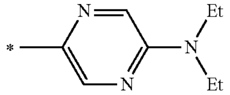
B-44
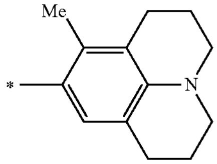
B-45
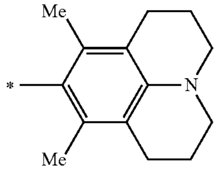
B-46
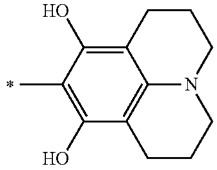
B-47
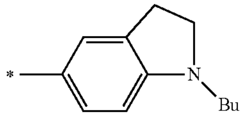
B-48
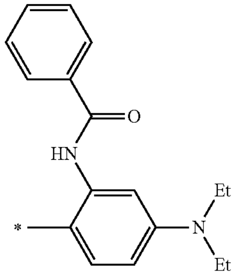
B-49
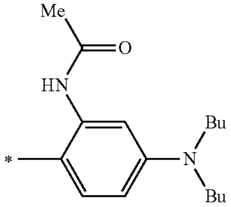
B-50
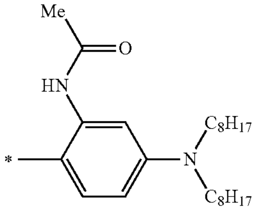
B-51
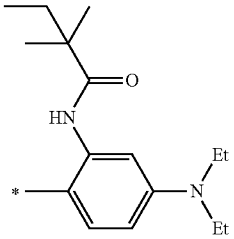
B-52
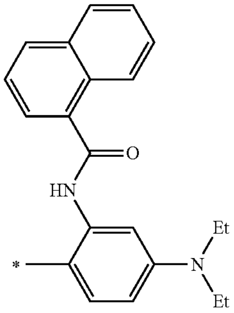
B-53
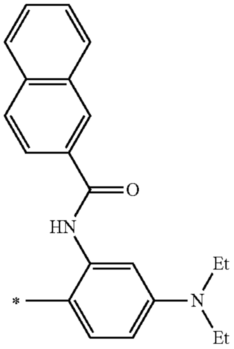

-continued
B-54
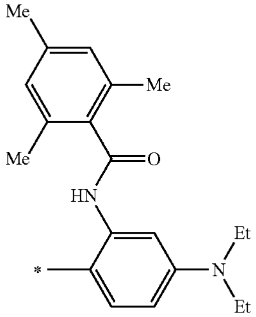
B-55
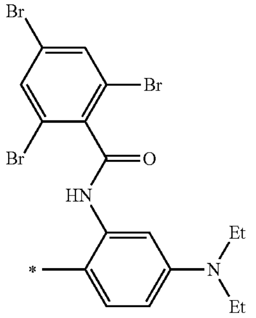
B-56
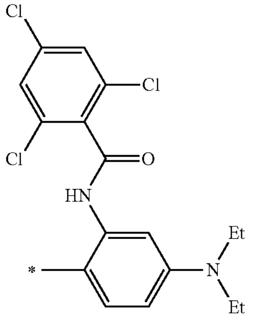
B-57
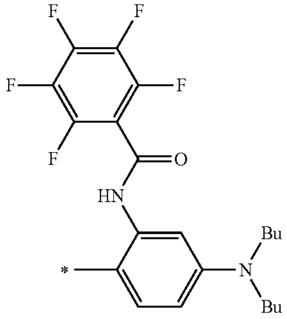
B-58
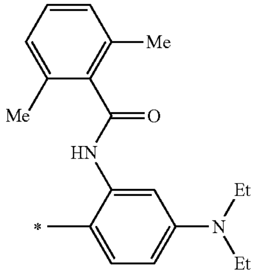
-continued
B-59
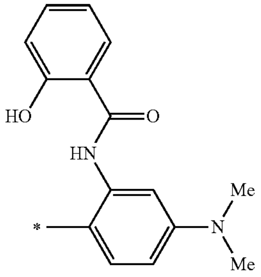
B-60
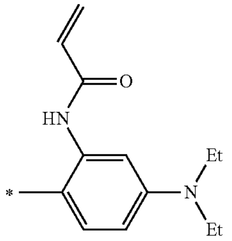
B-61
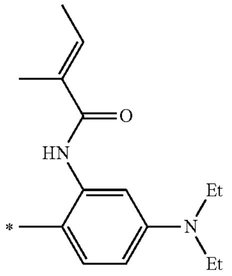
B-62
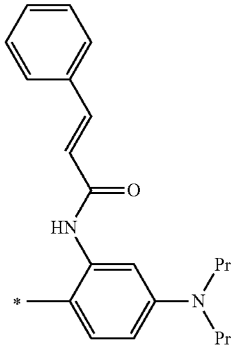
B-63
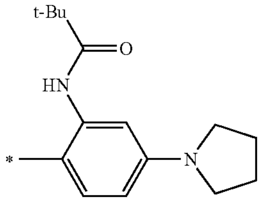
B-64
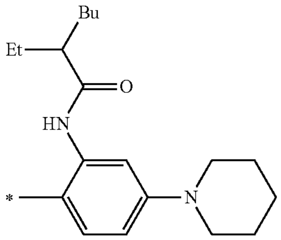

-continued
B-65
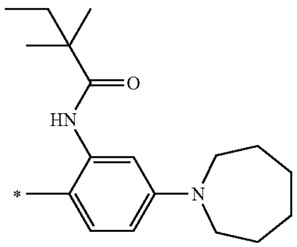
B-66
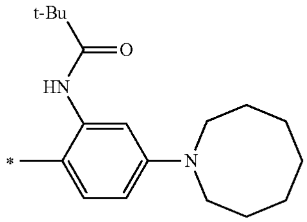
B-67
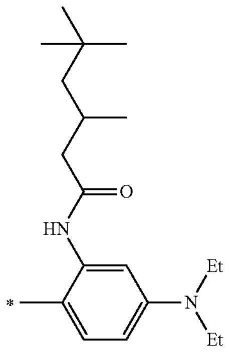
B-68
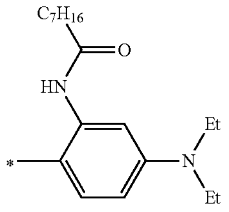
-continued
B-69
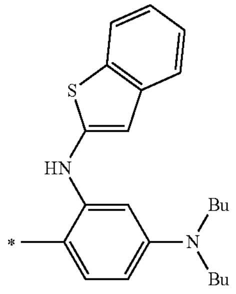
B-70
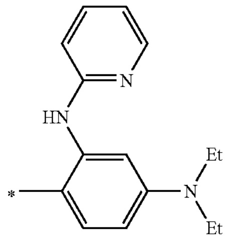
B-71
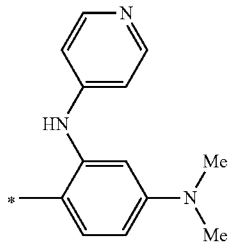
General Formula (3)
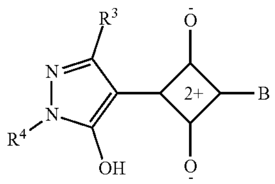
| Chemical compound No. | $R^3$ | $R^4$ | B | Chemcal compound No. | $R^3$ | $R^4$ | B |
|---|---|---|---|---|---|---|---|
| 3-1 | Me | Me | B-3 | 3-21 | H | H | B-23 |
| 3-2 | Me | Me | B-4 | 3-22 | Et | t-Bu | B-21 |
| 3-3 | Me | Me | B-5 | 3-23 | t-Bu | Me | B-18 |
| 3-4 | Me | Me | B-10 | 3-24 | $CF_3$ | i-Pr | B-12 |
| 3-5 | Me | Me | B-14 | 3-25 | COOEt | Et | B-6 |
| 3-6 | Me | Me | B-16 | 3-26 | CN | Ph | B-11 |
| 3-7 | Me | Me | B-17 | 3-27 | $NMe_2$ | Me | B-2 |
| 3-8 | Me | Me | B-18 | 3-28 | i-Pr | Me | B-17 |
| 3-9 | Me | Me | B-19 | 3-29 | OEt | Bu | B-27 |
| 3-10 | Me | Me | B-20 | 3-30 | $NH_2$ | i-Pr | B-9 |
| 3-11 | Me | Me | B-21 | 3-31 | t-Bu | Me | B-17 |
| 3-12 | Me | Me | B-22 | 3-32 | t-Bu | Bu | B-21 |
| 3-13 | Me | Me | B-23 | 3-33 | $CF_3$ | Me | B-18 |
| 3-14 | Me | Me | B-26 | 3-34 | OEt | Et | B-33 |
| 3-15 | Me | Me | B-32 | 3-35 | $NMe_2$ | i-Pr | B-2 |
| 3-16 | Me | Me | B-33 | 3-36 | Et | Me | B-17 |
| 3-17 | Me | Me | B-38 | 3-37 | Bu | Me | B-18 |
| 3-18 | Me | Me | B-49 | 3-38 | $NH_2$ | Ph | B-19 |

-continued
| Chemical compound No. | $R^3$ | $R^4$ | B | Chemcal compound No. | $R^3$ | $R^4$ | B |
|---|---|---|---|---|---|---|---|
| 3-19 | Et | 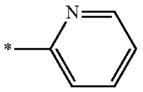 [SMILES: *c1ccccn1] | B-28 | 3-39 | OEt | 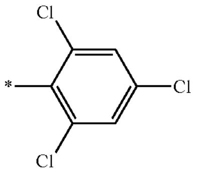 [SMILES: *c1c(Cl)cc(Cl)cc1Cl] | B-25 |
| 3-20 | Me | 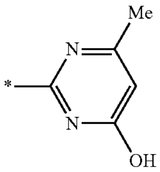 [SMILES: *c1nc(C)cc(O)n1] | B-29 | 3-40 | Me | 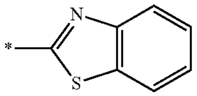 [SMILES: *c1nc2ccccc2s1] | B-2 |
| 3-41 | Me | Ph | B-17 | 3-55 | t-Bu | Me | B-17 |
| 3-42 | Me | Ph | B-21 | 3-56 | t-Bu | Me | B-10 |
| 3-43 | Me | Ph | B-36 | 3-57 | t-Bu | Me | B-44 |
| 3-44 | Me | t-Bu | B-17 | 3-58 | t-Bu | t-Bu | B-17 |
| 3-45 | Me | t-Bu | B-18 | 3-59 | t-Bu | t-Bu | B-10 |
| 3-46 | Me | t-Bu | B-10 | 3-60 | t-Bu | t-Bu | B-6 |
| 3-47 | OEt | Me | B-17 | 3-61 | $NBu_2$ | Me | B-17 |
| 3-48 | OEt | Me | B-10 | 3-62 | $NBu_2$ | Me | B-10 |
| 3-49 | Me | 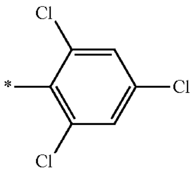 [SMILES: *c1c(Cl)cc(Cl)cc1Cl] | B-17 | 3-63 | t-Bu | 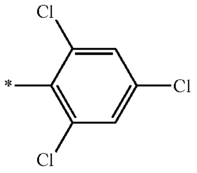 [SMILES: *c1c(Cl)cc(Cl)cc1Cl] | B-17 |
| 3-50 | Me | 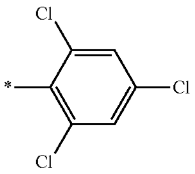 [SMILES: *c1c(Cl)cc(Cl)cc1Cl] | B-19 | 3-64 | t-Bu | 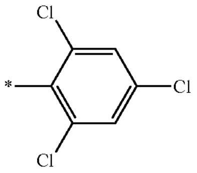 [SMILES: *c1c(Cl)cc(Cl)cc1Cl] | B-19 |
| 3-51 | Me | 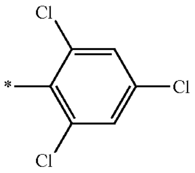 [SMILES: *c1c(Cl)cc(Cl)cc1Cl] | B-21 | 3-65 | t-Bu | 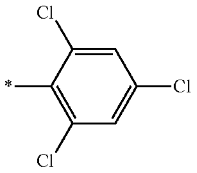 [SMILES: *c1c(Cl)cc(Cl)cc1Cl] | B-21 |
| 3-52 | Me | 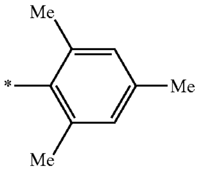 [SMILES: *c1c(C)cc(C)cc1C] | B-17 | 3-66 | t-Bu | 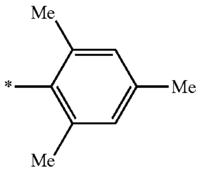 [SMILES: *c1c(C)cc(C)cc1C] | 8-17 |
| 3-53 | Me | 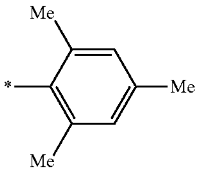 [SMILES: *c1c(C)cc(C)cc1C] | B-20 | 3-67 | t-Bu | 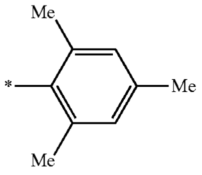 [SMILES: *c1c(C)cc(C)cc1C] | B-20 |

-continued
| Chemical compound No. | $R^3$ | $R^4$ | B | Chemcal compound No. | $R^3$ | $R^4$ | B |
|---|---|---|---|---|---|---|---|
| 3-54 | Me | 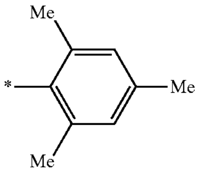 [SMILES: *c1c(C)cc(C)cc1C] | B-21 | 3-68 | t-Bu | 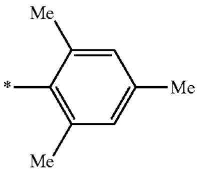 [SMILES: *c1c(C)cc(C)cc1C] | B-21 |
| 3-69 | Me | t-Bu | B-51 | 3-83 | Et | Bu | B-56 |
| 3-70 | Me | t-Bu | B-52 | 3-84 | Me | iPr | B-66 |
| 3-71 | Me | t-Bu | B-54 | 3-85 | Me | 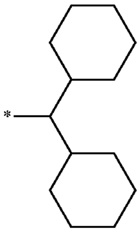 [SMILES: *C(C1CCCCC1)C1CCCCC1] | B-54 |
| 3-72 | Me | t-Bu | B-55 | 3-86 | Me | 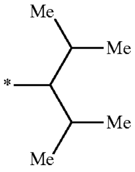 [SMILES: *C(C(C)C)C(C)C] | B-57 |
| 3-73 | Me | t-Bu | B-58 | 3-87 | Et | 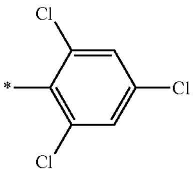 [SMILES: *c1c(Cl)cc(Cl)cc1Cl] | B-60 |
| 3-74 | Me | t-Bu | B-60 | 3-87 | Me | iPr | B-65 |
| 3-75 | Me | t-Bu | B-65 | 3-89 | Me | t-Bu | B-69 |
| 3-76 | Me | t-Bu | B-67 | 3-90 | Me | 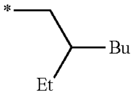 | |
| 3-77 | Me | t-Bu | B-68 | 3-91 | Me | 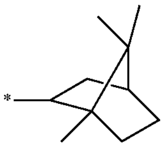 [SMILES: *C1CC2CCC1(C)C2(C)C] | B-61 |
| 3-78 | H | t-Bu | B-51 | 3-92 | Me | 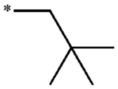 [SMILES: *CC(C)(C)C] | B-51 |
| 3-79 | Et | t-Bu | B-53 | 3-93 | Me | 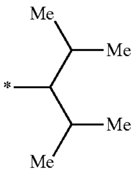 [SMILES: *C(C(C)C)C(C)C] | B-51 |

-continued
| Chemical compound No. | $R^3$ | $R^4$ | B | Chemcal compound No. | $R^3$ | $R^4$ | B |
|---|---|---|---|---|---|---|---|
| 3-80 | Pr | 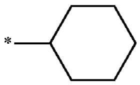 [SMILES: *C1CCCCC1] | B-54 | 3-94 | Me | 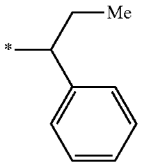 [SMILES: *C(CC)c1ccccc1] | B-67 |
| 3-81 | iPr | iPr | B-66 | 3-95 | Me | 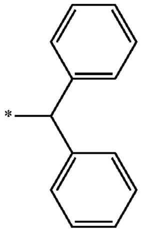 [SMILES: *C(c1ccccc1)c1ccccc1] | B-51 |
| 3-82 | Me | 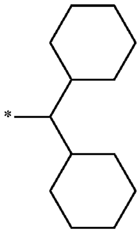 [SMILES: *C(C1CCCCC1)C1CCCCC1] | B-51 | 3-96 | Me | 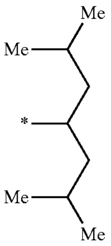 | B-51 |
General Formula (4)
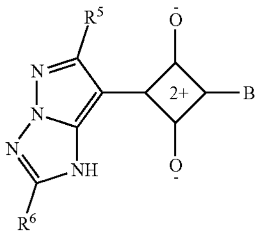
| Chemical compound No. | $R^5$ | $R^6$ | B | Chemical compound No. | $R^5$ | $R^6$ | B |
|---|---|---|---|---|---|---|---|
| 4-1 | t-Bu | 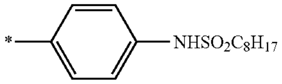 | B-2 | 4-16 | Me | Me | B-17 |
| 4-2 | t-Bu | 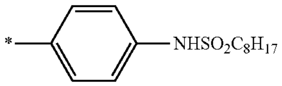 | B-6 | 4-17 | Me | Et | B-18 |
| 4-3 | t-Bu | 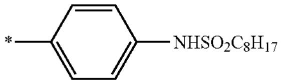 | B-10 | 4-18 | Ph | Ph | B-8 |
| 4-4 | Me | 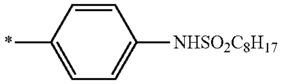 | B-4 | 4-19 | Et | t-Bu | B-17 |

-continued
| Chemical compound No. | $R^5$ | $R^6$ | B | Chemical compound No. | $R^5$ | $R^6$ | B |
|---|---|---|---|---|---|---|---|
| 4-5 | t-Bu | 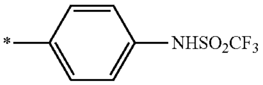 | B-6 | 4-20 | OEt | t-Bu | B-3 |
| 4-6 | t-Bu | 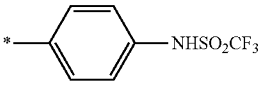 | B-14 | 4-21 | OEt | Bu | B-28 |
| 4-7 | $NHCOCH_3$ | 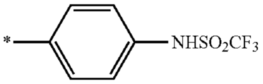 | B-1 | 4-22 | OEt | 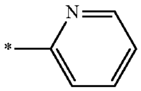 [SMILES: *c1ccccn1] | B-2 |
| 4-8 | t-Bu | 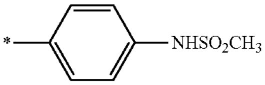 | B-6 | 4-23 | CF3 | t-Bu | B-19 |
| 4-9 | t-Bu | 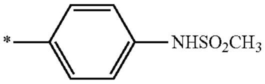 | B-18 | 4-24 | $NHCOCH_3$ | t-Bu | B-2 |
| 4-10 | OEt | 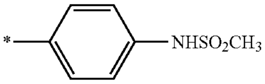 | B-11 | 4-25 | $NHOOCH_3$ | Me | B-1 |
| 4-11 | t-Bu | 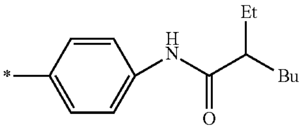 | B-6 | 4-26 | $NMe_2$ | t-Bu | B-6 |
| 4-12 | t-Bu | 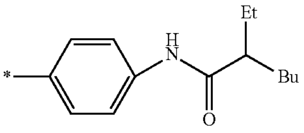 | B-12 | 4-27 | $NMe_2$ | Et | B-17 |
| 4-13 | OEt | 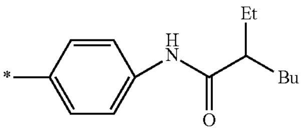 | B-31 | 4-28 | H | Me | B-2 |
| 4-14 | H | H | B-22 | 4-29 | t-Bu | tBu | B-18 |
| 4-15 | Me | Me | B-23 | 4-30 | t-Bu | Me | B-17 |
| 4-31 | t-Bu | 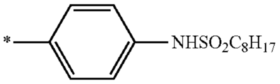 | B-51 | 4-36 | Me | Me | B-65 |
| 4-32 | t-Bu | 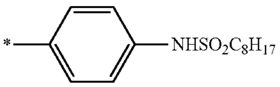 | B-52 | 4-37 | Me | Et | B-67 |
| 4-33 | t-Bu | 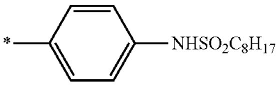 | B-64 | 4-38 | Ph | Ph | B-48 |
| 4-34 | Me | 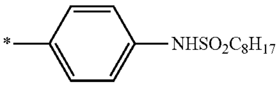 | B-55 | 4-39 | Et | t-Bu | B-54 |

-continued
| Chemical compound No. | $R^5$ | $R^6$ | B | Chemical compound No. | $R^5$ | $R^6$ | B |
|---|---|---|---|---|---|---|---|
| 4-35 | t-Bu | 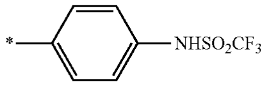 | B-60 | 4-40 | Me | Me | B-51 |
General Formula (5)
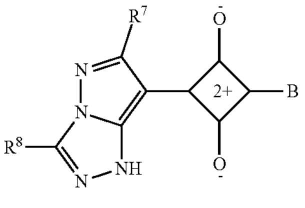
| Chemical compound No. | $R^7$ | $R^8$ | B | Chemical compound No. | $R^7$ | $R^8$ | B |
|---|---|---|---|---|---|---|---|
| 5-1 | t-Bu | 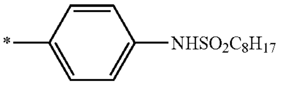 | B-2 | 5-11 | Me | Me | B-17 |
| 5-2 | Me | 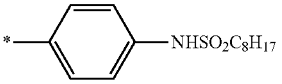 | B-6 | 5-12 | Me | t-Bu | B-18 |
| 5-3 | t-Bu | 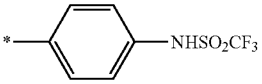 | B-4 | 5-13 | Ph | Ph | B-8 |
| 5-4 | Me | 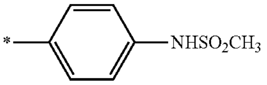 | B-10 | 5-14 | Ph | 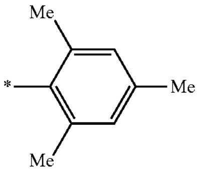 [SMILES: *c1c(C)cc(C)cc1C] | B 17 |
| 5-5 | t-Bu | 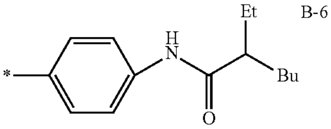 | B-6 | 5-15 | Et | Ph | B-17 |
| 5-6 | t-Bu | 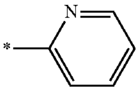 [SMILES: *c1ccccn1] | B-14 | 5-16 | OEt | t-Bu | B-3 |
| 5-7 | Me | 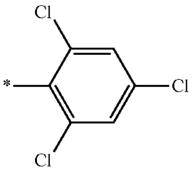 [SMILES: *c1c(Cl)cc(Cl)cc1Cl] | B-1 | 5-37 | OEt | Bu | B-26 |
| 5-8 | Me | 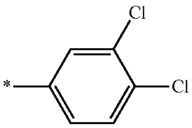 [SMILES: *c1ccc(Cl)c(Cl)c1] | B-6 | 5-18 | $CF_3$ | t-Bu | B-19 |

-continued

| Chemical compound No. | $R^7$ | $R^8$ | B | Chemical compound No. | $R^7$ | $R^8$ | B |
|---|---|---|---|---|---|---|---|
| 5-9 | Me | 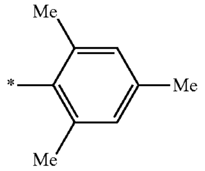 [SMILES: *c1c(C)cc(C)cc1C] | B-16 | 5-19 | NHCOCH3 | t-Bu | B-2 |
| 5-10 | t-Bu | 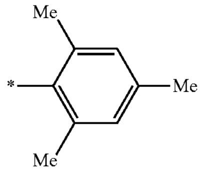 [SMILES: *c1c(C)cc(C)cc1C] | B-11 | 5-20 | NHCOCH3 | 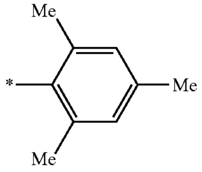 [SMILES: *c1c(C)cc(C)cc1C] | B-1 |
| 5-21 | t-Bu | 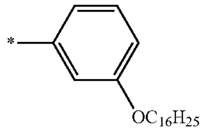 | B-2 | 5-26 | Me | Me | B-65 |
| 5-22 | Me | 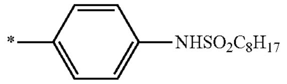 | B-51 | 5-27 | Me | t-Bu | B-67 |
| 5-23 | t-Bu | 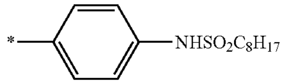 | B-52 | 5-28 | Ph | Ph | B-50 |
| 5-24 | Me | 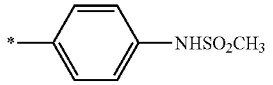 | B-55 | 5-29 | Ph | 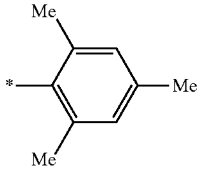 [SMILES: *c1c(C)cc(C)cc1C] | B-23 |
| 5-25 | t-Bu | 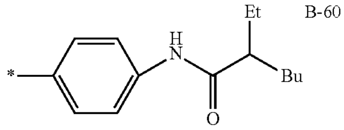 | B-60 | 5-30 | Et | Ph | B-59 |

One preferred embodiment of the coloring agent represented by General Formula (1) includes a coloring agent represented by General Formula (6).

General Formula (6)

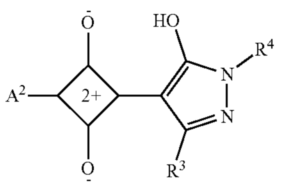

In General Formula (6), $R^3$ and $R^4$ each independently represent a hydrogen atom or a substituent and they respectively have the same meanings as $R^3$ and $R^4$ in General Formula (3), where the preferred ones thereof are also the same.

In General Formula (6), $A^2$ has the same meaning as A in General Formula (1). Among these, a heterocyclic group which is a nitrogen-containing 5-membered ring is preferable.

The coloring agent represented by General Formula (6) is preferably a coloring agent represented by any one of General Formula (7), (8), or (9).

General Formula (7)

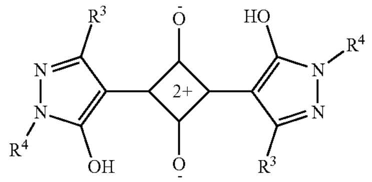

In General Formula (7), $R^3$ and $R^4$ each independently represent a hydrogen atom or a substituent, and they respectively have the same meanings as $R^3$ and $R^4$ in General Formula (3), where the same applies to the preferred ranges thereof. Two $R^3$'s and two $R^4$'s may be the same or different from each other.

General Formula (8)

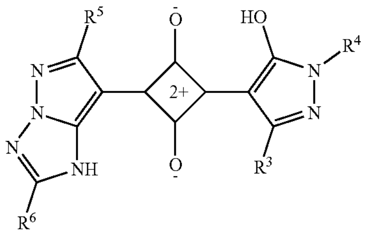

In General Formula (8), $R^3$ and $R^4$ each independently represent a hydrogen atom or a substituent, and they respectively have the same meanings as $R^3$ in General Formula (3), where the same applies to the preferred ranges thereof.

In General Formula (8), $R^3$ and $R^6$ each independently represent a hydrogen atom or a substituent, and they respectively have the same meanings as $R^5$ and $R^6$ in General Formula (4), where the same applies to the preferred ranges thereof.

General Formula (9)

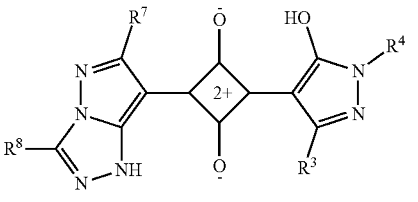

In General Formula (9), $R^3$ and $R^4$ each independently represent a hydrogen atom or a substituent, and they respectively have the same meanings as $R^3$ in General Formula (3), where the same applies to the preferred ranges thereof.

In General Formula (9), $R^7$ and $R^8$ each independently represent a hydrogen atom or a substituent, and they respectively have the same meanings as $R^7$ and $R^8$ in General Formula (5), where the same applies to the preferred ranges thereof.

In the present invention, in a case where a squarine-based coloring agent is used as the dye B, any squarine-based coloring agent may be used without particular limitations as long as the squarine-based coloring agent is the squarine coloring agent represented by any one of General Formulae (6) to (9). Examples thereof include the compounds described in JP2002-97383A and JP2015-68945A.

Hereinafter, specific examples of the coloring agent represented by any one of General Formulae (6) to (9) will be shown. However, the present invention is not limited thereto.

In the following specific examples, Me represents methyl, Et represents ethyl, i-Pr represents i-propyl, t-Bu represents t-butyl, and Ph represents phenyl, respectively. In the following structures, * indicates a bonding site to a 4-membered carbon ring in each General Formula.

General Formula (7)

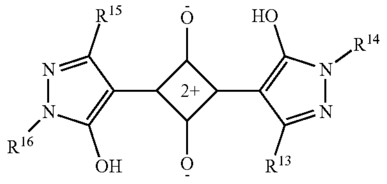

| Chemical compound No. | $R^{13}$ | $R^{14}$ | $R^{15}$ | $R^{16}$ |
|---|---|---|---|---|
| 7-1 | Me | Me | Me | Me |
| 7-2 | Et | Me | Et | Me |
| 7-3 | Me | 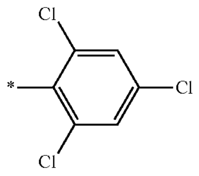 [SMILES: *c1c(Cl)cc(Cl)cc1Cl] | Me | 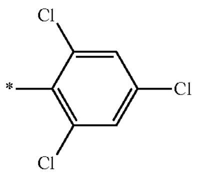 [SMILES: *c1c(Cl)cc(Cl)cc1Cl] |
| 7-4 | t-Bu | 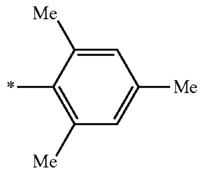 [SMILES: *c1c(C)cc(C)cc1C] | t-Bu | 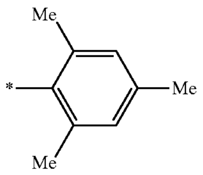 [SMILES: *c1c(C)cc(C)cc1C] |
| 7-5 | $NMe_2$ | Me | $NMe_2$ | Me |
| 7-6] | CN | Me | CN | Me |
| 7-7 | OEt | Me | OEt | Me |

-continued
| Chemical compound No. | $R^{13}$ | $R^{14}$ | $R^{15}$ | $R^{16}$ |
| --- | --- | --- | --- | --- |
| 7-8 | Me | 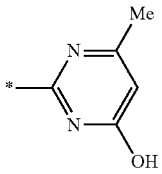 [SMILES: *c1nc(C)cc(O)n1] | Me | 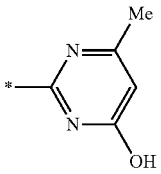 [SMILES: *c1nc(C)cc(O)n1] |
| 7-9 | Et | 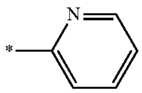 | Et | 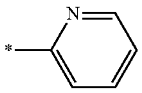 [SMILES: *c1ccccn1] |
| 7-10 | i-Pr | 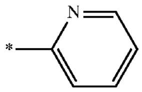 [SMILES: *c1ccccn1] | i-Pr | 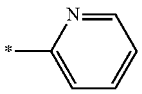 [SMILES: *c1ccccn1] |
| 7-11 | t-Bu | t-Bu | t-Bu | t-Bu |
| 7-12 | $CF_3$ | Ph | $CF_3$ | Ph |
| 7-13 | COOEt | Me | COOEt | Me |
| 7-14 | $NH_2$ | Me | $NH_2$ | Me |
| 7-15 | Me | Me | Me | 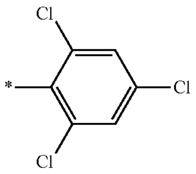 [SMILES: *c1c(Cl)cc(Cl)cc1Cl] |
| 7-16 | Me | Me | t-Bu | t-Bu |
| 7-17 | Me | Me | $NMe_2$ | Me |
| 7-18 | Me | Me | Me | Ph |
| 7-19 | Et | Me | Et | 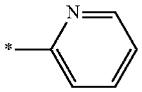 [SMILES: *c1ccccn1] |
| 7-20 | COOEt | Me | Me | 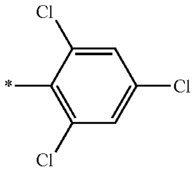 [SMILES: *c1c(Cl)cc(Cl)cc1Cl] |

7-21
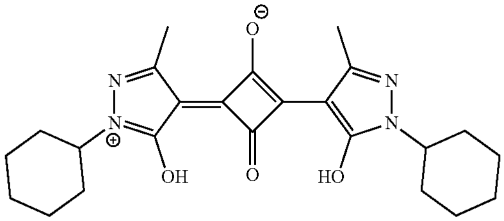
7-22
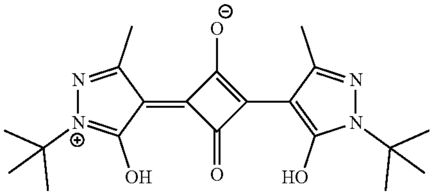
General Formula (8)
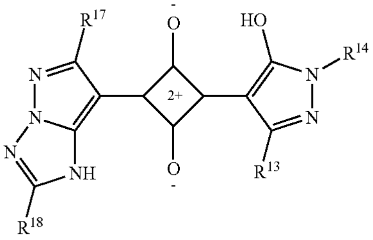
| Chemical compound No. | $R^{13}$ | $R^{14}$ | $R^{17}$ | $R^{18}$ |
|---|---|---|---|---|
| 8-1 | Me | Me | Me | Me |
| 8-2 | Me | Me | t-Bu | 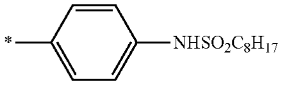 |
| 8-3 | Me | Me | t-Bu | 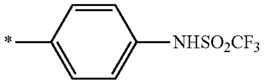 |
| 8-4 | Me | Me | t-Bu | 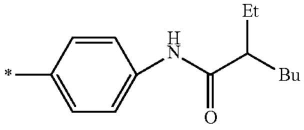 |
| 8-5 | Me | 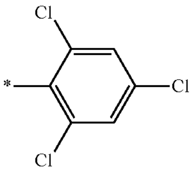 [SMILES: *c1c(Cl)cc(Cl)cc1Cl] | Me | Me |

-continued
| Chemical compound No. | $R^{13}$ | $R^{14}$ | $R^{17}$ | $R^{18}$ |
| --- | --- | --- | --- | --- |
| 8-6 | Me | 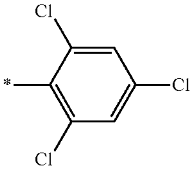 [SMILES: *c1c(Cl)cc(Cl)cc1Cl] | t-Bu | 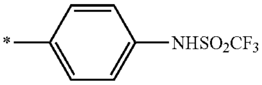 |
| 8-7 | Me | Ph | t-Bu | 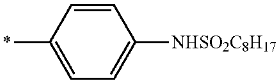 |
| 8-8 | Me | 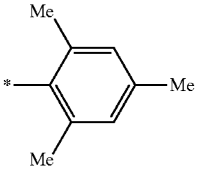 [SMILES: *c1c(C)cc(C)cc1C] | Me | Me |
| 8-9 | Et | Me | Me | Me |
| 8-10 | i-Pr | Me | Me | Me |
| 8-11 | t-Bu | Me | Me | Me |
| 8-12 | Me | Me | OEt | Bu |
| 8-13 | COOEt | Me | Me | Me |
| 8-14 | $NH_2$ | Me | Me | Me |
| 8-15 | Me | Me | $CF_3$ | t-Bu |
General Formula (9)
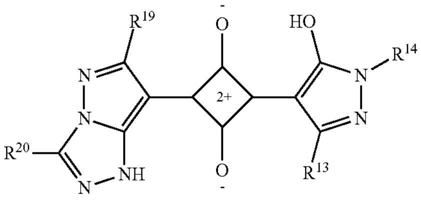
| Chemical compound No. | $R^{13}$ | $R^{14}$ | $R^{19}$ | $R^{20}$ |
| --- | --- | --- | --- | --- |
| 9-1 | Me | Me | Me | Me |
| 9-2 | Me | Me | t-Bu | 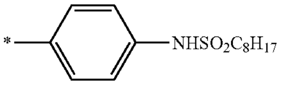 |
| 9-3 | Me | Me | Me | 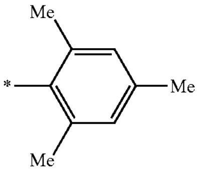 [SMILES: *c1c(C)cc(C)cc1C] |
| 9-4 | Me | Me | Me | 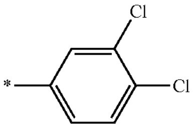 [SMILES: *c1ccc(Cl)c(Cl)c1] |

-continued

| Chemical compound No. | $R^{13}$ | $R^{14}$ | $R^{19}$ | $R^{20}$ |
|---|---|---|---|---|
| 9-5 | Me | 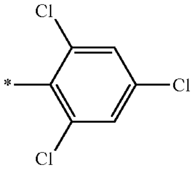 [SMILES: *c1c(Cl)cc(Cl)cc1Cl] | Me | Me |
| 9-6 | Me | 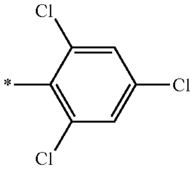 [SMILES: *c1c(Cl)cc(Cl)cc1Cl] | Me | 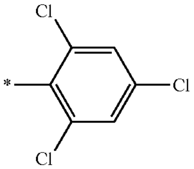 [SMILES: *c1c(Cl)cc(Cl)cc1Cl] |
| 9-7 | t-Bu | Me | t-Bu | 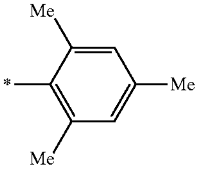 [SMILES: *c1c(C)cc(C)cc1C] |
| 9-8 | t-Bu | Me | Me | Me |
| 9-9 | Et | Me | t-Bu | Me |
| 9-10 | i-Pr | Me | Me | 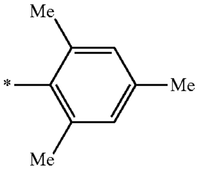 [SMILES: *c1c(C)cc(C)cc1C] |

(Quencher-Embedded Coloring Agent)

The squarine-based coloring agent represented by General Formula (1) may be a quencher-embedded coloring agent in which a quencher moiety is linked to a coloring agent by a covalent bond with a linking group being interposed therebetween. The quencher-embedded coloring agent can also be preferably used as the coloring agent of at least one of the dyes B or C. That is, the quencher-embedded coloring agent is counted as the dye B or dye C according to the wavelength having the main absorption wavelength band.

The quencher moiety may be an electron migration-type antifading agent portion, and in this case, the quencher-embedded coloring agent is an electron migration-type antifading agent-embedded coloring agent.

Examples of the quencher moiety include the ferrocenyl group in the above-described substituent X. Further, examples thereof include the quencher moiety in the quencher compounds described in paragraphs [0199] to [0212] and paragraphs [0234] to [0310] of WO2019/066043A.

Among the squarine-based coloring agents represented by General Formula (1), specific examples of the coloring agent corresponding to the quencher-embedded coloring agent are shown below. However, the present invention is not limited thereto.

In the following specific examples, Me represents methyl, Et represents ethyl, and Bu represents butyl, respectively.

AA-1

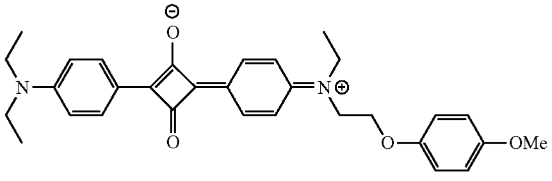

AA-2

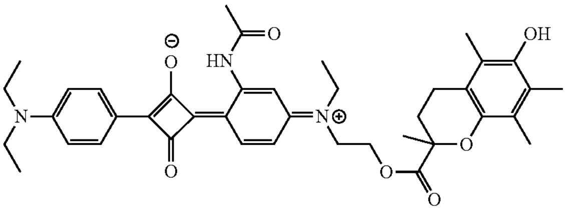

-continued
AA-3
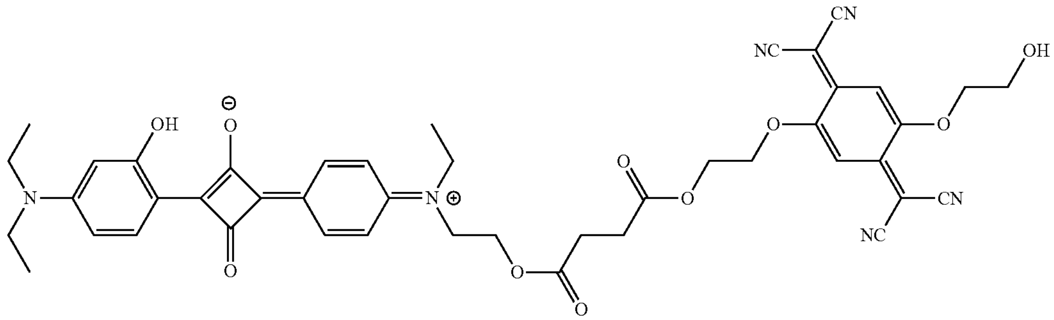
AA-4
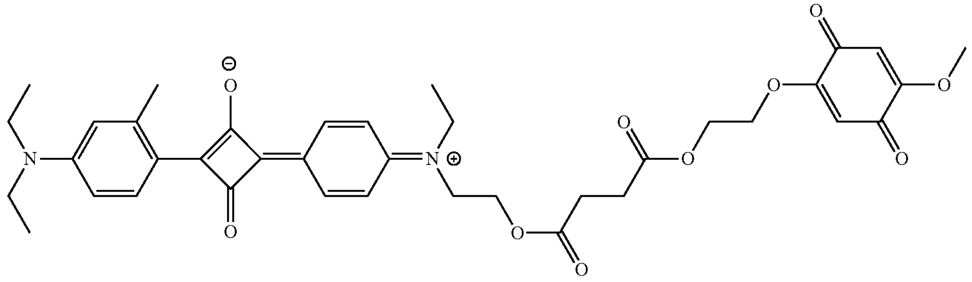
AA-5
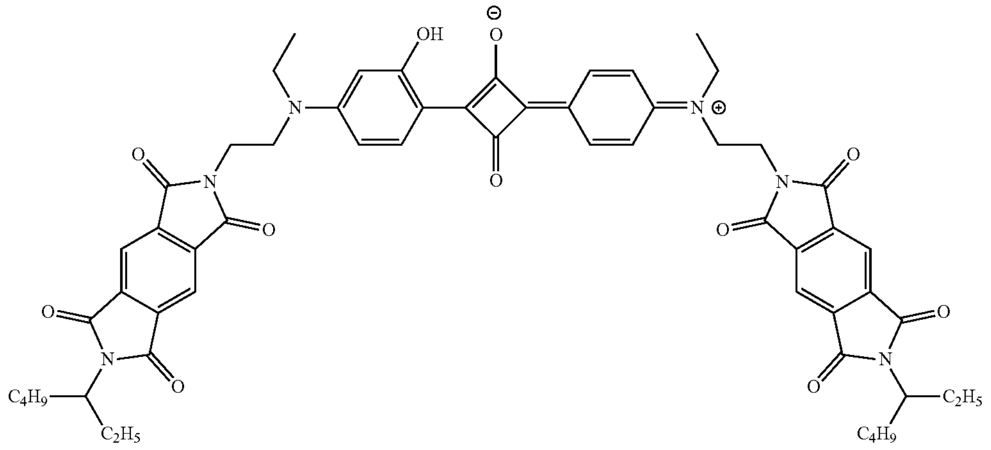
AA-6
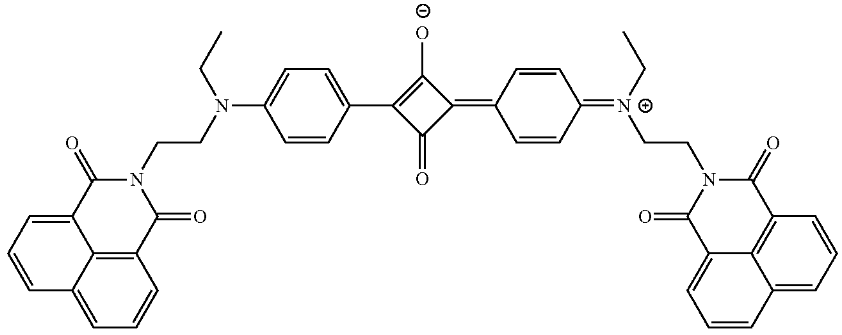
AA-7
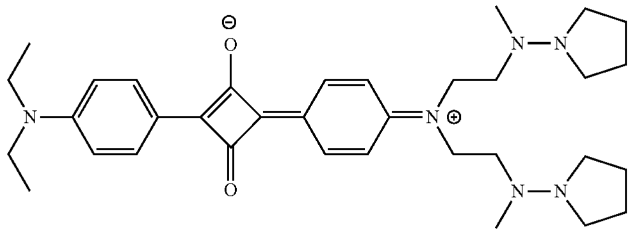

-continued
AA-8
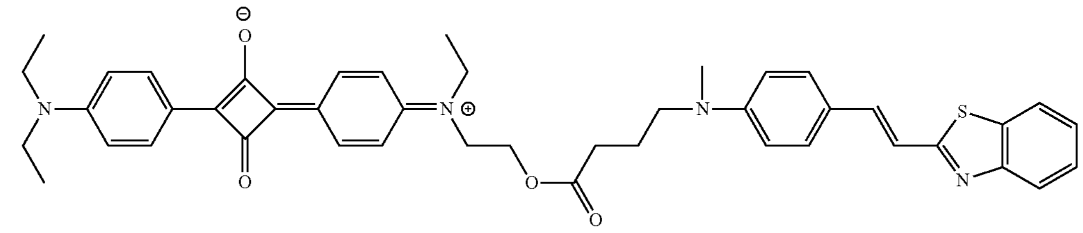
AA-9
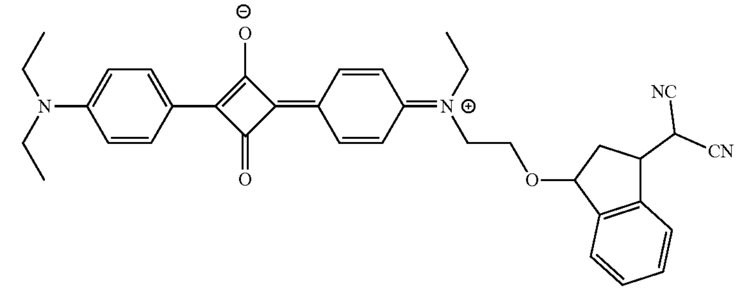
AA-10
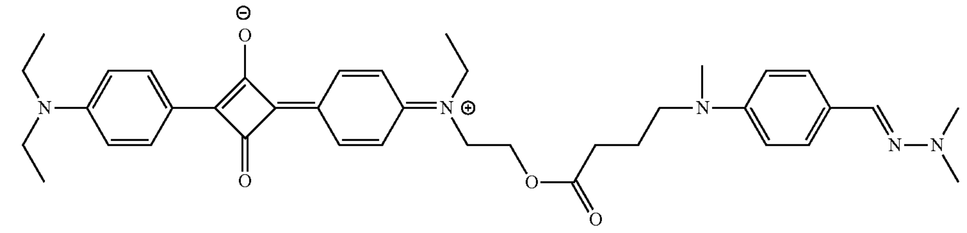
AA-11
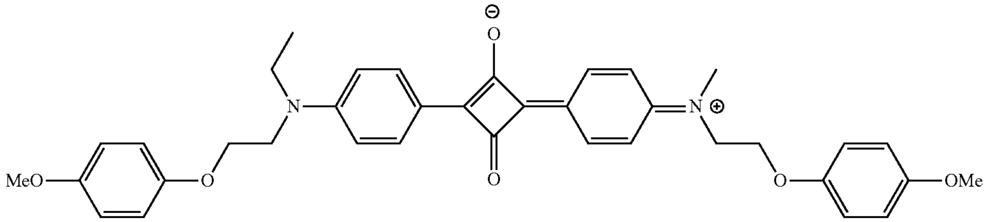
AA-12
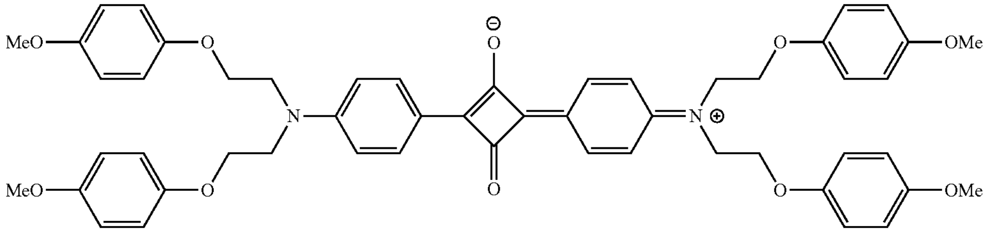
AA-13
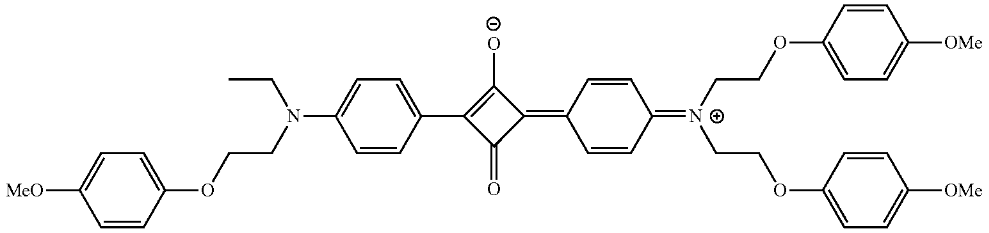

-continued
AA-14
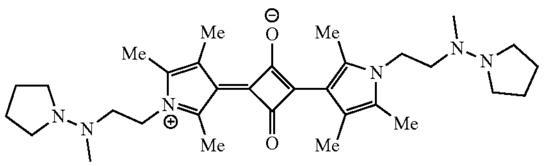
AA-15
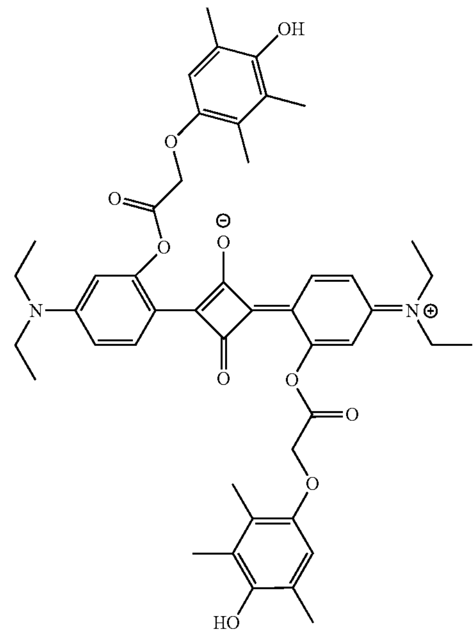
AA-16
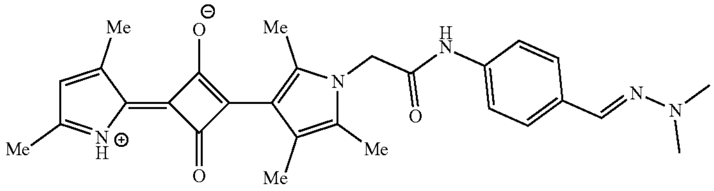
AA-17
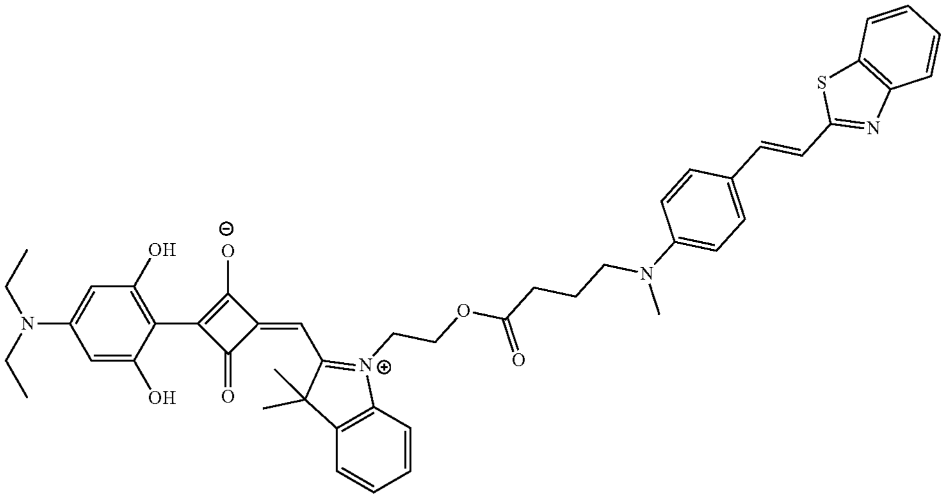
AA-18
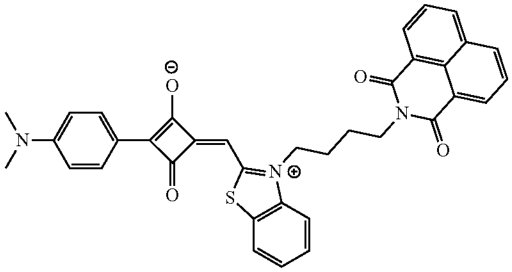
AA-19
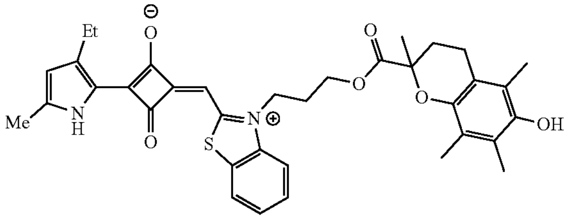

-continued
BB-1
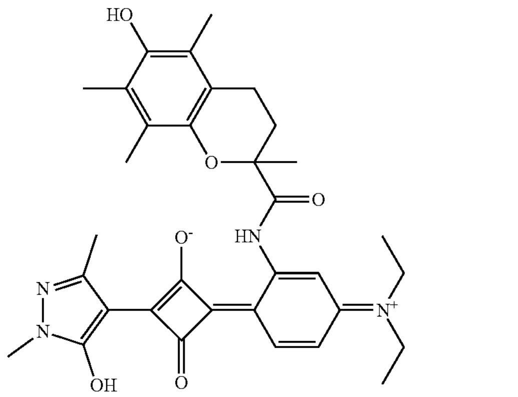
BB-2
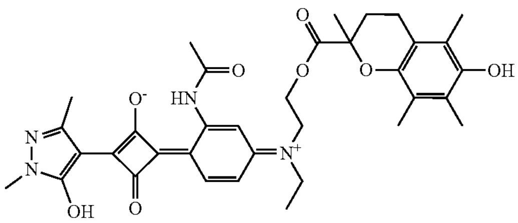
BB-3
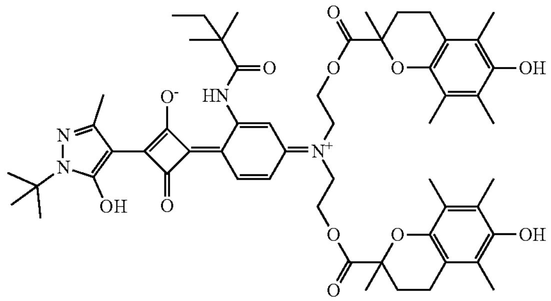
BB-4
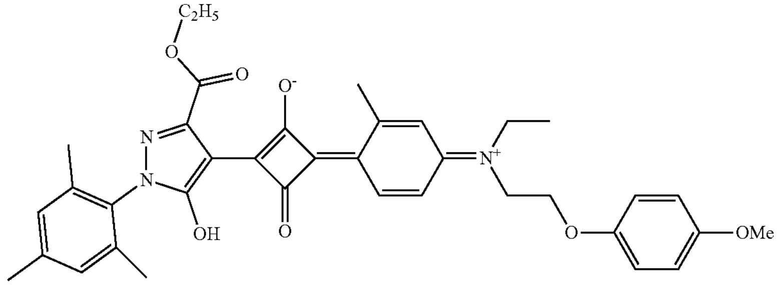
BB-5
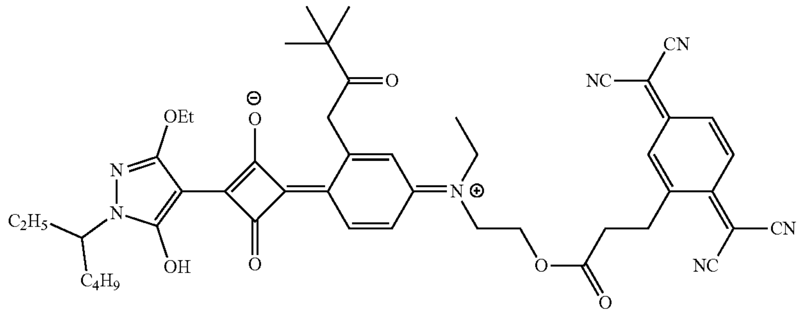
BB-6
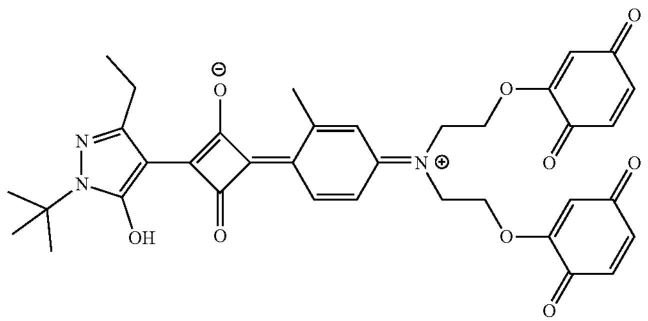

-continued
BB-7
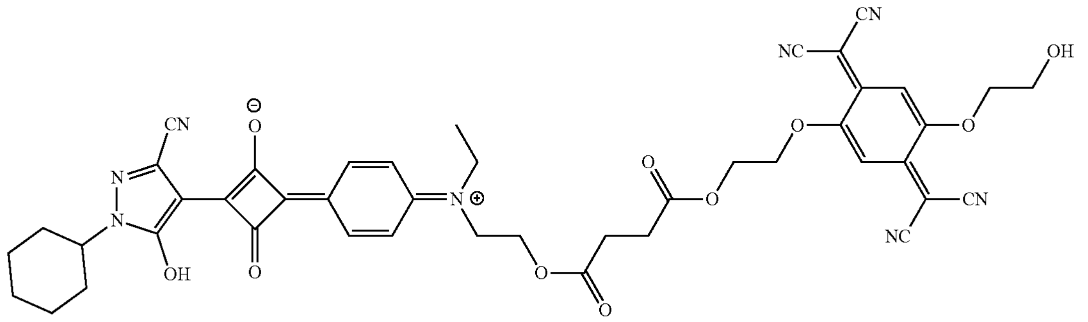
BB-8
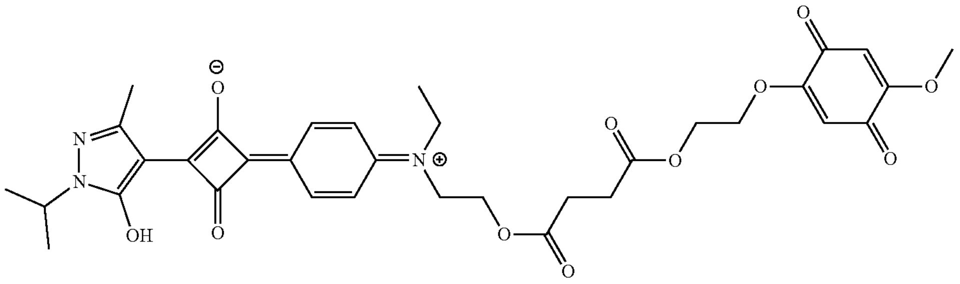
BB-9
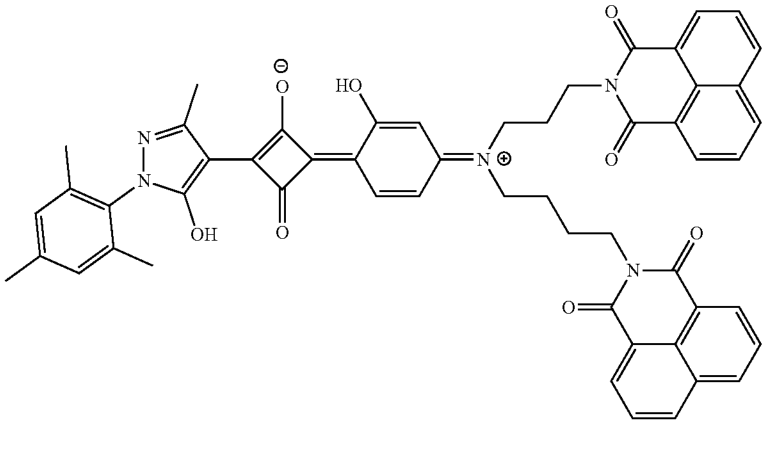
BB-10
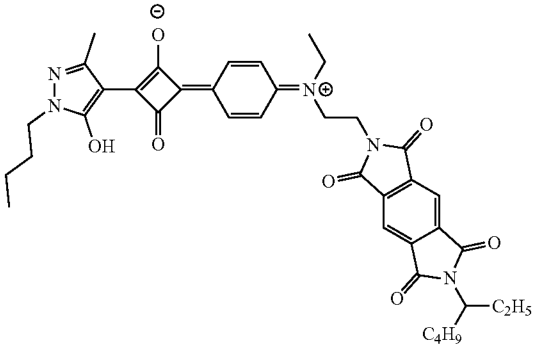
BB-11
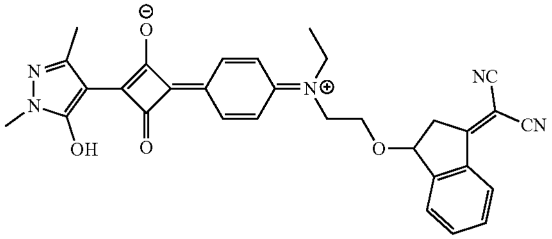

-continued
BB-12
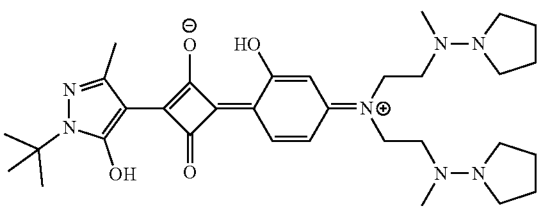
BB-13
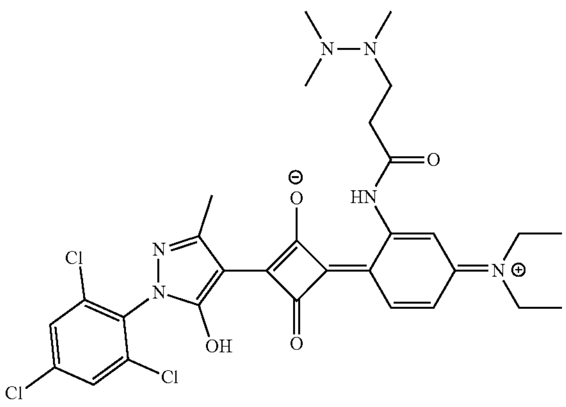
BB-14
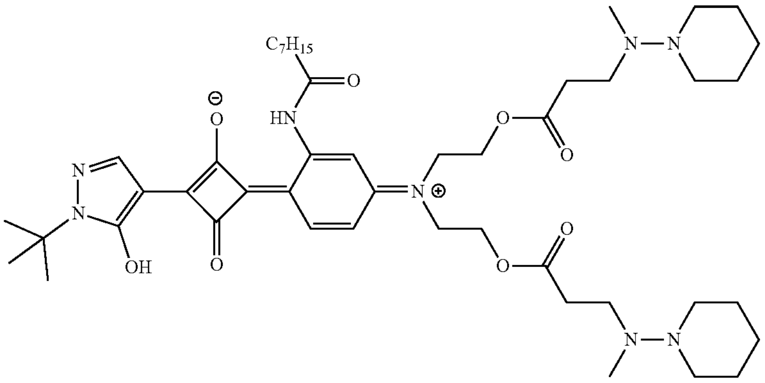
BB-15
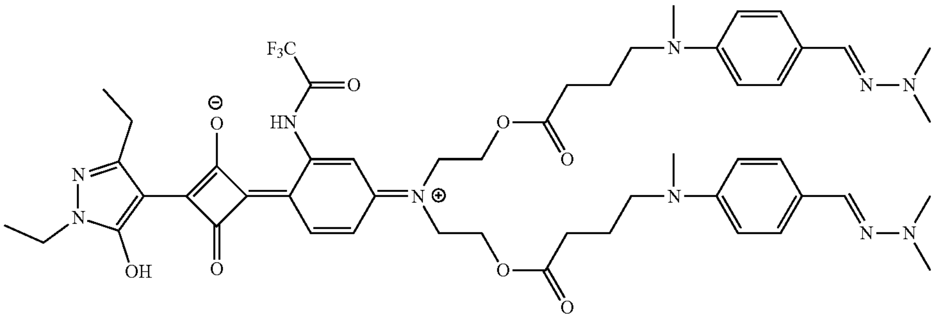
BB-16
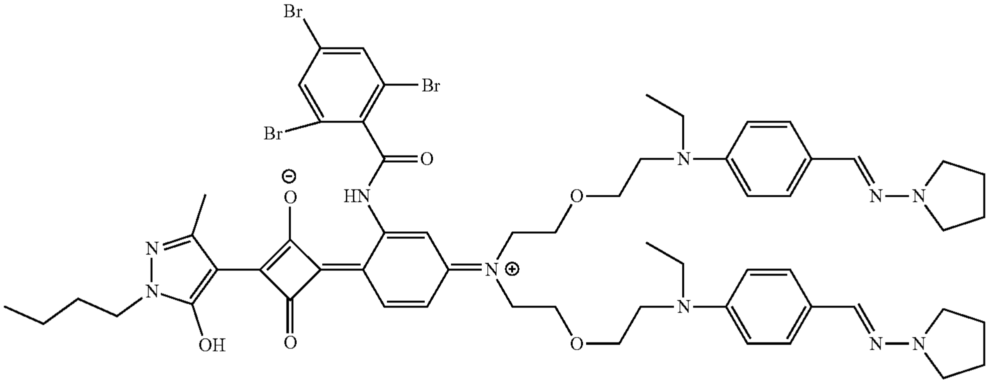

-continued
BB-17
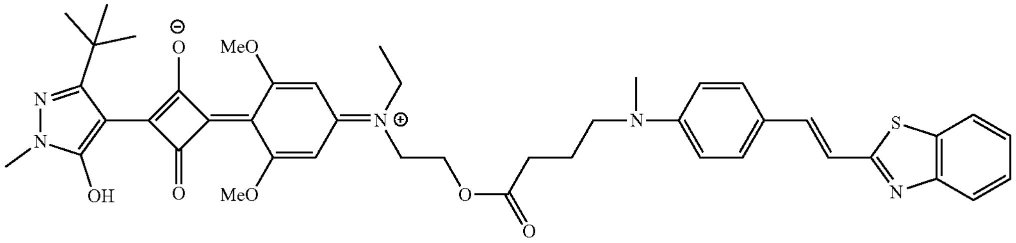
BB-18
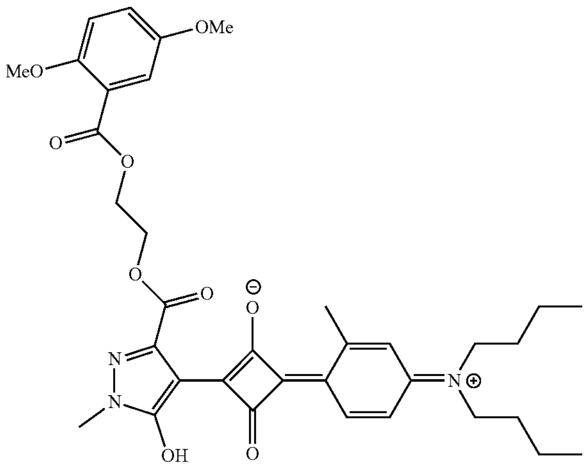
BB-19
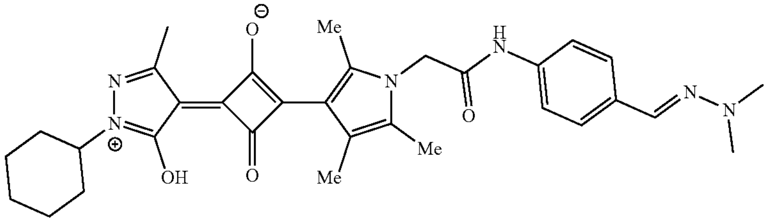
BB-20
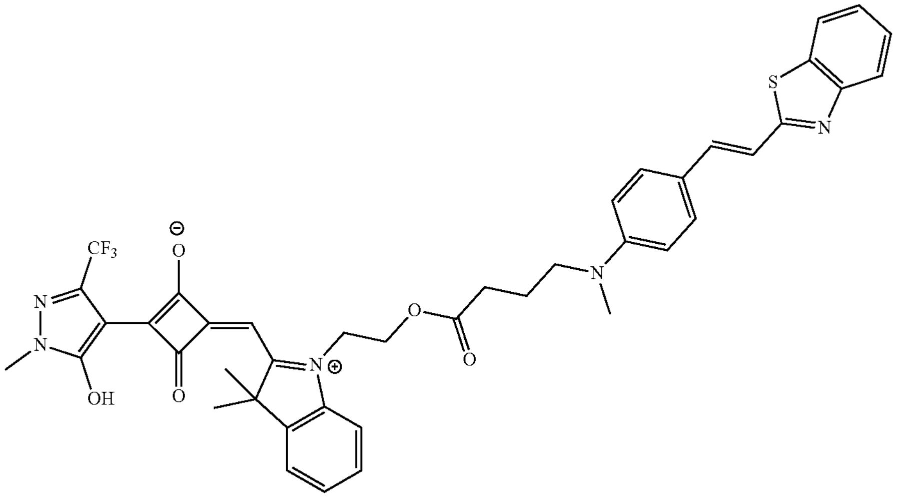

-continued
BB-21
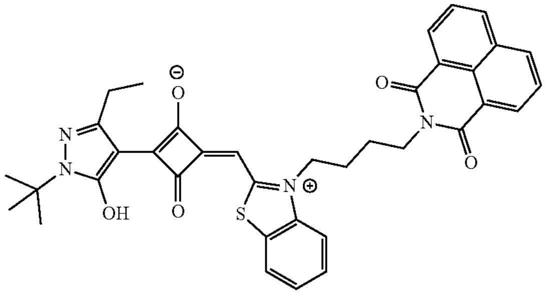
BB-22
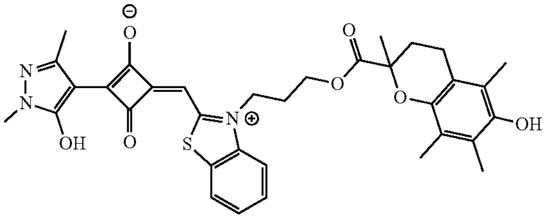
BB-23
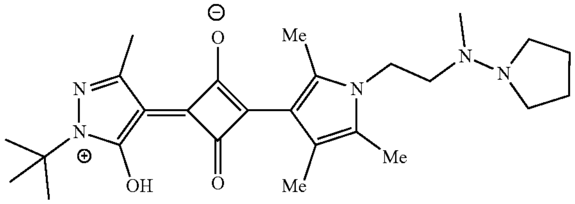
C-1
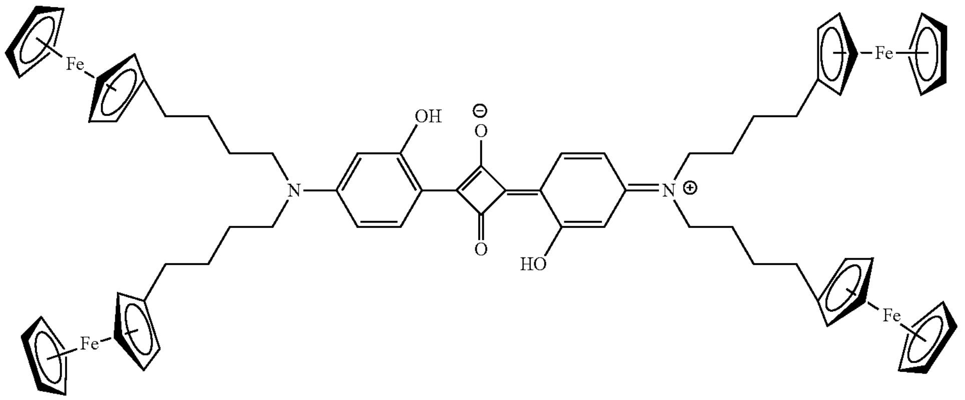
C-2
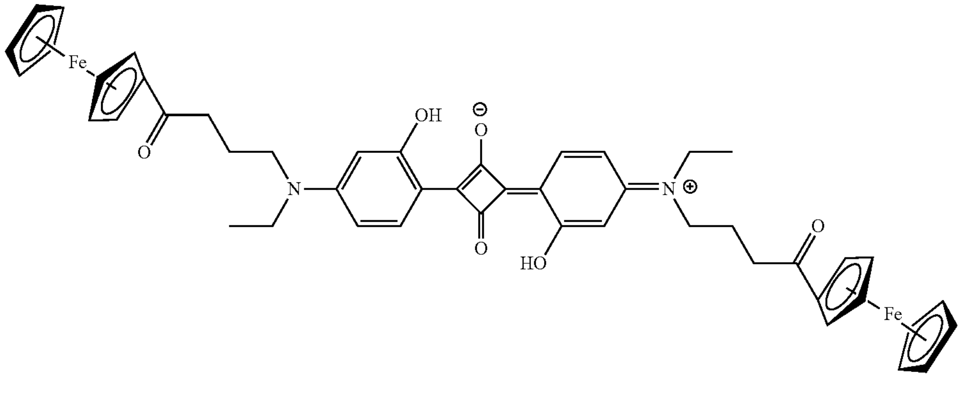

-continued
C-3
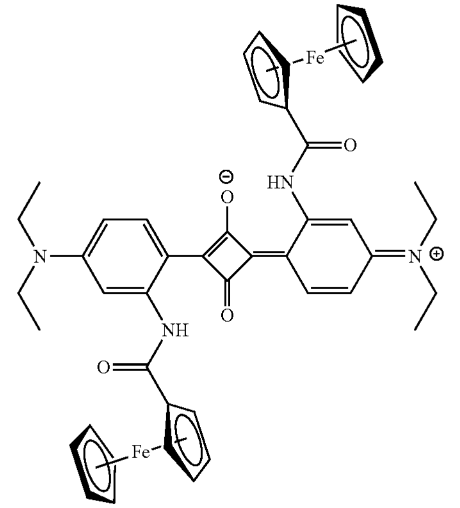
C-4
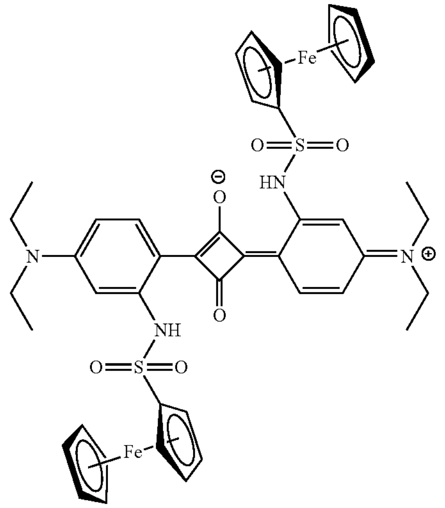
C-5
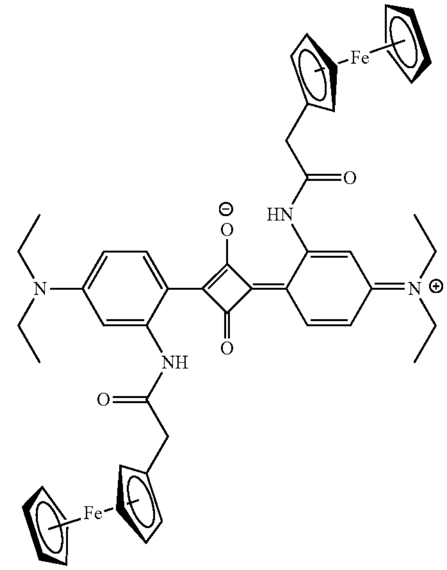
C-6
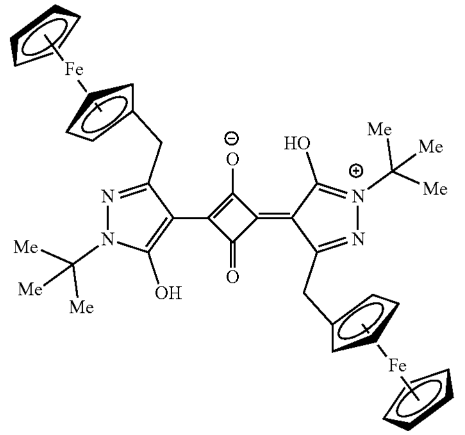
C-7
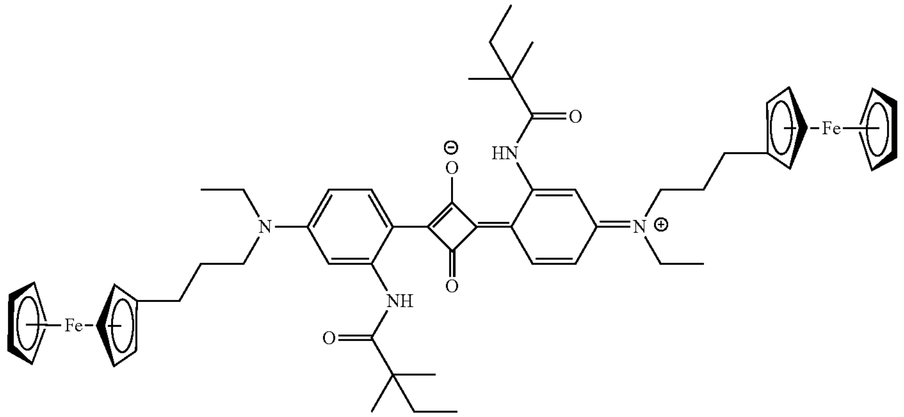

-continued
C-8
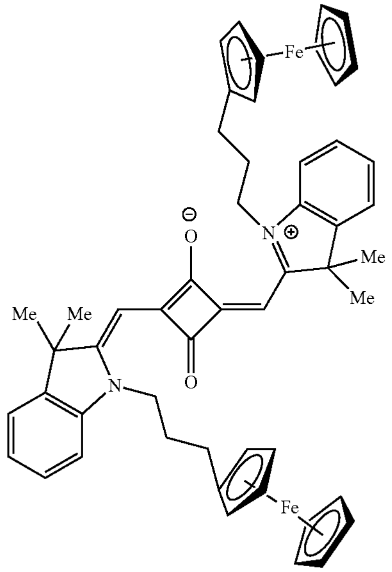
C-9
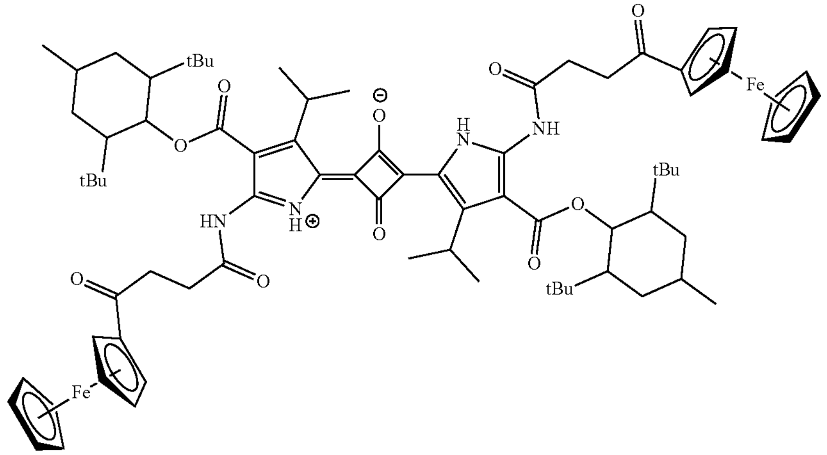
C-10
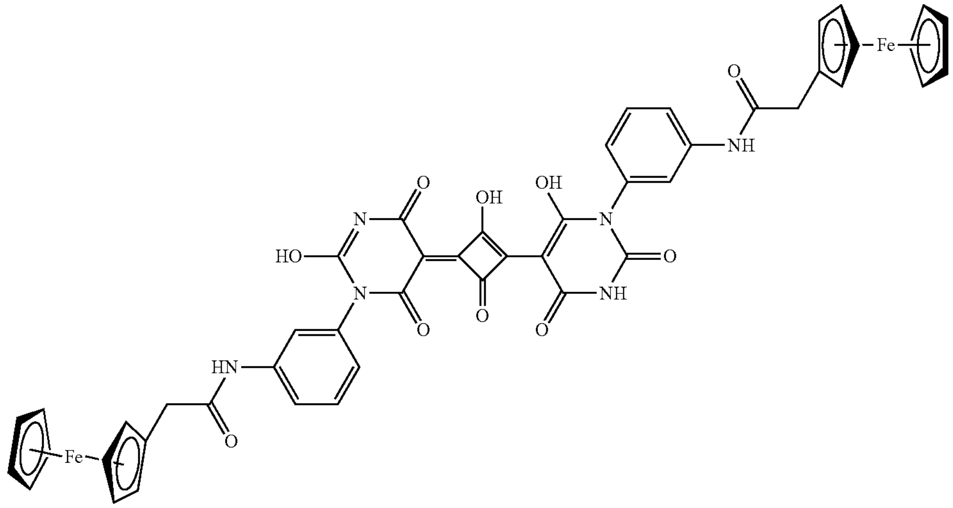

-continued
C-11
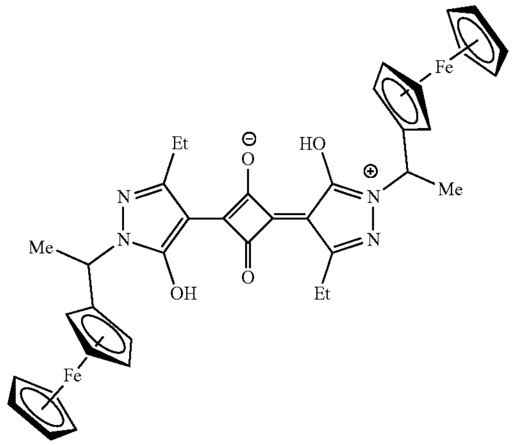
C-12
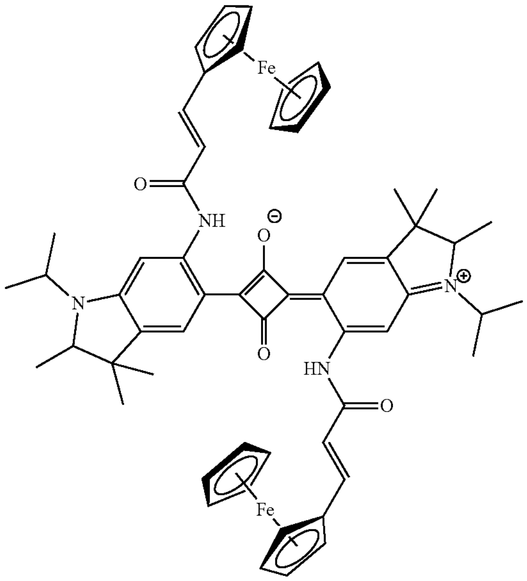
C-13
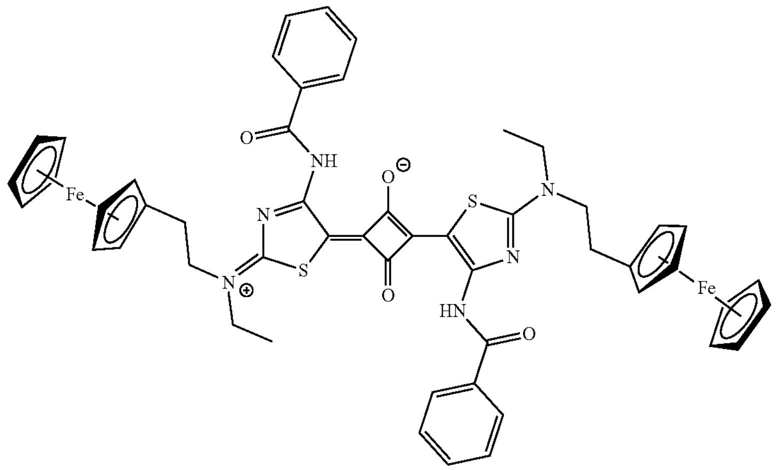
C-14
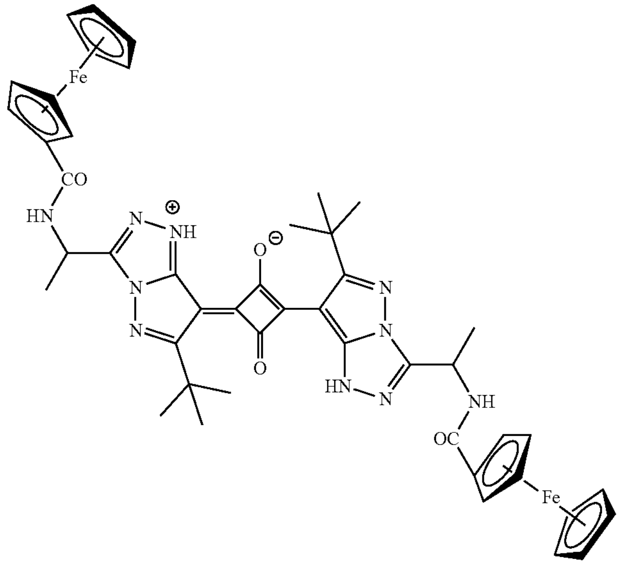

-continued
C-15
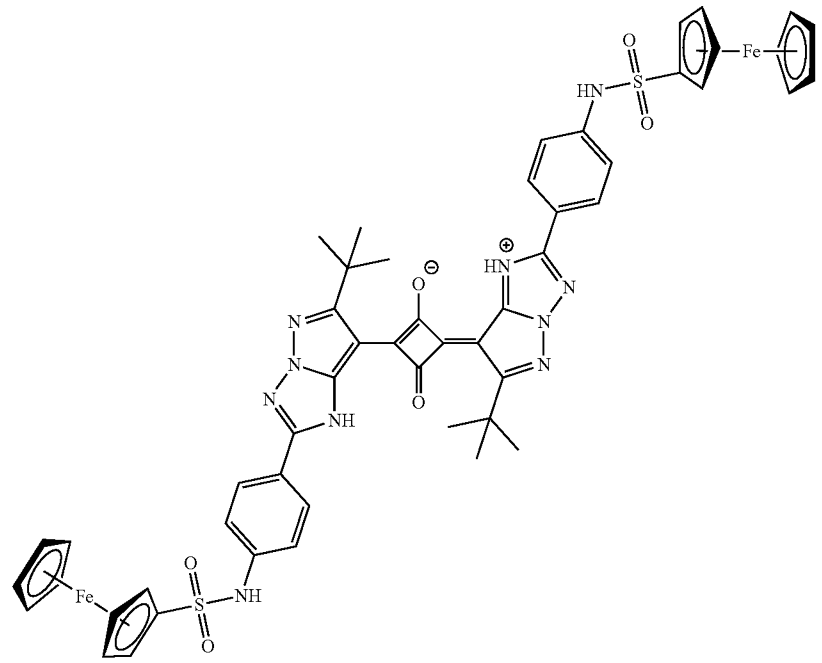
C-16
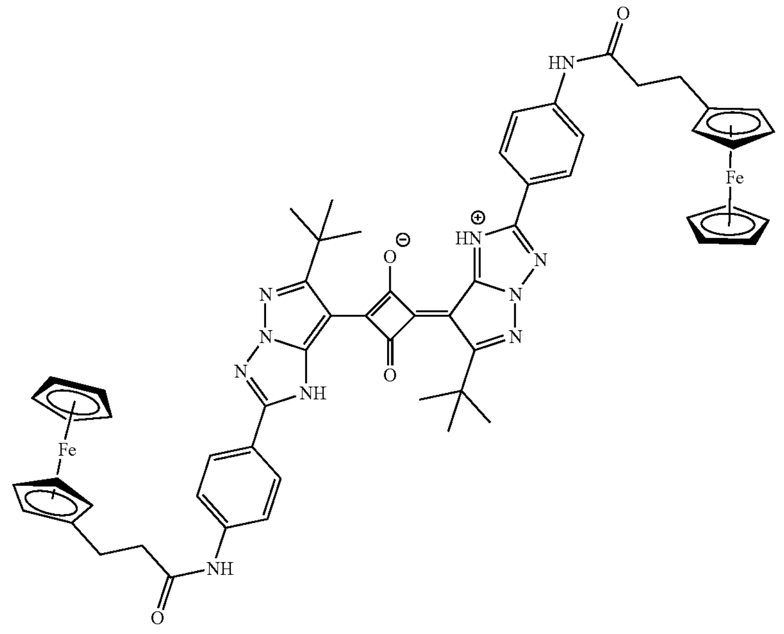

-continued
C-17
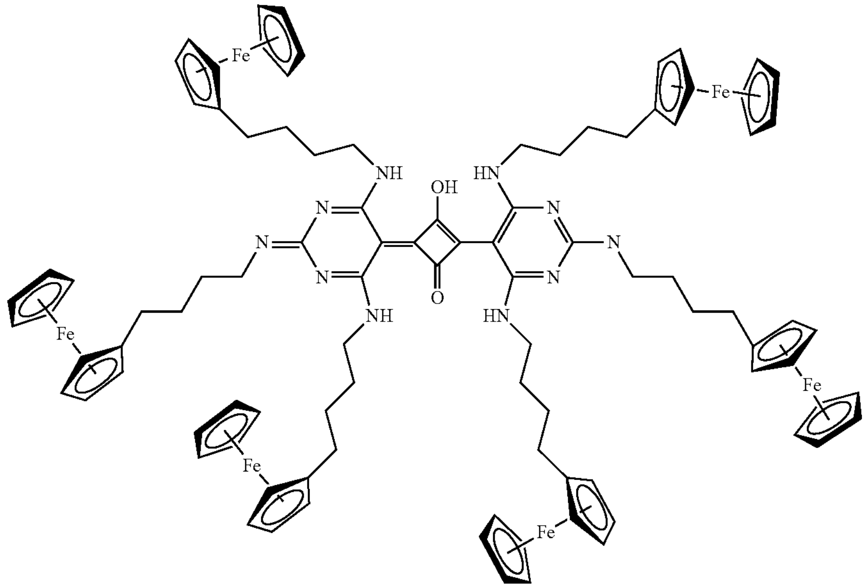
C-18
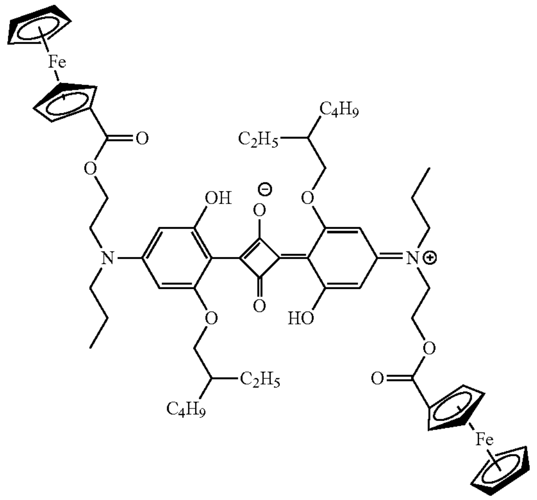
C-19
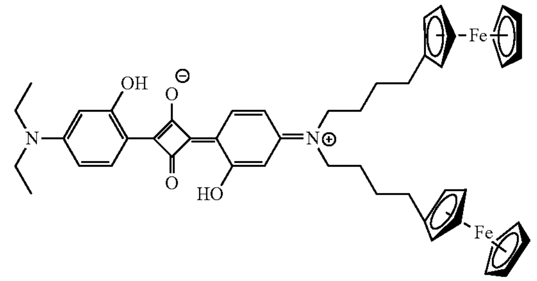
C-20
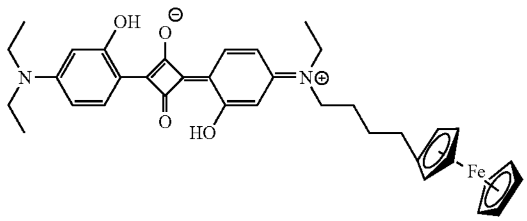
C-21
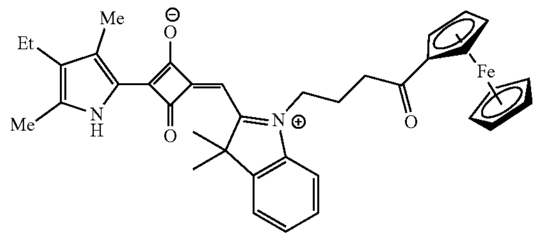
C-22
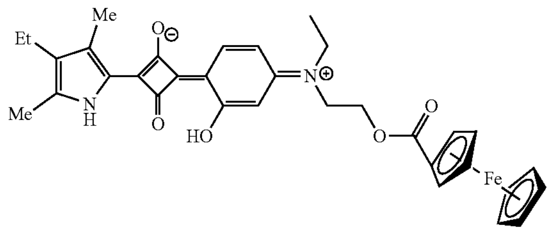
C-23
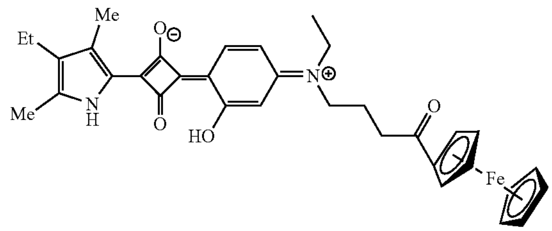

-continued
C-24
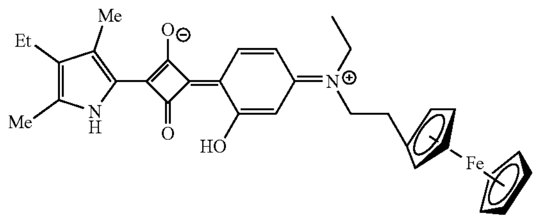
C-25
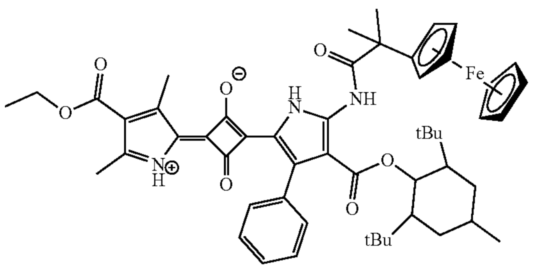
C-26
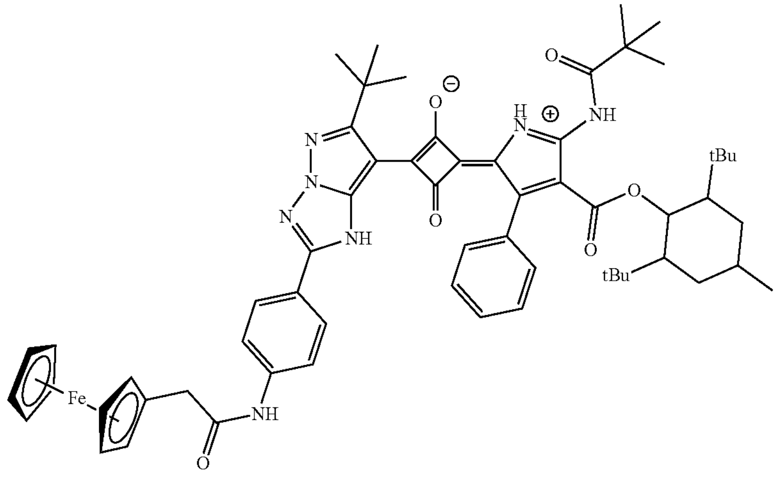
C-27
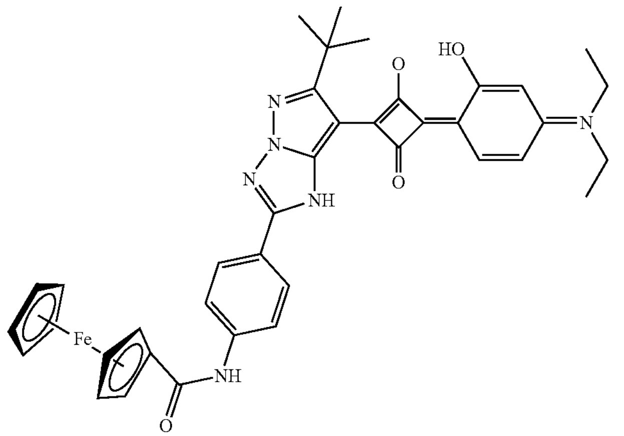

-continued
C-28
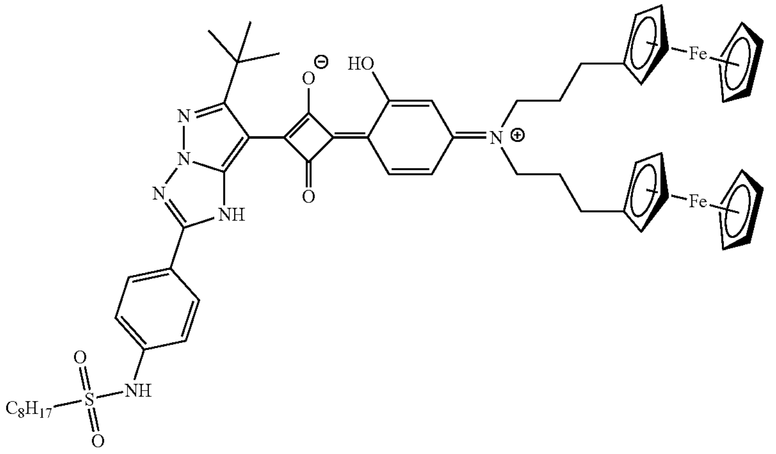
C-29
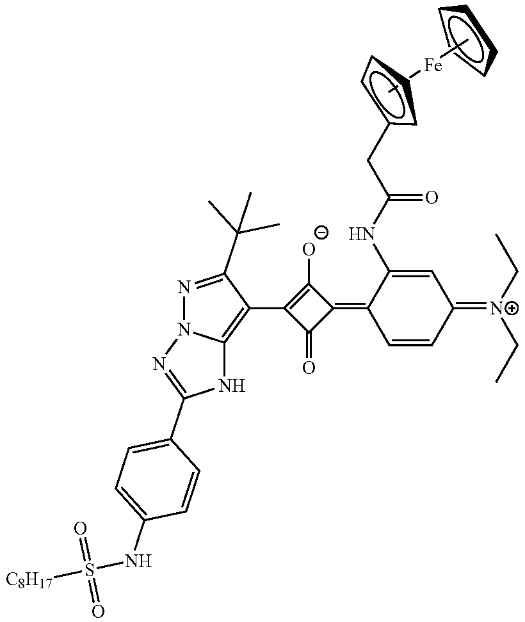
C-30
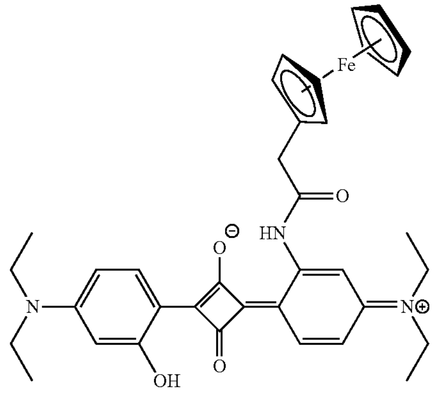
C-31
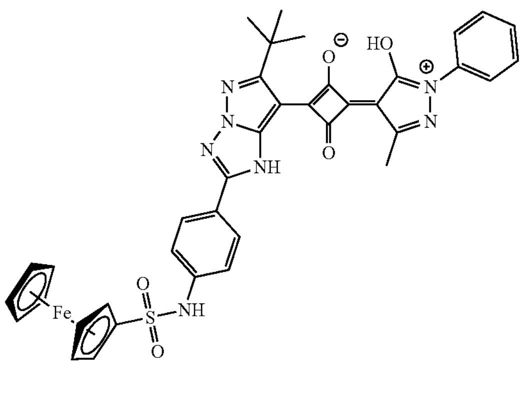
C-32
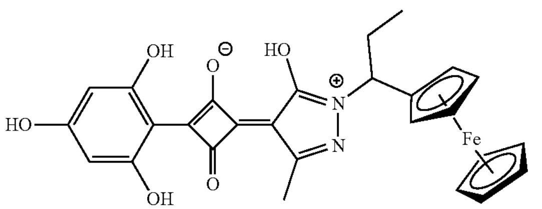

-continued
C-33
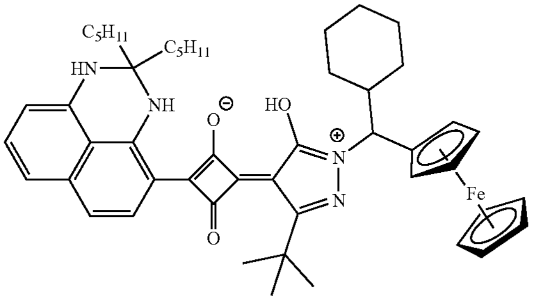
C-34
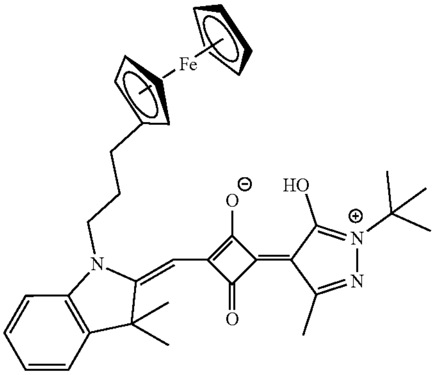
C-35
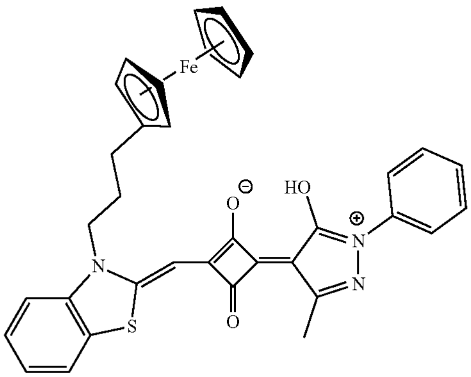
C-36
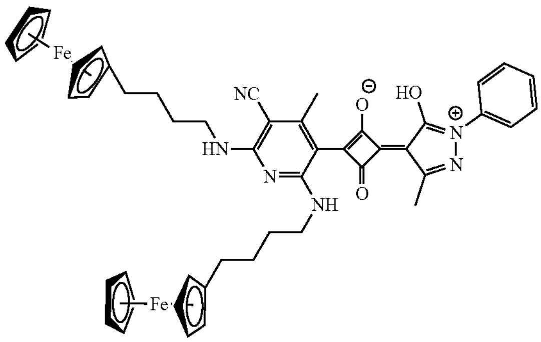
C-37
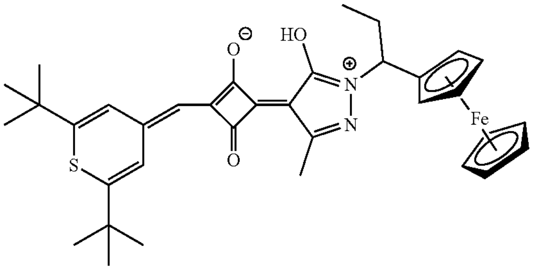
C-38
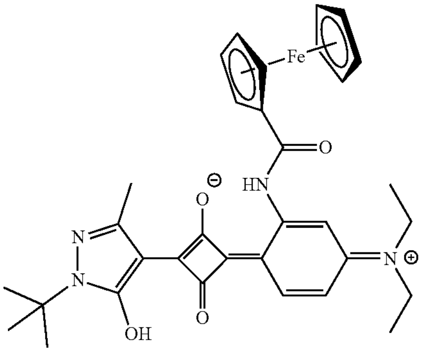

-continued
C-39
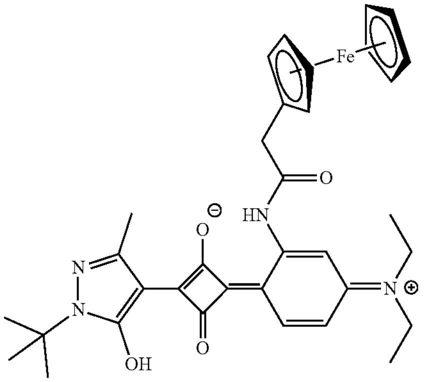
C-40
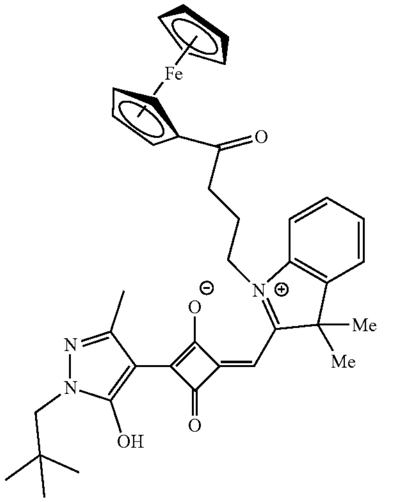
C-41
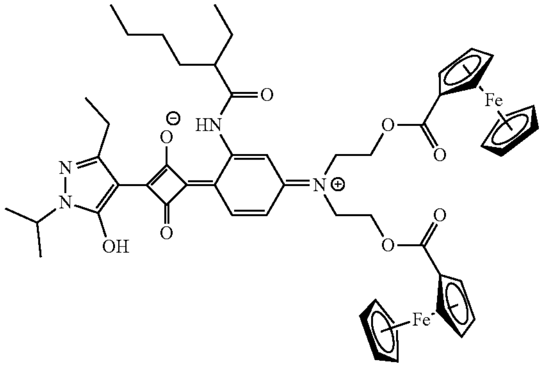
C-42
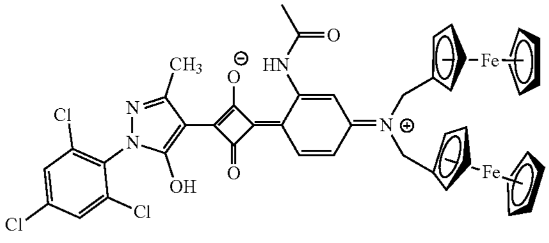
C-43
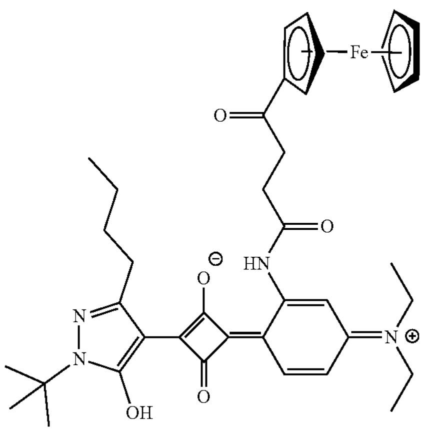
C-44
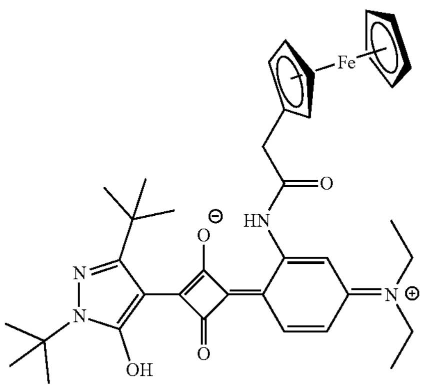

-continued
C-45
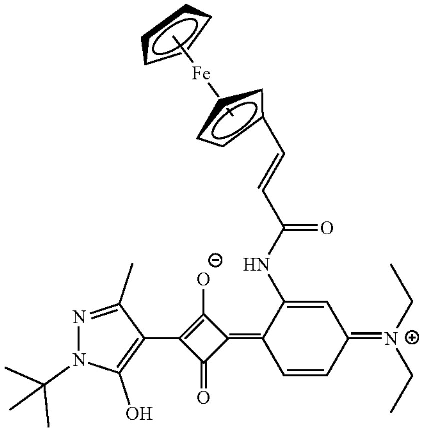
C-46
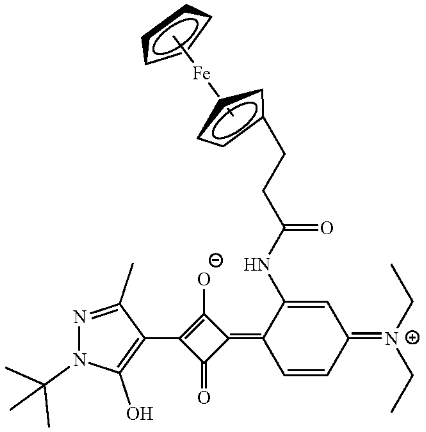
C-47
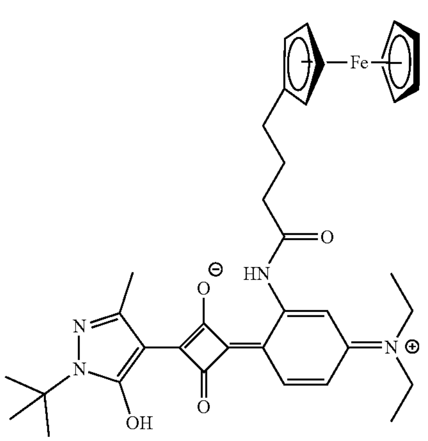
C-48
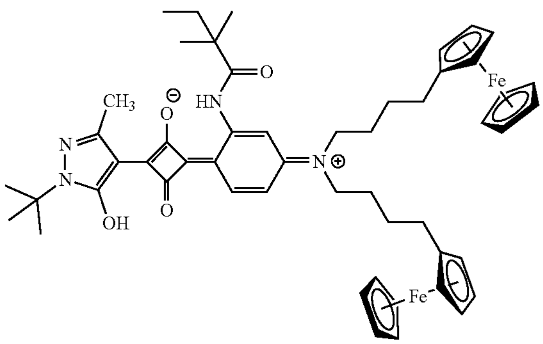
C-49
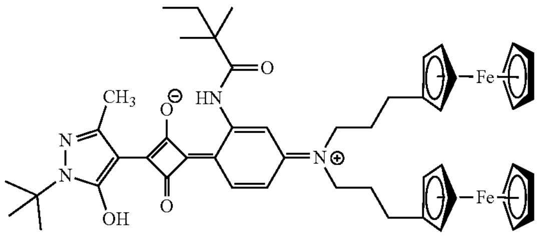
C-50
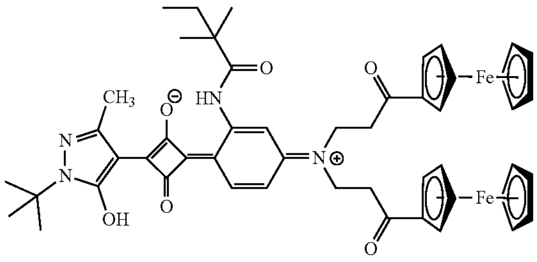
C-51
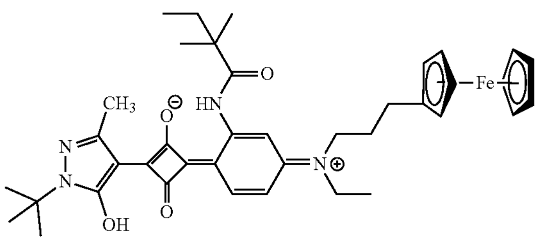
C-52
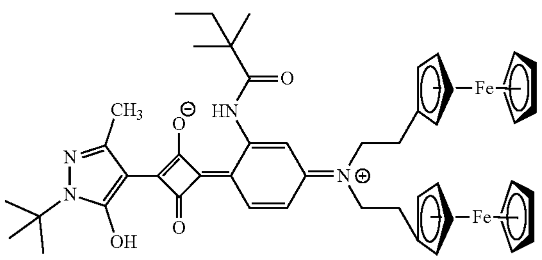

-continued
C-53
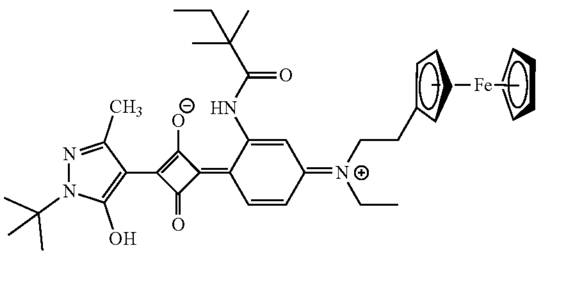
C-54
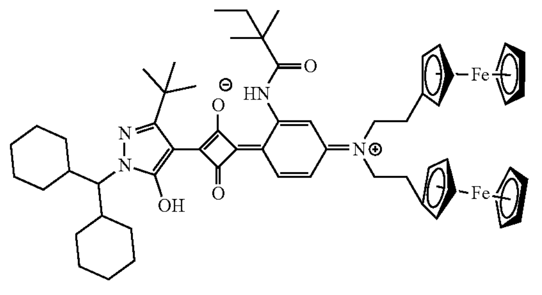
C-55
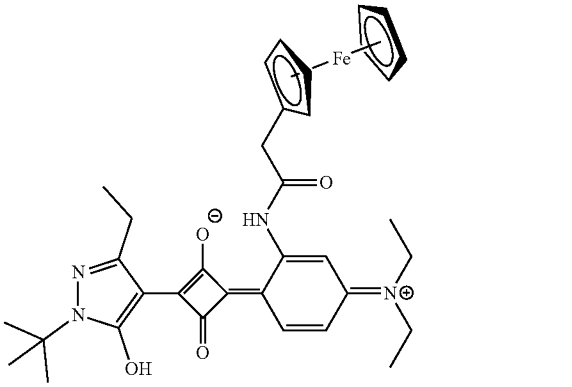
C-56
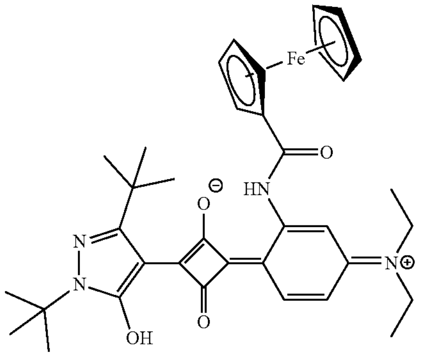
C-57
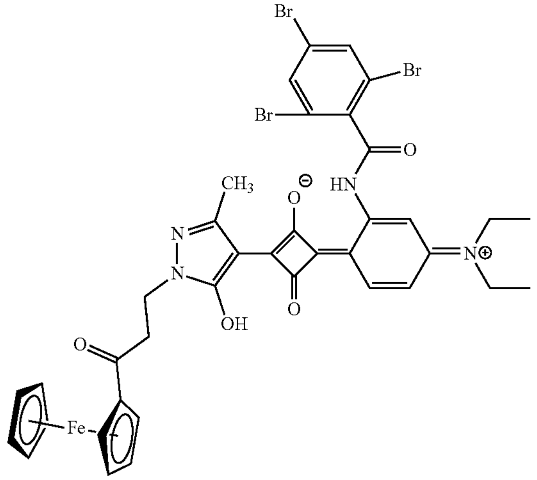
C-58
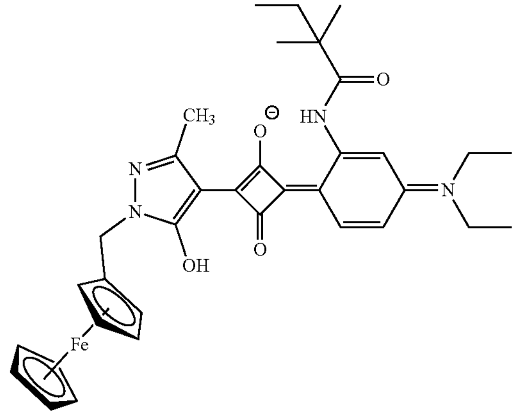
C-59
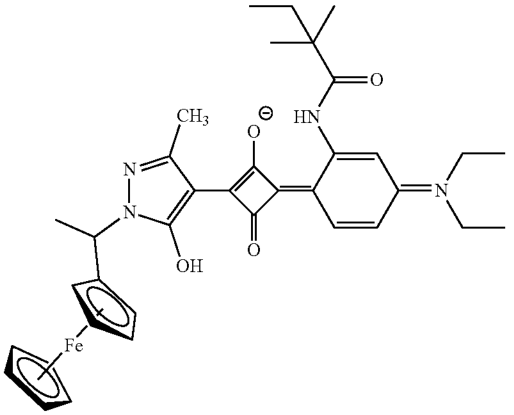
C-60
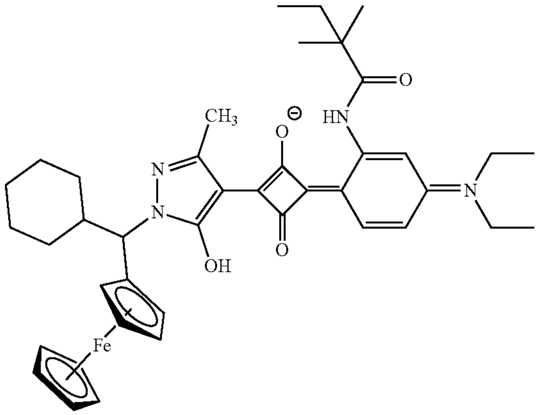

-continued
C-61
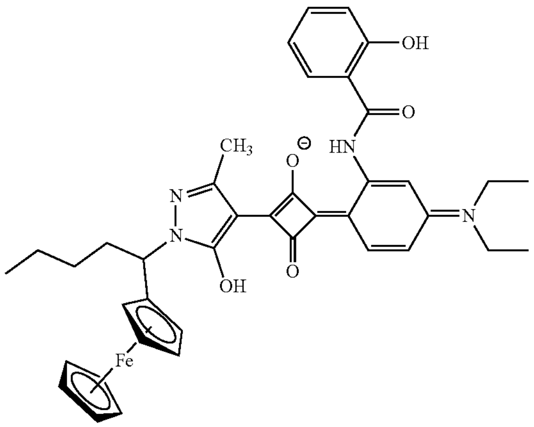
C-62
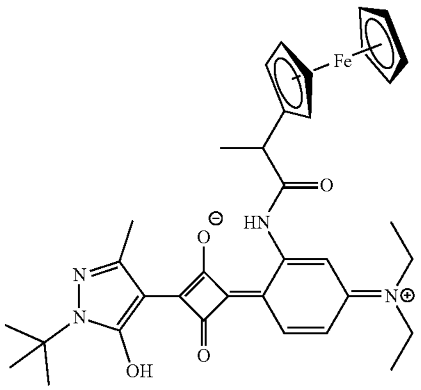
C-63
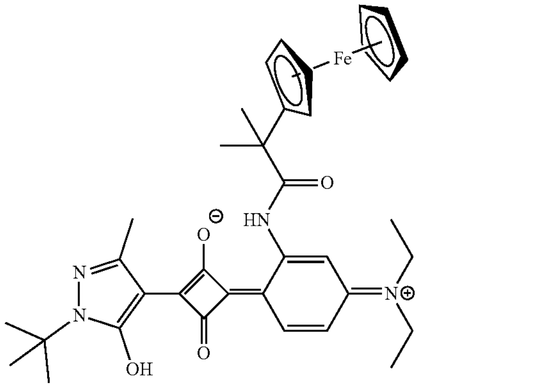
C-64
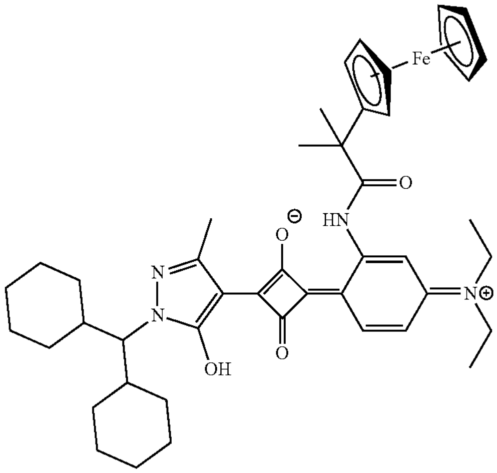
C-65
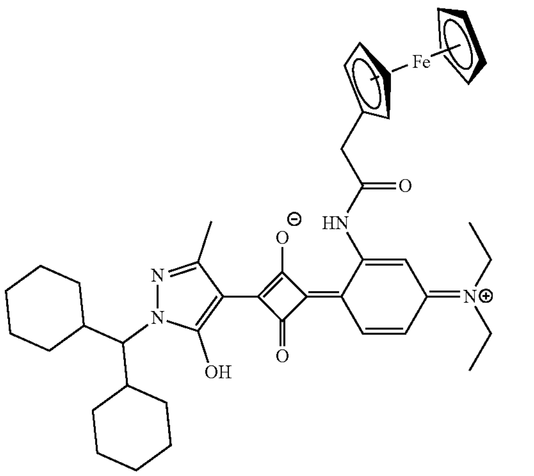
C-66
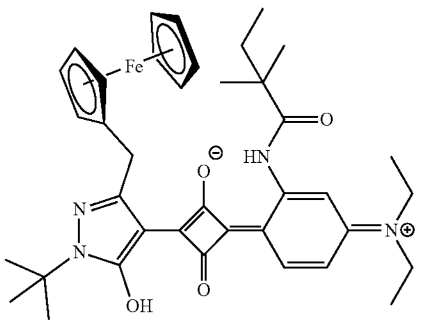

-continued
C-67
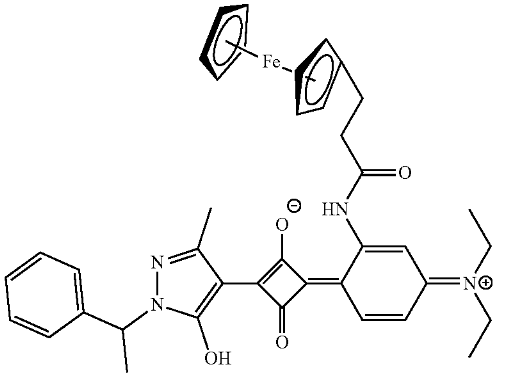
C-68
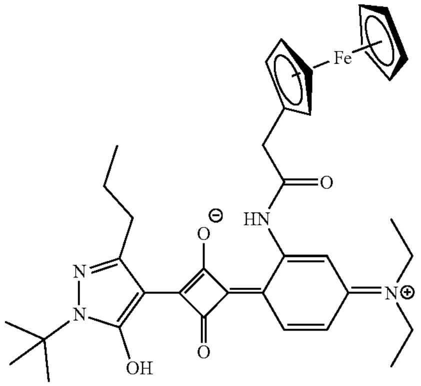
C-69
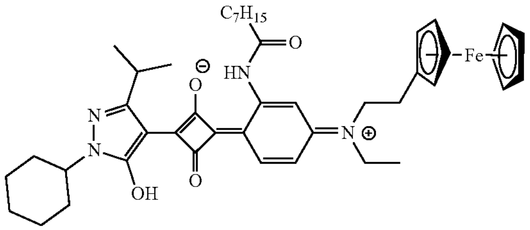
C-70
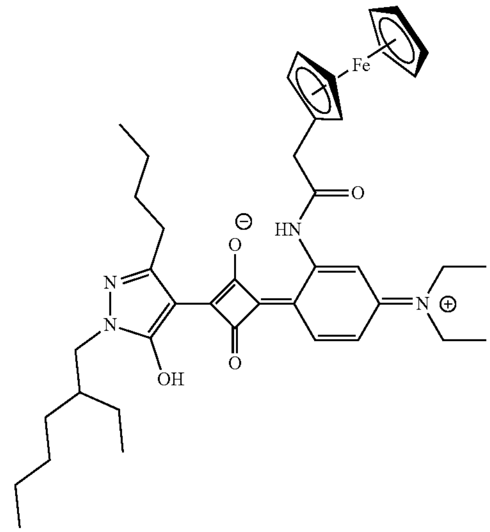
C-71
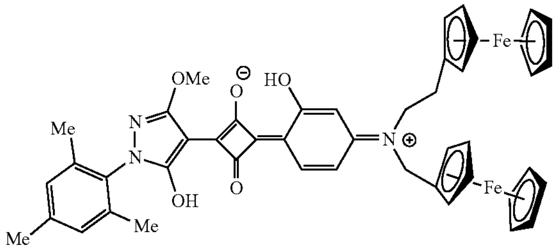
C-72
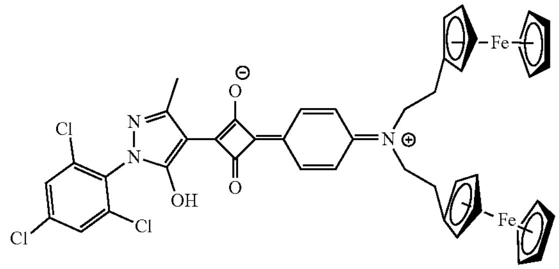
C-73
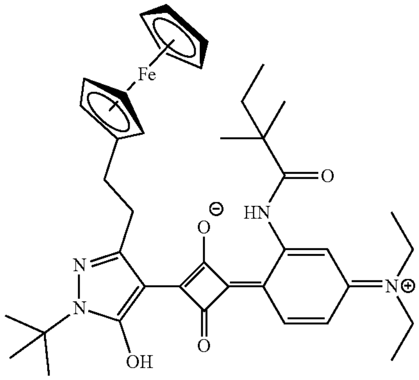
C-74
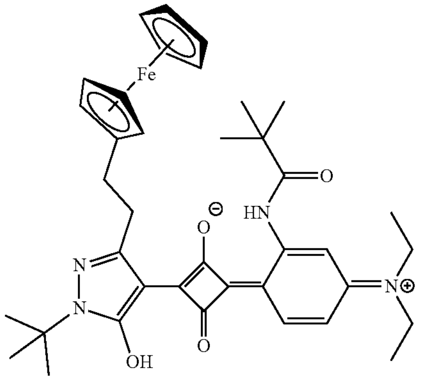

-continued
C-75
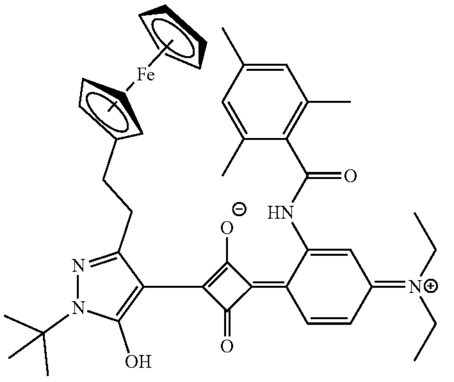
C-76
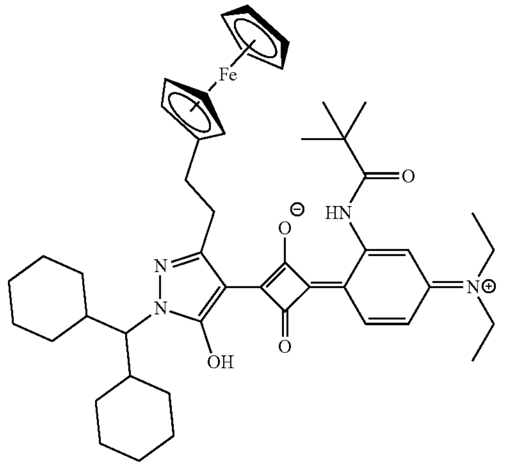
C-77
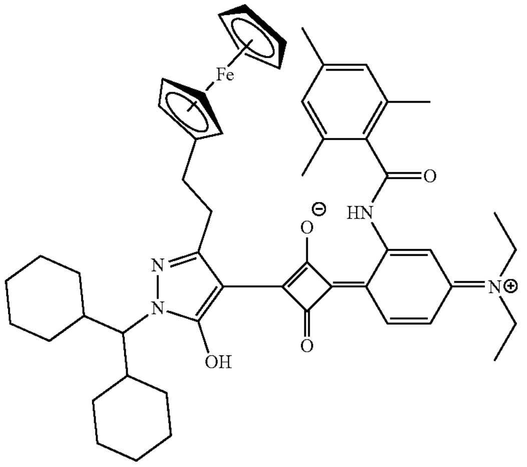
C-78
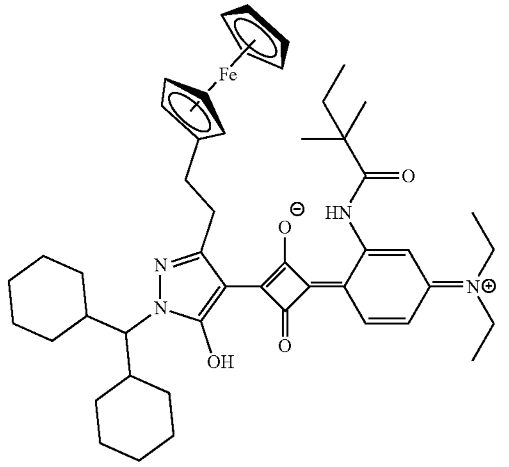
C-79
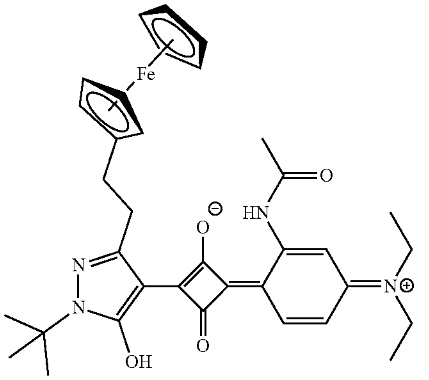
C-80
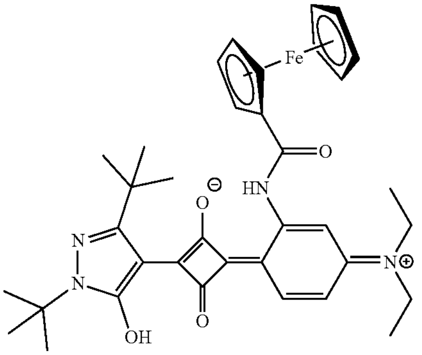

-continued
C-81
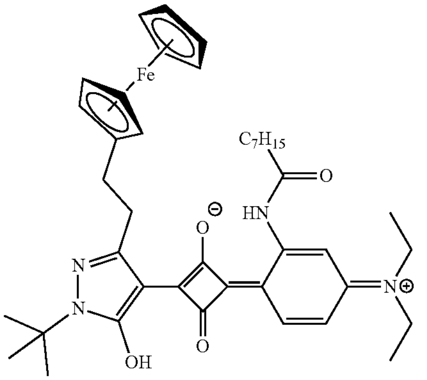
C-82
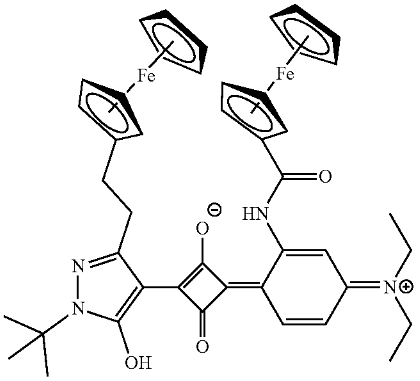
C-83
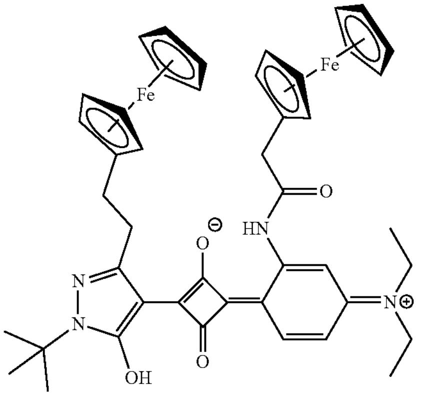
C-84
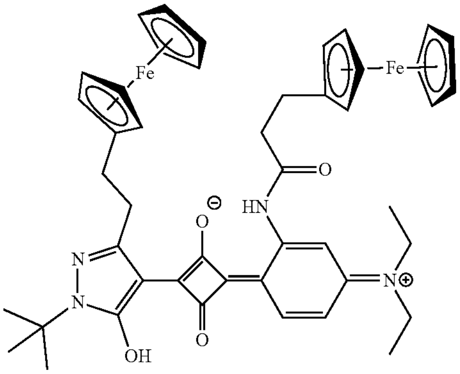
C-85
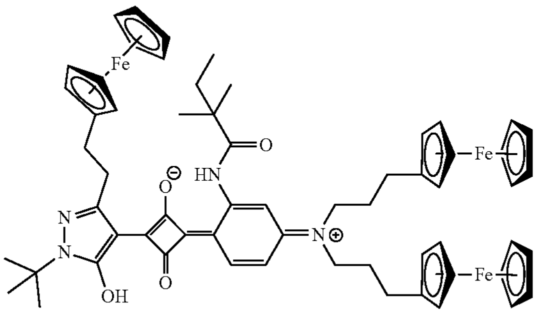
C-86
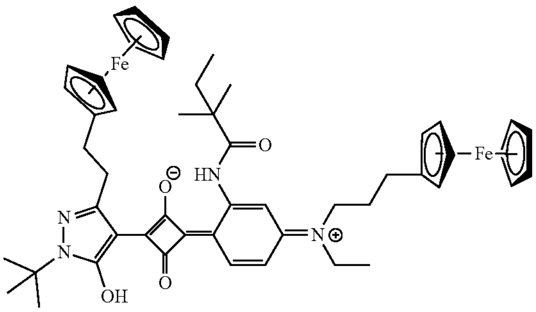
C-87
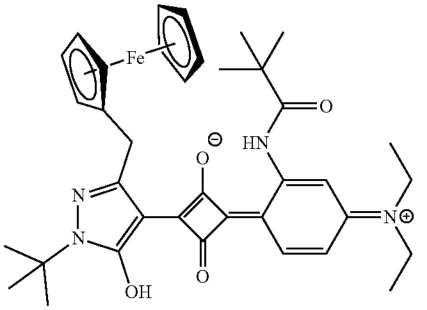
C-88
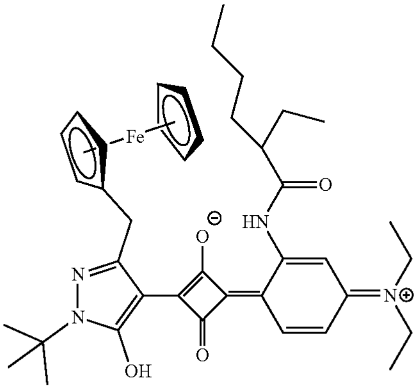

-continued
C-89
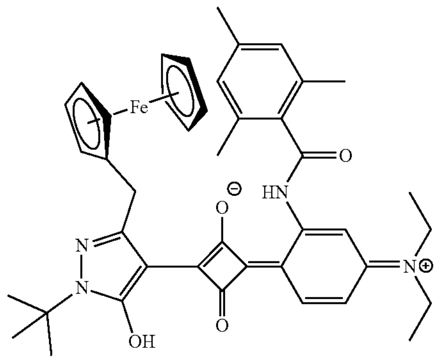
C-90
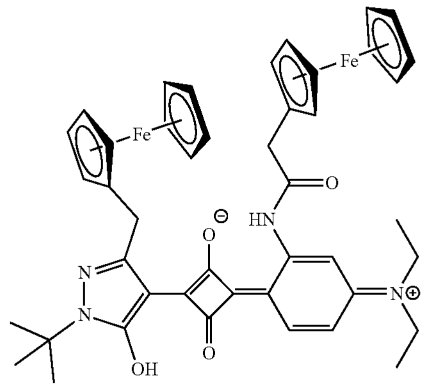
C-91
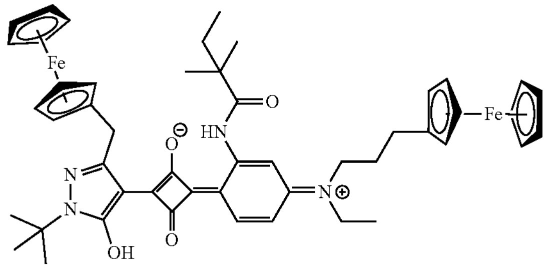
C-92
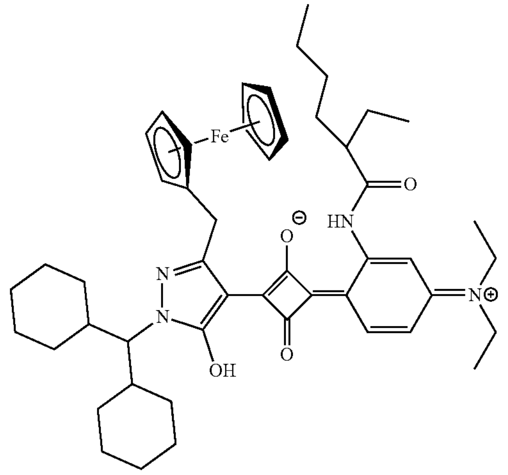
C-93
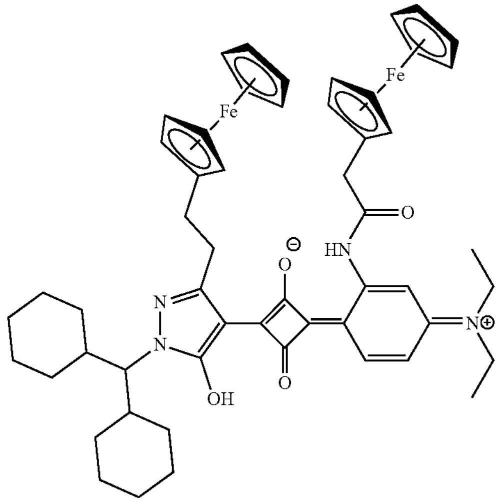
C-94
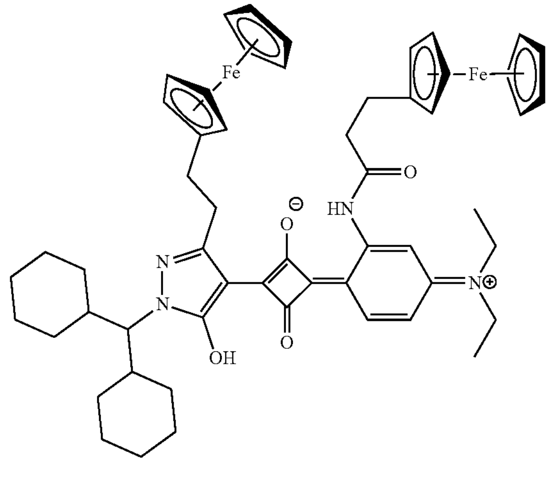

-continued
C-95
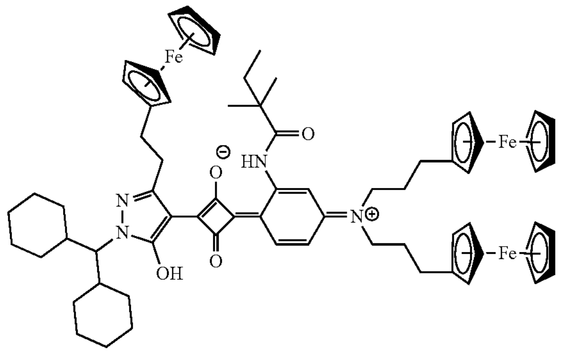
C-96
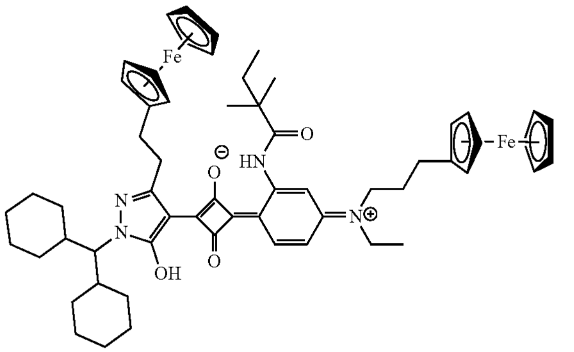
C-97
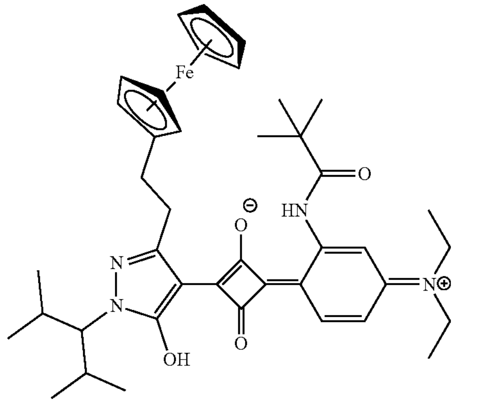
C-98
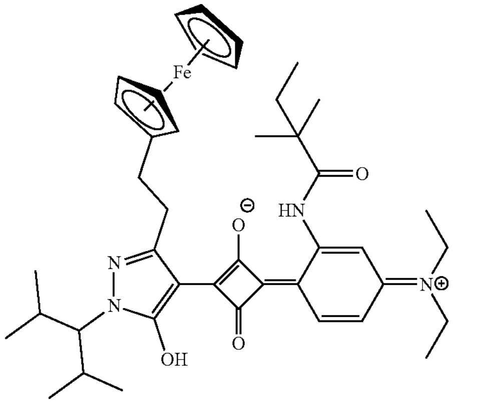
C-99
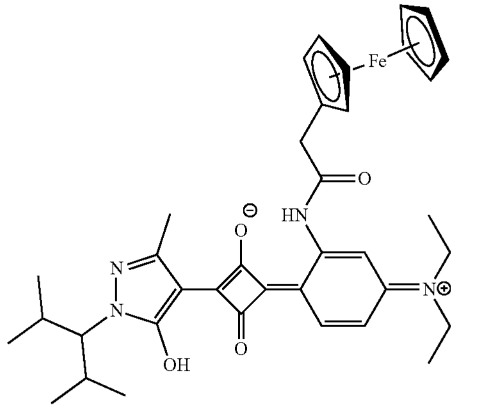
C-100
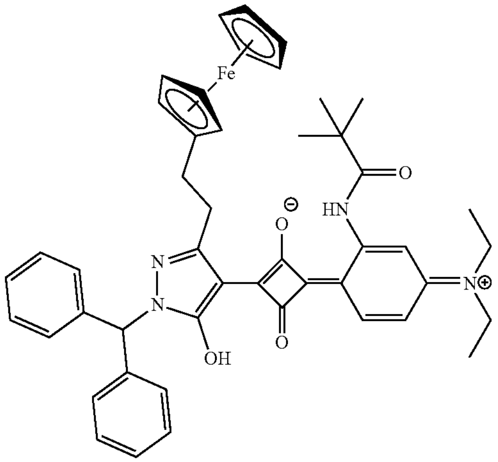

-continued
C-101
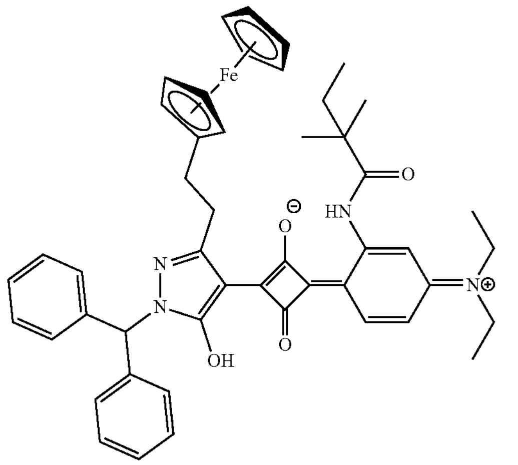
C-102
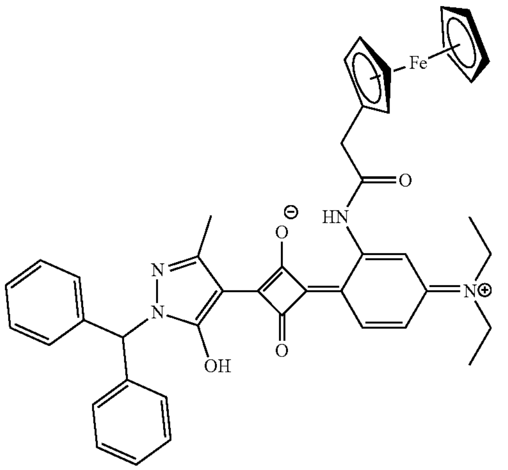
C-103
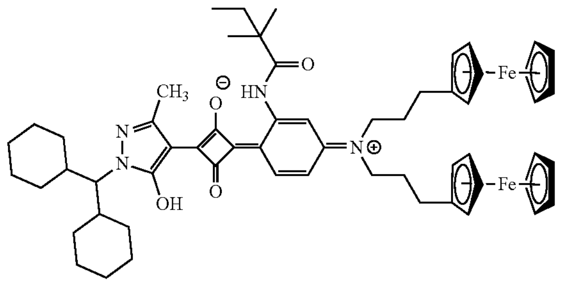
C-104
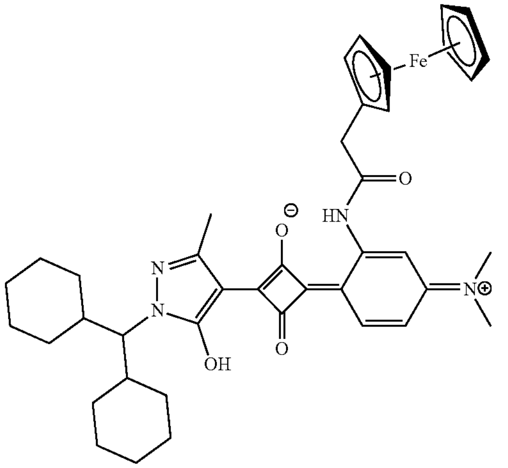
C-105
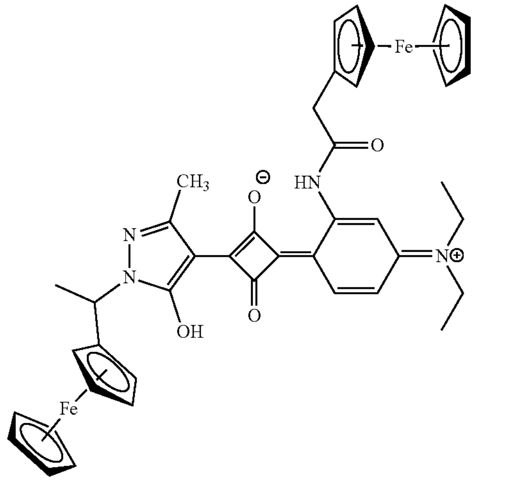
C-106
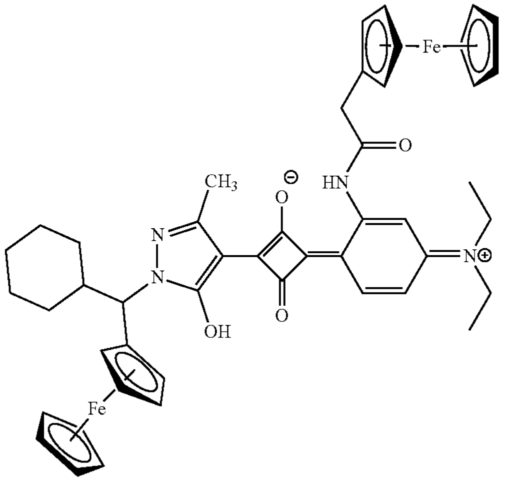

-continued
C-107
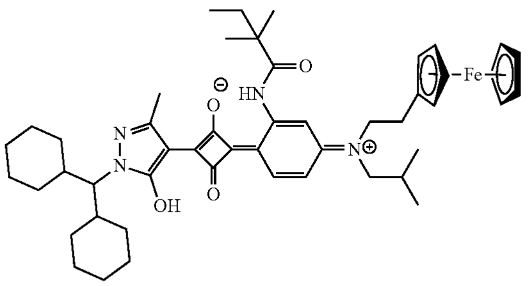
C-108
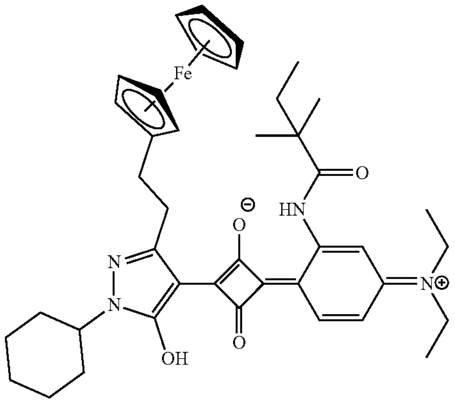
C-109
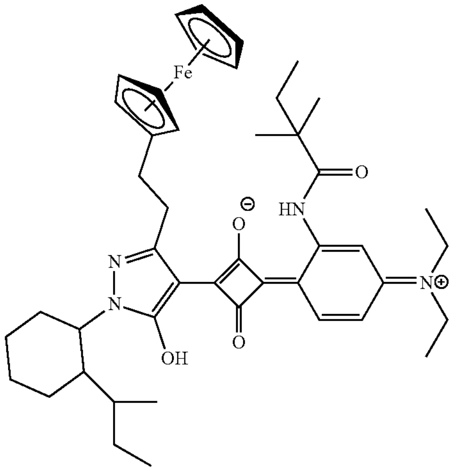
C-110
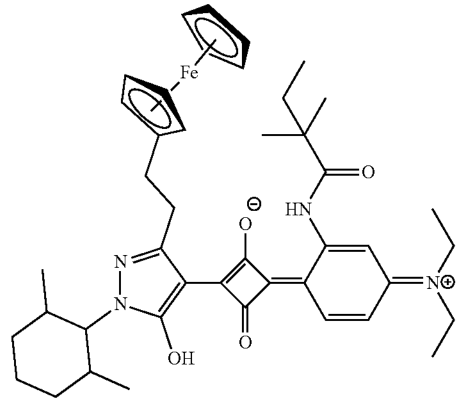
C-111
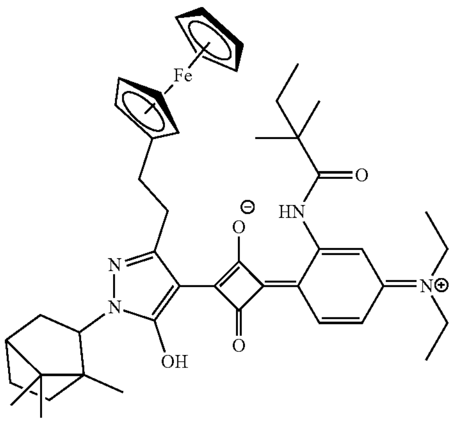
C-111
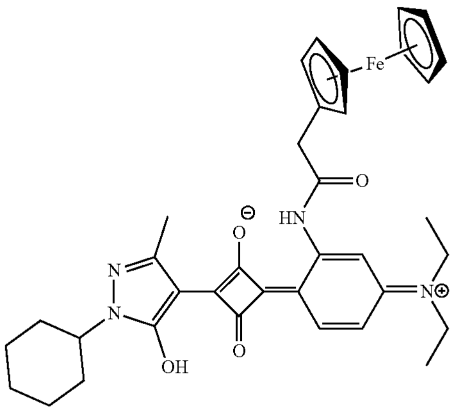

-continued
C-113
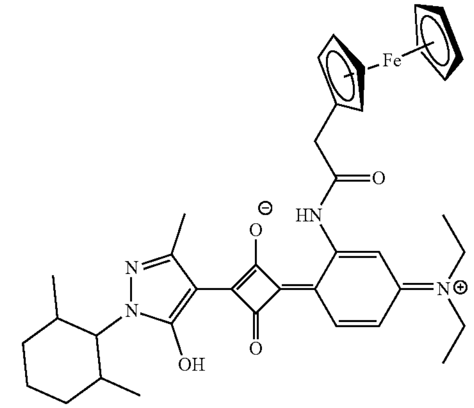
C-114
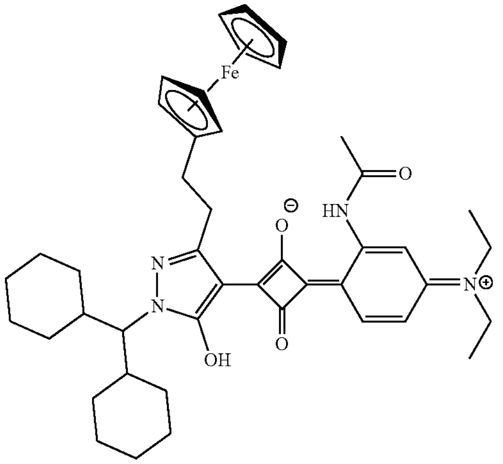
C-115
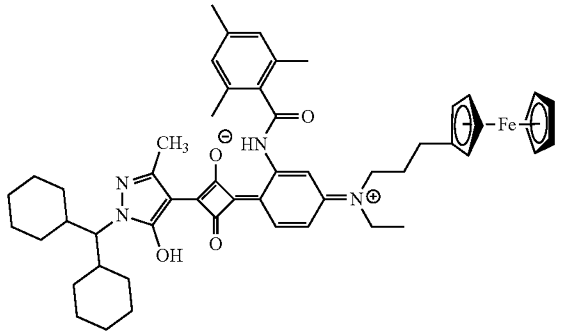
C-116
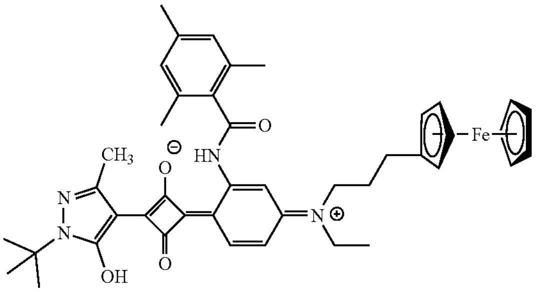
C-117
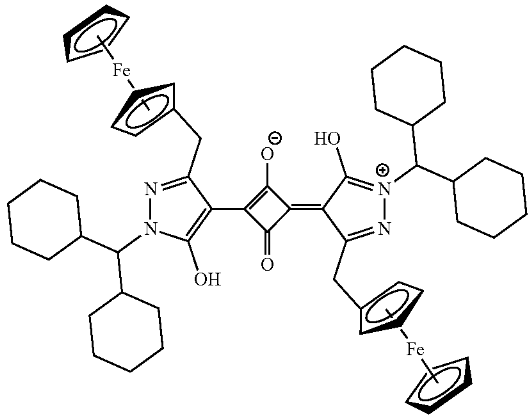
C-118
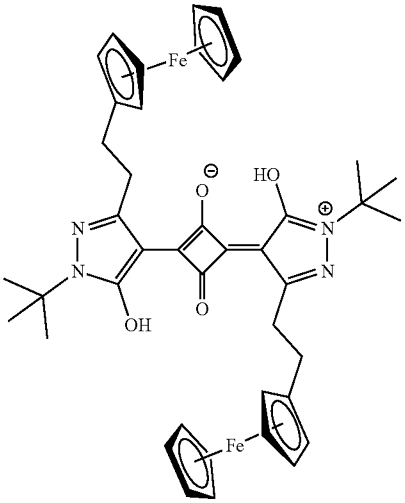

-continued

C-119

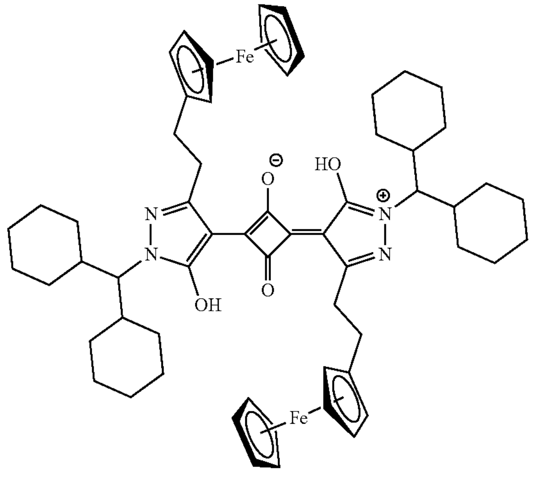

C-120

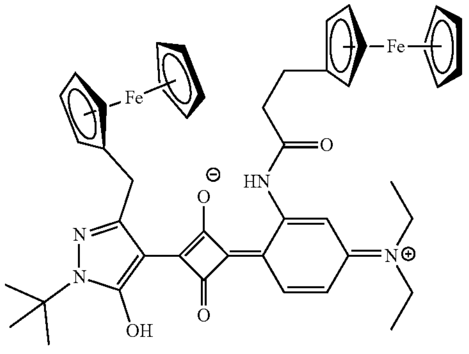

(Dye D)

The dye D is not particularly limited as long as the dye has the main absorption wavelength band in a wavelength of 680 to 780 nm in the laminate, and various dyes can be used.

Specific examples of the dye D include individual coloring agents (dyes) which are based on, for example, porphyrin, squarine, and cyanine (CY).

The dye D is preferably at least one of a coloring agent represented by General Formula (D1) or a coloring agent represented by General Formula (1) in that the absorption waveform is sharp.

(Coloring Agent Represented by General Formula (D1))

General Formula (D1)

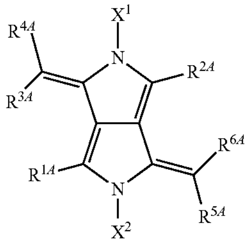

In General Formula (D1), $R^{1A}$ and $R^{2A}$ each independently represent an alkyl group, an aryl group, or a heteroaryl group, $R^{4A}$ and $R^{5A}$ each independently represent a heteroaryl group, and $R^{3A}$ and $R^{6A}$ each independently represent a substituent.

$X^1$ and $X^2$ each independently represent —$BR^{21a}R^{22a}$, where $R^{21a}$ and $R^{22a}$ each independently represent a substituent, and $R^{21a}$ and $R^{22a}$ may be bonded to each other to form a ring.

$R^{1A}$ and $R^{2A}$ each independently represent an alkyl group, an aryl group, or a heteroaryl group.

The number of carbon atoms in the alkyl group is preferably 1 to 40. The lower limit thereof is more preferably 3 or more, still more preferably 5 or more, even still more preferably 8 or more, and particularly preferably 10 or more. The upper limit thereof is more preferably 35 or less and still more preferably 30 or less. The alkyl group may be linear, branched, or cyclic, and it is preferably linear or branched and particularly preferably branched. The number of carbon atoms in the branched alkyl group is preferably 3 to 40. The lower limit thereof is, for example, more preferably 5 or more, still more preferably 8 or more, and even still more preferably 10 or more. The upper limit thereof is more preferably 35 or less and still more preferably 30 or less. The number of branches in the branched alkyl group is, for example, preferably 2 to 10 and more preferably 2 to 8. In a case where the number of branches is in the above range, the solubility in a solvent is good.

The number of carbon atoms in the aryl group is preferably 6 to 30, more preferably 6 to 20, and still more preferably 6 to 12. Among the above, a phenyl group is preferable.

The heteroaryl group is preferably a monocyclic ring or a fused ring, preferably a monocyclic ring or a fused ring having the number of fusions of 2 to 8, and more preferably a monocyclic ring or a fused ring having the number of fusions of 2 to 4. The number of heteroatoms constituting the heteroaryl group is preferably 1 to 3. The heteroatom constituting the heteroaryl group is preferably a nitrogen atom, an oxygen atom, or a sulfur atom. The number of carbon atoms in the heteroaryl group is preferably 3 to 30, more preferably 3 to 18, more preferably 3 to 12, and particularly preferably 3 to 5. The heteroaryl group is preferably a 5-membered ring or a 6-membered ring. Specific examples of the heteroaryl group include an imidazolyl group, a pyridyl group, a pyrazyl group, a pyrimidyl group, a pyridazyl group, a triazyl group, a quinolyl group, a quinoxalyl group, an isoquinolyl group, an indolenyl group, a furyl group, a thienyl group, a benzoxazolyl group, a benzimidazolyl group, a benzthiazolyl group, a naphthiazolyl group, a benzoxazoly group, a m-carbazolyl group, and an azepinyl group.

The alkyl group, the aryl group, and the heteroaryl group as $R^{1A}$ and $R^{2A}$ may have a substituent or may be unsubstituted. Examples of the substituents that may be provided a hydrocarbon group which may have an oxygen atom, a heteroaryl group, an amino group, an acylamino group, an alkoxycarbonylamino group, an aryloxycarbonylamino group, a sulfonylamino group, a sulfamoyl group, a carbamoyl group, an alkylthio group, an arylthio group, a heteroarylthio group, an alkylsulfonyl group, an arylsulfonyl group, a sulfinyl group, a ureido group, a phosphate amide group, a mercapto group, a sulfo group, a carboxyl group, a nitro group, a hydroxamic acid group, a sulfino group, a hydrazino group, an imino group, a silyl group, a hydroxy group, a halogen atom, and a cyano group.

As the heteroaryl group, the description for the heteroaryl group as $R^{1A}$ and $R^{A}$ can be preferably applied.

Examples of the halogen atom include a fluorine atom, a chlorine atom, a bromine atom, and an iodine atom.

Examples of the hydrocarbon group include an alkyl group, an alkenyl group, and an aryl group.

As the alkyl group, the description for the alkyl group as $R^{1A}$ and $R^{2A}$ can be preferably applied.

The number of carbon atoms in the alkenyl group is preferably 2 to 40. The lower limit thereof is, for example, more preferably 3 or more, still more preferably 5 or more, even still more preferably 8 or more, and particularly preferably 10 or more. The upper limit thereof is more preferably 35 or less and still more preferably 30 or less. The alkenyl group may be linear, branched, or cyclic, and it is preferably linear or branched, and particularly preferably branched. The number of carbon atoms in the branched alkenyl group is preferably 3 to 40. The lower limit thereof is, for example, more preferably 5 or more, still more preferably 8 or more, and even still more preferably 10 or more. The upper limit thereof is more preferably 35 or less and still more preferably 30 or less. The number of branches in the branched alkenyl group is preferably 2 to 10 and more preferably 2 to 8. In a case where the number of branches is in the above range, the solubility in a solvent is good.

The number of carbon atoms in the aryl group is preferably 6 to 30, more preferably 6 to 20, and still more preferably 6 to 12.

Examples of the hydrocarbon group containing an oxygen atom include a group represented by —L—$R^{x1}$.

L represents —O—, —CO—, —COO—, —OCO—, —$(OR^{x2})_m$— or —$(R^{x2}O)_m$—. $R^{x1}$ represents an alkyl group, an alkenyl group, or an aryl group, $R^{x2}$ represents an alkylene group or an arylene group, m represents an integer of 2 or more, and m $R^{x2}$ may be the same or different from each other.

L is preferably —O—, —COO—, or —OCO—, and more preferably —O—.

The alkyl group, the alkenyl group, and the aryl group, which are represented by $R^{x1}$, have the same meanings as those described above, and the same applies to the preferred ranges thereof. $R^{x1}$ is preferably an alkyl group or an alkenyl group, and more preferably an alkyl group. The number of carbon atoms in the alkylene group represented by $R^{x2}$ is preferably 1 to 20, more preferably 1 to 10, and still more preferably 1 to 5. The alkylene group may be linear, branched, or cyclic, and it is preferably linear or branched.

The number of carbon atoms in the arylene group represented by $R^{x2}$ is preferably 6 to 20, and more preferably 6 to 12.

m represents an integer of 2 or more, preferably 2 to 20, and more preferably 2 to 10.

The substituent which may be contained in the alkyl group, the aryl group, and the heteroaryl group as $R^{1A}$ and $R^{2A}$ is preferably a hydrocarbon group which may contain an oxygen atom, and more preferably a hydrocarbon group containing an oxygen atom.

The hydrocarbon group containing an oxygen atom is preferably a group represented by —O—$R^{x1}$. $R^{x1}$ is preferably an alkyl group or an alkenyl group, more preferably an alkyl group, and particularly preferably a branched alkyl group. That is, the substituents represented by $R^{1A}$ and $R^{2A}$ each are preferably an alkoxy group. In a case where $R^{1A}$ and $R^{2A}$ are an alkoxy group, a dye can be suitably used as the dye D according to the embodiment of the present invention, as a near-infrared absorbing substance excellent in solubility in a solvent, light resistance, and visible transmittance.

The number of carbon atoms in the alkoxy group is preferably 1 to 40. The lower limit thereof is, for example, more preferably 3 or more, still more preferably 5 or more, even still more preferably 8 or more, and particularly preferably 10 or more. The upper limit thereof is more preferably 35 or less and still more preferably 30 or less. The alkoxy group may be linear, branched, or cyclic, and it is preferably linear or branched, and particularly preferably branched. The number of carbon atoms in the branched alkoxy group is preferably 3 to 40. The lower limit thereof is, for example, more preferably 5 or more, still more preferably 8 or more, and even still more preferably 10 or more. The upper limit thereof is more preferably 35 or less and still more preferably 30 or less. The number of branches in the branched alkoxy group is preferably 2 to 10 and more preferably 2 to 8.

$R^{1A}$ and $R^{2A}$ is preferably a heteroaryl group or an aryl group, more preferably an aryl group, and still more preferably a phenyl group having a substituent at the 3-position.

$R^{1A}$ and $R^{6A}$ each independently represent a substituent.

Examples of the substituent include an alkyl group, an alkenyl group, an alkynyl group, an aryl group, a heteroaryl group, an amino group (including an alkylamino group, an arylamino group, and a heterocyclic amino group), an alkoxy group, an aryloxy group, a heteroaryloxy group, an acyl group, an alkylcarbonyl group, an arylcarbonyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, a heteroarylthio group, an alkylsulfonyl group, an arylsulfonyl group, a sulfinyl group, a ureido group, a phosphate amide group, a hydroxy group, a mercapto group, a halogen atom, a cyano group, a sulfo group, a carboxyl group, a nitro group, a hydroxamic acid group, a sulfino group, a hydrazino group, an imino group, and a silyl group.

$R^{3A}$ and $R^{6A}$ are preferably an electron withdrawing group.

A substituent having a positive value of the Hammett σp value (the sigma para value) acts as an electron withdrawing group.

In the present invention, a substituent having a Hammett σp value of 0.2 or more can be exemplified as an electron withdrawing group. The σp value is preferably 0.25 or more, more preferably 0.3 or more, and particularly preferably 0.35 or more. The upper limit thereof is not particularly limited, and it is preferably 0.80.

Specific examples of the electron withdrawing group include a cyano group (0.66), a carboxyl group (—COOH: 0.45), an alkoxycarbonyl group (—COOMe: 0.45), an aryloxycarbonyl group (—COOPh: 0.44), a carbamoyl group (—$CONH_2$: 0.36), an alkylcarbonyl group (—COMe: 0.50), an arylcarbonyl group (—COPh: 0.43), an alkylsulfonyl group (—$SO_2Me$: 0.72), and an arylsulfonyl group (—$SO_2Ph$: 0.68). The cyano group is particularly preferable. Here, Me represents a methyl group, and Ph represents a phenyl group.

For the Hammett σp value, for example, paragraphs [0024] and [0025] of JP2009-263614A can be referred to, and the contents thereof are incorporated in the present specification.

$R^{4A}$ and $R^{IA}$ each independently represent a heteroaryl group.

The heteroaryl group is preferably a monocyclic ring or a fused ring, preferably a monocyclic ring or a fused ring having the number of fusions of 2 to 8, and more preferably a monocyclic ring or a fused ring having the number of fusions of 2 to 4. The number of heteroatoms constituting the heteroaryl group is preferably 1 to 3. The heteroatom constituting the heteroaryl group is preferably a nitrogen atom, an oxygen atom, or a sulfur atom. The number of carbon atoms in the heteroaryl group is preferably 3 to 30, more preferably 3 to 18, more preferably 3 to 12, and particularly preferably 3 to 5. The heteroaryl group is preferably a 5-membered ring or a 6-membered ring. Specific examples of the heteroaryl group include those described in $R^{1A}$ and $R^{2A}$, where a pyridyl group, a pyrimidyl group, a triazyl group, a quinolyl group, a quinoxalyl group, an isoquinolyl group, an indolenyl group, a benzoxazolyl group, or a benzthiazolyl group is preferable.

The heteroaryl group may have a substituent or may be unsubstituted. Examples of the substituent include an alkyl group, an alkenyl group, an alkynyl group, an aryl group, an amino group (including an alkylamino group, an arylamino group, and a heterocyclic amino group), an alkoxy group, an aryloxy group, an acyl group, an alkylcarbonyl group, an arylcarbonyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, a heteroarylthio group, a sulfonyl group, an alkylsulfonyl group, an arylsulfonyl group, a sulfinyl group, a ureido group, a phosphate amide group, a hydroxy group, a mercapto group, a halogen atom, a cyano group, a sulfo group, a carboxyl group, a nitro group, a hydroxamic acid group, a sulfino group, a hydrazino group, and an imino group, a silyl group. A halogen atom, an alkyl group, or an alkoxy group is preferable.

The halogen atom is preferably a fluorine atom, a chlorine atom, a bromine atom, or an iodine atom, and particularly preferably a chlorine atom.

The number of carbon atoms in the alkyl group is preferably 1 to 40, more preferably 1 to 30, and particularly preferably 1 to 25. The alkyl group may be linear, branched, or cyclic, and it is preferably linear or branched, and particularly preferably linear.

The number of carbon atoms in the alkoxy group is preferably 1 to 40, more preferably 1 to 30, and particularly preferably 1 to 25. The alkoxy group may be linear, branched, or cyclic, and it is preferably linear or branched, and particularly preferably linear.

$R^{3A}$ and $R^{4A}$ may be bonded to each other to form a ring, and $R^{5A}$ and $R^{6A}$ may be bonded to each other to form a ring.

In a case where $R^{3A}$ and $R^{4A}$, and $R^{5A}$ and $R^{6A}$ are bonded to each other to form rings, respectively, they preferably form 5-membered to 7-membered rings (preferably 5-membered or 6-membered rings), respectively. The ring to be formed is preferably a ring that is used as an acidic nucleus in a merocyanine pigment. Specific examples thereof include the following rings.

(a) A 1,3-dicarbonyl ring: for example, 1,3-indandione, 1,3-cyclohexanedione, 5,5-dimethyl-1,3-cyclohexanedione, or 1,3-dioxane-4,6-dione.

(b) A pyrazolinone ring: for example, 1-phenyl-2-pyrazolin-5-one, 3-methyl-1-phenyl-2-pyrazolin-5-one, or 1-(2-benzothiazoyl)-3-methyl-2-pyrazolin-5-one.

(c) An isooxazolinene ring: for example, 3-phenyl-2-isooxazoline-5-one or 3-methyl-2-isooxazoline-5-one.

(d) An oxindole ring: for example, 1-alkyl-2,3-dihydro-2-oxindole.

(e) A 2,4,6-triketohexahydropyrimidine ring: for example, barbituric acid or 2-thiobarbituric acid, or a derivative thereof. Examples of the derivative thereof include a 1-alkyl derivative such as 1-methyl or 1-ethyl, a 1,3-dialkyl derivative such as 1,3-dimethyl, 1,3-diethyl, or 1,3-dibutyl, a 1,3-diaryl derivative such as 1,3-diphenyl, 1,3-di(p-chlorophenyl), or 1,3-di(p-ethoxycarbonylphenyl), a 1-alkyl-1-aryl derivative such as 1-ethyl-3-phenyl, and a 1,3-diheterocyclic derivative substituted at the 1,3-position such as 1,3-di(2-pyridyl).

(f) A 2-thio-2,4-thiazolidinedione ring: for example, rhodanine or a derivative thereof. Examples of the derivative thereof include a 3-alkyl rhodanine such as 3-methyl rhodanine, 3-ethyl rhodanine, or 3-allyl rhodanine: a 3-aryl rhodanine such as 3-phenyl rhodanine; and a rhodanine substituted with a heterocyclic ring at the 3-position such as 3-(2-pyridyl) rhodanine.

(g) A 2-thio-2,4-oxazolidinedione (2-thio-2,4-(3H,5H)-oxazoledione) ring: for example, 3-ethyl-2-thio-2,4-oxazolidinedione.

(h) A thianaphthene ring: for example, 3(2H)-thianaphthene-1,1-dioxide.

(i) A 2-thio-2,5-thiozolidinedione ring: for example, 3-ethyl-2-thio-2,5-thiazolidinedione.

(j) A 2,4-thiozolidinedione ring: for example, 2,4-thiazolidmedione, 3-ethyl-2,4-thiazolidinedione, or 3-phenyl-2,4-thiazolidinedione.

(k) A thiazoline-4-one ring: for example, 4-thiazolinone or 2-ethyl-4-thiazolinone.

(l) A 4-thiazolidinone ring: for example, 2-ethylmercapto-5-thiazolin-4-one or 2-alkylphenylamino-5-thiazolin-4-one.

(m) A 2,4-imidazolidinedione (hydantoin) ring: for example, 2,4-imidazolidinedione or 3-ethyl-2,4-imidazolidinedione.

(n) A 2-thio-2,4-imidazolidinedione (2-thiohydantoin) ring: for example, 2-thio-2,4-imidazolidinedione or 3-ethyl-2-thio-2,4-imidazolidinedione.

(o) An imidazoline-5-one ring: for example, 2-propyl mercapto-2-imidazolin-5-one.

(p) A 3,5-pyrazolidinedione ring: for example, 1,2-diphenyl-3,5-pyrazolidinedione or 1,2-dimethyl-3,5-pyrazolidinedione.

(q) A benzothiophene-3-one ring: for example, benzothiophene-3-one, oxobenzothiophene-3-one, ordioxobenzothiophene-3-one.

(r) An indanone ring: for example, 1-indanone, 3-phenyl-1-indanone, 3-methyl-1-indanone, 3,3-diphenyl-1-indanone, or 3,3-dimethyl-1-indanone.

The ring formed by $R^{3A}$ and $R^{4A}$ being bonded to each other and the ring formed by $R^{5A}$ and $R^{6A}$ being bonded to each other are preferably a 1,3-dicarbonyl ring, a pyrazolinone ring, a 2,4,6-triketohexahydropyrimidine ring (including thioketones), a 2-thio-2,4-thiazolidinedione ring, a 2-thio-2,4-oxazolidinedione ring, a 2-thio-2,5-thiazolidinedione ring, a 2,4-thiazolidinedione ring, a 2,4-imidazolidinedione ring, a 2-thio-2,4-imidazolidinedione ring, a 2-imidazoline-5-one ring, a 3,5-pyrazolidinedione ring, a benzothiophene-3-one ring, or an indanone ring, and still more preferably a 1,3-dicarbonyl ring, a 2,4,6-triketohexahydropyrimidine ring (including a thioketones), a 3,5-pyrazolidinedione ring, a benzothiophene-3-one ring, or an indanone ring.

In a case where $R^{3A}$ and $R^{4A}$, and $R^{5A}$ and $R^{6A}$ are bonded to each other to form rings, respectively, it is not possible to specify the op values of the $R^{3A}$ to $R^{6A}$ that forms the rings;

however, in the present invention, it is regarded that $R^{3A}$ to $R^{6A}$ are substituted with partial structures of the respective rings, whereby the op values in the case of ring formation shall be defined. For example, in a case where $R^{3A}$ and $R^{4A}$ are bonded to form a 1,3-indandion ring, it is conceived that $R^{3A}$ and $R^{4A}$ are substituted with benzoyl groups, respectively.

$X^1$ and $X^2$ each independently represent —$BR^{21}R^{11}$.

$R^{21}$ and $R^{22}$ each independently represent a substituent, and $R^{21}$ and $R^{22}$ may be bonded to each other to form a ring.

The substituent represented by $R^{21}$ and $R^{22}$ is preferably a halogen atom, an alkyl group, an alkoxy group, an aryl group, a heteroaryl group, or a group represented by Formula (24), more preferably a halogen atom, an aryl group, or an aryl group, and still more preferably an aryl group.

The halogen atom is preferably a fluorine atom, a chlorine atom, a bromine atom, or an iodine atom, and particularly preferably a fluorine atom.

The number of carbon atoms in the alkyl group is preferably 1 to 40. The lower limit thereof is, for example, more preferably 3 or more. The upper limit thereof is, for example, more preferably 30 or less, and still more preferably 25 or less. The alkyl group may be linear, branched, or cyclic, and it is preferably linear or branched, and particularly preferably linear.

The number of carbon atoms in the alkoxy group is preferably 1 to 40. The lower limit thereof is, for example, more preferably 3 or more. The upper limit thereof is, for example, more preferably 30 or less, and still more preferably 25 or less. The alkoxy group may be linear, branched, or cyclic, and it is preferably linear or branched, and particularly preferably linear.

The number of carbon atoms in the aryl group is preferably 6 to 20 and more preferably 6 to 12. The aryl group is preferably a phenyl group.

The heteroaryl group may be monocyclic or polycyclic, and a monocyclic ring is preferable. The number of heteroatoms constituting the heteroaryl group is preferably 1 to 3. The heteroatom constituting the heteroaryl group is preferably a nitrogen atom, an oxygen atom, or a sulfur atom. The number of carbon atoms in the heteroaryl group is preferably 3 to 30, more preferably 3 to 18, more preferably 3 to 12, and particularly preferably 3 to 5. The heteroaryl group is preferably a 5-membered ring or a 6-membered ring. Specific examples of the heteroaryl group include those described in $R^{1A}$ and $R^{2A}$.

(2-4)

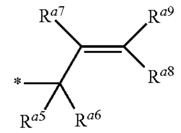

In Formula (2-4), $R^{a5}$ to $R^{a9}$ each independently represent a hydrogen atom or a substituent. * represents a bonding site to General Formula (D1). Examples of the substituent represented by $R^{a5}$ to $R^{a9}$ include an alkyl group, an alkoxy group, an aryl group, or a heteroaryl group, and an alkyl group is preferable.

$R^{21}$ and $R^{22}$ may be bonded to each other to form a ring. Examples of the ring formed by $R^{21}$ and $R^{22}$ being bonded to each other include the structures shown in (2-1) to (2-3) below. In the following formulae, R represents a substituent. $R^{a1}$ to $R^{a4}$ each independently represent a hydrogen atom or a substituent, and m1 to m3 each independently represent an integer of 0 to 4. Examples of the substituent represented by R and $R^{a1}$ to $R^{a4}$ include the substituents described in $R^{21}$ and $R^{22}$, and an alkyl group is preferable.

(2-1)

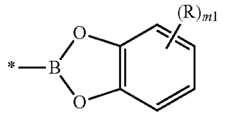

(2-2)

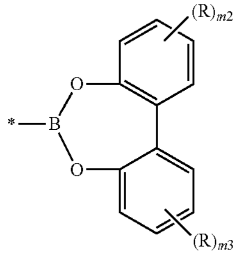

(2-3)

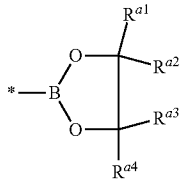

The coloring agent represented by General Formula (D1) is preferably a coloring agent represented by General Formula (D2).

General Formula (D2)

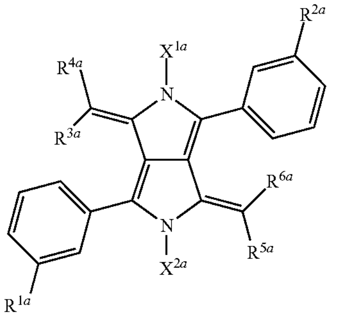

In General Formula (D2), $R^{1a}$ and $R^{2a}$ each independently represent a substituent, $R^{3a}$ and $R^{6a}$ each independently represent a substituent, and $R^{4a}$ and $R^{5a}$ each independently represent a heteroaryl group. $R^{3a}$ and $R^{4a}$ may be bonded to each other to form a ring, and $R^{5a}$ and $R^{6a}$ may be bonded to each other to form a ring. Xia and $X^2$ each independently represent —$BR^{21a}R^{22a}$, $R^{21a}$ and $R^{22a}$ each independently represent a substituent, and $R^{21a}$ and $R^{22a}$ may be bonded to each other to form a ring.

In General Formula (D2), $R^{3a}$ to $R^{6a}$, $X^{1a}$, $X^{2a}$, $R^{21a}$, and $R^{22a}$ have the same meanings as $R^{3A}$ to $R^{6A}$, $X^1$, $X^2$, $R^{21}$, and $R^{22}$, and the same applies to the preferred ranges thereof.

The substituents as $R^{1a}$ and $R^{2a}$ respectively have the same meaning as the substituents which may be contained in the alkyl group, the aryl group, and the heteroaryl group as $R^{1A}$ and $R^{2A}$, and the same applies to the preferred ranges thereof.

The coloring agent represented by General Formula (D1) is more preferably a coloring agent represented by General Formula (D3).

General Formula (D3)

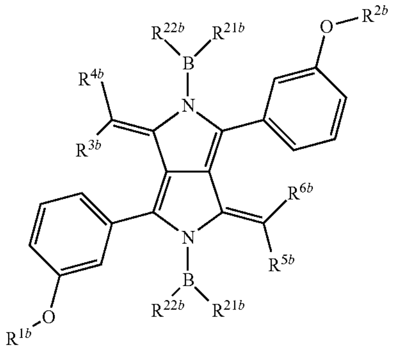

In General Formula (D3), $R^{1b}$ and $R^{2b}$ each independently represent a branched alkyl group, and $R^{3b}$ and $R^{6b}$ each independently represent a substituent, $R^{4b}$ and $R^{5b}$ each independently represent a heteroaryl group. $R^{3b}$ and $R^{4b}$ may be bonded to each other to form a ring, and $R^{5b}$ and $R^{6b}$ may be bonded to each other to form a ring. $R^{21b}$ and $R^{22b}$ each independently represent a substituent, and $R^{21b}$ and $R^{22b}$ may be bonded to each other to form a ring.

$R^{1b}$ and $R^{2b}$ each independently represent a branched alkyl group. The number of carbon atoms thereof is preferably 3 to 40. The lower limit thereof is, for example, more preferably 5 or more, still more preferably 8 or more, and even still more preferably 10 or more. The upper limit thereof is more preferably 35 or less and still more preferably 30 or less. The number of branches in the branched alkyl group is preferably 2 to 10 and more preferably 2 to 8.

$R^{3b}$ to $R^{6b}$, and $R^{21b}$ and $R^{22b}$ respectively have the same meanings as $R^{3A}$ to $R^{6A}$, $R^{21}$, and $R^{22}$, and the same applies to the preferred ranges thereof.

That is, $R^{3b}$ and $R^{6b}$ each are preferably an electron withdrawing group and more preferably a cyano group.

$R^{21b}$ and $R^{22b}$ are each independently preferably a halogen atom, an alkyl group, an alkoxy group, an aryl group, or a heteroaryl group, more preferably a halogen atom, an aryl group, or an aryl group, and still more preferably an aryl group.

Specific examples of the dye D are shown below. Compounds D-1 to D-24 and D-28 to D-90 shown below are coloring agents represented by General Formula (D1).

In the following structural formulae, "i" in i-$C_{10}H_{21}$ and the like represents the corresponding compound is present in a branched state.

In addition, Bu represents a butyl group, and Ph represents a phenyl group.

D-1

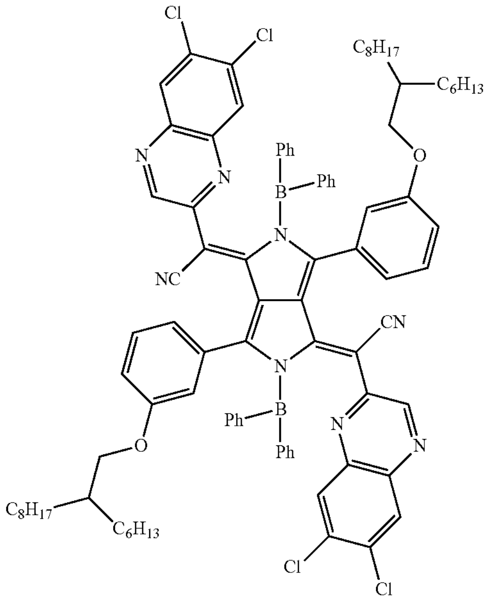

D-2

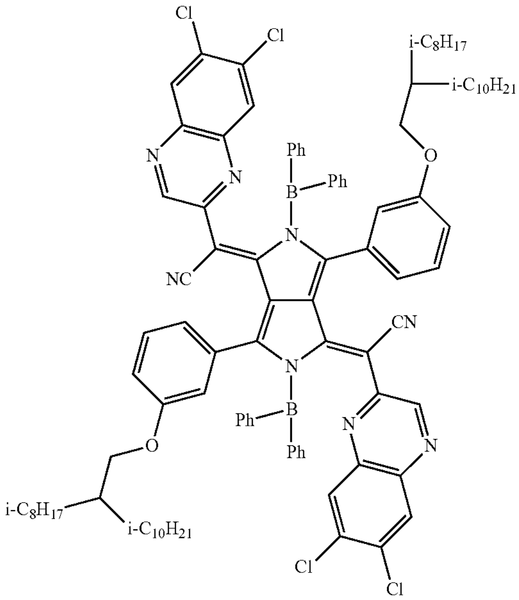

-continued
D-3
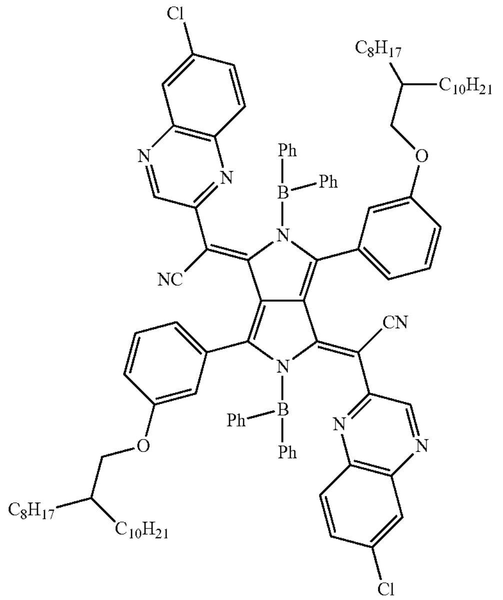
D-4
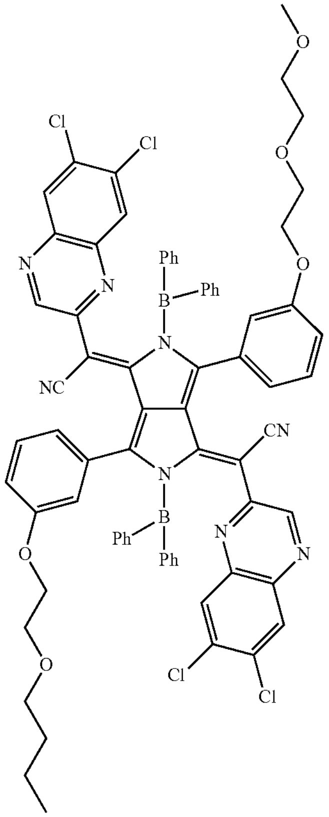
D-5
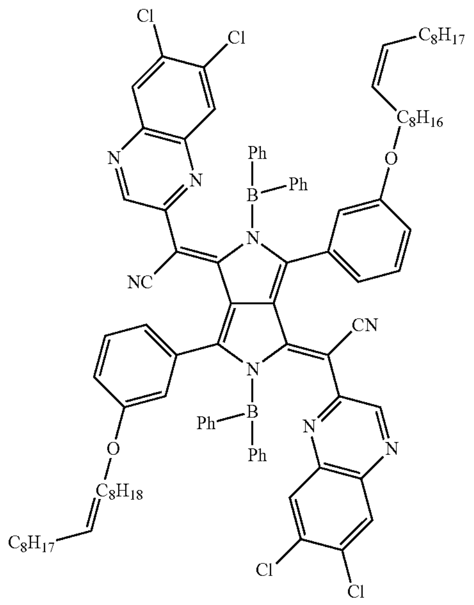

-continued
D-6
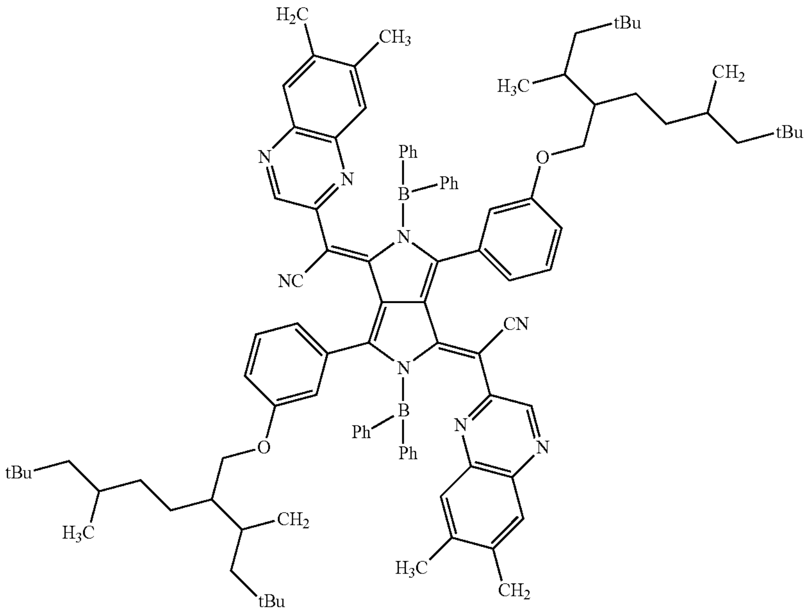
D-7
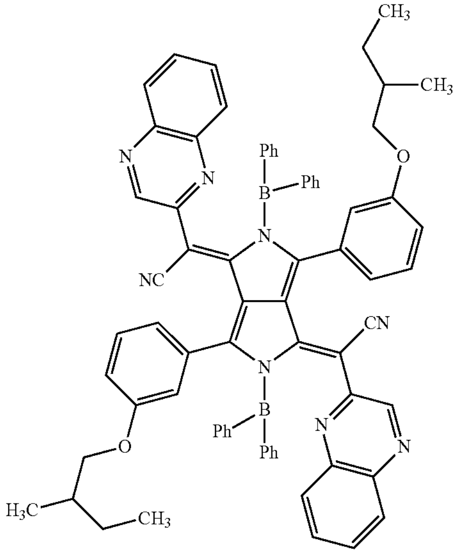
D-8
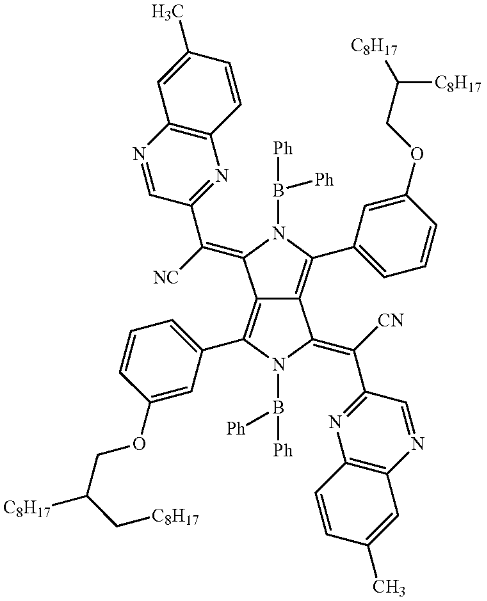

-continued
D-9
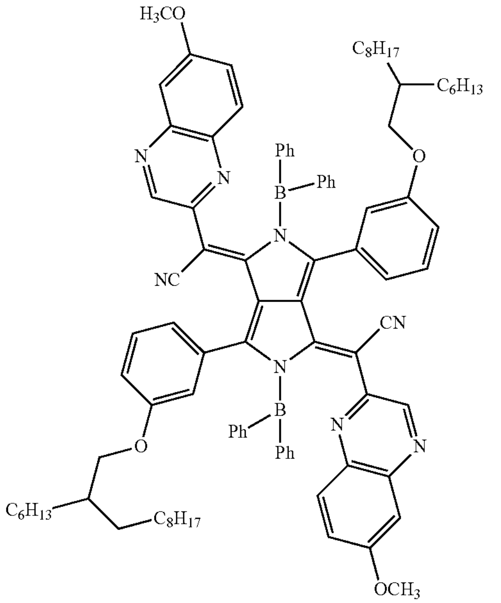
D-10
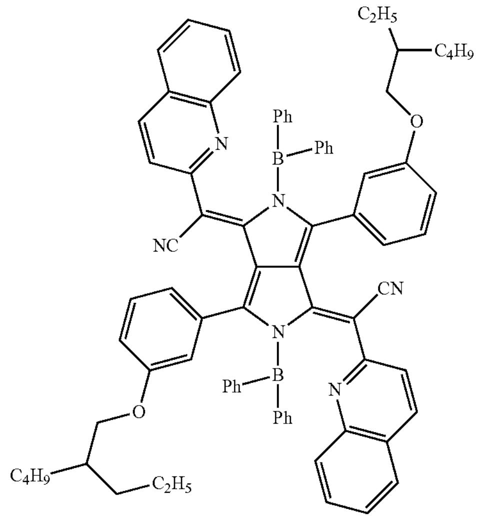
D-11
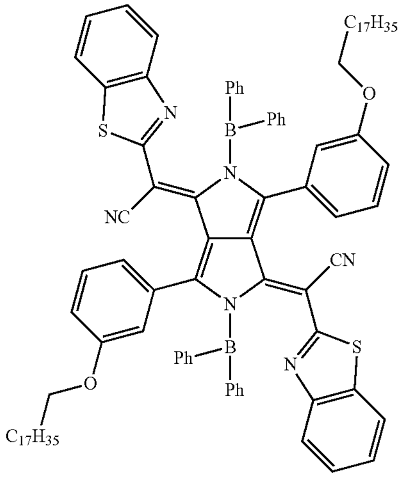
D-12
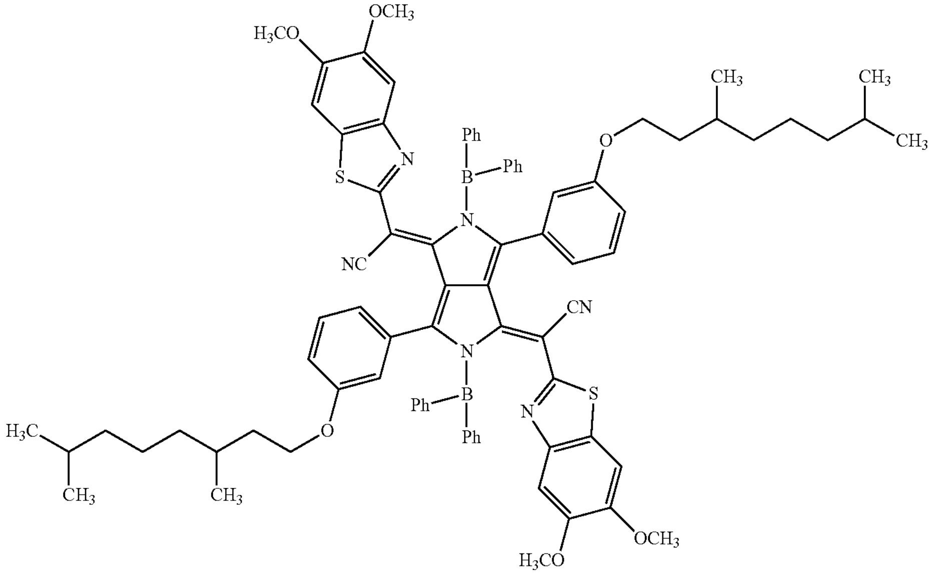

-continued
D-13
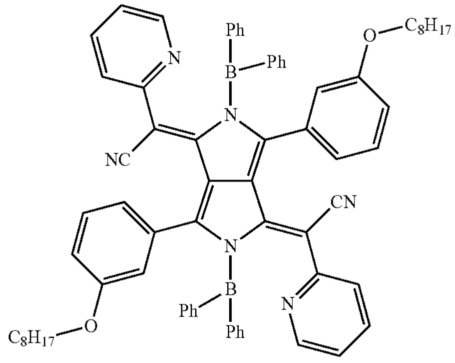
D-14
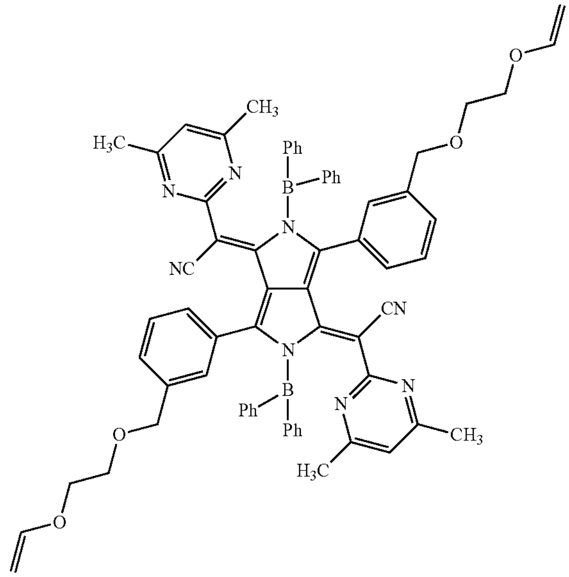
D-15
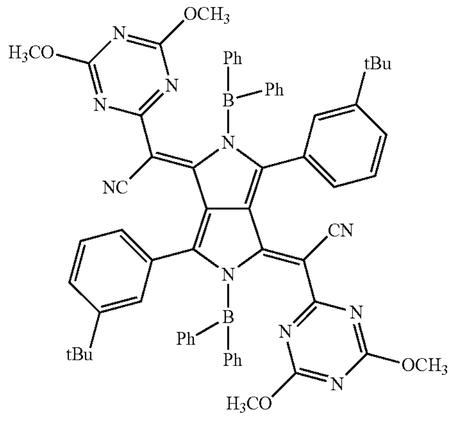
D-16
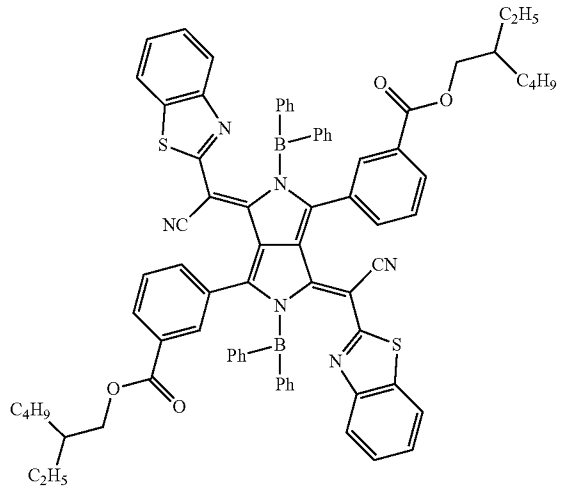
D-17
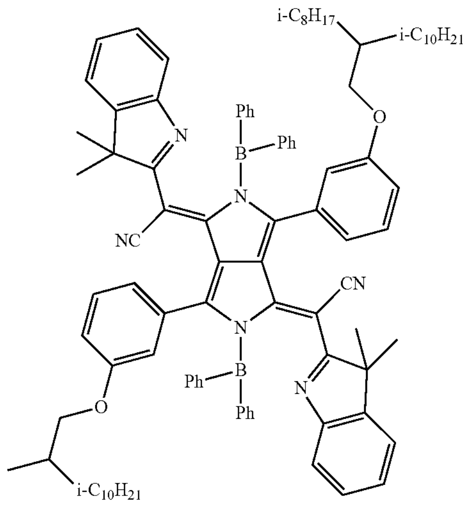
D-18
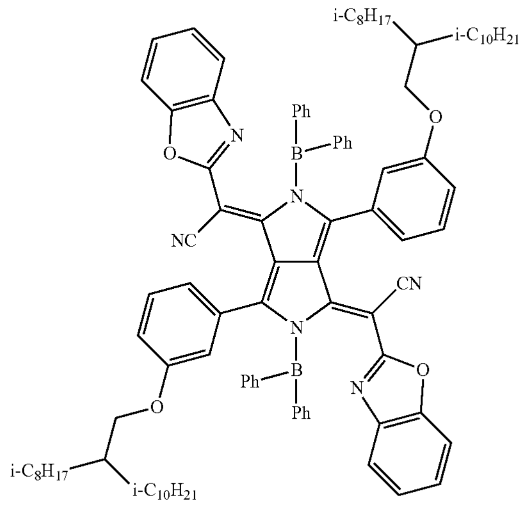

-continued
D-19
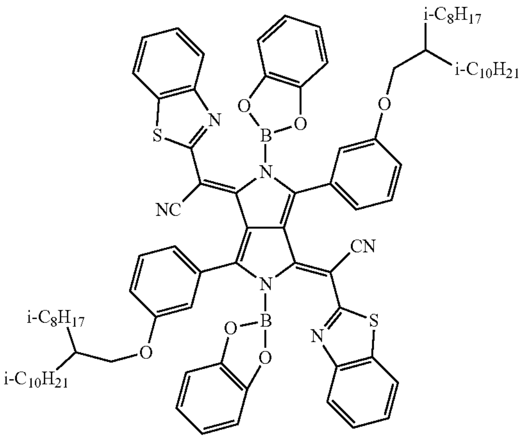
D-20
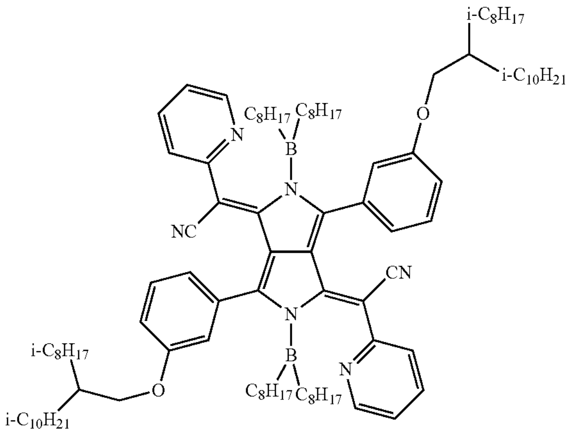
D-21
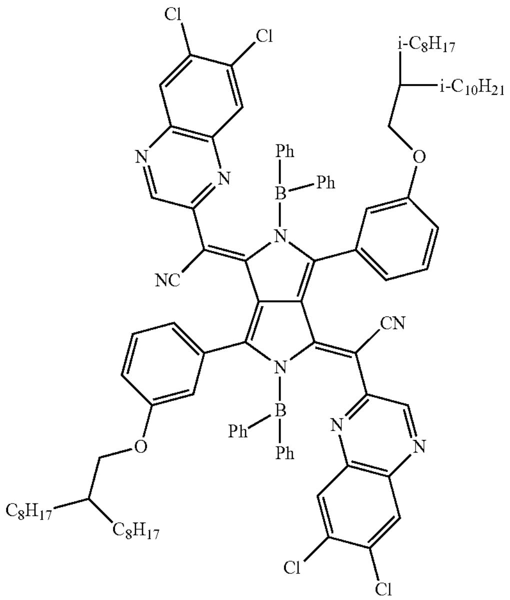
D-22
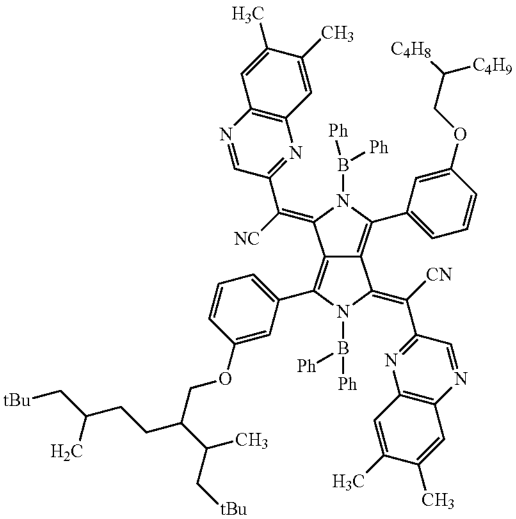
D-23
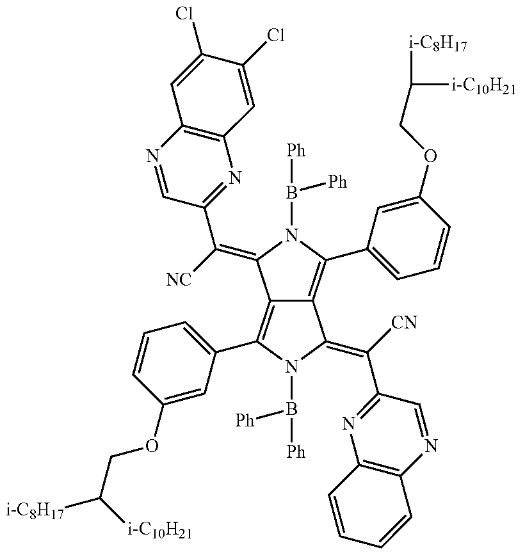
D-24
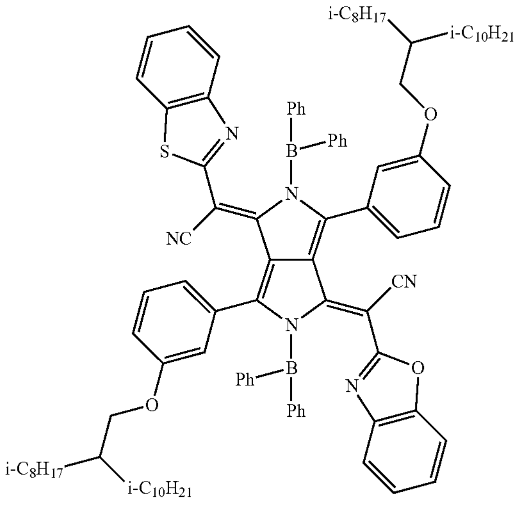

-continued
D-28
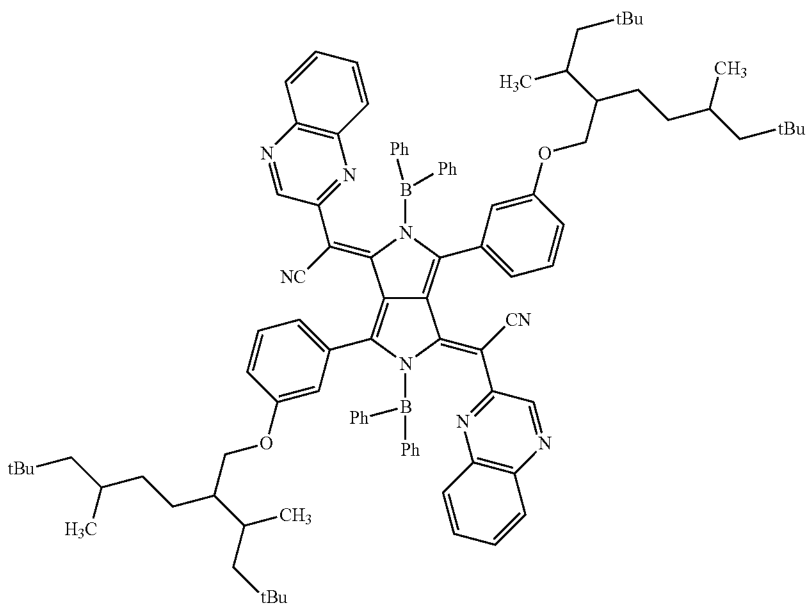
D-29
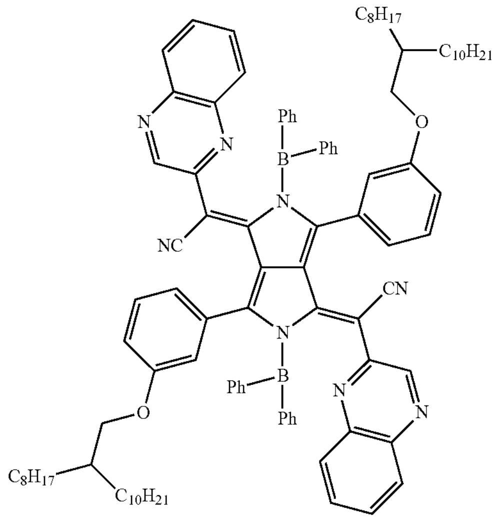
D-30
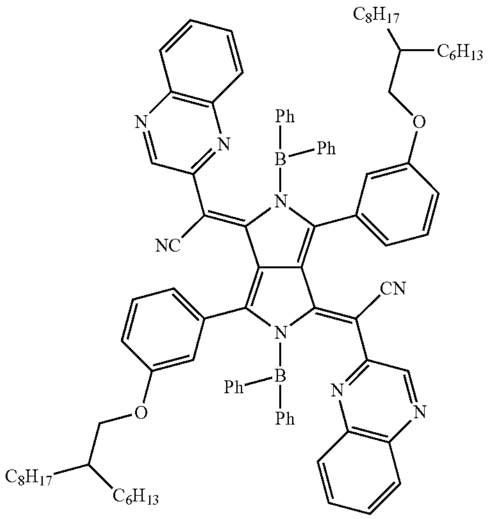

-continued
D-31
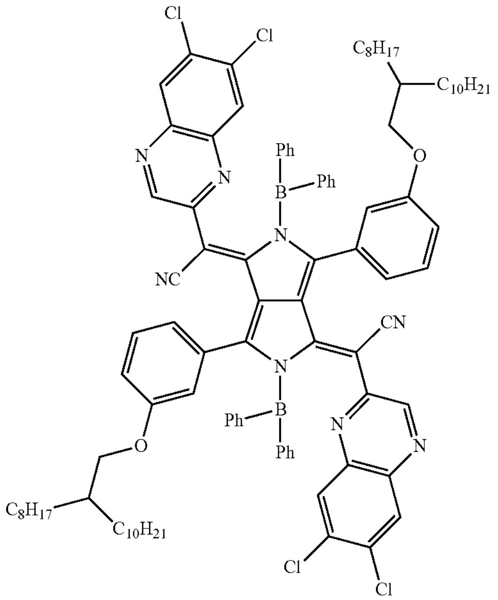
D-32
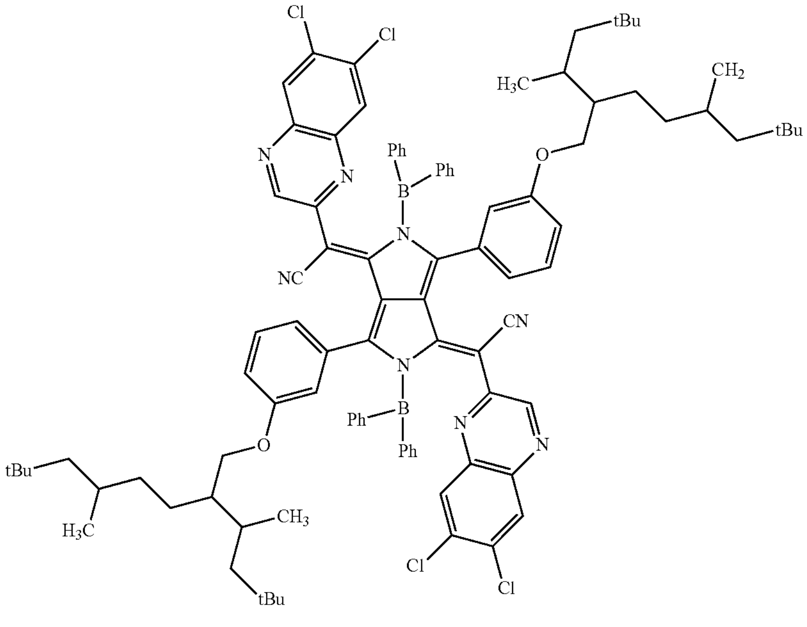

-continued
D-33
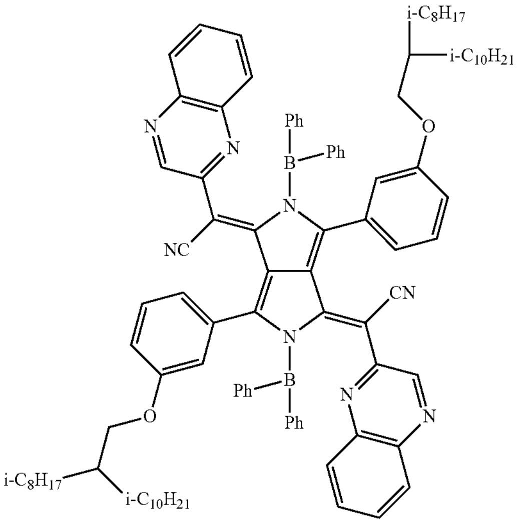
D-34
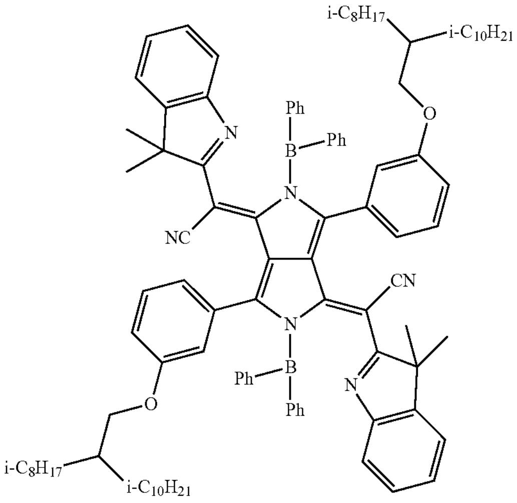
D-35
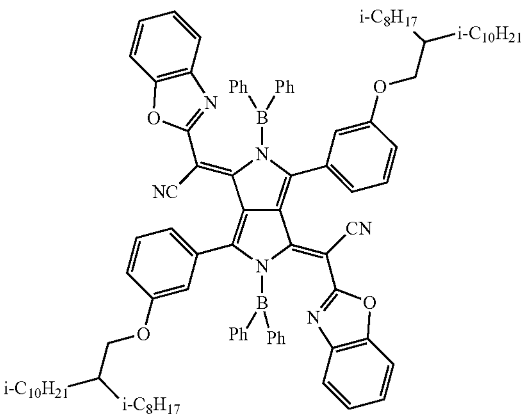
D-36
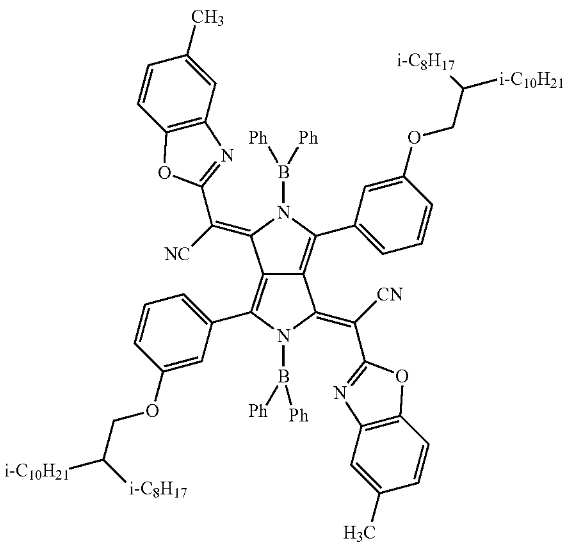
D-37
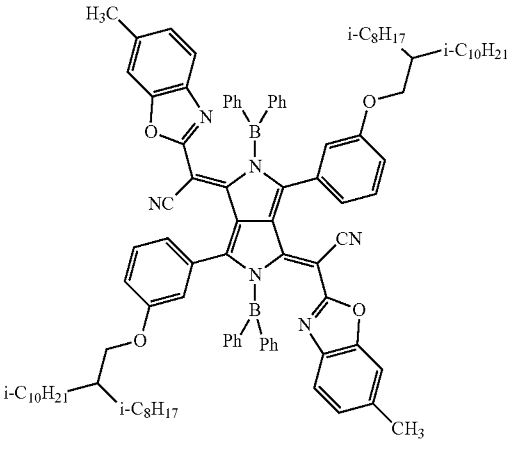
D-38
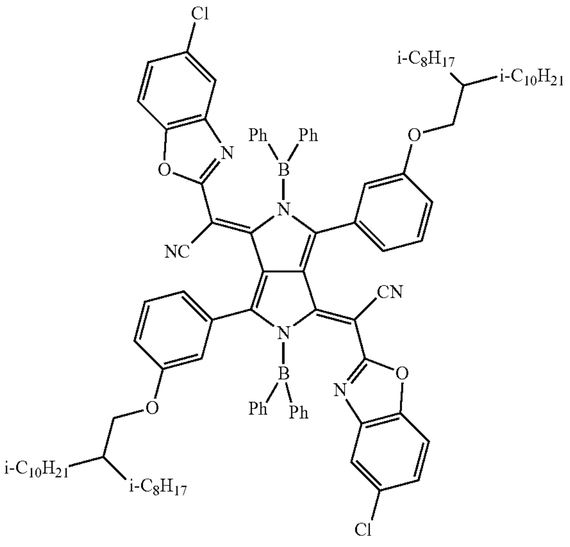

-continued
D-39
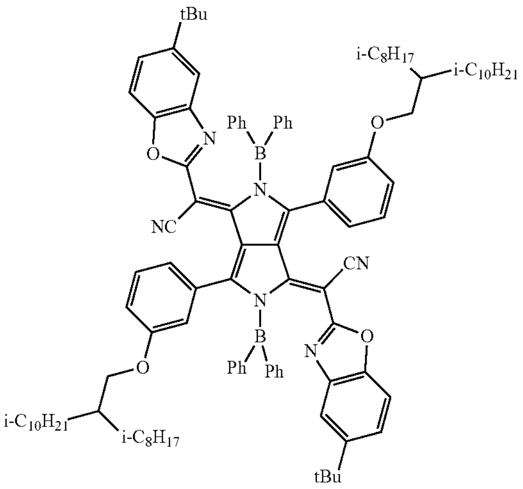
D-40
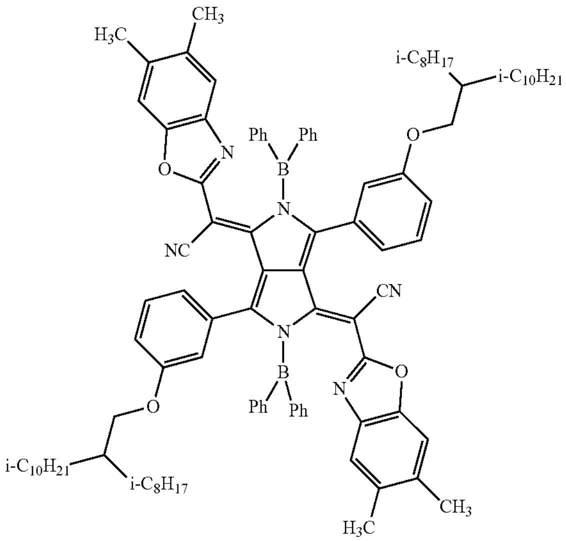
D-41
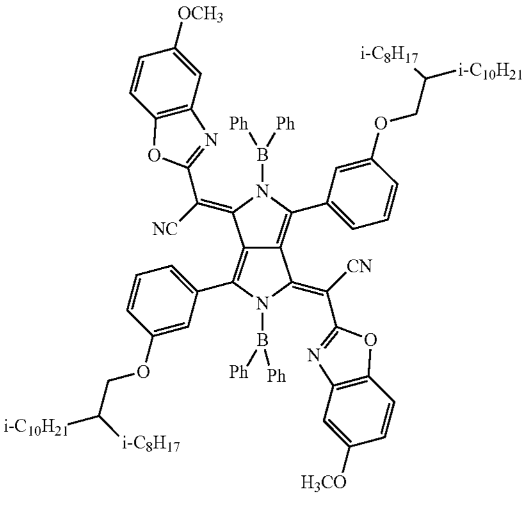
D-42
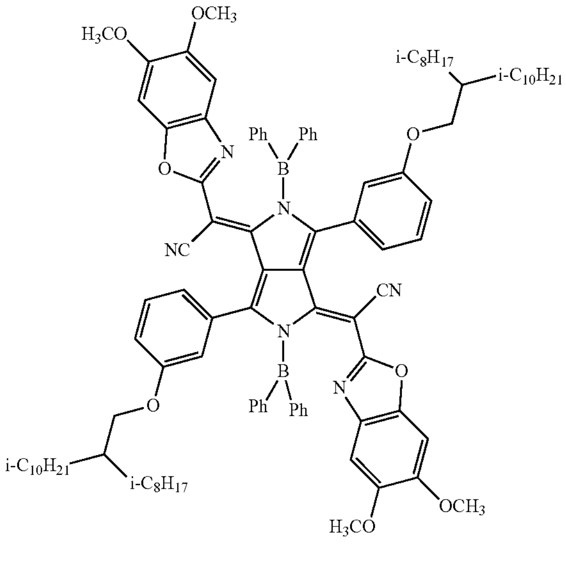

-continued
D-43
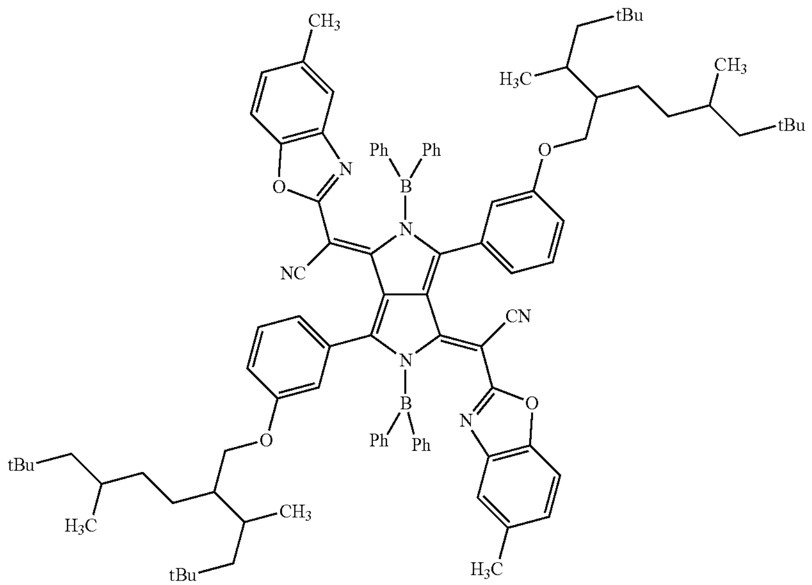
D-44
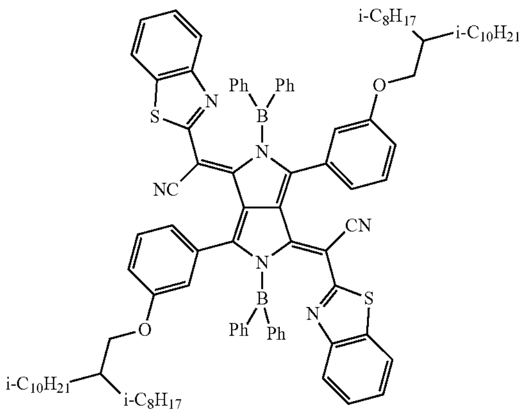
D-45
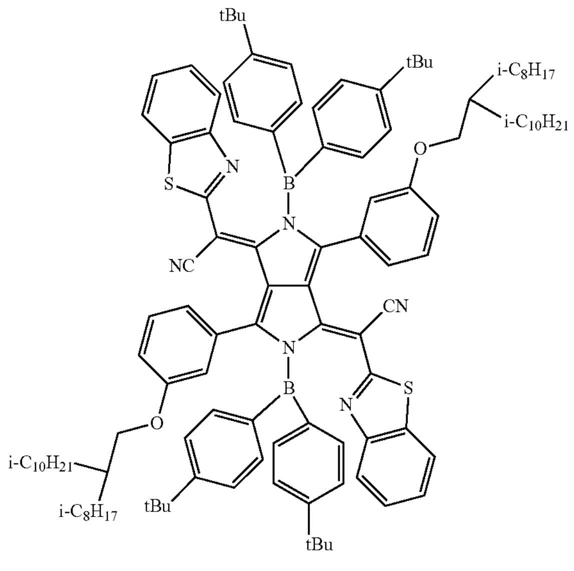

-continued
D-46
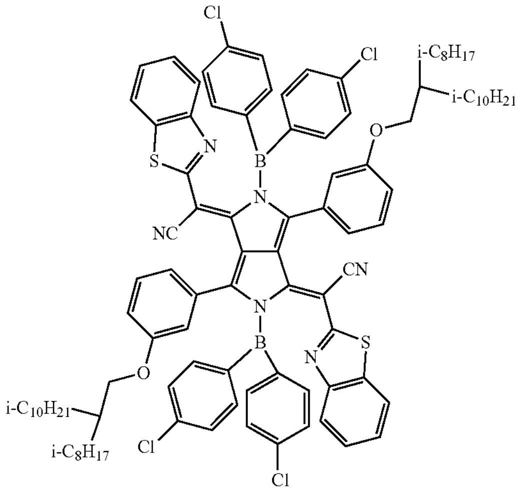
D-47
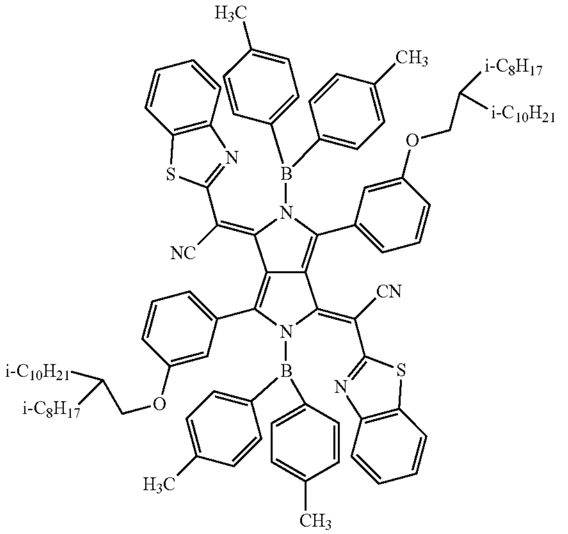
D-48
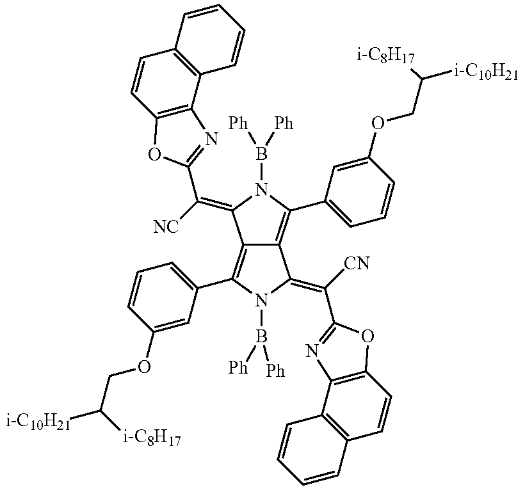
D-49
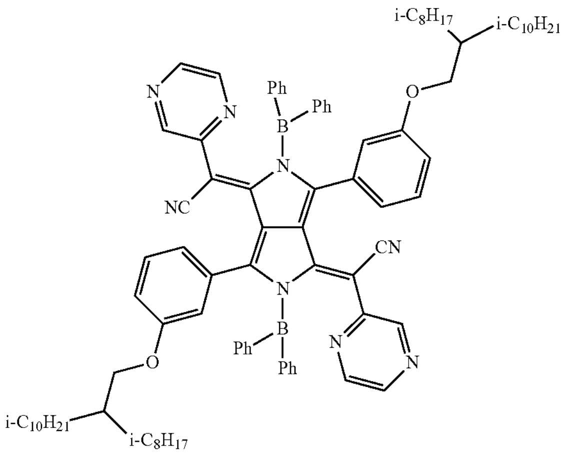
D-50
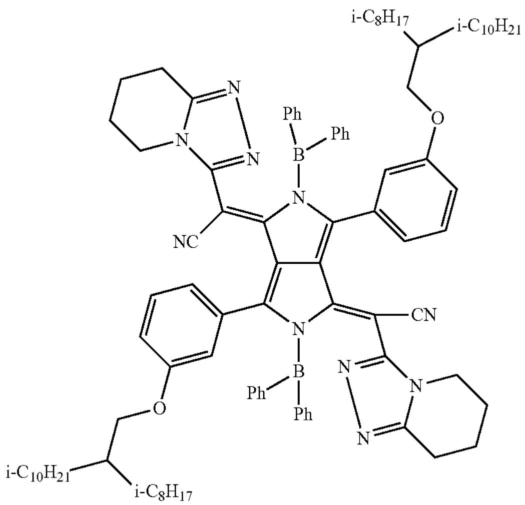
D-51
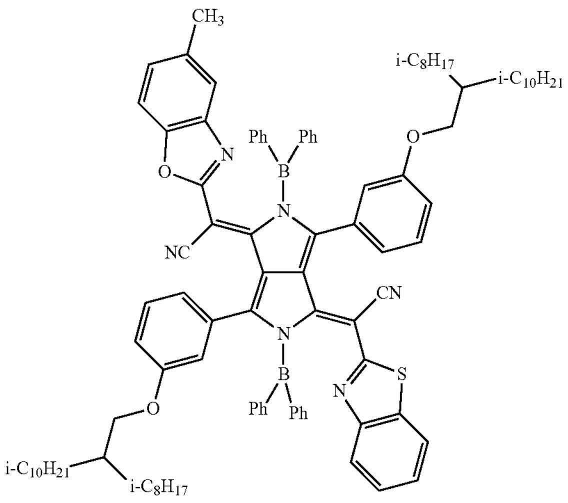

-continued
D-52
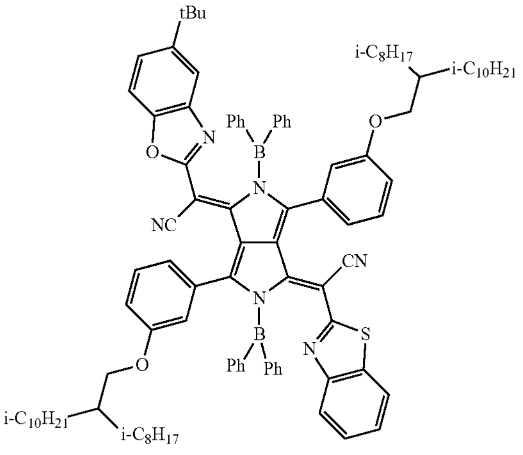
D-53
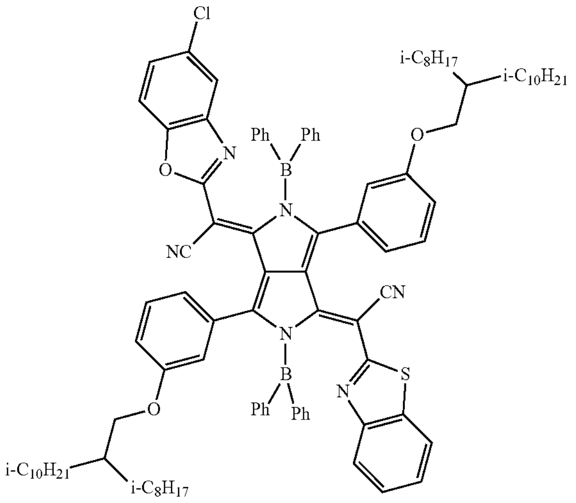
D-54
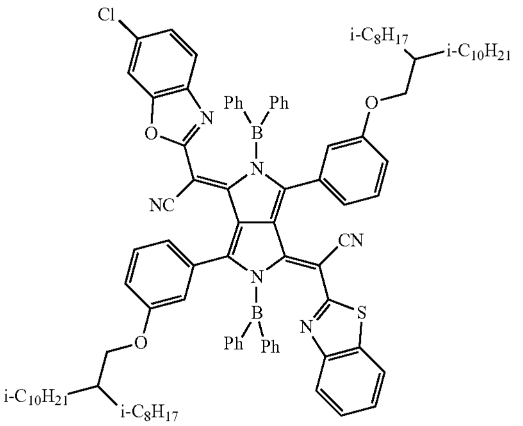
D-55
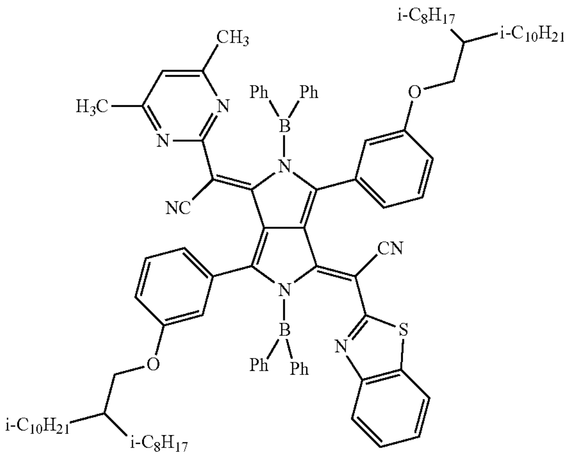
D-56
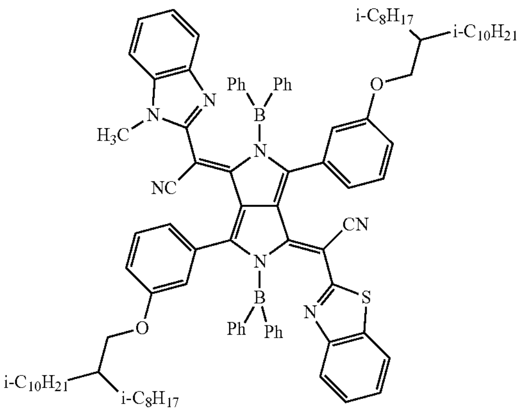
D-57
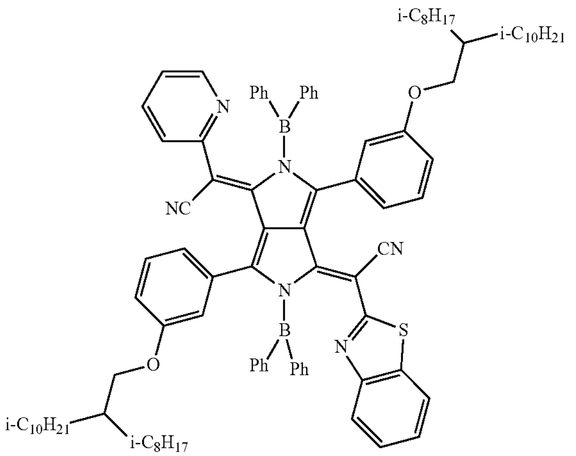

-continued
D-58
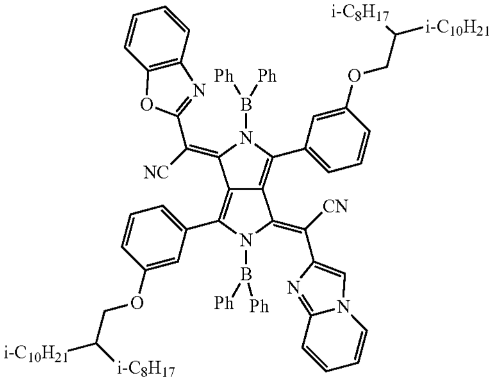
D-59
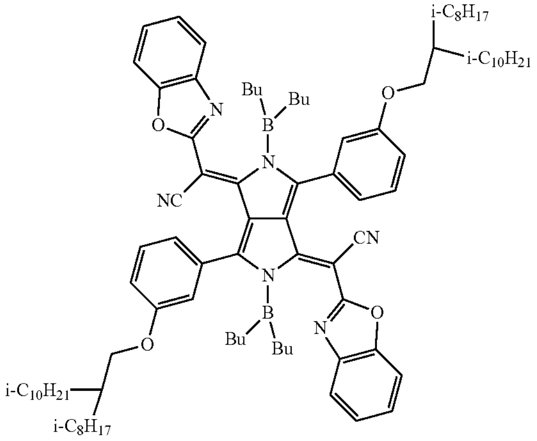
D-60
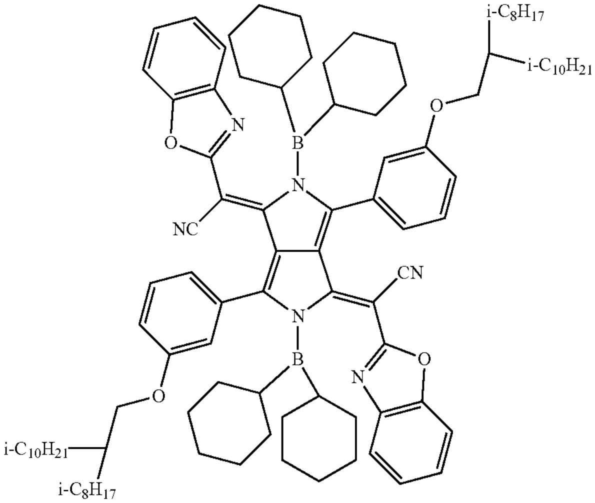
D-61
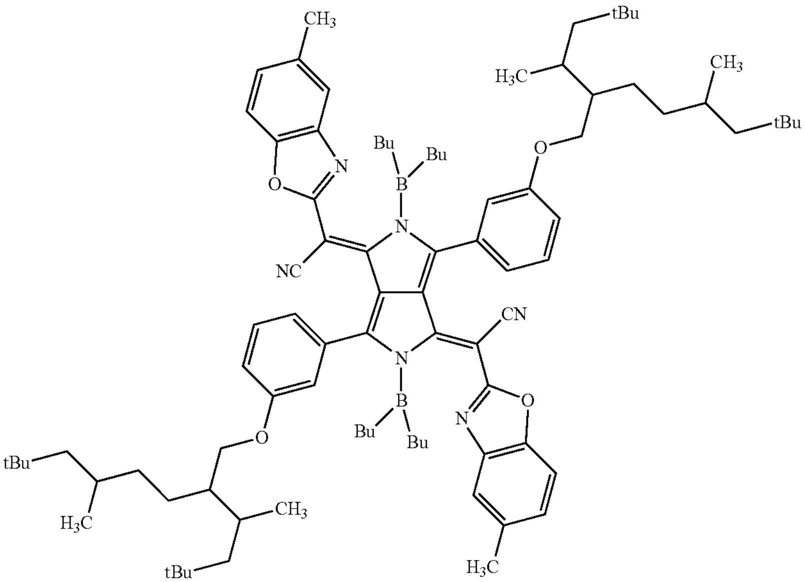

-continued
D-62
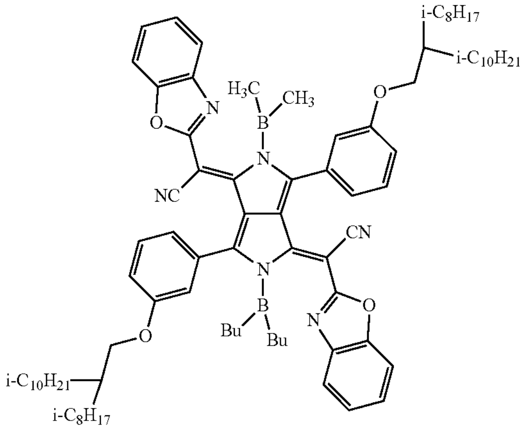
D-63
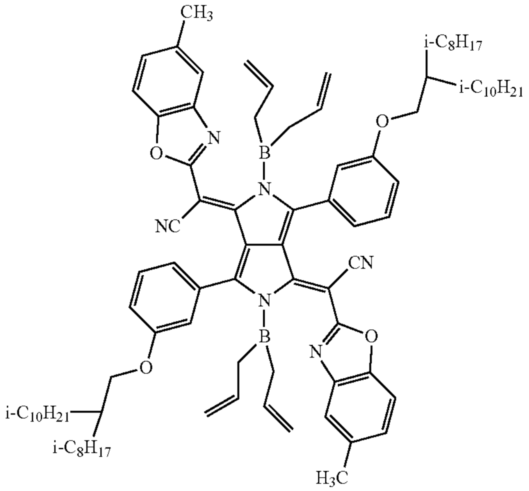
D-64
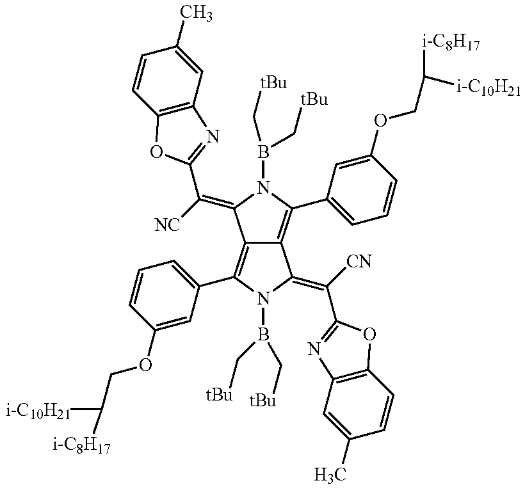
D-65
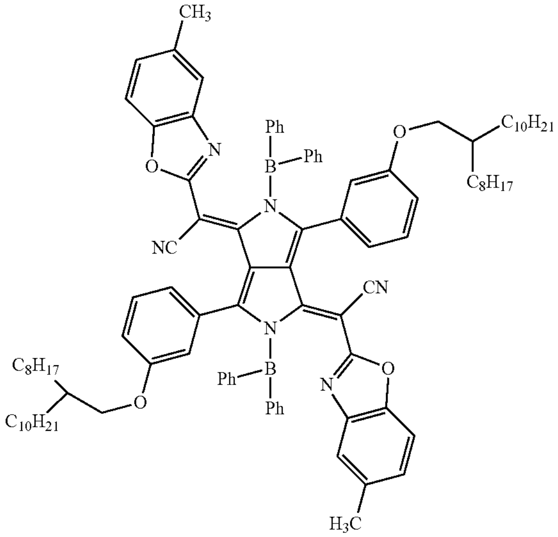
D-66
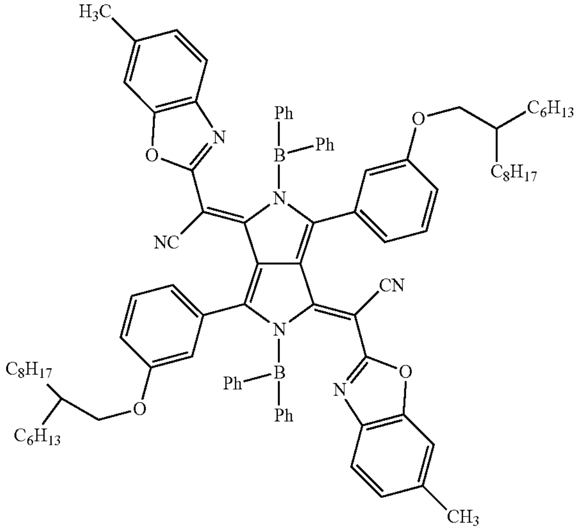

-continued
D-67
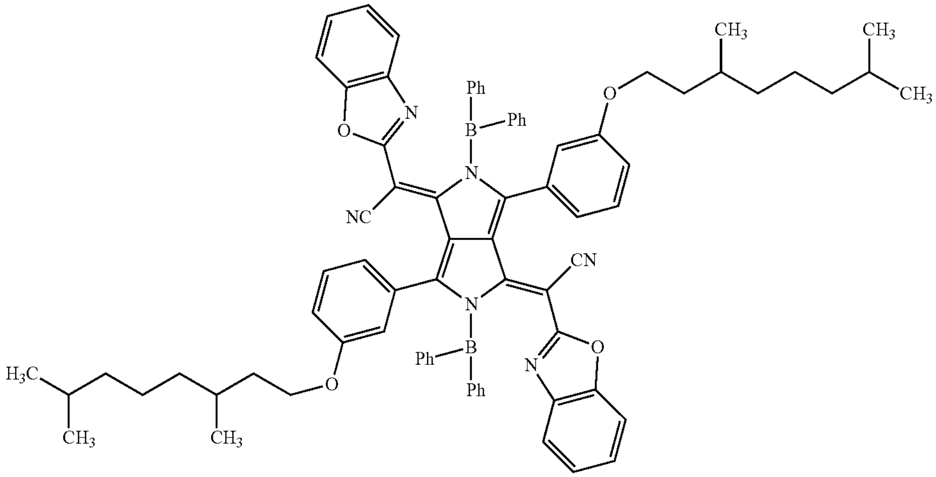
D-68
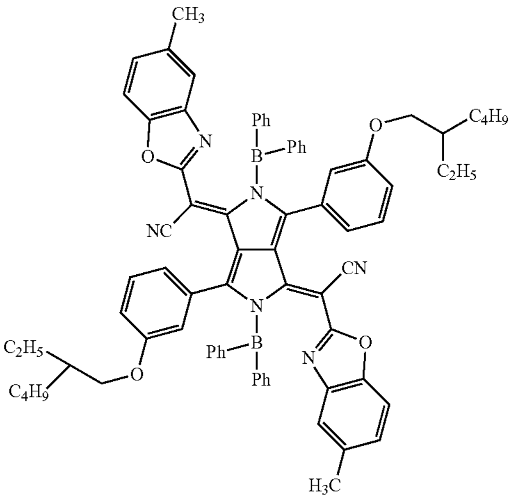
D-69
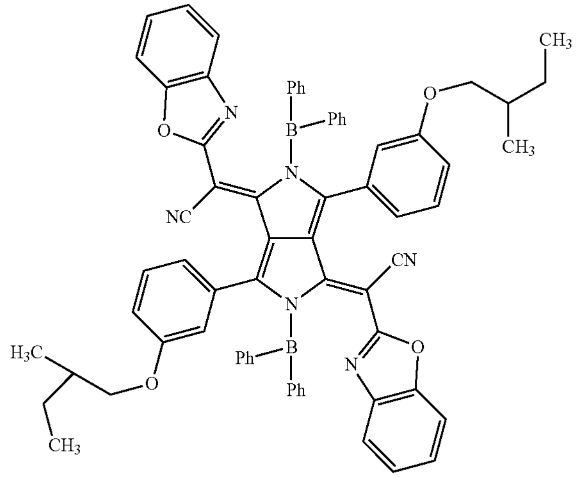
D-70
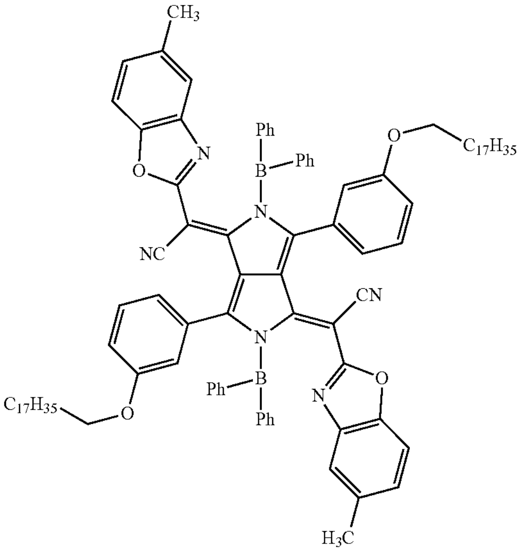
D-71
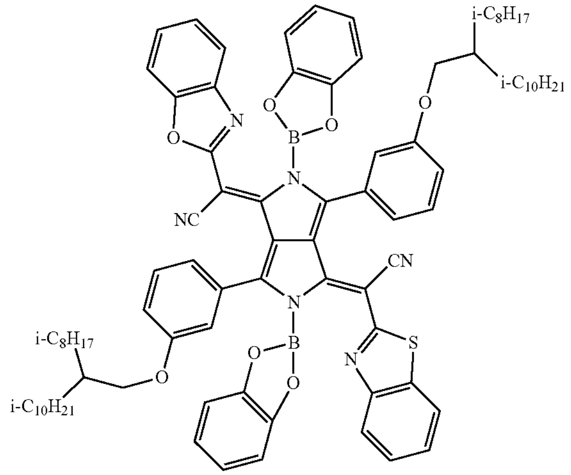

-continued
D-72
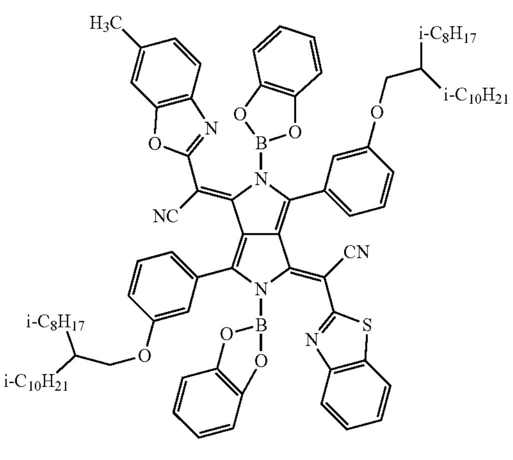
D-73
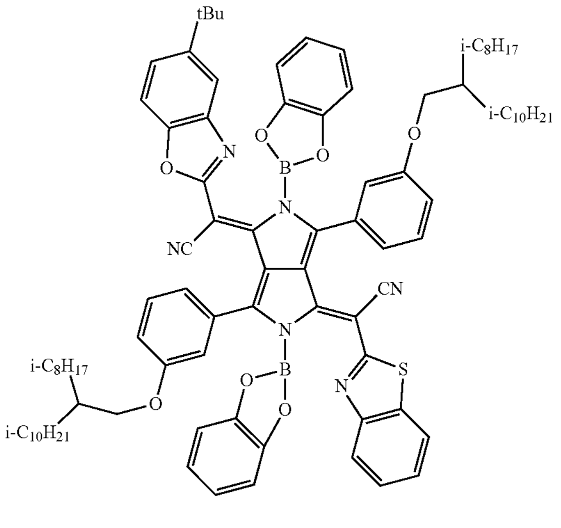
D-74
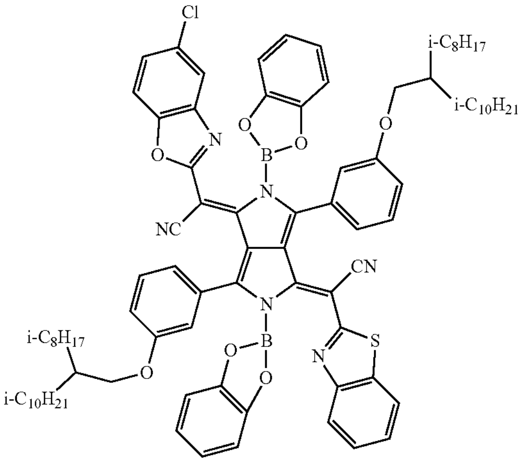
D-75
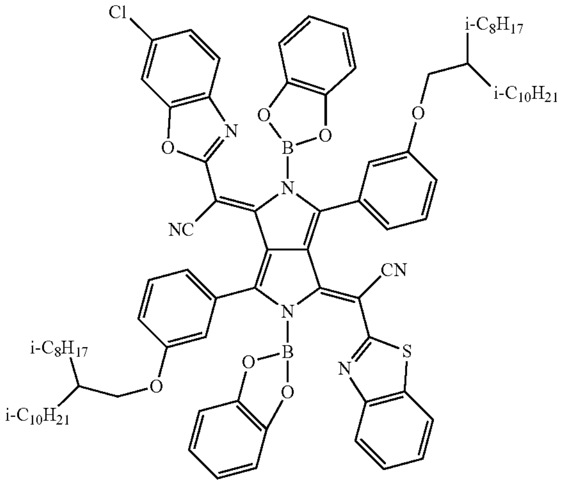
D-76
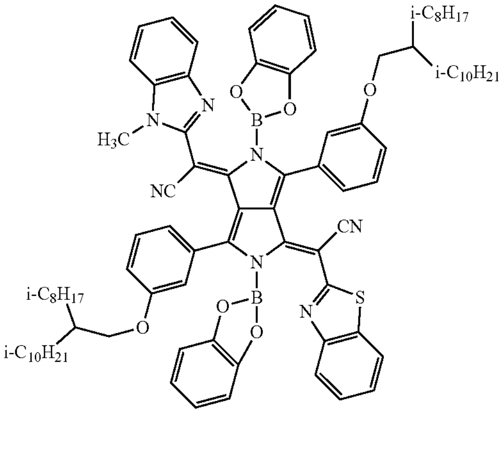
D-77
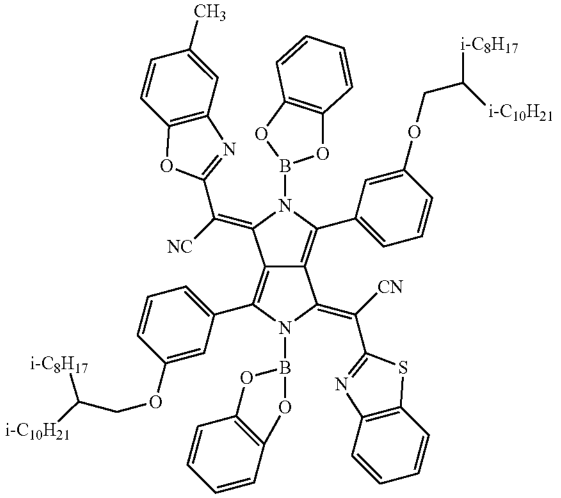

-continued
D-78
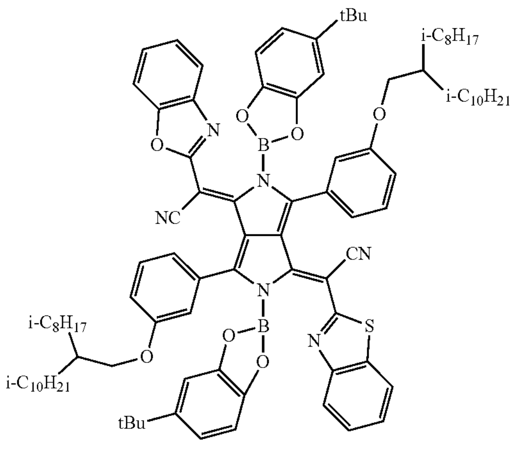
D-79
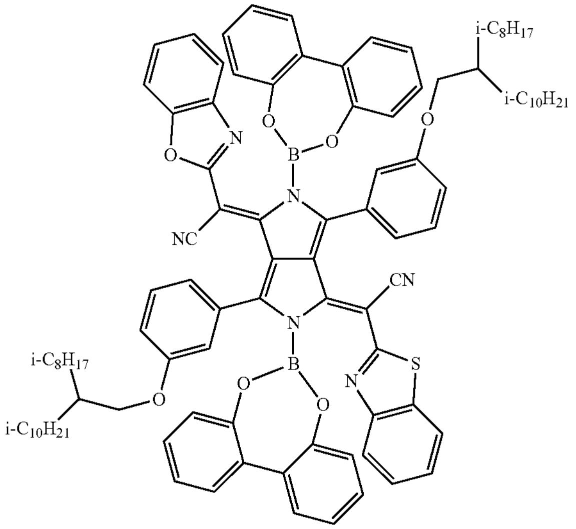
D-80
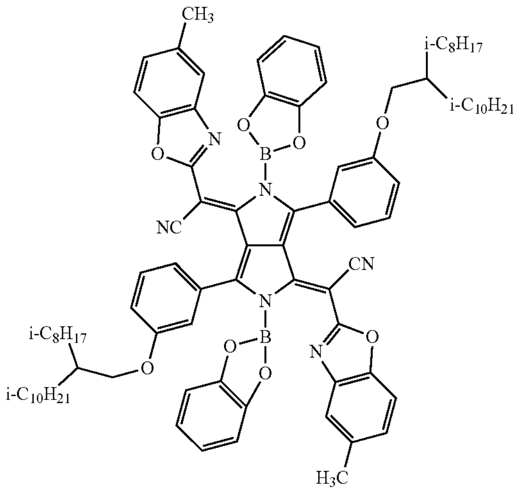
D-81
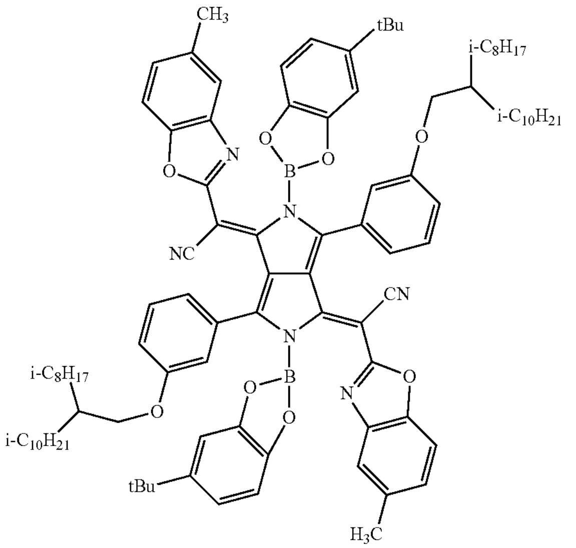
D-82
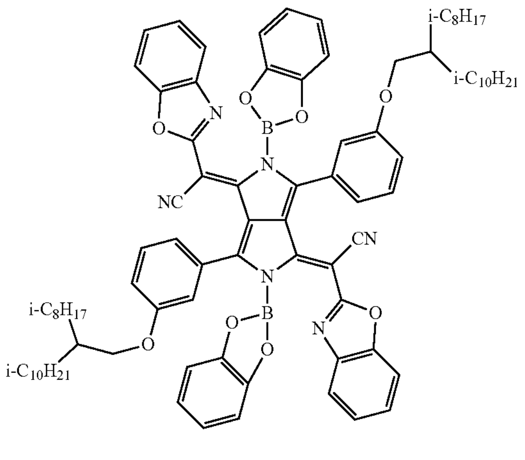
D-83
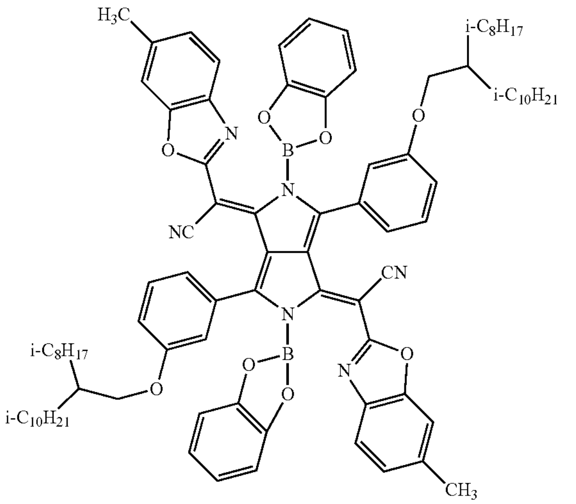

-continued
D-84
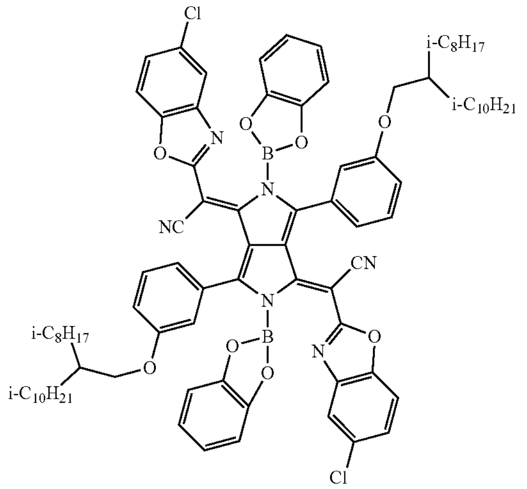
D-85
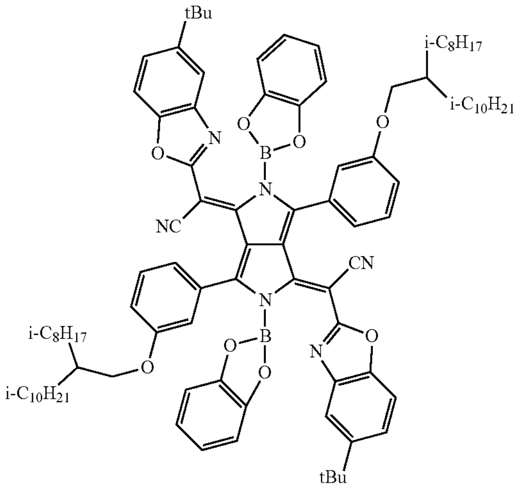
D-86
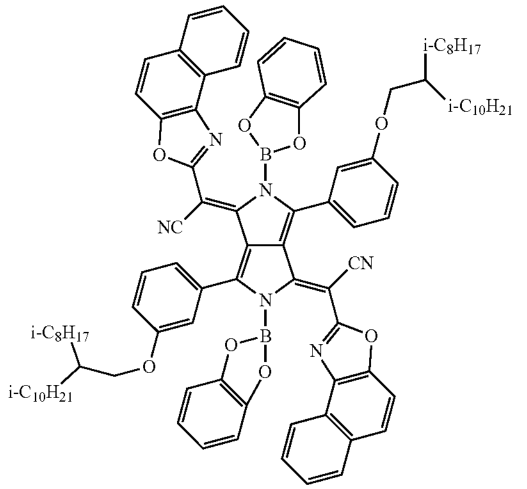
D-87
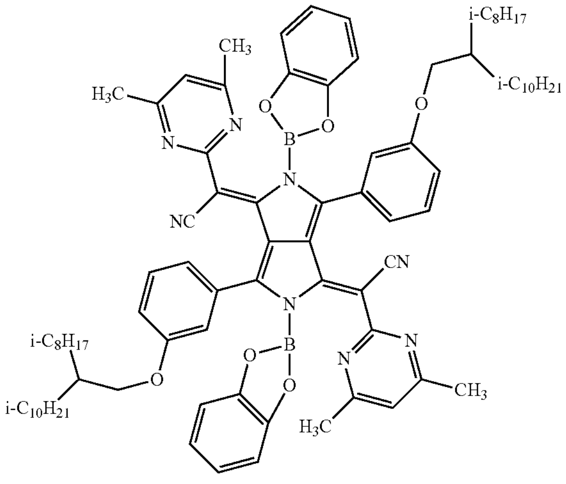
D-88
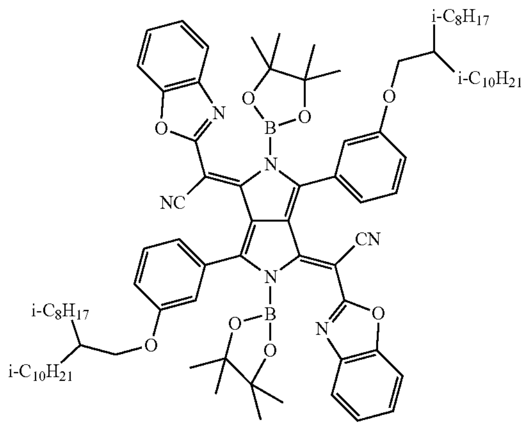
D-89
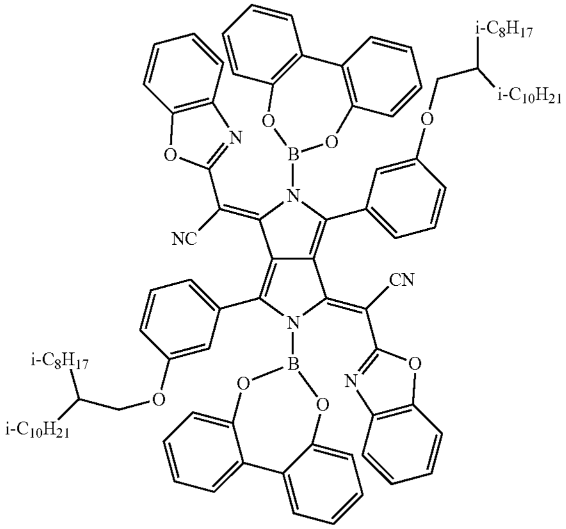

-continued

D-90

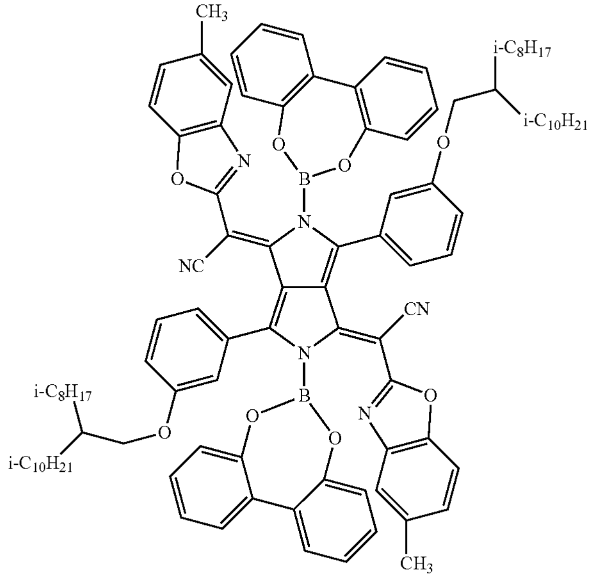

(Coloring Agent Represented by General Formula (1))

General Formula (1)

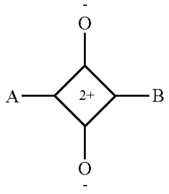

The aspects that can be employed by A and B in General Formula (1) are respectively the same as those of A and B in General Formula (1) described in the above-described dye B and dye C.

In a case where the dye D is a coloring agent represented by General Formula (1), a coloring agent represented by General Formula (14) is preferable.

General Formula (14)

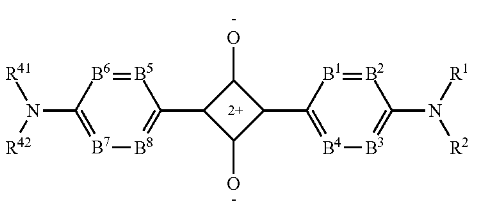

In General Formula (14), $R^1$ and $R^2$ respectively have the same meaning as $R^1$ and $R^2$ in General Formula (2) described above. $R^{41}$ and $R^{42}$ respectively have the same meaning as $R^1$ and $R^2$ in General Formula (2) described above.

Among the above, $R^1$, $R^2$, $R^{41}$, and $R^{42}$ is preferably an alkyl group, an alkenyl group, an aryl group, or a heteroaryl group, more preferably an alkyl group, an aryl group, or a heteroaryl group, and still more preferably an alkyl group or an aryl group is.

$R^1$, $R^2$, $R^{41}$, and $R^{42}$ may further have a substituent. Examples of the substituent which may be further contained include the substituent X.

$B^1$, $B^2$, $B^3$, and $B^4$ in General Formula (14) respectively have the same meaning as $B^1$, $B^2$, $B^3$, and $B^4$ in General Formula (2) described above. In addition, $B^5$, $B^6$, $B^7$, and $B^8$ in General Formula (14) respectively have the same meaning as $B^1$, $B^2$, $B^3$, and $B^4$ in General Formula (2) described above.

The substituent possessed by the carbon atom that can be employed as $B^1$, $B^2$, $B^3$, $B^4$, $B^5$, $B^6$, $B^7$, and $B^8$ may further have a substituent. Examples of this substituent which may be further contained include the substituent X.

In General Formula (14), $R^1$ and $R^2$ may be bonded to each other to form a ring, and $R^1$ or $R^2$ and the substituent contained in $B^2$ or $B^3$ may be bonded to each other to form a ring. In addition, $R^{41}$ and $R^{42}$ may be bonded to each other to form a ring, and $R^{41}$ or $R^{42}$ and the substituent contained in $B^6$ or $B^7$ may be bonded to each other to form a ring.

In the above description, the ring to be formed is preferably a heterocyclic ring or a heteroaryl ring, and it is preferably a 5-membered ring or a 6-membered ring although the size of the ring to be formed is not particularly limited. Further, the number of rings to be formed is not particularly limited, and it may be one or two or more. Examples of the form in which two or more rings are formed include a form in which the substituents of $R^1$ and $B^2$ and the substituents of $R^2$ and $B^3$ are respectively bonded to each other to form two rings.

Among the dyes D, the squarine-based coloring agent represented by General Formula (1) may be an electron migration-type antifading agent-embedded coloring agent. To the electron migration-type antifading agent-embedded coloring agent, the description related to the electron migration-type antifading agent-embedded coloring agent in the dye B or C described above can be applied.

Specific examples of the dye D are shown below. The following compounds F-1 to F-44 are coloring agents represented by General Formula (1). Among these, compounds F-24 to F-33 and F-44 correspond to electron migration-type antifading agent-embedded coloring agents.

F-1
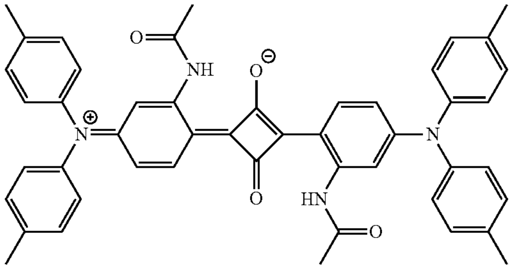
F-2
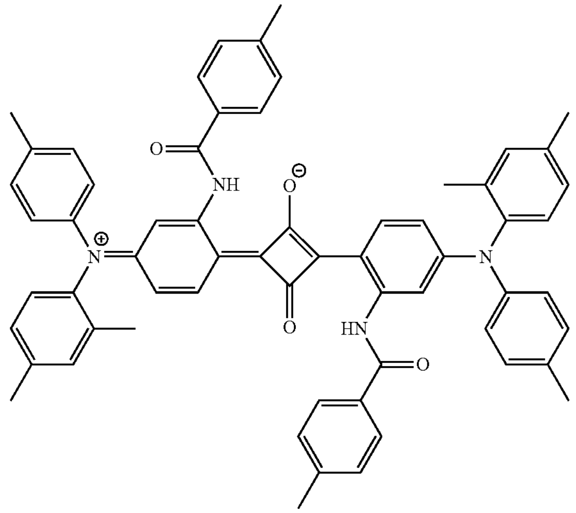
F-3
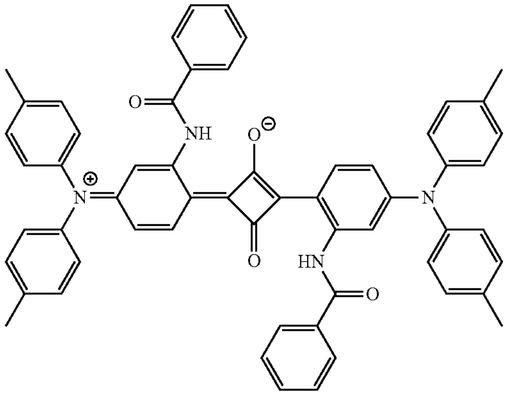
F-4
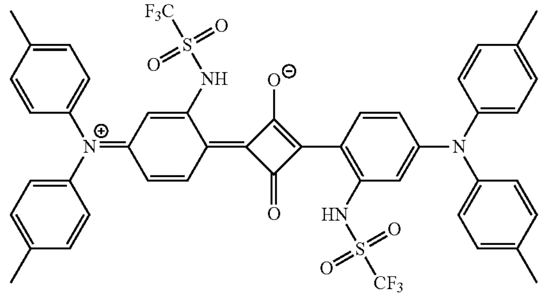
F-5
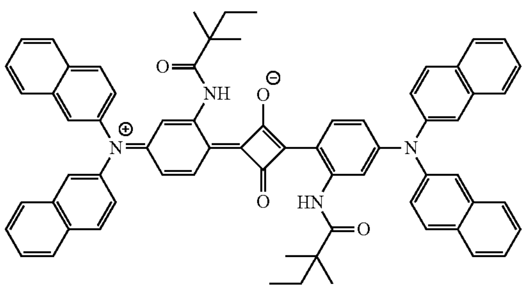
F-6
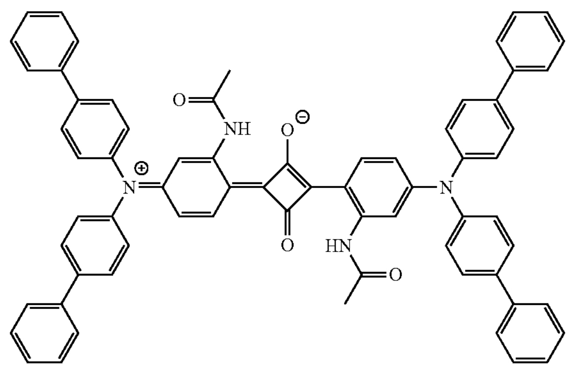

-continued
F-7
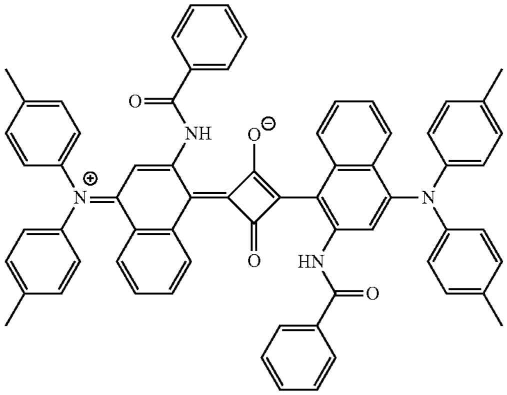
F-8
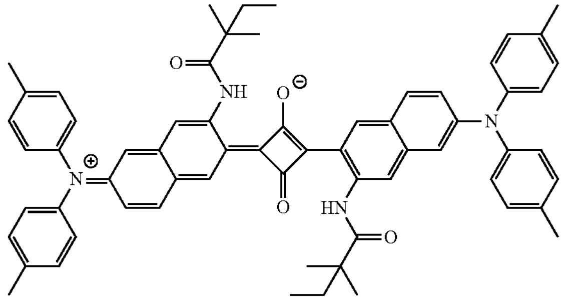
F-9
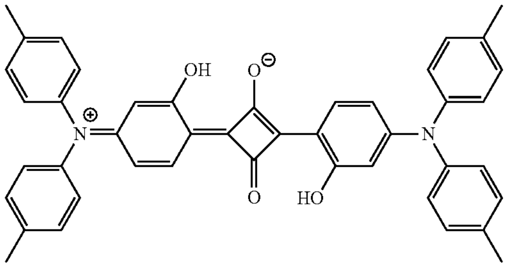
F-10
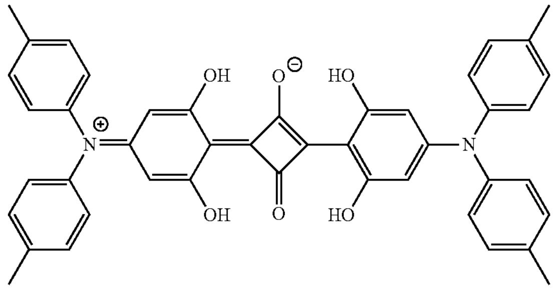
F-11
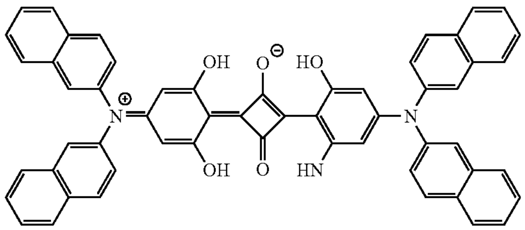
F-12
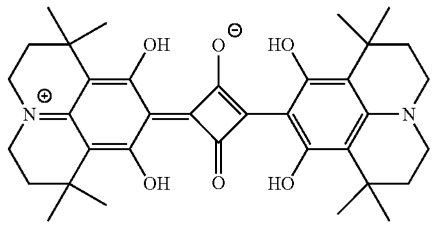
F-13
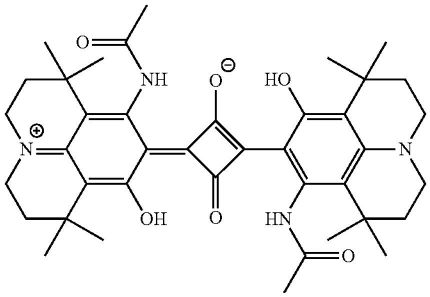
F-14
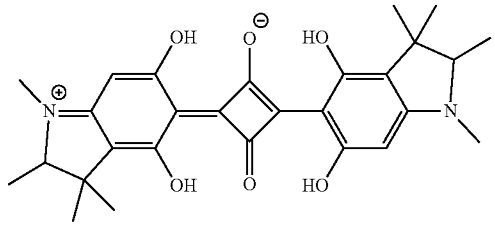

-continued
F-15
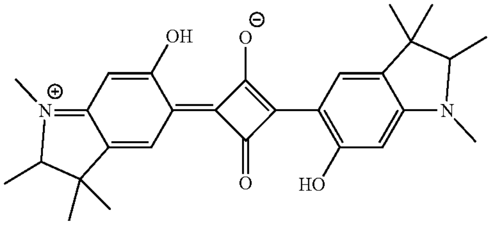
F-16
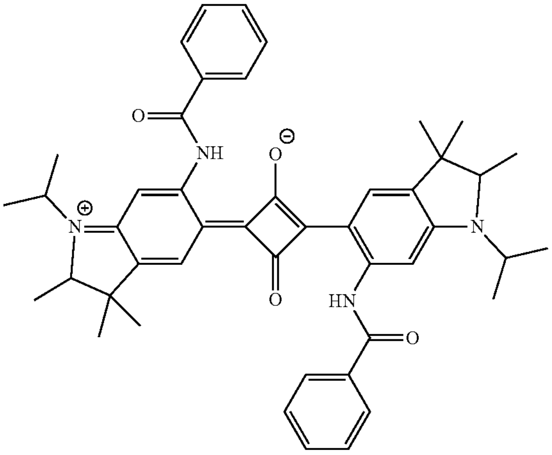
F-17
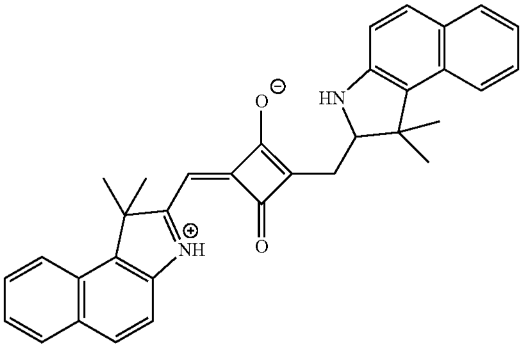
F-18
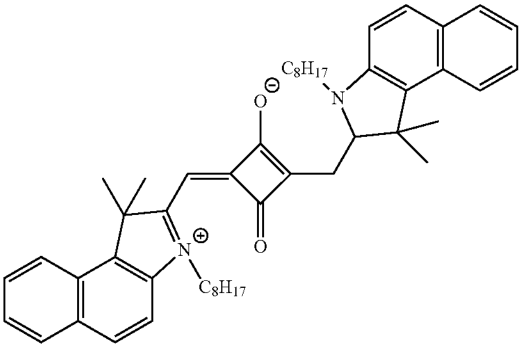
F-19
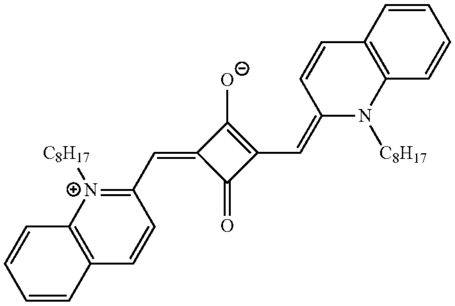
F-20
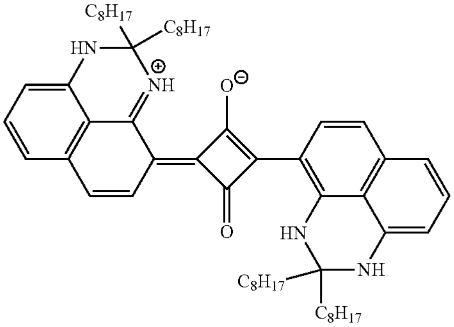

-continued
F-21
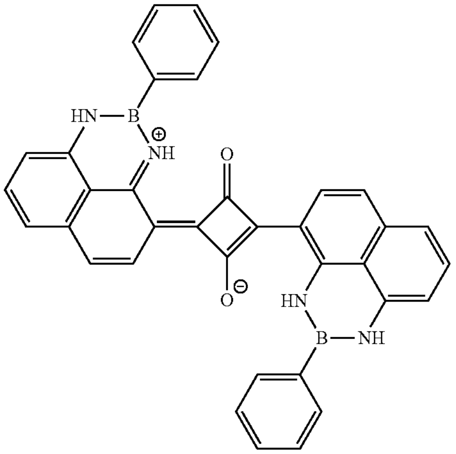
F-22
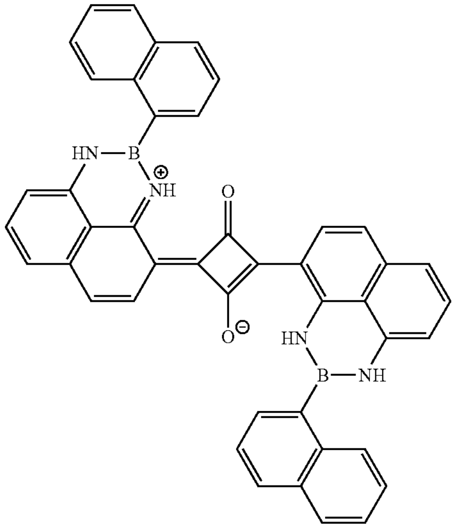
F-23
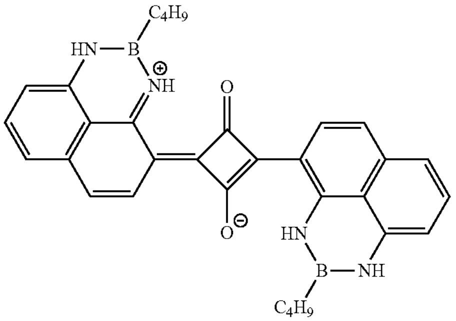
F-24
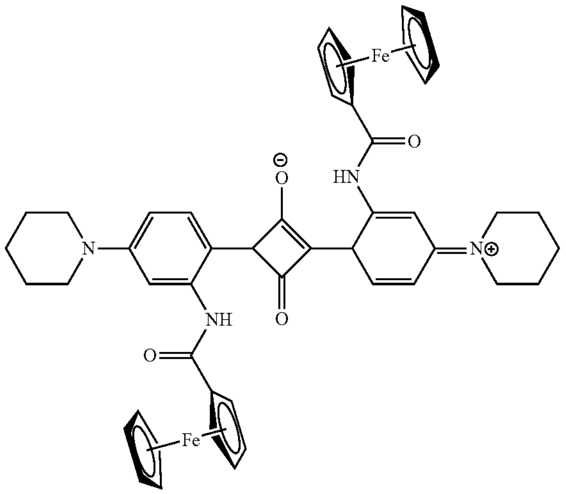
F-25
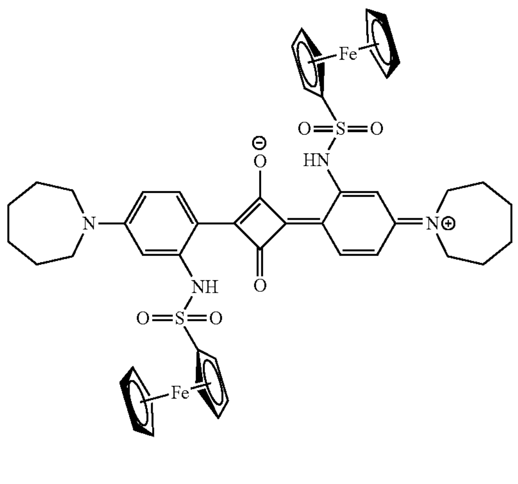
F-26
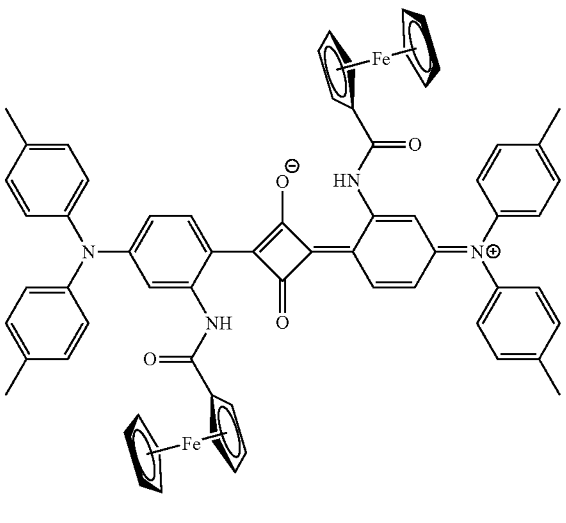

-continued
F-27
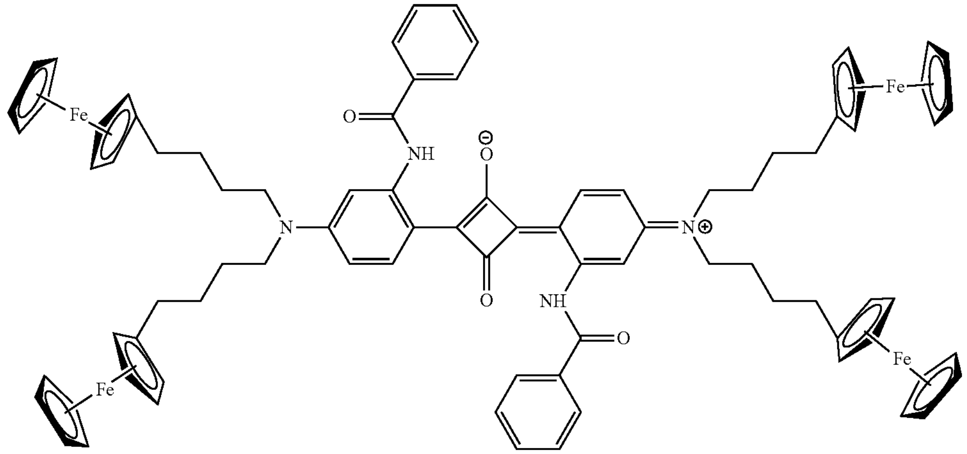
F-28
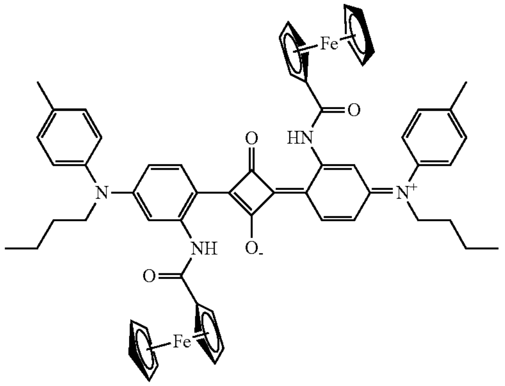
F-29
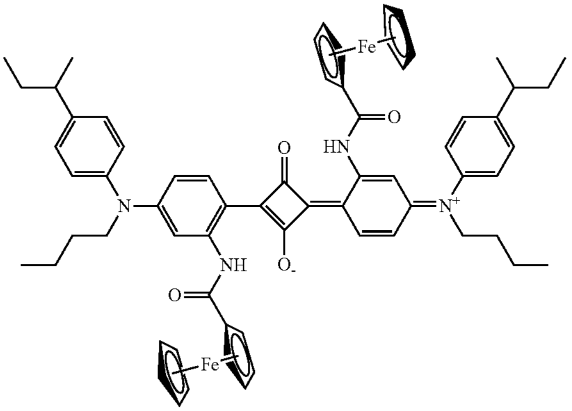
F-30
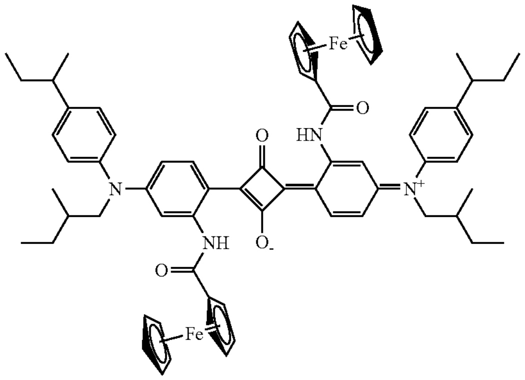
F-31
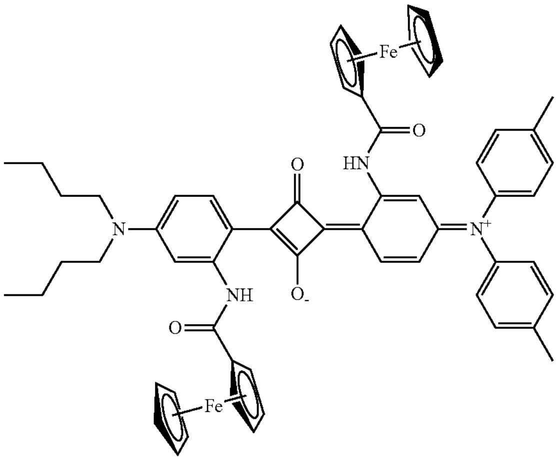

-continued
F-32
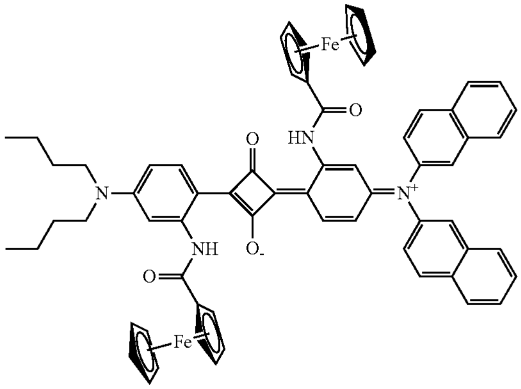
F-33
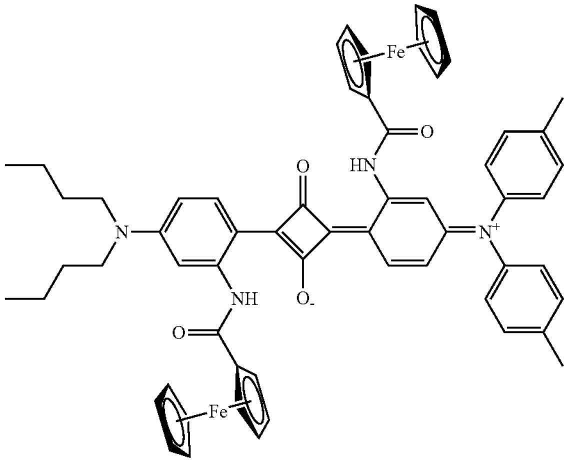
F-34
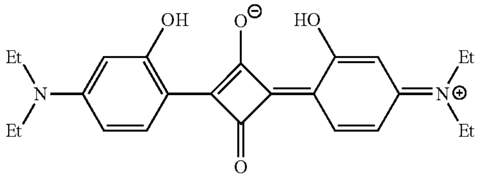
F-35
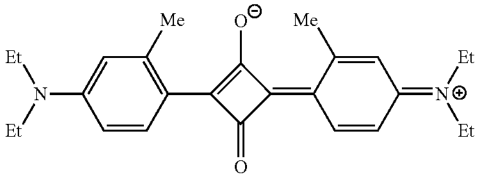
F-36
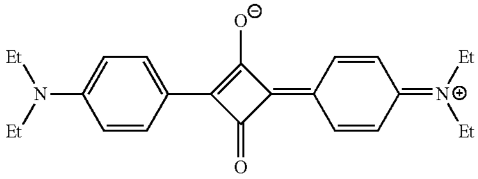
F-37
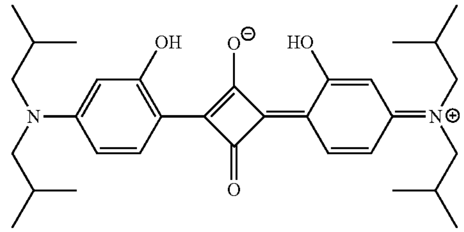
F-38
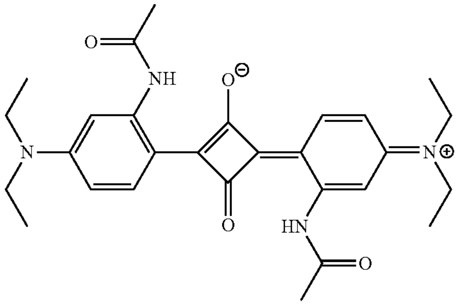
F-39
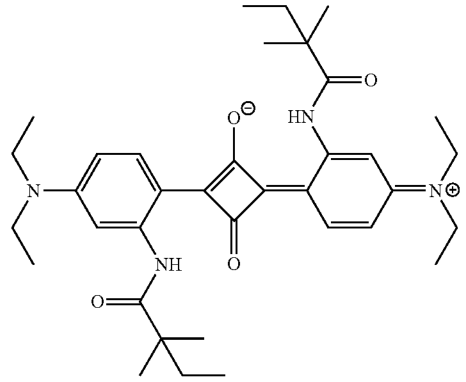

-continued

F-40

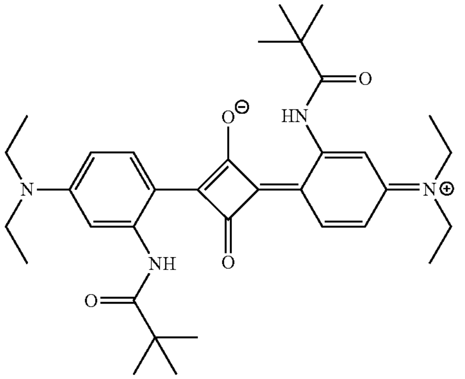

F-41

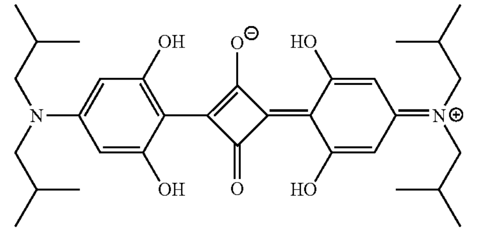

F-42

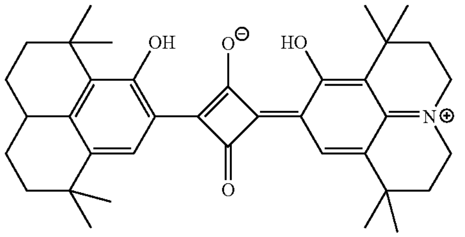

F-43

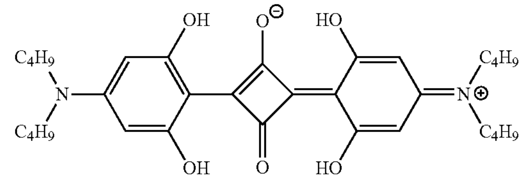

F-44

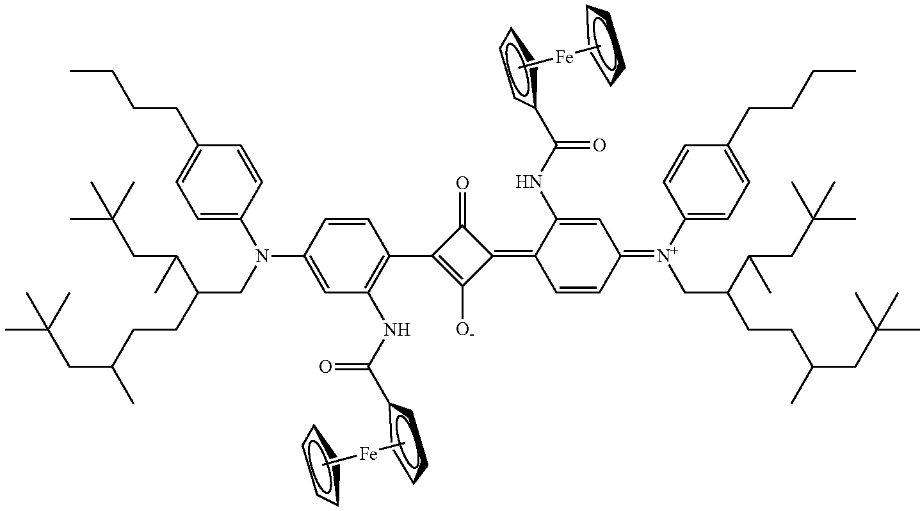

The total content of the dyes A to D in the wavelength selective absorption layer is preferably 0.10 parts by mass or more, more preferably 0.15 parts by mass or more, still more preferably 0.20 parts by mass or more, particularly preferably 0.25 parts by mass or more, and especially preferably 0.30 parts by mass or more, with respect to 100 parts by mass of the resin constituting the wavelength selective absorption layer. In a case where the total content of the dyes A to D in the wavelength selective absorption layer is equal to or larger than the above-described preferred lower limit value, a good antireflection effect can be obtained. Among the above, from the viewpoint of further improving the light resistance, the total content of the dyes A to D is preferably 4 parts by mass or more with respect to 100 parts by mass of the resin constituting the wavelength selective absorption layer.

Further, in the wavelength selective absorption layer, the total content of the dyes A to D is generally 50 parts by mass or less, preferably 40 parts by mass or less, and more preferably 30 parts by mass or less, with respect to 100 parts by mass of the resin constituting the wavelength selective absorption layer.

The content of each of the dyes A to D that can be contained in the wavelength selective absorption layer is preferably as follows.

The content of the dye A is preferably 0.01 to 45 parts by mass, and more preferably 0.1 to 30 parts by mass, with respect to 100 parts by mass of the resin constituting the wavelength selective absorption layer. The content of the dye B is preferably 0.01 to 45 parts by mass, and more preferably 0.1 to 30 parts by mass, with respect to 100 parts by mass of the resin constituting the wavelength selective absorption layer. The content of the dye C is preferably 0.01 to 30 parts by mass, and more preferably 0.1 to 25 parts by mass, with respect to 100 parts by mass of the resin constituting the wavelength selective absorption layer. The content of the dye D is preferably 0.05 to 50 parts by mass, and more preferably 0.2 to 40 parts by mass, with respect to 100 parts by mass of the resin constituting the wavelength selective absorption layer.

In a case where the wavelength selective absorption layer contains four dyes A to D, the content proportions of the respective dyes A to D in terms of the mass ratio (the dye A:the dye B:the dye C:the dye D) in the wavelength selective absorption layer are preferably 1:0.1 to 10:0.05 to 5:0.1 to 10, and more preferably 1:0.2 to 5:0.1 to 3:0.2 to 5.

In a case where at least one of the dye B or C is the quencher-embedded coloring agent, the content of the quencher-embedded coloring agent is preferably 0.1 parts by mass or more with respect to 100 parts by mass of the resin constituting the wavelength selective absorption layer, in terms of the antireflection effect. The upper limit value thereof is preferably 45 parts by mass or less.

<Resin>

The resin contained in the wavelength selective absorption layer (hereinafter, also referred to as a "matrix resin") is not particularly limited as long as the resin can disperse (preferably dissolve) the dye and the antifading agent for a dye to be described later, and can suppress the decrease in light resistance of the dye due to the antifading agent. It is possible to satisfy the suppression of external light reflection and the suppression of brightness decrease, and moreover, it is possible to maintain the original tint of an image of the self-luminous display device at an excellent level, which are preferable.

In a case where at least one of the dye B or C is a squarine-based coloring agent represented by General Formula (1), the matrix resin is preferably a low-polarity matrix resin in which the squarine-based coloring agent can exhibit sharper absorption. In a case w % here the squarine-based coloring agent exhibits the sharper absorption, Relational Expressions (I) to (VI) can be satisfied at a preferred level, and the original tint of the image of the self-luminous display device can be maintained at a more excellent level.

Here, the low polarity means that an fd value defined by Relational Expression I is preferably 0.50 or more.

$$fd=\delta d/(\delta d+\delta p+\delta h) \qquad \text{Relational Expression I:}$$

In Relational Expression I, δd, δp, and δh respectively indicate a term corresponding to a London dispersion force, a term corresponding to a dipole-dipole force, and a term corresponding to a hydrogen bonding force with respect to a solubility parameter δt calculated according to a Hoy method. A specific calculation method of fd will be described later. That is, fd indicates a ratio of δd to the sum of δd, δp, and δh.

In a case where the fd value is set to 0.50 or more, a sharper absorption waveform can be easily obtained.

Further, in a case where the wavelength selective absorption layer contains two or more matrix resins, the fd value is calculated as follows.

$$fd=\Sigma(w_i \cdot fd_i)$$

Here, $w_i$ represents the mass fraction of the i-th matrix resin, and $fd_i$ represents the fd value of the i-th matrix resin.

—Term δd Corresponding to London Dispersion Force—

The term δd corresponding to the London dispersion force refers to δd obtained for the Amorphous Polymers described in the column "2) Method of Hoy (1985, 1989)" on pages 214 to 220 of the document "Properties of Polymers 3$^{rd}$, ELSEVIER, (1990)", and is calculated according to the description in the column of the document.

—Term δp Corresponding to Dipole-Dipole Force—

The term Sp corresponding to the dipole-dipole force refers to op obtained for Amorphous Polymers described in the column "2) Method of Hoy (1985, 1989)" on pages 214 to 220 of the document "Properties of Polymers 3$^{rd}$, ELSEVIER, (1990)", and is calculated according to the description in the column of the document.

—Term δh Corresponding to Hydrogen Bonding Force—

The term δh corresponding to the hydrogen bonding force refers to δh obtained for the Amorphous Polymers described in the column "2) Method of Hoy (1985, 1989)" on pages 214 to 220 of the document "Properties of Polymers 3$^{rd}$, ELSEVIER, (1990)", and is calculated according to the description in the column of the document.

In addition, in a case where the matrix resin is a resin exhibiting a certain hydrophobicity, the moisture content of the wavelength selective absorption layer can be set to a low moisture content, for example, 0.5% or lower, and the light resistance of the laminate that is used in the present invention including the wavelength selective absorption layer is improved, which is preferable.

The resin may contain any conventional component in addition to a polymer. However, the fd of the matrix resin is a calculated value for the polymer constituting the matrix resin.

Preferred examples of the matrix resin include a polystyrene resin and a cyclic polyolefin resin, and the polystyrene resin is more preferable. In general, the fd value of the polystyrene resin is 0.45 to 0.60, and the fd value of the cyclic polyolefin resin is 0.45 to 0.70. As described above, it is preferable to use the resin having an fd value of 0.50 or more.

Further, for example, in addition to these preferable resins, it is also preferable to use a resin component, that imparts functionality to the wavelength selective absorption layer, such as an extensible resin component and a peelability control resin component, which will be described later. That is, in the present invention, the matrix resin is used in the meaning of including the extensible resin component and the peelability control resin component in addition to the above-described resins.

It is preferable that the matrix resin includes a polystyrene resin in terms of sharpening the absorption waveform of the coloring agent.

(Polystyrene Resin)

The polystyrene contained in the polystyrene resin means a polymer containing a styrene component. The polystyrene preferably contains 50% by mass or more of the styrene component. The wavelength selective absorption layer may contain one kind of polystyrene or two or more kinds of thereof. Here, the styrene component is a structural unit derived from a monomer having a styrene skeleton in the structure thereof.

The polystyrene more preferably contains 70% by mass or more of the styrene component, and still more preferably 85% by mass or more of the styrene component, in terms of controlling the photo-elastic coefficient and the hygroscopicity to values in ranges preferable for the wavelength selective absorption layer. It is also preferable that the polystyrene is composed of only a styrene component.

Among polystyrenes, examples of the polystyrene composed of only the styrene component include a homopolymer of a styrene compound and a copolymer of two or more kinds of styrene compounds. Here, the styrene compound is a compound having a styrene skeleton in the structure thereof, and is meant to include, in addition to styrene, a compound in which a substituent is introduced within a range where an ethylenically unsaturated bond of styrene can act as a reactive (polymerizable) group.

Specific examples of the styrene compound include the following styrenes: alkylstyrene such as α-methylstyrene, o-methylstyrene, m-methylstyrene, p-methylstyrene, 3,5-dimethylstyrene, 2,4-dimethylstyrene, o-ethylstyrene, p-ethylstyrene, and tert-butyl styrene; and substituted styrene having a hydroxyl group, an alkoxy group, a carboxy group, or a halogen atom introduced into the benzene nucleus of styrene, such as hydroxystyrene, tert-butoxy styrene, vinyl benzoic acid, o-chlorostyrene, and p-chlorostyrene. Among these, the polystyrene is preferably a homopolymer of styrene (that is, polystyrene) from the viewpoints of availability and material cost.

The constitutional component other than the styrene component that may be contained in the polystyrene is not particularly limited. That is, the polystyrene may be a styrene-diene copolymer, a styrene-polymerizable unsaturated carboxylic acid ester copolymer, or the like. In addition, it is also possible to use a mixture of polystyrene and synthetic rubber (for example, polybutadiene and polyisoprene). Further, high impact polystyrene (HIPS) obtained by subjecting styrene to graft polymerization with synthetic rubber is also preferable. Further, a polystyrene obtained by dispersing a rubber-like elastic body in a continuous phase of a polymer including a styrene component (for example, a copolymer of a styrene component and a (meth)acrylate ester component), and subjecting the copolymer to graft polymerization with a rubber-like elastic body (referred to as graft type high impact polystyrene "graft HIPS") is also preferable. Furthermore, a so-called styrene-based elastomer can also be suitably used.

In addition, the polystyrene may be hydrogenated (may be a hydrogenated polystyrene). The hydrogenated polystyrene is not particularly limited, and it is preferably a hydrogenated styrene-diene-based copolymer such as a hydrogenated styrene-butadiene-styrene block copolymer (SEBS) obtained by hydrogenating a styrene-butadiene-styrene block copolymer (SBS) or hydrogenated styrene-isoprene-styrene block copolymer (SEPS) obtained by hydrogenating a styrene-isoprene-styrene block copolymer (SIS). Only one of these hydrogenated polystyrenes may be used, or two or more thereof may be used.

In addition, the polystyrene may be modified polystyrene. The modified polystyrene is not particularly limited, and examples thereof include polystyrene having a reactive group such as a polar group introduced therein. Specific examples thereof preferably include acid-modified polystyrene such as maleic acid-modified and epoxy-modified polystyrene.

As the polystyrene, a plurality of kinds of polystyrene resins having different compositions, molecular weights, and the like may be used in combination. The polystyrene-based resin can be obtained using a conventional method such as anion, bulk, suspension, emulsification, or a solution polymerization method. In addition, in the polystyrene, at least a part of the unsaturated double bond of the benzene ring of the conjugated diene and the styrene monomer may be hydrogenated. The hydrogenation rate can be measured by a nuclear magnetic resonance apparatus (NMR).

As the polystyrene resin, a commercially available product may be used, and examples thereof include "CLEAREN 530L" and "CLEAREN 730L" manufactured by Denki Kagaku Kogyo Kabushiki Kaisha, "TUFPRENE 126S" and "ASAPRENE T411" manufactured by Asahi Kasei Corporation, "KRATON D1102A", "KRATON D1116A" manufactured by Kraton Polymers Japan Ltd., "STYROLUX S" and "STYROLUX T" manufactured by Styrolution Group, "ASAFLEX 840" and "ASAFLEX 860" manufactured by Asahi Kasei Chemicals Corporation (all are SBS), "679", "HF77", and "SGP-10" manufactured by PS Japan Corporation, "DIC STYRENE XC-515" and "DIC STYRENE XC-535" manufactured by DIC Corporation (all are GPPS), "475D", "H0103", and "HT478" manufactured by PS Japan Corporation, and "DIC STYRENE GH-8300-5" manufactured by DIC Corporation (all are HIPS). Examples of the hydrogenated polystyrene-based resin include "TUFTEC H series" manufactured by Asahi Kasei Chemicals Corporation, and "KRATON G series" manufactured by Shell Japan Ltd. (all are SEBS), "DYNARON" manufactured by JSR Corporation (hydrogenated styrene-butadiene random copolymer), and "SEPTON" (SEPS) manufactured by Kuraray Co., Ltd. Examples of the modified polystyrene-based resin include "TUFTEC M series" manufactured by Asahi Kasei Chemicals Corporation, "EPOFRIEND" manufactured by Daicel Corporation, "Polar Group Modified DYNARON" manufactured by JSR Corporation, and "RESEDA" manufactured by ToaGosei Co., Ltd.

The wavelength selective absorption layer preferably contains a polyphenylene ether resin in addition to the polystyrene resin. By containing the polystyrene resin and the polyphenylene ether resin together, the toughness of the wavelength selective absorption layer can be improved, and the occurrence of defects such as cracks can be suppressed even in a harsh environment such as high temperature and high humidity.

However, in the calculation of the fd value described above, the fd value of the polyphenylene ether resin is not taken into consideration, in a case where the wavelength selective absorption filter according to the embodiment of the present invention contains a polyphenylene ether resin in addition to the polystyrene resin.

As the polyphenylene ether resin, ZYLON S201A, ZYLON 202A, ZYLON S203A, and the like, manufactured by Asahi Kasei Corporation, can be preferably used. In addition, a resin in which the polystyrene resin and the polyphenylene ether resin are mixed in advance may also be used. As the mixed resin of the polystyrene resin and the polyphenylene ether resin, for example, ZYLON 1002H, ZYLON 1000H, ZYLON 600H, ZYLON 500H, ZYLON 400H, ZYLON 300H, ZYLON 200H, and the like manufactured by Asahi Kasei Corporation can be preferably used.

In a case where the polystyrene resin and the polyphenylene ether resin are contained in the wavelength selective absorption layer, the mass ratio of both resins is preferably 99/1 to 50/50, more preferably 98/2 to 60/40, and still more preferably 95/5 to 70/30, in terms of the polystyrene resin/polyphenylene ether resin. In a case where the formulation ratio of the polyphenylene ether resin is set in the above-described preferred range, the wavelength selective absorption layer can have sufficient toughness, and a solvent can be appropriately volatilized in a case where a film formation is carried out with a solution.

(Cyclic Polyolefin Resin)

The cyclic olefin compound that forms the cyclic polyolefin contained in the cyclic polyolefin resin is not particularly limited as long as the compound has a ring structure including a carbon-carbon double bond, and examples thereof include a norbornene compound and a monocyclic olefin compound, a cyclic conjugated diene compound, and a vinyl alicyclic hydrocarbon compound, which are not the norbornene compound.

Examples of the cyclic polyolefin include (1) polymers including a structural unit derived from a norbornene compound: (2) polymers including a structural unit derived from a monocyclic olefin compound other than the norbornene compound: (3) polymers including a structural unit derived from a cyclic conjugated diene compound; (4) polymers including a structural unit derived from a vinyl alicyclic hydrocarbon compound: and hydrides of polymers including a structural unit derived from each of the compounds (1) to (4).

In the present invention, ring-opening polymers of the respective compounds are included in the polymers including a structural unit derived from a norbornene compound and the polymers including a structural unit derived from a monocyclic olefin compound. The cyclic polyolefin is not particularly limited; however, it is preferably a polymer having a structural unit derived from a norbornene compound, which is represented by General Formula (A-II) or (A-III). The polymer having the structural unit represented by General Formula (A-II) is an addition polymer of a norbornene compound, and the polymer having the structural unit represented by General Formula (A-III) is a ring-opening polymer of a norbornene compound.

General Formula (A-II)

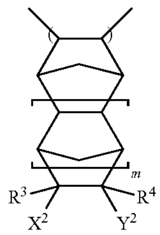

General Formula (A-III)

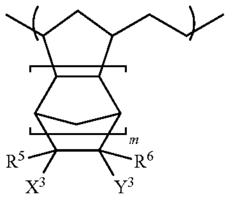

In General Formulae (A-II) and (A-III), m is an integer of 0 to 4, and preferably 0 or 1.

In General Formulae (A-II) and (A-III), $R^3$ to $R^6$ each independently represent a hydrogen atom or a hydrocarbon group having 1 to 10 carbon atoms.

The hydrocarbon group in General Formulae (A-I) to (A-III) is not particularly limited as long as the hydrocarbon group is a group consisting of a carbon atom and a hydrogen atom, and examples thereof include an alkyl group, an alkenyl group, an alkynyl group, and an aryl group (an aromatic hydrocarbon group). Among these, an alkyl group or an aryl group is preferable.

In General Formula (A-II) or (A-III), $X^2$ and $X^3$, and $Y^2$ and $Y^3$ each independently represent a hydrogen atom, a hydrocarbon group having 1 to 10 carbon atoms, a halogen atom, a hydrocarbon group having 1 to 10 carbon atoms, which is substituted with a halogen atom, $—(CH_2)_n COOR^{11}$, $—(CH_2)_nOCOR^2$, $—(CH_2)_nNCO$, $—(CH_2)_nNO_2$, $—(CH_2)_nCN$, $—(CH_2)_nCONR^{13}R^{14}$, $—(CH_2)_nNR^{13}R^{14}$, $—(CH_2)_nOZ$ or $—(CH_2)_nW$, or $(—CO)_2O$ or $(—CO)_2NR^{15}$ which is formed by $X^2$ and $Y^2$ or X3 and $Y^3$ being bonded to each other.

Here, $R^{11}$ to $R^{15}$ each independently represent a hydrogen atom or a hydrocarbon group having 1 to 20 carbon atoms, Z represents a hydrocarbon group or a hydrocarbon group substituted with halogen, W represents $Si(R^{15})_pD_{(3-p)}$ ($R^{16}$ represents a hydrocarbon group having 1 to 10 carbon atoms, D represents a halogen atom, $—OCOR^{17}$, or $—OR^{17}$ ($R^{17}$ represents a hydrocarbon group having 1 to 10 carbon atoms), and p is an integer of 0 to 3). n is an integer of 0 to 10, preferably 0 to 8, and more preferably 0 to 6.

In General Formulae (A-II) and (A-III), $R^3$ to $R^6$ are each preferably a hydrogen atom or $—CH_3$, and, in terms of moisture permeability, more preferably a hydrogen atom.

$X^2$ and $X^3$ are each preferably a hydrogen atom, $—CH_3$, or $—C_2H_5$ and, in terms of moisture permeability, more preferably a hydrogen atom.

$Y^2$ and $Y^3$ are each preferably a hydrogen atom, a halogen atom (particularly a chlorine atom), or $—(CH_2)_nCOOR^{11}$ (particularly $—COOCH_3$) and, in terms of moisture permeability, more preferably a hydrogen atom.

Other groups are appropriately selected.

The polymer having the structural unit represented by General Formula (A-II) or (A-III) may further include at least one or more structural units represented by General Formula (A-I).

General Formula (A-I)

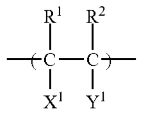

In General Formula (A-I), $R^1$ and $R^2$ each independently represent a hydrogen atom or a hydrocarbon group having 1 to 10 carbon atoms, and $X^1$ and $Y^1$ each independently represent a hydrogen atom, a hydrocarbon group having 1 to 10 carbon atoms, a halogen atom, a hydrocarbon group having 1 to 10 carbon atoms, which is substituted with a halogen atom, $—(CH_2)_nCOOR^{11}$, $—(CH_2)_nOCOR^{12}$, $—(CH_2)_nNCO$, $—(CH_2)_nNO2$, $—(CH_2)_nCN$, $—(CH_2)_n CONR^{13}R^{14}$, $—(CH_2)_nNR^{13}R^{14}$, $—(CH_2)_nOZ$, $—(CH_2)_nW$, or $(—CO)_2O$ or $(—CO)_2NR^{15}$ which is formed by $X^1$ and $Y^1$ being bonded to each other.

Here, $R^{11}$ to $R^{15}$ each independently represent a hydrogen atom or a hydrocarbon group having 1 to 20 carbon atoms, Z represents a hydrocarbon group or a hydrocarbon group substituted with halogen, W represents $Si(R^{16})_pD_{(3-p)}$ ($R^{16}$ represents a hydrocarbon group having 1 to 10 carbon atoms, D represents a halogen atom, $—OCOR^{17}$, or $—OR^{17}$ ($R^{17}$ represents a hydrocarbon group having 1 to 10 carbon atoms), and p is an integer of 0 to 3). n is an integer of 0 to 10.

From the viewpoint of adhesiveness, the content of the structural unit derived from a norbornene compound in the cyclic polyolefin having the structural unit represented by General Formula (A-II) or (A-III) is preferably 90% by mass or less, more preferably 30% to 85% by mass, still more preferably 50% to 79% by mass, and most preferably 60% to 75% by mass with respect to the total mass of the cyclic polyolefin. Here, the proportion of the structural unit derived from a norbornene compound represents the average value in the cyclic polyolefin.

The addition (co)polymer of a norbornene compound is described in JP1998-7732A (JP-H10-7732A), JP2002-504184A, US2004/229157A1A, and WO2004/070463A.

The polymer of a norbornene compound is obtained by the addition polymerization of norbornene compounds (for example, polycyclic unsaturated compounds of norbornene).

In addition, as the polymer of a norbornene compound, copolymers obtained by the addition copolymerization of, as necessary, a norbornene compound, olefin such as ethylene, propylene, and butene, conjugated diene such as butadiene and isoprene, unconjugated diene such as ethylidene norbornene, and an ethylenically unsaturated compound such as acrylonitrile, acrylic acid, methacrylic acid, maleic acid anhydride, acrylic acid ester, methacrylic acid ester, maleimide, vinyl acetate, and vinyl chloride are exemplified. Among these, a copolymer of a norbornene compound and ethylene is preferable.

Examples of the addition (co)polymers of a norbornene compound include APL8008T (Tg: 70° C.), APL6011T (Tg, 105° C.), APL6013T (Tg: 125° C.), and APL6015T (Tg: 145° C.), which are on the market by Mitsui Chemicals, Inc. under a product name of APEL and have mutually different glass transition temperatures (Tg). In addition, pellets such as TOPAS8007, TOPAS6013, and TOPAS6015 are commercially available from Polyplastics Co., Ltd. Further, Appear 3000 is commercially available from Film Ferrania S. R. L.

As the polymer of a norbornene compound, a commercially available product can be used. For example, it is commercially available from JSR Corporation under a product name of Arton G or Arton F, and it is also commercially available from Zeon Corporation under a product name of Zeonor ZF14, ZF16, Zeonex 250, or Zeonex 280.

The hydride of a polymer of a norbornene compound can be synthesized by the addition polymerization or the metathesis ring-opening polymerization of a norbornene compound or the like and then the addition of hydrogen. The synthesis method is described in, for example, JP1989-240517A (JP-H1-240517A), JP1995-196736A (JP-H7-196736A), JP1985-26024A (JP-S60-26024A), JP1987-19801A (JP-S62-19801A), JP2003-159767A, and JP2004-309979A.

The molecular weight of the cyclic polyolefin is appropriately selected depending on the intended use, and it is a mass average molecular weight measured in terms of polyisoprene or polystyrene by the gel permeation chromatography of a cyclohexane solution (a toluene solution in a case where the polymer is not dissolved). In general, it is preferable that the molecular weight is in a range of 5,000 to 500,000, preferably 8,000 to 200,000, and more preferably 10,000 to 100,000. A polymer having a molecular weight in the above-described range is capable of satisfying both the mechanical strength of a molded body and the molding workability of compacts at a high level in a well-balanced manner.

In the wavelength selective absorption layer, the content of the matrix resin is preferably 5% by mass or more, more preferably 20% by mass or more, still more preferably 50% by mass or more, particularly preferably 70% by mass or more, and among the above, it is preferably particularly preferably 80% by mass.

The content of the matrix resin in the wavelength selective absorption layer is generally 99.90% by mass or less and preferably 99.85% by mass or less.

The cyclic polyolefin contained in the wavelength selective absorption layer may be two or more kinds, and polymers that differ in at least one of the compositional ratio or the molecular weight may be used in combination. In this case, the total content of the respective polymers is in the above range.

(Extensible Resin Component)

The wavelength selective absorption layer can appropriately select and contain a component exhibiting extensibility (also referred to as an extensible resin component) as a resin component. Specific examples thereof include an acrylonitrile-butadiene-styrene resin (an ABS resin), a styrene-butadiene resin (an SB resin), an isoprene resin, a butadiene resin, a polyether-urethane resin, and a silicone resin. Further, these resins may be further hydrogenated as appropriate.

As the extensible resin component, it is preferable to use an ABS resin or an SB resin, and it is more preferable to use an SB resin.

As the SB resin, for example, a commercially available one can be used. Examples of such commercially available products include TR2000, TR2003, and TR2250 (all, product name, manufactured by JSR Corporation): CLEAREN 210M, 220M, and 730V (all, product name, manufactured by Denka Corporation); ASAFLEX 800S, 805, 810, 825, 830, and 840 (all, product name, manufactured by Asahi Kasei Corporation); and EPOREX SB2400, SB2610, and SB2710 (all, product name, Sumitomo Chemical Co., Ltd.).

The wavelength selective absorption layer preferably contains an extensible resin component in the matrix resin in an amount of 15% to 95% by mass, more preferably 20% to 50% by mass, and still more preferably 25% to 45% by mass.

The extensible resin component is preferably an extensible resin component having a breaking elongation of 10% or more and more preferably an extensible resin component having a breaking elongation of 20% or more, in a case where a sample having a form with a thickness of 30 μm and a width of 10 mm is produced by using the extensible resin component alone and the breaking elongation at 25° C. is measured in accordance with JIS 7127.

(Peelability Control Resin Component)

The wavelength selective absorption layer can contain, as a resin component, a component that controls the peelability (a peelability control resin component) in a case of being produced according to a method including a step of peeling a wavelength selective absorption layer from a release film, among the manufacturing methods for a wavelength selective absorption layer described later, which is preferable. In a case of controlling the peelability of the wavelength selective absorption layer from the release film, it is possible to prevent a peeling mark from being left on the wavelength selective absorption layer after peeling, and it is possible to cope with various processing speeds in the peeling step. As a result, a preferred effect can be obtained for improving the quality and productivity of the wavelength selective absorption layer.

The peelability control resin component is not particularly limited and can be appropriately selected depending on the kind of the release film. In a case where a polyester-based polymer film is used as the release film as described later, for example, a polyester resin (also referred to as a polyester-based additive) is suitable as the peelability control resin component.

The polyester-based additive can be obtained by a conventional method such as a dehydration condensation reaction of a polyhydric basic acid and a polyhydric alcohol and an addition of a dibasic anhydride to a polyhydric alcohol and a dehydration condensation reaction, and a polycondensation ester formed from a dibasic acid and a diol is preferable.

The mass average molecular weight (Mw) of the polyester-based additive is preferably 500 to 50,000, more preferably 750 to 40,000, and still more preferably 2,000 to 30,000.

In a case where the mass average molecular weight of the polyester-based additive is equal to or larger than the above-described preferred lower limit value, it is preferable from the viewpoint of brittleness and moisture-heat resistance, and in a case where the mass average molecular weight thereof is equal to or smaller than the above-described preferred upper limit value, it is preferable from the viewpoint of compatibility with the resin.

The mass average molecular weight of the polyester-based additive is a value of the mass average molecular weight (Mw) in terms of standard polystyrene measured under the following conditions. The molecular weight distribution (Mw/Mn) can also be measured under the same conditions. Mn is a number average molecular weight in terms of standard polystyrene.

GPC: Gel permeation chromatograph device (HLC-8220GPC manufactured by Tosoh Corporation, column: Guard column HXL-H manufactured by Tosoh Corporation, where TSK gel G7000HXL, TSK gel GMHXL 2 pieces, and TSK gel G2000HXL are connected in sequence, eluent: tetrahydrofuran, flow velocity: 1 mL/min, sample concentration: 0.7% to 0.8% by mass, sample injection volume: 70 μL, measurement temperature: 40° C., detector: differential refractometer (RI) meter (40° C.), and standard substance: TSK standard polystyrene manufactured by Tosoh Corporation)

Preferred examples of the dibasic acid component constituting the polyester-based additive include dicarboxylic acid.

Examples of the dicarboxylic acid include an aliphatic dicarboxylic acid and an aromatic dicarboxylic acid. An aromatic dicarboxylic acid or a mixture of an aromatic dicarboxylic acid and an aliphatic dicarboxylic acid can be preferably used.

Among the aromatic dicarboxylic acids, an aromatic dicarboxylic acid having 8 to 20 carbon atoms is preferable, and an aromatic dicarboxylic acid having 8 to 14 carbon atoms is more preferable. Specifically, preferred examples thereof include at least one of phthalic acid, isophthalic acid, or terephthalic acid.

Among the aliphatic dicarboxylic acids, an aliphatic dicarboxylic acid having 3 to 8 carbon atoms is preferable, and an aliphatic dicarboxylic acid having 4 to 6 carbon atoms is more preferable. Specifically, preferred examples thereof include at least one of succinic acid, maleic acid, adipic acid, or glutaric acid, and at least one of succinic acid or adipic acid is more preferable.

Examples of the diol component constituting the polyester-based additive include an aliphatic diol and an aromatic diol, and aliphatic diol is preferable.

Among the aliphatic diols, an aliphatic diol having 2 to 4 carbon atoms is preferable, and an aliphatic diol having 2 to 3 carbon atoms is more preferable.

Examples of the aliphatic diol include ethylene glycol, diethylene glycol, 1,2-propylene glycol, 1,3-propylene glycol, 1,3-butylene glycol, and 1,4-butylene glycol. These aliphatic diols can be used alone, or two or more kinds thereof can be used in combination.

The polyester-based additive is particularly preferably a compound obtained by fusing at least one of phthalic acid, isophthalic acid, or terephthalic acid with an aliphatic diol.

The terminal of the polyester-based additive may be sealed by reacting with a monocarboxylic acid. The monocarboxylic acid that is used for sealing is preferably an aliphatic monocarboxylic acid. Preferred examples thereof include acetic acid, propionic acid, butanoic acid, benzoic acid, and a derivative thereof, where acetic acid or propionic acid is more preferable and acetic acid is still more preferable.

Examples of the commercially available polyester-based additive include ester-based resin polyesters manufactured by Nippon Synthetic Chemical Industry Co., Ltd. (for example, LP050, TP290, LP035, LP033, TP217, and TP220) and ester-based resins Byron manufactured by Toyobo Co., Ltd. (for example, Byron 245, Byron GK890, Byron 103, Byron 200, and Byron 550. GK880).

The content of the peelability control resin component in the wavelength selective absorption layer is preferably 0.05% by mass or more, and more preferably 0.1% by mass or more in the matrix resin. In addition, the upper limit value thereof is preferably 25% by mass or less, more preferably 20% by mass or less, and still more preferably 15% by mass or less. From the viewpoint of obtaining proper adhesiveness, the above-described preferred range is preferable.

<Antifading Agent (Singlet Oxygen Quencher)>

The wavelength selective absorption layer contains the antifading agent for a dye (simply also referred to as an antifading agent) in order to prevent the fading of the dye including at least one of the dyes A to D.

This antifading agent is also called a singlet oxygen quencher since it has a function of preventing the fading of the dye due to the singlet oxygen.

As the antifading agent, it is possible to use commonly used antifading agents without particular limitation, such as the antioxidants described in paragraphs [0143] to [0165] of WO2015/005398A, the radical scavengers described in paragraphs [0166] to [0199] of WO2015/005398A, and the deterioration preventing agents described in paragraphs [0205] to [0206] of WO2015/005398A.

The compound represented by General Formula (IV) below can be preferably used as the antifading agent.

General Formula (IV)

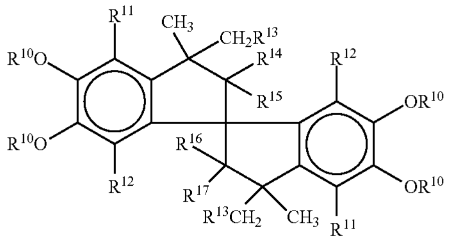

In General Formula (IV), $R^{10}$ represents an alkyl group, an alkenyl group, an aryl group, a heterocyclic group, or a group represented by $R^{18}CO—$, $R^{19}SO_2—$ or $R^{20}NHCO—$. Here, $R^{18}$, $R^{19}$, and $R^{20}$ each independently represent an alkyl group, an alkenyl group, an aryl group, or a heterocyclic group. $R^{11}$ and $R^{12}$ each independently represent a hydrogen atom, a halogen atom, an alkyl group, an alkenyl group, an alkoxy group, or an alkenyloxy group, and $R^{13}$, $R^{14}$, $R^{15}$, $R^{16}$, and $R^{17}$ each independently represent a hydrogen atom, an alkyl group, an alkenyl group, or an aryl group.

However, the alkyl group in $R^{10}$ to $R^{20}$ includes an aralkyl group.

Examples of the alkyl group represented by $R^{10}$ in General Formula (IV) include methyl, ethyl, propyl, and benzyl: examples of the alkenyl group include allyl; examples of the aryl group include phenyl; and examples of the heterocyclic group include tetrahydropyranyl and pyrimidyl. $R^{18}$, $R^{19}$, and $R^{20}$ each independently represent an alkyl group (for example, methyl, ethyl, n-propyl, n-butyl, or benzyl), an alkenyl group (for example, allyl), an aryl group (for example, phenyl, or methoxyphenyl), or a heterocyclic group (for example, pyridyl, or pyrimidyl).

Examples of the halogen atom represented by $R^{11}$ and $R^{12}$ in General Formula (IV) include chlorine and bromine; examples of the alkyl group include methyl, ethyl, n-butyl, and benzyl: examples of the alkenyl group include allyl: examples of the alkoxy group include methoxy, ethoxy, and benzyloxy; and examples of the alkenyloxy group include 2-propenyloxy.

Examples of the alkyl group represented by $R^{13}$, $R^{14}$, $R^{15}$, $R^{16}$, and $R^{17}$ in General Formula (IV) include methyl, ethyl, n-butyl, and benzyl: examples of the alkenyl group include 2-propenyl: and examples of the aryl group include phenyl, methoxyphenyl, and chlorophenyl.

$R^{10}$ to $R^{20}$ may further have a substituent, and examples of the substituent include each group represented by $R^{10}$ to $R^{20}$.

Specific examples of the compound represented by General Formula (IV) are shown below. However, the present invention is not limited thereto.

General Formula (IV)

IV-1

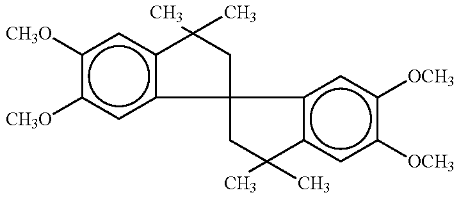

IV-2

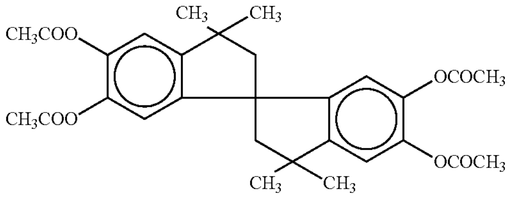

IV-3

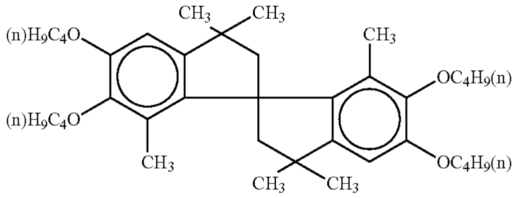

IV-4

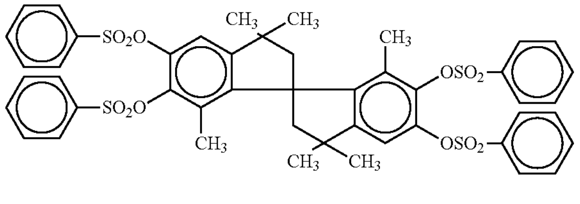

-continued

IV-5

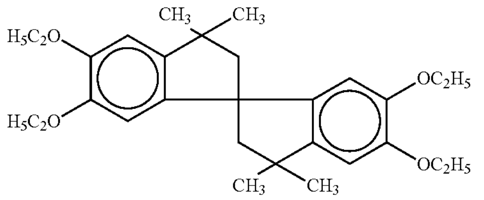

IV-6

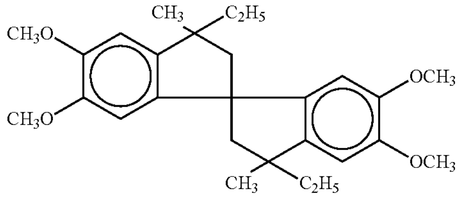

IV-7

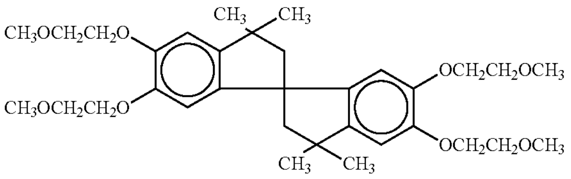

IV-8

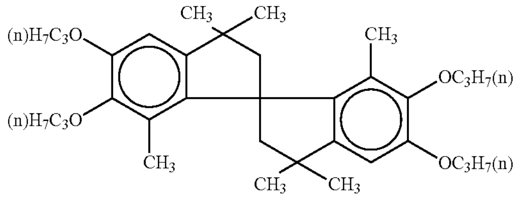

IV-9

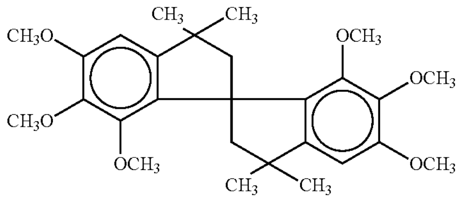

As the antifading agent (the singlet oxygen quencher), a compound represented by General Formula [III] below can also be preferably used.

General Formula [III]

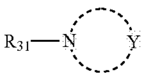

In General Formula [III], $R^{31}$ represents an aliphatic group or an aromatic group, and Y represents a non-metal atomic group necessary for forming a 5- to 7-membered ring with a nitrogen atom.

Next, in General Formula [III]. $R^{31}$ represents an aliphatic group or an aromatic group, and is preferably an alkyl group, an aryl group, or a heterocyclic group (preferably, an aliphatic heterocyclic group), and more preferably an aryl group.

Examples of the heterocyclic ring formed by Y together with the nitrogen atom include a piperidine ring, a piperazine ring, a morpholine ring, a thiomorpholine ring, a thiomorpholine-1,1-dione ring, a pyrrolidine ring, and an imidazolidine ring.

In addition, the heterocyclic ring may further have a substituent, and examples of the substituent include an alkyl group and an alkoxy group.

Specific examples of the compound represented by General Formula [III] are shown below. However, the present invention is not limited thereto.

III-1

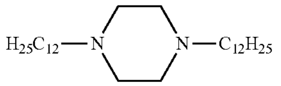

III-2

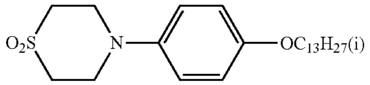

III-3

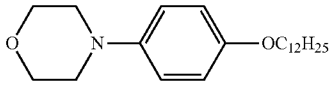

III-4

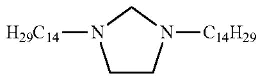

III-5

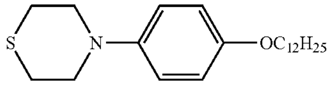

In addition to the above specific examples, specific examples of the compound represented by General Formula [III] above include exemplary compounds B-1 to B-65 described on pages 8 to 11 of JP2004-167543A (JP-H2-167543A), and exemplary compounds (1) to (120) described on pages 4 to 7 of JP1988-95439A (JP-S63-95439A).

The content of the antifading agent in the wavelength selective absorption layer is preferably 0.1% to 15% by mass, more preferably 1% to 15% by mass, still more preferably 5% to 15% by mass, and particularly preferably 5% to 12.5% by mass, and among them, it is preferably 8% to 12.5% by mass and most preferably 10% to 12.5% by mass, in 100% by mass of the total mass of the wavelength selective absorption layer.

In a case where the antifading agent is contained within the above-described preferred range, the laminate that is used in the present invention can improve the light resistance of the dye (the coloring agent) without causing side effects such as discoloration of the wavelength selective absorption layer.

<Other Components>

In addition to the dye, the matrix resin, and the antifading agent for a dye described above, the wavelength selective absorption layer may contain a matting agent, a leveling agent (a surfactant), and the like. Further, it may contain an electron migration-type antifading agent.

(Matting Agent)

It is preferable to add fine particles to the surface of the wavelength selective absorption layer in order to impart sliding properties and prevent blocking. As the fine particles, silica (silicon dioxide, $SiO_2$) of which the surface is coated with a hydrophobic group and which has an aspect of secondary particles is preferably used. As the fine particles, in addition to or instead of silica, fine particles of titanium dioxide, aluminum oxide, zirconium oxide, calcium carbonate, talc, clay, calcined kaolin, calcined calcium silicate, hydrated calcium silicate, aluminum silicate, magnesium silicate, and calcium phosphate may be used. Examples of the commercially available product of the fine particles include the R972 or NX90S (product name, both manufactured by Nippon Aerosil Co., Ltd.).

The fine particles function as a so-called matting agent, and the addition of the fine particles forms minute unevenness on the surface of the wavelength selective absorption layer. Due to the unevenness, even in a case where the wavelength selective absorption layers overlap each other or the wavelength selective absorption layer of the present invention and other films overlap each other, the films do not stick to each other and sliding properties are secured.

In a case where the wavelength selective absorption layer contains a matting agent as fine particles, and in the fine irregularities due to the protrusions in which fine particles protrude from the filter surface, there are $10^4$/mm$^2$ or more of protrusions having a height of 30 nm or more, the effect of improving sliding properties and blocking properties are particularly large.

It is preferable to apply the matting agent fine particles particularly onto the surface layer in order to improve the blocking properties and the sliding properties. Examples of the method of applying fine particles onto the surface layer include methods such as multilayer casting and coating.

The content of the matting agent in the wavelength selective absorption layer is appropriately adjusted according to the purpose.

However, in the laminate that is used in the present invention, it is preferable to apply the above-described matting agent fine particles to the surface of the wavelength selective absorption layer in contact with the gas barrier layer as long as the effect of the present invention is not impaired.

(Leveling Agent)

A leveling agent (surfactant) can be appropriately mixed with the wavelength selective absorption layer. As the leveling agent, a commonly used compound can be used, and a fluorine-containing surfactant is particularly preferable. Specific examples thereof include the compounds described in paragraphs [0028] to [0056] of JP2001-330725A.

The content of the leveling agent in the wavelength selective absorption layer is appropriately adjusted according to the purpose.

The wavelength selective absorption layer may contain, in addition to the above components, a low-molecular plasticizer, an oligomer-based plasticizer, a retardation modifier, an ultraviolet absorbing agent, a deterioration preventing agent, a peeling accelerating agent, an infrared absorbing agent, an antioxidant, a filler, a compatibilizer.

(Electron Migration-Type Antifading Agent)

The wavelength selective absorption layer may contain an electron migration-type antifading agent that satisfies Relational Expressions [A-1] or [A-2] (hereinafter, also referred to as the "electron migration-type antifading agent").

$E_{Hd}>E_{Hq}>E_{Ld}$, or Relational Expression [A-1]:

$E_{Hd}>E_{Lq}>E_{Ld}$ Relational Expression [A-2]:

where $E_{Hd}$, $E_{Hq}$, $E_{Ld}$, and $E_{Lq}$ respectively represent the following values, $E_{Hd}$: an energy level of a highest occupied molecular orbital of the dye, $E_{Hq}$: an energy level of a highest occupied molecular orbital of the electron migration-type antifading agent, $E_{Ld}$: an energy level of a lowest unoccupied molecular orbital of the dye, and $E_{Lq}$: an energy level of a lowest unoccupied molecular orbital of the electron migration-type antifading agent.

Further, in the above-described relational expressions, the more negatively larger the E is, the higher the energy is, and thus it is meant that the more right side of the relational expression, the E is, the higher the energy level is.

In a case where the electron migration-type antifading agent satisfies Relational Expression [A-1] or [A-2], the laminate that is used in the present invention can improve the light resistance.

However, in the present invention, the electron migration-type antifading agent is contained as a compound different from the above-described dye. That is, in the present invention, in a case where the dye has, in a compound, a structure capable of functioning as an electron migration-type antifading agent, this compound shall be treated as the above-described electron migration-type antifading agent-embedded coloring agent, that is, as the dye.

In the above-described electron migration-type antifading agent-embedded coloring agent, an effect of improving light resistance can be obtained due to potential transfer between a structure portion that functions as an electron migration-type antifading agent and a dye portion. However, in the laminated that is used in the present invention, an electron migration-type antifading agent is contained in addition to the electron migration-type antifading agent-embedded coloring agent, and thus it is possible to obtain an excellent light resistance effect by supplementing electrons that could not be subjected to the electron migration in the electron migration-type antifading agent-embedded coloring agent, with the electron migration-type antifading agent.

In the present invention, in a case where the wavelength selective absorption layer contains two or more kinds of dyes, in a case where it contains two or more kinds of electron migration-type antifading agents, and in a case where it contains two or more kinds of dyes and two or more kinds of electron migration-type antifading agent, it is mean that in any one of these cases, all of the kinds of dyes and electron migration-type antifading agents satisfy Relational Expression [A-1] or [A-2].

Relational Expression [A-1] preferably satisfies Relational Expression [A-11] below, more preferably satisfies Relational Expression [A-12] below, and still more preferably satisfies Relational Expression [A-13] below. It is noted that in the following relational expressions, $E_{Hd}$, $E_{Hq}$, and $E_{Ld}$ respectively have the same meanings as $E_{Hd}$, $E_{Hq}$ and $E_{Ld}$ in Relational Expression [A-1], and all of them have a unit of eV.

$$E_{Hd}-0.02>E_{Hq}>E_{Ld}+0.02 \quad \text{Relational Expression [A-11]:}$$

$$E_{Hd}-0.05>E_{Lq}>E_{Ld}+0.05 \quad \text{Relational Expression [A-12]:}$$

$$E_{Hd}-0.07>E_{Lq}>E_{Ld}+0.07 \quad \text{Relational Expression [A-13]:}$$

Relational Expression [A-2] preferably satisfies Relational Expression [A-21] below, more preferably satisfies Relational Expression [A-22] below, and still more preferably satisfies Relational Expression [A-23] below. In the following relational expression, $E_{Hd}$, $E_{Lq}$ and $E_{Ld}$ respectively have the same meanings as $E_{Hd}$, $E_{Lq}$ and $E_{Ld}$ in Relational Expression [A-2], and all of them have a unit of eV $$E_{Hd}-0.02>E_{Lq}>E_{Ld}+0.02 \quad \text{Relational Expression [A-11]:}$$

$$E_{Hd}-0.05>E_{Lq}>E_{Ld}+0.05 \quad \text{Relational Expression [A-12]:}$$

$$E_{Hd}-0.07>E_{Lq}>E_{Ld}+0.07 \quad \text{Relational Expression [A-13]:}$$

—Calculation Method for Energy Level—

The energy levels of the dye and the electron migration-type antifading agent, which are used in the present invention, are calculated based on the following potential measurement as well as the absorption spectrum and the fluorescence spectrum. A value of the oxidation potential is used as the energy level of HOMO, and a value of the reduction potential, which is calculated from the oxidation potential and the HOMO-LUMO band gap, is used as the energy level of LUMO. Hereinafter, the measurement and calculation method for each potential will be described.

The oxidation potential of the dye and the oxidation potential of the electron migration-type antifading agent are measured by an electrochemical analyzer (for example, model number: 660A, manufactured by ALS Co., Ltd.) using each of a glassy carbon electrode (GC) as a working electrode, a platinum black electrode as a counter electrode, an Ag line as a reference electrode, tetrabutylammonium hexafluorophosphate as a supporting electrolyte, and dichloromethane as a solvent, and they are indicated as values using, as the standard potential, the ferrocene/ferrocinium ion system ($Fc/Fc^+$) measured under the same conditions. Regarding the above-described electron migration-type antifading agent-embedded coloring agent, among the two detected oxidation potentials, the noble potential is assigned to the oxidation potential of the dye portion, and the base potential is assigned to the oxidation potential of the electron migration-type antifading agent portion. In a case where three or more oxidation potentials are detected, the most noble potential is assigned to the oxidation potential of the dye portion, and the lowest potential is assigned to the oxidation potential of the electron migration-type antifading agent.

The reduction potential of the dye is calculated as follows.

First, the absorption spectrum of the dye is measured by using an ultraviolet-visible spectrophotometer (for example, model number: 8430, manufactured by HEWLETT PACKARD Company), and the fluorescence spectrum of the dye is measured by using a fluorescence meter (for example, product name: Modula Spectrofluorometer Fluorolog-3, manufactured by HORIBA, Ltd.). It is noted that a solvent used in the measurement is the same as the solvent used in the above-described potential measurement.

Next, the absorption spectrum and fluorescence spectrum obtained above are respectively standardized by the absorbance at the absorption maximum wavelength and the emission intensity at the emission maximum wavelength, a wavelength at the intersection point thereof is determined, and the value of this wavelength is converted into an energy unit (eV) to obtain a HOMO-LUMO band gap.

The reduction potential of the dye is calculated by adding the value of the HOMO-LUMO band gap to the value (eV) of the oxidation potential of the dye measured as described above.

As the electron migration-type antifading agent, a compound generally used as an electron migration-type antifading agent can be used without particular limitation as long as it satisfies Relational Expression [A-1] or [A-2], and examples thereof include an electron-donating type antifading agent that satisfies Relational Expression [A-1] and an electron-receiving type antifading agent that satisfies Relational Expression [A-2].

The mechanism for improving the light resistance of the dye with the electron migration-type antifading agent is presumed as follows.

In a case where a dye in a ground state absorbs the excitation energy due to light irradiation, it donates one of the electrons in the energy level of HOMO to the energy level of LUMO and becomes to be in an excited state. Since the electron in an excited state in LUMO has a high energy level and is unstable, various photochemical reactions such as radical cleavage, intersystem crossing, and fluorescence emission occur (see "Principles of Molecular Photochemistry" written by Nicholas J. Turro, V Ramamurt, Haruo Inoue (a translation supervisor), Osamu Ito (a translation supervisor), Maruzen Publishing Co., Ltd.).

The electron-donating type antifading agent means a compound having a function of inactivating a dye in an excited state into a ground state by (i) donating an electron to a SOMO (a semi-occupied orbital) in the low energy level of the two SOMO's of the dye in the excited state, and then (ii) receiving the electron from a SOMO in the high energy level. In Relational Expression [A-1], the process of the (i) does not proceed unless $E_{Hd}>E_{Hq}$ is satisfied, and the process of the (ii) does not proceed unless $E_{Hq}>E_{Ld}$ is satisfied, and thus it is possible to improve the light resistance of the dye in a case of using a compound that satisfies Relational Expression [A-1] as the electron-donating type antifading agent. The electron-receiving type antifading agent means a compound having a function of inactivating a dye in an excited state into a ground state by (iii) receiving an electron from a SOMO in the higher energy level of the two SOMO's of the dye in the excited state, and then (iv) donating the electron from to a SOMO in the lower energy level. In Relational Expression [A-2], the process of the (iii) does not proceed unless $E_{Lq}>E_{Ld}$ is satisfied, and the process of the (iv) does not proceed unless $E_{Hd}>E_{Lq}$ is satisfied, and thus it is possible to improve the light resistance of the dye in a case of using a compound that satisfies Relational Expression [A-2] as the electron-receiving type antifading agent.

The electron migration-type antifading agent is preferably an electron migration-type antifading agent having a reversible waveform of cyclic voltammetry from the viewpoint of further improving light resistance. Examples of such an electron migration-type antifading agent preferably include a metallocene compound represented by General Formula (L) and a tetrahydropyran compound represented by General Formula (T), which will be described later. A metallocene compound represented by General Formula (L) is more preferable. In a case where the waveform of cyclic voltammetry is reversible, the electron-donating type antifading agent is highly stable after donating an electron to the dye, and the electron-receiving type antifading agent is highly stable after receiving an electron from the dye, whereby it is conceived that the light resistance can be improved more effectively.

—Electron-Donating Type Antifading Agent—

The compound represented by General Formula (I) or (I') can be preferably used as an electron-donating type antifading agent.

General Formula (I)

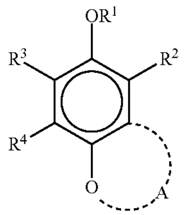

In General Formula (I), $R^1$ represents a hydrogen atom, an alkyl group, an acyl group, a sulfonyl group, a carbamoyl group, a sulfamoyl group, an alkoxycarbonyl group, an aryloxycarbonyl group, or a trialkylsilyl group, and A represents a non-metal atom necessary for completing a 5-membered or 6-membered ring, $R^2$, $R^3$, and $R^4$ each represent a hydrogen atom, an alkyl group, a cycloalkyl group, an alkoxy group, an aryl group, an aryloxy group, an aralkyl group, an aralkoxy group, an alkenyl group, an alkenoxy group, an acylamino group, a halogen atom, an alkylthio group, a diacylamino group, an arylthio group, an alkoxycarbonyl group, an acyloxy group, an acyl group, or a sulfonamide group, and they may be the same or different from each other. Furthermore, the compound represented by General Formula (I) includes a bisspiro compound in which the ring A is a structure including a spiro atom.

Preferred examples of $R^1$ in General Formula (I) include an alkyl group such as methyl, ethyl, and propyl; an acyl group for example, acetyl or benzoyl; a sulfonyl group, for example methanesulfonyl, butanesulfonyl, benzenesulfonyl, or toluenesulfonyl: a carbamoyl group for example, N-methylcarbamoyl, N,N-diethylcarbamoyl, or N-phenylcarbamoyl; a sulfamoyl group, for example, N-methylsulfamoyl, N,N-dimethylsulfamoyl, or N-phenylsulfamoyl; an alkoxycarbonyl group, for example, methoxycarbonyl, ethoxycarbonyl, or benzyloxycarbonyl; an aryloxycarbonyl group, for example, phenoxycarbonyl; and a trialkylsilyl group, for example, trimethylsilyl or dimethylbutylsilyl.

A in General Formula (I) represents a non-metal atom necessary for completing a 5-membered or 6-membered ring, and this ring may have a substituent. Preferred examples of the substituent include an alkyl group (for example, methyl), an alkoxy group (for example, methoxy), an aryl group (for example, phenyl), an aryloxy group (for example, phenoxy), an aralkyl group (for example, benzyl), an aralkoxy group (for example, benzyloxy) an alkenyl group (for example, allyl), an N-substituted amino group (for example, an alkylamino group, a dialkylamino group, an N-alkyl-N-arylamino group, or piperazino), and a heterocyclic group (for example, benzothiazolyl or benzoxazoyl). In addition. A may have a residue obtained by forming a fused ring. The alkyl group and aryl group as the substituent that A may have may further have a substituent, and preferred examples of the substituent include a halogen atom, a hydroxy group, a carboxy group, an alkoxycarbonyl group, an acyloxy group, a sulfo group, a sulfonyloxy group, an amide group (for example, acetamide, ethanesulfonamide, or benzamide), an alkoxy group, and an aryloxy group.

Preferred examples of $R^2$, $R^3$, and $R^4$ in General Formula (1) include an alkyl group such as methyl, ethyl, and propyl; a cycloalkyl group, for example, cyclohexyl; an alkoxy group, for example, methoxy, ethoxy, or butoxy; an aryl group, for example, phenyl; an aryloxy group, for example, phenoxy; an aralkyl group, for example, benzyl; an aralkoxy group, for example, benzyloxy; an alkenyl group, for example, allyl; an alkenoxy group, for example, allyloxy; an acylamino group, for example, acetylamino or benzamide; a halogen atom, for example, a chlorine atom or a bromine atom; an alkylthio group, for example, ethylthio; a diacylamino group, for example, succinimide or hydantoinyl; an arylthio group, for example, phenylthio; an alkoxycarbonyl group, for example, methoxycarbonyl, ethoxycarbonyl, or benzyloxycarbonyl: an acyloxy group, for example, acetyloxy or benzoyloxy; an acyl group, for example, methylcarbonyl; and a sulfonamide group, for example, dimethylsulfonamide or diethylsulfonamide.

Examples of the bisspiro compound which is a preferred aspect of the compound represented by General Formula (I) include the following compound represented by General Formula (I').

General Formula (I')

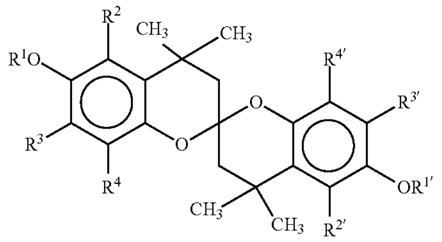

$R^1$, $R^2$, $R^3$, and $R^4$ in General Formula (I') respectively have the same meaning as Rt, $R^2$, $R^3$, and $R^4$ in General Formula (I). In addition, $R^{1'}$, $R^{2'}$, $R^{3'}$, and $R^{4'}$ in General Formula (I') respectively have the same meaning as $R^1$, $R^2$, $R^3$, and $R^4$ in General Formula (I).

The total number of carbon atoms included as $R^2$, $R^3$, $R^4$, and the ring A in General Formula (I) is preferably 20 or less and particularly preferably 12 or less. In addition, for general purposes, the compound represented by General Formula (I) preferably a compound in which the total number of carbon atoms included in the molecule is approximately up to 30. A 5-hydroxycoumaran compound and a 6-hydroxychromane compound, in which one of $R^2$ and $R^3$ in General Formula (I) is a hydrogen atom, as well as a 6,6'-dihydroxybis-2,2'-spirochromane compound included in General Formula (I') are particularly useful. It is still more preferable that each of $R^2$, $R^3$, and $R^4$ in General Formula (I) and $R^{2'}$, $R^{3'}$, and $R^{4'}$ in General Formula (I') is an alkyl group, an alkoxy group, an aryl group, an aryloxy group, or an alkylthio group.

Specific examples of the compound represented by General Formula (I) or (I') are shown below.

General Formula (I)

I-1

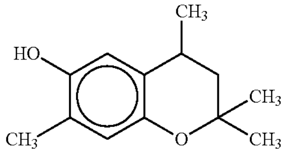

I-2

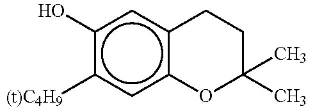

I-3

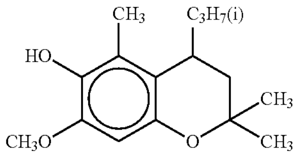

-continued

I-4

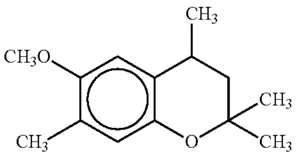

I-5

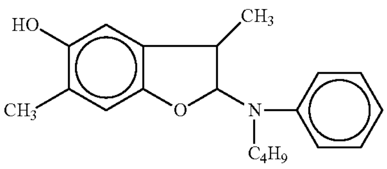

I-6

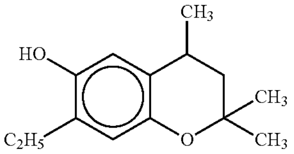

I-7

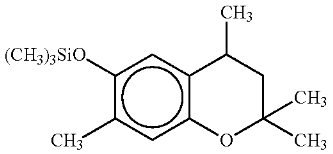

I-8

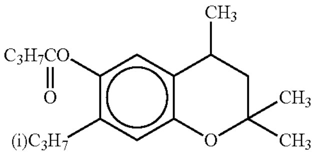

I-9

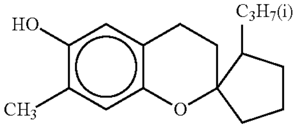

I-10

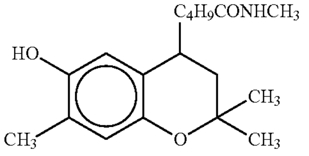

I-11

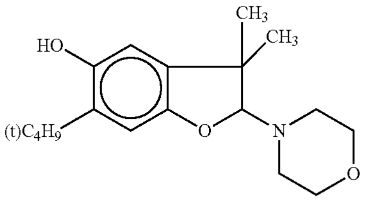

I-12

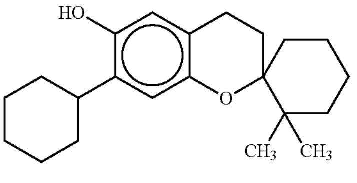

-continued

I-13

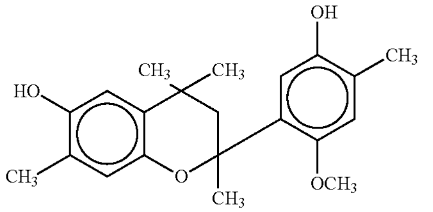

I-14

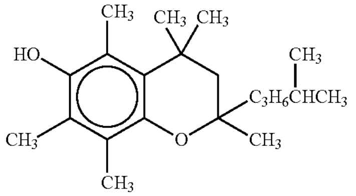

General Formula (I')

I'-1

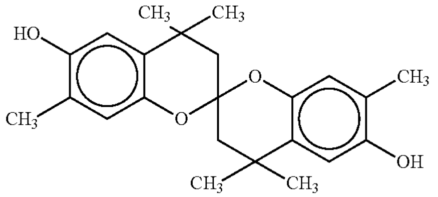

I'-2

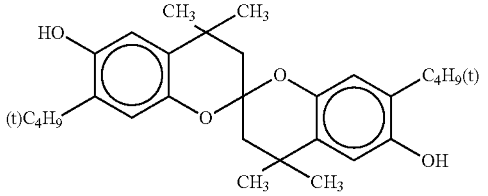

I'-3

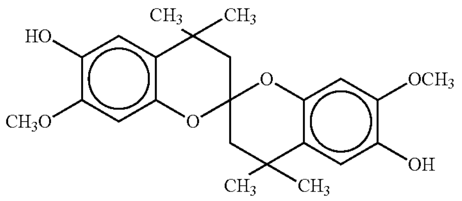

I'-4

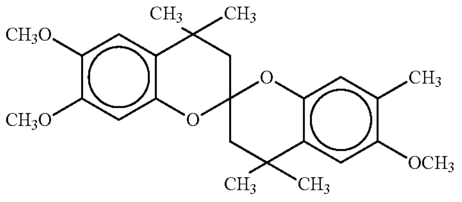

I'-5

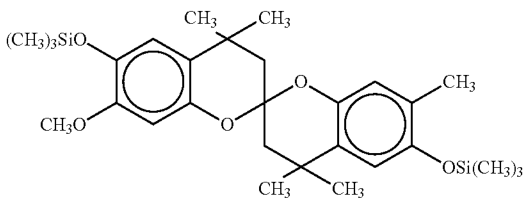

-continued

I'-6

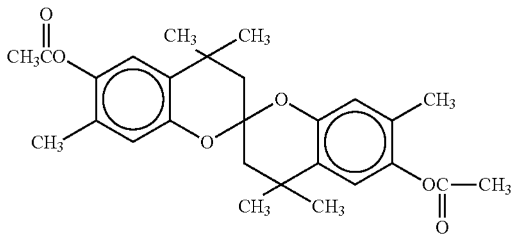

I'-7

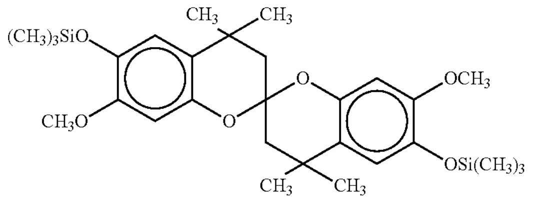

I'-8

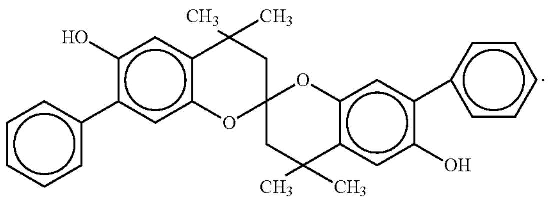

The compound represented by General Formula (T) is preferable as an electron-donating type antifading agent that is used in the present invention.

General Formula (T)

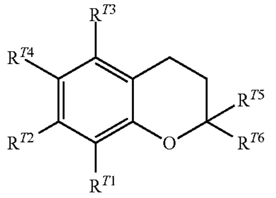

In General Formula (T), $R^{T1}$ to $R^{T3}$ each independently represent a hydrogen atom, an alkyl group, an alkoxy group, an aryl group, an aryloxy group, an aralkyl group, an aralkoxy group, or an alkenyl group.

$R^{T4}$ represents a hydrogen atom, an alkyl group, an alkoxy group, a hydroxy group, an alkoxycarbonyl group, an aryloxycarbonyl group, an acyloxy group, an acyl group, a carboxy group, a sulfo group, a cyano group, or a halogen atom.

$R^{T5}$ and $R^{T6}$ each independently represent a hydrogen atom, an alkyl group, an alkenyl group, an alkoxy group, a hydroxy group, an alkoxycarbonyl group, an aryloxycarbonyl group, an acyloxy group, an acyl group, a carboxy group, a sulfo group, a cyano group, or a halogen atom.

As the substituent that can be employed as $R^{T1}$ to $R^{T3}$, the description for the substituent that can be employed as $R^2$ to $R^4$ in General Formula (I) can be preferably applied.

As the alkoxy group, the acyloxy group, and the acyl group, which can be employed as $R^{T4}$, the description for the substituent that can be employed as —OR3 in General Formula (I) can be preferably applied.

As the alkoxycarbonyl group and the aryloxycarbonyl group, which can be employed as $R^{T4}$, the description for the alkoxycarbonyl group and the aryloxycarbonyl group, which can be employed as $R^1$ in General Formula (I), can be preferably applied.

As the alkyl group, the alkenyl group, and the alkoxy group, which can be employed as $R^{T5}$ and $R^{T6}$, the description for the alkyl group, the alkenyl group, and the alkoxy group, which may be contained in the ring A as the substituent in General Formula (I), can be preferably applied.

As the alkoxycarbonyl group, the acyloxy group, and the acyl group, which can be employed as $R^{T5}$ and $R^{T6}$, the description for the alkoxycarbonyl group, the acyloxy group, and the acyl group, which can be employed as $R^2$ to $R^4$ in General Formula (I), can be preferably applied.

As the aryloxycarbonyl group that can be employed as $R^{T5}$ and $R^{T6}$, the description for the aryloxycarbonyl group that can be employed as $R^1$ in General Formula (I) can be preferably applied.

The alkyl group or aryl group moiety in each of the substituents that can be employed as $R^{T1}$ to $R^{T6}$ may be unsubstituted or have a substituent.

$R^{T1}$ to $R^{T3}$ are preferably an alkyl group.

$R^{T4}$ is preferably a hydroxy group or an acyloxy group.

$R^{T5}$ and $R^{T6}$ are preferably an alkyl group or a carboxy group. It is preferable that at least one of $R^{T5}$ or $R^{T6}$ is an alkyl group having 8 to 20 carbon atoms or a carboxy group and the other thereof is an alkyl group having 1 to 3 carbon atoms.

Specific examples of the compound represented by General Formula (T) are shown below.

T-1

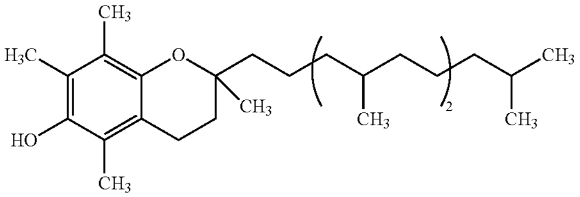

T-2

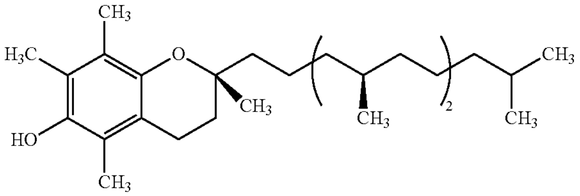

T-3

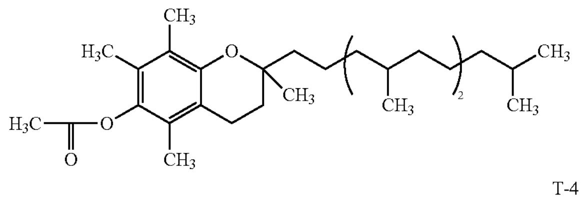

T-4

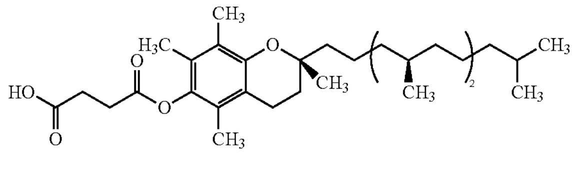

-continued

T-5

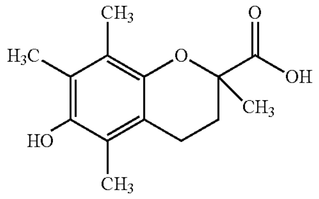

The metallocene compound represented by General Formula (L) is also preferable as an electron-donating type antifading agent that is used in the present invention.

General Formula (L)

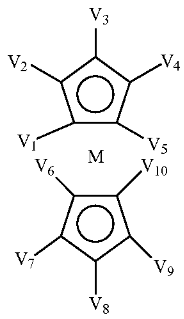

In the formula, M represents Fe, Ti, V, Cr, Co, Ni, Ru, Os, or Pd, and $V_1$, $V_2$, $V_3$, $V_4$, $V_5$, $V_6$, $V_7$, $V_8$, $V_9$, and $V_{10}$ each independently represent a hydrogen atom or a monovalent substituent.

The compounds in which the M is Ti, V, Cr, Co, Ni, Ru, or Hf and $V_1$ to $V_{10}$ are a hydrogen atom respectively have $E_{Hq}$ shown below, which are described in CHAPTER 1 of ENCYCLOPEDIA OF ELECTROCHEMISTRY OF THE ELEMENTS VOL. 13 (ORGANIC SECTION). It is noted that these values are values indicated by using the ferrocene/ferrocinium ion system ($Fc/Fc^+$) as the standard potential.

M=Ti: −0.8 to −0.7 eV
M=V: −2.6 to −2.5 eV
M=Cr: −1.2 to −1.1 eV
M=Co: −1.5 to −1.4 eV
M=Ni: −0.4 to −0.3 eV
M=Ru: −0.1 to 0.0 eV
M=Hf: −1.4 to −1.3 eV

In General, a dye has an $E_{Hd}$ of about 0 to 1.5 eV and an $E_{Ld}$ of about −2 to −1 eV. As a result, in a case of referencing to the list of potentials described in ENCYCLOPEDIA OF ELECTROCHEMISTRY OF THE ELEMENTS VOL. 13 p. 26 and 27, and the like (ORGANIC SECTION) in a case where the substituents of the ferrocene compounds are changed in addition to the kind of the M, and appropriately adjusting $V_1$ to $V_{10}$ according to the electron donating group or the electron withdrawing group, it is possible to use the metallocene compound represented by General Formula (L) as an electron-donating type antifading agent. In particular, as described in Examples described later, the metallocene compound represented by General Formula (L) can be preferably used as an electron-donating type antifading agent that satisfies Relational Expression [A-1] with respect to the dyes A to D.

The M is preferably Fe, Ti, V, Cr, Co, Ni, Ru, or Hf, and more preferably Fe, Ti, Cr, Co, Ni, Ru, or Hf. From the viewpoint of cost and safety, a ferrocene compound in which the M is Fe is still more preferable.

—$V_1$ to $V_{10}$—

$V_1$ to $V_{10}$ represent a hydrogen atom or a monovalent substituent, and the monovalent substituent that can be employed by $V_1$ to $V_{10}$ is not particularly limited; however, examples thereof preferably include the following groups.

Examples thereof include alkyl groups (for example, a methyl group, an ethyl group, a propyl group, an isopropyl group, a butyl group, an isobutyl group, a hexyl group, an octyl group, a dodecyl group, an octadecyl group, a cyclopentyl group, a cyclopropyl group, a cyclohexyl group) and the following substituent V.

It is noted that the alkyl group may be unsubstituted or may have a substituent. The substituent which may be contained is not particularly limited; however, examples thereof preferably include the following substituent V.

(Substituent V)

Examples thereof include a carboxy group, a sulfo group, a cyano group, a halogen atom (for example, a fluorine atom, a chlorine atom, a bromine atom, or an iodine atom), a hydroxy group, an alkoxycarbonyl group (for example, a methoxycarbonyl group, an ethoxycarbonyl group, a phenoxycarbonyl group, or a benzyloxycarbonyl group), an alkoxy group (for example, methoxy group, an ethoxy group, a benzyloxy group, or a phenethyloxy group), an alkenyloxy group (for example, an ethenyloxy group), an aryloxy group having 18 or fewer carbon atoms (for example, a phenoxy group, a 4-methylphenoxy group, or a α-naphthoxy group), an acyloxy group (for example, an acetyloxy group or a propionyloxy group), an acyl group (for example, an acetyl group, a propionyl group, a benzoyl group, or a mesyl group), a carbamoyl group (for example, a carbamoyl group, a N,N-dimethylcarbamoyl group, a morpholinocarbonyl group, or a piperidinocarbonyl group), a sulfamoyl group (for example, a sulfamoyl group, a N,N-dimethylsulfamoyl group, a morpholinosulfonyl group, or a piperidinosulfonyl group), an aryl group (for example, a phenyl group, a 4-chlorophenyl group, a 4-methylphenyl group, or an α-naphthyl group), a heterocyclic group (for example, a 2-pyridyl group, a tetrahydrofurfuryl group, a morpholino group, or a 2-thiopheno group), an amino group (for example, an amino group, a dimethylamino group, an anilino group, or a diphenylamino group), an alkylthio group (for example, a methylthio group or an ethylthio group), an alkylsulfonyl group (for example, a methylsulfonyl group or a propylsulfonyl group), an alkylsulfinyl group (for example, a methylsulfinyl group), a nitro group, a phosphate group, an acylamino group (for example, an acetylamino group), an ammonium group (for example, a trimethylammonium group or a tributylammonium group), a mercapto group, a hydrazino group (for example, a trimethylhydrazino group), a ureido group (for example, a ureido group or an N,N-dimethylureido group), an imide group, an alkenyl group (for example, a vinyl group or a 2-phenylethenyl group), an alkynyl group (for example, an ethynyl group), and a group consisting of a non-aromatic unsaturated hydrocarbon ring (for example, a 1-cyclohexenyl group).

The number of carbon atoms of the substituent V is preferably 18 or less. Further, this substituent V may be further substituted with the substituent V.

More specifically, the monovalent substituent that can be employed as $V_1$ to $V_{10}$ is preferably an alkyl group (examples thereof include a methyl group, an ethyl group, a carboxymethyl group, a 2-carboxyethyl group, a 3-carboxypropyl group, a 4-carboxybutyl group, a sulfomethyl group, a 2-sulfoethyl group, a 3-sulfopropyl group, a 4-sulfobutyl group, a 3-sulfobutyl group, a 2-hydroxy-3-sulfopropyl group, a 2-cyanoethyl group, a 2-chloroethyl group, a 2-bromoethyl group, a 2-hydroxyethyl group, a 3-hydroxypropyl group, a hydroxymethyl group, a 2-hydroxyethyl group, a 4-hydroxybutyl group, a 2,4-dihydroxybutyl group, a 2-methoxyethyl group, a 2-ethoxyethyl group, a methoxymethyl group, a 2-ethoxycarbonylethyl group, a methoxycarbonylmethyl group, a 2-methoxyethyl group, a 2-ethoxyethyl group, a 2-phenoxyethyl group, a 2-acetyloxyethyl group, a 2-propionyloxyethyl group, a 2-acetylethyl group, a 3-benzoylpropyl group, a 2-carbamoylethyl group, a 2-morpholinocarbonylethyl group, a sulfamoylmethyl group, a 2-(N,N-dimethylsulfamoyl)ethyl group, a benzyl group, a 2-naphthylethyl group, a 2-(2-pyridyl)ethyl group, an allyl group, a 3-aminopropyl group, a dimethylaminomethyl group, a 3-dimethylaminopropyl group, a methylthiomethyl group, a 2-methylsulfonylethyl group, a methylsulfinylmethyl group, a 2-acetylaminoethyl group, an acetylaminomethyl group, a trimethylammoniumethyl group, a 2-mercaptoethyl group, a 2-trimethylhydrazinoethyl group, a methylsulfonylcarbamoylmethyl group, or a (2-methoxy)ethoxymethyl group), an aryl group (for example, a phenyl group, a 1-naphthyl group, or a p-chlorophenyl group), a heterocyclic group (for example, a 2-pyridyl group, a 2-thiazolyl group, or a 4-phenyl-2-thiazolyl group), a carboxy group, a formyl group, an acetyl group, a benzoyl group, a halogen atom (preferably a chlorine atom), an N-phenylcarbamoyl group, an N-butylcarbamoyl group, a borate group, a sulfo group, a cyano group, a hydroxy group, an alkoxy group (preferably, a methoxy group, a 3-carboxypropanoyl group, or a 3-hydroxypropanoyl group), an alkenyloxy group (for example, an ethenyloxy group), an alkenyl group (for example, a vinyl group, a 2-phenylethenyl group), a methoxycarbonyl group, an acetyloxy group, or a dimethylamino group.

In addition, two of $V_1$ to $V_{10}$ may be bonded to each other to form a ring. This ring may be either aliphatic or aromatic. In addition, this ring may be substituted with, for example, the above-described substituent V.

$V_1$ to $V_{10}$ is preferably a hydrogen atom, a halogen atom, an alkyl group, an alkenyl group, an alkoxy group, or an alkenyloxy group, and more preferably a hydrogen atom or an alkyl group.

In $V_1$ to $V_{10}$, the number of groups that are monovalent substituents is not particularly limited as long as Relational Expression [A-1] or [A-2] is satisfied in relation to the dye: however, it is preferably, for example, 0 to 5, more preferably 0 to 3, and still more preferably 0 to 2.

Examples of the compound represented by General Formula (L) are shown below, which are not limited thereto. n in I-36 and I-37 means the number of repetitions of the unit, and it is 1 to 3.

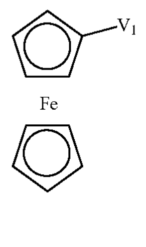

| Chemical compound No. | $V_1$ |
|---|---|
| I-1 | H |
| I-2 | $CO_2H$ |
| I-3 | $(CH_2)_{11}N^+(CH_3)_3I^-$ |
| I-4 | CHO |
| I-5 | $SO_3H$ |
| I-6 | CO 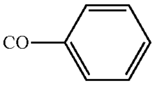 |
| I-7 | 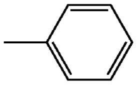 |
| I-8 | $B(OH)_2$ |
| I-9 | $CH_2N^+(CH_3)_3I^-$ |
| I-10 | $CH_2N(CH_3)_2$ |
| I-11 | $CO(CH_2)_2CO_2H$ |
| I-12 | $COCH_3$ |
| I-13 | CONH 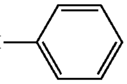 |
| I-14 | CONH—$(CH_2)_3CH_3$ |
| I-15 | $CH_2OH$ |
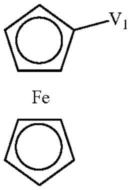
| Chemical compound No. | $V_1$ |
|---|---|
| I-16 | Cl |
| I-17 | $CH_2P^+$ 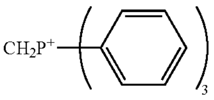 $I^-$ |
| I-18 | $CO(CH_2)_3Br$ |
| I-19 | $CO(CH_2)_3OH$ |
| I-20 | $CO(CH_2)_2OH$ |
| I-21 | CH═N—OH |
| I-22 | $CH═N^+—O^-$ |
| I-23 | $CH2SO_3^-Na^+$ |
| I-24 | $CH_2OCH_3$ |
| I-25 | $CH_2NHCOCH_3$ |
| I-26 | $C_2H_5$ |
| I-27 | $CH(OH)CH_3$ |
| I-28 | $C(OH)(CH_3)_2$ |
| I-29 | $(CH_2)_4OH$ |
| I-30 | $CH(OH)(CH_2)_2CH_2OH$ |
I-31
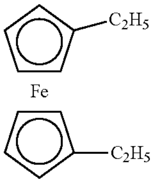
I-32
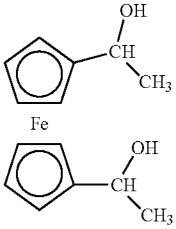
I-33
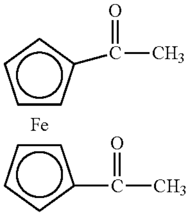
I-34
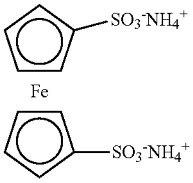
I-35
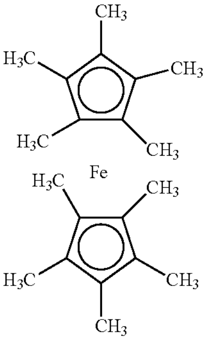
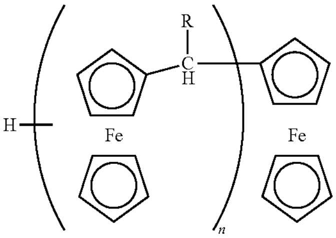
I-36
R = H
I-37
R = 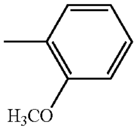

-continued
I-38
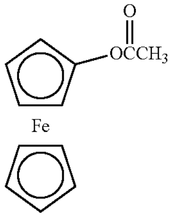
I-39
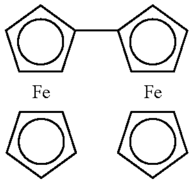
I-40
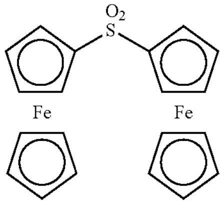
I-41
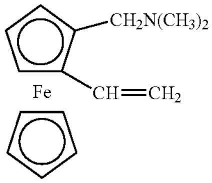
I-42
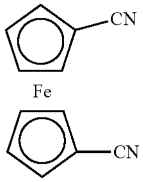
I-43
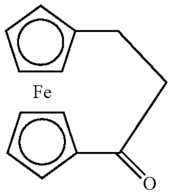
I-44
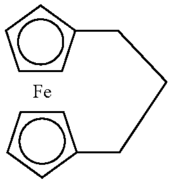
I-45
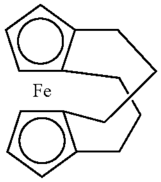
-continued
I-46
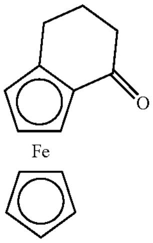
I-47
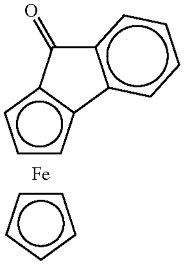
I-48
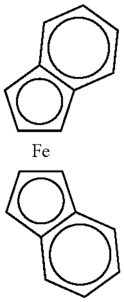
I-50
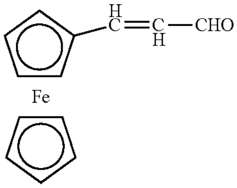
I-51
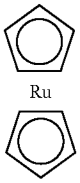
I-52
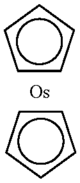
I-53
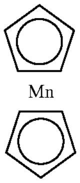

The metallocene compound that is used in the present invention can be synthesized with reference to the method described in D. E. Bublitz et al., Organic Reactions, Vol. 17, pp. 1 to 154 (1969). It is noted that as the notation of each of the metallocene compound and the ferrocene compound, the following notation is known in addition to those shown in the present invention; however, all of them mean the same compound.

Notations in Present Invention a)

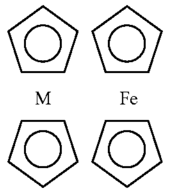

Other Notations in Present Invention b)

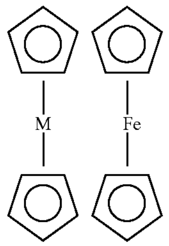

c)

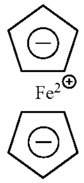

The compound represented by General Formula (IA) is also preferable as an electron-donating type antifading agent in the present invention.

General Formula (IA)

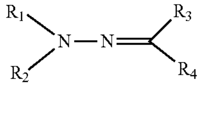

In General Formula (IA), each of $R_1$, $R_2$, and $R_3$ represents an alkyl group, an aryl group, or a heterocyclic group. However, in $R_1$ and $R_2$, the carbon atom directly bonded to the nitrogen atom is not substituted with an oxo group, a thioxo group, or an imino group. $R_4$ is a hydrogen atom, an alkyl group, an aryl group, or a heterocyclic group.

In addition, it is preferable that the compound represented by General Formula (IA) is a compound represented by General Formula (IIA).

General Formula (IIA)

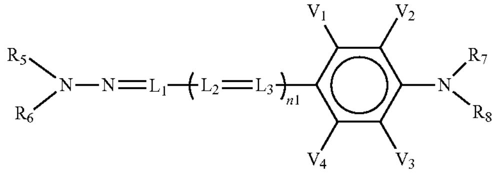

In General Formula (IIA), $R_5$ and $R_6$ respectively have the same meaning as $R_1$ and $R_2$ in General Formula (IA). $R_7$ and $R_8$ each represent a hydrogen atom, an alkyl group, an aryl group, or a heterocyclic group. $V_1$, $V_2$, $V_3$, and $V_4$ each represent a hydrogen atom or a monovalent substituent. $L_1$, $L_2$, and $L_3$ each represent a methine group. n1 represents 0 or 1.

Hereinafter, General Formula (IA) will be described in detail.

Examples of $R_1$, $R_2$, and $R_3$ in General Formula (IA) include, an unsubstituted alkyl group (for example, a methyl group, an ethyl group, a propyl group, an isopropyl group, a butyl group, an isobutyl group, a hexyl group, an octyl group, a dodecyl group, an octadecyl group, a cyclopentyl group, a cyclopropyl group, or a cyclohexyl group); a substituted alkyl group {in a case where a substituent is defined as Va, the substituent represented by Va is not particularly limited; however, examples thereof include a carboxy group, a sulfo group, a cyano group, a halogen atom (for example, a fluorine atom, a chlorine atom, a bromine atom, or an iodine atom), a hydroxy group, an alkoxycarbonyl group (for example, a methoxycarbonyl group, an ethoxycarbonyl group, a phenoxycarbonyl group, or a benzyloxycarbonyl group), an alkoxy group (for example, a methoxy group, an ethoxy group, a benzyloxy group, or a phenethyloxy group), an aryloxy group having 18 or fewer carbon atoms (for example, a phenoxy group, a 4-methylphenoxy group, or an α-naphthoxy group), an acyloxy group (for example, an acetyloxy group or a propionyloxy group), an acyl group (for example, an acetyl group, a propionyl group, a benzoyl group, or a mesyl group), a carbamoyl group (for example, a carbamoyl group, an N,N-dimethylcarbamoyl group, a morpholinocarbonyl group, or a piperidinocarbonyl group), a sulfamoyl group (for example, a sulfamoyl group, an N,N-dimethylsulfamoyl group, a morpholinosulfonyl group, or a piperidinosulfonyl group), an aryl group (for example, a phenyl group, a 4-chlorophenyl group, a 4-methylphenyl group, or an α-naphthyl group), a heterocyclic group (for example, a 2-pyridyl group, a tetrahydrofurfuryl group, a morpholino group, or a 2-thiopheno group), an amino group (for example, an amino group, a dimethylamino group, an anilino group, or a diphenylamino group), an alkylthio group (for example, a methylthio group or an ethylthio group), an alkylsulfonyl group (for example, a methylsulfonyl group or a propylsulfonyl group), an alkylsulfinyl group (for example, a methylsulfinyl group), a nitro group, a phosphate group, an acylamino group (for example, an acetylamino group), an ammonium group (for example, a trimethylammonium group or a tributylammonium group), a mercapto group, a hydracino group (for example, trimethylhydrazino group), a ureido group (for example, a ureido group or an N,N-dimethylureido group), an imide group, and an unsaturated hydrocarbon group (for example, a vinyl group, an ethynyl group, a 1-cyclohexenyl group, a benzylidine group, or a benzylidene group). The number of carbon atoms of the substituent Va is preferably 18 or less. In addition, these substituents may be further substituted with the substituent Va.

More specifically, $R_1$, $R_2$, and $R_3$ are preferably an alkyl group (examples thereof include a carboxymethyl group, a 2-carboxyethyl group, a 3-carboxypropyl group, a 4-carboxybutyl group, a 2-sulfoethyl group, a 3-sulfopropyl group, a 4-sulfobutyl group, a 3-sulfobutyl group, a 2-hydroxy-3-sulfopropyl group, a 2-cyanoethyl group, a 2-chloroethyl group, a 2-bromoethyl group, a 2-hydroxyethyl group, a 3-hydroxypropyl group, a hydroxymethyl group, a 2-hydroxyethyl group, a 2-methoxyethyl group, a 2-ethoxyethyl group, a 2-ethoxycarbonylethyl group, a methoxycarbonylmethyl group, a 2-methoxyethyl group, a 2-ethoxyethyl group, a 2-phenoxyethyl group, a 2-acetyloxyethyl group, a 2-propionyloxyethyl group, a 2-acetylethyl group, a 3-benzoylpropyl group, a 2-carbamoylethyl group, a 2-morpholinocarbonylethyl group, a sulfamoylmethyl group, a 2-(N,N-dimethylsulfamoyl)ethyl group, a benzyl group, a 2-naphthylethyl group, a 2-(2-pyridyl)ethyl group, an allyl group, a 3-aminopropyl group, a 3-dimethylaminopropyl group, a methylthiomethyl group, a 2-methylsulfonylethyl group, a methylsulfinylmethyl group, a 2-acetylaminoethyl group, a 3-trimethylammoniumethyl group, a 2-mercaptoethyl group, a 2-trimethylhydrazinoethyl group, a methylsulfonylcarbamoylmethyl group, or a (2-methoxy) ethoxymethyl group), an aryl group (for example, a phenyl group, an α-naphthyl group, or a β-naphthyl group, such as a phenyl group or a naphthyl group, which is substituted with the above-described unsubstituted alkyl group or the above-described substituent Va), or a heterocyclic group (for example, a 2-pyridyl group, a 2-thiazolyl group, or a 2-pyridyl group substituted with the above-described substituent Va).

In addition, in General Formula (IA), $R_1$ and $R_2$, and $R_3$ and $R_4$ may be bonded to each other to form rings, respectively. These rings may be substituted with, for example, the above-described substituent Va. However, the carbon atom directly bonded to the nitrogen atom in $R_1$ and $R_2$ is not substituted with an oxo group, a thioxo group, or an imino group. For example, $R_1$ and $R_2$ are not an acetyl group, a carboxy group, a benzoyl group, a formyl group, a thioacetyl group, a thioaldehyde group, a thiocarboxy group, a thiobenzoyl group, an imino group, an N-methylimino group, or an N-phenylimino group, and in a case where the two ($R_1$ and $R_2$) form a ring, they are not a malonyl group, a succinyl group, a glutaryl group, or an adipoyl group.

In General Formula (IA), $R_1$ and $R_2$ are still more preferably the unsubstituted alkyl group or the substituted alkyl group described in General Formula (IA). They are particularly preferable to be an unsubstituted alkyl group (for example, a methyl group, an ethyl group, a propyl group, or a butyl group), or a substituted alkyl group {for example, a sulfoalkyl group (for example, a 2-sulfoethyl group, a 3-sulfopropyl group, a 4-sulfobutyl group, or a 3-sulfobutyl group), a carboxyalkyl group (for example, a carboxymethyl group or a 2-carboxyethyl group), and a hydroxyalkyl group (for example, a 2-hydroxyethyl group)}.

In General Formula (IA), $R_3$ is still more preferably a substituent represented by General Formula (IIIA).

General Formula (IIIA)

$$-\!\left(L_4{=}L_5\right)_{n2}\!-Ar$$

In General Formula (IIIA), each of $L_4$ and $L_5$ is a methine group. Ar represents an aryl group. $n_2$ represents an integer of 0 or more. Ar is preferably a phenyl group or a substituted phenyl group (here, examples of the substituent include the above-described Va). $L_4$ and $L_5$ are preferably an unsubstituted methine group. $n_2$ is preferably 0 or 1.

In General Formula (IA), as $R_4$, a hydrogen atom or the same substituent of $R_1$, $R_2$, and $R_3$ in General Formula (IA) is used, $R_4$ is preferably a hydrogen atom.

The hydrazone compound represented by General Formula (IA) may be isolated as a salt without any problem, in a case where it is advantageous for synthesis and storage. In such a case, any compound can be used as long as the compound can form a salt with a hydrazone compound; however, examples of the preferred salt include the following salts. Examples thereof include aryl sulfonates (for example, p-toluene sulfonate and p-chlorobenzene sulfonate), aryl disulfonates (for example, 1,3-benzene disulfonate, 1,5-naphthalene disulfonate, and 2,6-naphthalene disulfonate), thiocyanates, picrates, carboxylates (for example, oxalate, acetate, benzoate, and hydrogen oxalate), halogenates (for example, hydrochloride, hydrofluoride, hydrobromide, and hydroiodide), sulfate salts, perchlorate salts, tetrafluoroborate salts, sulfite salts, nitrate salts, phosphate salts, carbonate salts, and bicarbonate salts. Hydrogen oxalate, oxalate, or hydrochloride is preferable.

Hereinafter, General Formula (IIA) will be described in detail.

$R_5$ and $R_6$ in General Formula (IIA) respectively have the same meaning as $R^1$ and $R^2$ in General Formula (IA), and they are preferably the same as $R^1$ and $R^2$, respectively.

$R_7$ and $R_8$ in General Formula (IIA) are preferably a hydrogen atom or the same ones as the examples of $R_1$ and $R_2$ in General Formula (IA). $R_7$ and $R_8$ are still more preferably an unsubstituted alkyl group or a substituted alkyl group, and they are particularly preferably an unsubstituted alkyl group (for example, a methyl group, an ethyl group, a propyl group, or a butyl group) or a substituted alkyl group {for example, a sulfoalkyl group (for example, a 2-sulfoethyl group, a 3-sulfopropyl group, a 4-sulfobutyl group, or a 3-sulfobutyl group), a carboxyalkyl group (for example, a carboxymethyl group or a 2-carboxyethyl group), or a hydroxyalkyl group (for example, a 2-hydroxyethyl group)}.

In General Formula (IIA), $V_1$, $V_2$, $V_3$, and $V_4$ represent a hydrogen atom or a monovalent substituent. The substituent is not particularly limited, however, examples thereof include those represented by $R_1$, $R_2$, $R_3$, and Va in General Formula (IA). Particularly preferred examples thereof include an unsubstituted alkyl group (for example, a methyl group or an ethyl group), a substituted alkyl group (for example, a 2-sulfobutyl group or 2-carboxyethyl group), and an alkoxy group (for example, a methoxy group or an ethoxy group).

In General Formula (IIA), $L_1$, $L_2$, and $L_3$ represent an unsubstituted methine group or a substituted methine group (examples of a substituent include those represented by $R_1$, $R_2$, $R_3$, and Va in General Formula (IA)). An unsubstituted methine group is preferable. $n_1$ is preferably 0.

Examples of the compound represented by General Formulae (IA) and (IIA) are shown below, which are not limited thereto.

Compound represented by General Formula (IA) (the compound represented by General Formula (IA) includes the compound represented by General Formula (IIA); however, as the compound represented by General Formula (IA), examples in which the compound represented by General Formula (TIA) is excluded will be shown below)

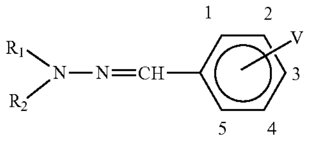

| Chemical compound No. | $R_1$ | $R_2$ | V |
|---|---|---|---|
| IA-1 | $CH_3$ | $CH_3$ | H |
| IA-2 | $CH_3$ | $CH_3$ | 3-O—$CH_3$ |
| IA-3 | $CH_3$ | $CH_3$ | 3-Cl |
| IA-4 | $(CH_2)_2SO_3Na$ | $CH_3$ | H |
| IA-5 | $(CH_2)_4SO_3Na$ | $CH_3$ | 1-$CH_3$ |
| IA-6 | $(CH_2)_4SO_3Na$ | $CH_3$ | 1-$OCH_3$ |
| IA-7 | $(CH_2)_2CO_2H$ | $(CH_2)_2CO_2H$ | 2-$OCH_3$ |
| IA-8 | $(CH_2)_2CO_2H$ | $C_2H_5$ | H |
| IA-9 | $(CH_2)_3OH$ | $CH_3$ | 3-$SCH_3$ |
| IA-10 | $(CH_2)_2CO_2C_2H_5$ | $CH_3$ | 2,4-$Cl_2$ |
| IA-11 | $(CH_2)_2CN$ | $CH_3$ | 1,5-$(CH_3)_2$ |
| IA-12 | $(CH_2)_3NHCOCH_3$ | $CH_3$ | H |
| IA-13 | $(CH_2)_2SO_3Na$ | $(CH_2)_2SO_3Na$ | H |
| IA-14 | $CH_3$ | 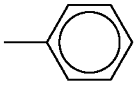 | 3-$OC_2H_5$ |
| IA-15 | 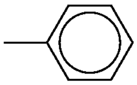 | 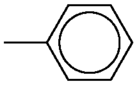 | H |

IA-16

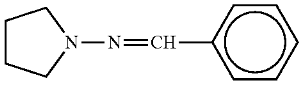

IA-17

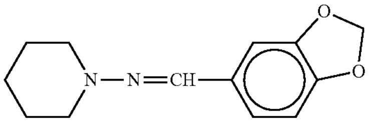

IA-18

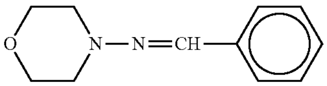

-continued

IA-19

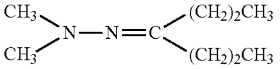

$(CO_2H)_2$

IA-20

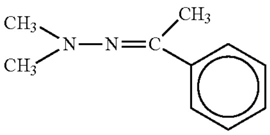

$(CO_2H)_2$

IA-21

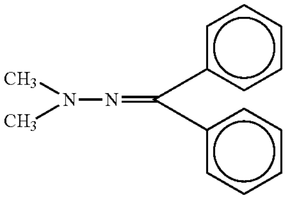

IA-22

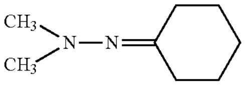

$(CO_2H)_2$

IA-23

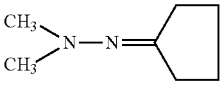

$(CO_2H)_2$

IA-24

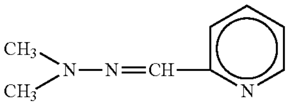

IA-25

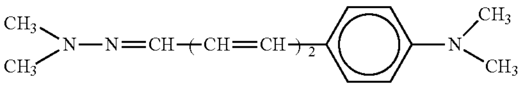

Compound Represented by General Formula (IIA)

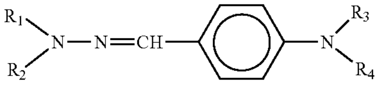

| Chemical compound No. | $R_1$ | $R_2$ | $R_3$ | $R_4$ |
|---|---|---|---|---|
| IIA-1 | $CH_3$ | $CH_3$ | $CH_3$ | $CH_3$ |
| IIA-2 | $CH_3$ | $CH_3$ | $CH_3$ | $(CH_2)_2OH$ |
| IIA-3 | $CH_3$ | $CH_3$ | $CH_3$ | $(CH_2)_2OCH_5$ |
| IIA-4 | $CH_3$ | $CH_3$ | $CH_3$ | $CH_2CO_2H$ |
| IIA-5 | $CH_3$ | $CH_3$ | $CH_3$ | $(CH_2)_2N(CH_3)_3^{\oplus}\ I^{\ominus}$ |
| IIA-6 | $CH_3$ | $CH_3$ | $CH_2CO_2H$ | $CH_2CO_2H$ |
| IIA-7 | $CH_3$ | $CH_3$ | $CH_3$ | $(CH_2)_2SO_3Na$ |
| IIA-8 | $CH_3$ | $CH_3$ | $CH_3$ | $(CH_2)_2Cl$ |
| IIA-9 | $CH_3$ | $CH_3$ | $CH_3$ | $CH_2CN$ |
| IIA-10 | $CH_3$ | $(CH_2)_2SO_3Na$ | $CH_3$ | $CH_3$ |
| IIA-11 | $CH_3$ | $(CH_2)_2SO_3Na$ | $CH_3$ | $(CH_2)_2SO_3Na$ |

-continued

| Chemical compound No. | $R_1$ | $R_2$ | $R_3$ | $R_4$ |
|---|---|---|---|---|
| IIA-12 | $(CH_2)_2SO_3Na$ | $(CH_2)_2SO_3Na$ | $CH_3$ | $CH_3$ |
| IIA-13 | $CH_3$ | $(CH_2)_3OH$ | $CH_3$ | $CH_3$ |
| IIA-14 | $CH_3$ | $(CH_2)_2CO_2H$ | $CH_3$ | $CH_3$ |
| IIA-15 | $CH_3$ | $(CH_2)_2CN$ | $CH_3$ | $CH_3$ |
| IIA-16 | $CH_3$ | $(CH_2)_3NHCOCH_3$ | $CH_3$ | $CH_3$ |
| IIA-17 | $CH_3$ | $(CH_2)_2CO_2C_2H_5$ | $CH_3$ | $CH_3$ |

IIA-18

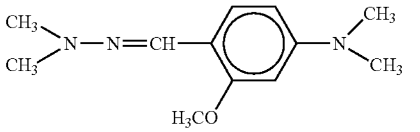

IIA-19

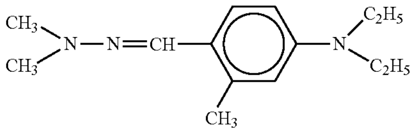

IIA-20

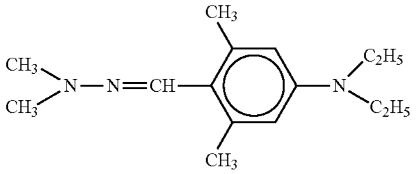

IIA-21

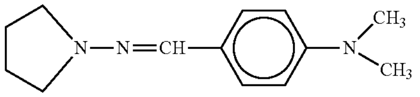

IIA-22

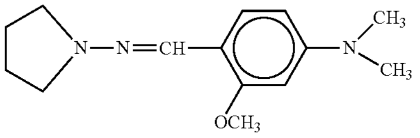

IIA-23

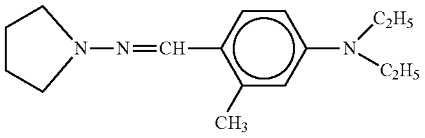

IIA-24

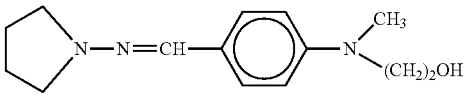

IIA-25

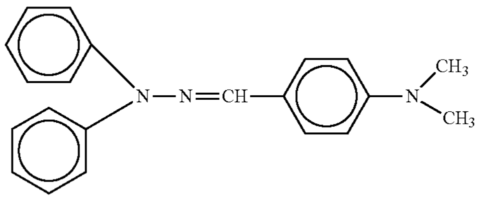

-continued

IIA-26

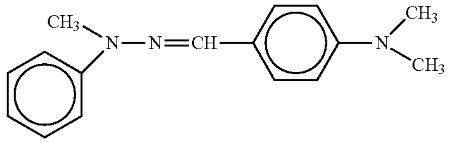

IIA-27

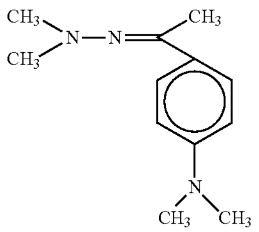

IIA-28

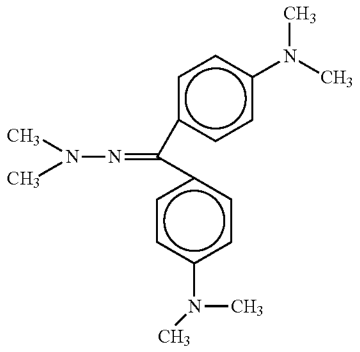

IIA-29

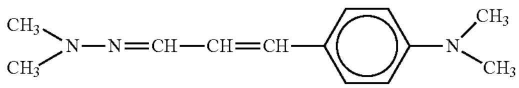

IIA-30

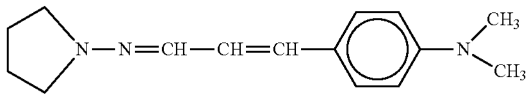

IIA-31

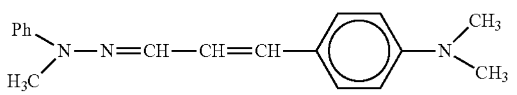

The compound represented by General Formula (IA) (including General Formula (IIA)) can be easily produced according to a known method. That is, the compound can be obtained by adding a small amount of an acid (for example, acetic acid and hydrochloric acid) as a condensing agent to a hydrazine compound, and an aldehyde compound or ketone compound, and then condensing the mixture. Specific methods are described in JP1985-34099A (JP-S60-34099A), JP1985-34100A (JP-S60-34100A).

In addition, a reductone compound represented by General Formula (A) or General Formula (B) described later is also preferable as the electron-donating type antifading agent that is used in the present invention.

General Formula (A)

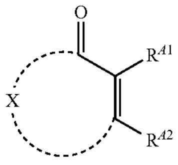

In General Formula (A), $R^{A1}$ and $R^{A2}$ each independently represent a hydroxy group, an amino group, an acylamino group, an alkylsulfonylamino group, an arylsulfonylamino group, an alkoxycarbonylamino group, a mercapto group, or an alkylthio group. X represents a non-metal atomic group which is composed of a carbon atom, and an oxygen atom and/or a nitrogen atom, and it constitutes a 5-membered ring or a 6-membered ring together with —C(═O)—C($R^{A1}$)═C($R^{A2}$)—.

$R^{A1}$ and $R^{A2}$ are preferably a hydroxy group, an amino group, an alkylsulfonylamino group, or an arylsulfonylamino group, more preferably a hydroxy group or an amino group, and still more preferably a hydroxy group.

In General Formula (A), X has at least one —O— bond, and it is preferably composed of a combination of one or two or more of —C($R^{A3}$)($R^{A4}$)—, —C($R^{A5}$)═, —C(═O)—, and —N(Ra)—, and N═. Here, it is preferable that $R^{A3}$ to $R^{A5}$ and $R^a$ are each independently a hydrogen atom; an alkyl group which has 1 to 10 carbon atoms and may have a substituent: an aryl group which has 6 to 15 carbon atoms and may have a substituent: a hydroxy group: or a carboxyl group.

In General Formula (A), examples of the 5-membered or 6-membered ring that is formed through X include a cyclopentenone ring (2-cyclopenten-1-one ring; the formed compound is reductic acid), a furanone ring [2(5H)-furanone ring], a dihydropyranone ring [3,4-dihydro-2H-pyran-4-one ring (2,3-dihydro-4H-pyrone ring), 3,6-dihydro-2H-pyran-2-one ring, 3,6-dihydro-2H-pyran-6-one ring (5,6-dihydro-2-pyrone ring)], and a 3,4-dihydro-2H-pyrone ring. A cyclopentenone ring, a furanone ring, or a dihydropyrone ring is preferable, a furanone ring or a dihydropyrone ring is still more preferable, and a furanone ring is particularly preferable.

These rings may be fused and the fused ring may be a saturated ring or an unsaturated ring.

Among the reductone compounds represented by General Formula (A), a compound represented by General Formula (A1) is preferable, and among these, a compound represented by General Formula (A2) is preferable.

General Formula (A1)

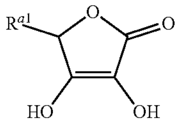

-continued

General Formula (A2)

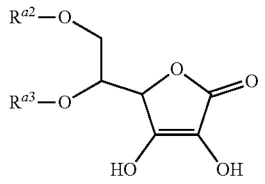

In General Formula (A1), $R^{a1}$ represents a hydrogen atom, an alkyl group, an aryl group, or a heterocyclic group, which may have a substituent.

$R^{a1}$ is preferably an alkyl group which may have a substituent, and more preferably —CH($OR^{a3}$)$CH_2OR^{a2}$, and in this case, the compound represented by General Formula (A1) is the compound represented by General Formula (A2).

In General Formula (A2), $R^{a2}$ and $R^{a3}$ each independently represent a hydrogen atom, an alkyl group, an acyl group, or an alkoxycarbonyl group, $R^{a2}$ and $R^{a3}$ may be bonded to each other to form a ring, the formed ring is preferably a 1,3-dioxolane ring, and the ring may further have a substituent. A compound having a dioxolane ring can be synthesized by acetalization or ketalization of ascorbic acid with an aldehyde compound or ketone compound, and any ketone compound and aldehyde compound can be used as raw materials without particular limitation.

In the compound represented by General Formula (A2), one of the particularly preferred combinations of the substituents is that $R^a$ is an acyl group and $R^{a3}$ is a hydrogen atom, where the acyl group may be either an aliphatic acyl group or an aromatic acyl group. In a case of an aliphatic acyl group, the number of carbon atoms thereof is preferably 2 to 30, more preferably 4 to 24, and still more preferably 8 to 18. In a case of an aromatic acyl group, the number of carbon atoms is preferably 7 to 24, more preferably 7 to 22, and still more preferably 7 to 18. Preferred examples of the acyl group include butanoyl, hexanoyl, 2-ethylhexanoyl, decanoyl, lauroyl, myristoyl, palmitoyl, stearoyl, palmitoleyl, myristoleic, oleoyl, benzoyl, 4-methylbenzoyl, and 2-methylbenzoyl.

Similarly to the case of the compound represented by General Formula (A), a compound represented by General Formula (B) is also preferable.

General Formula (B)

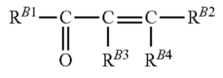

In General Formula (B), $R^{B1}$ and $R^{B2}$ each independently represent a hydrogen atom, an alkyl group, an alkenyl group, a cycloalkyl group, an aryl group, an acyl group, a carboxy group, an amino group, an alkoxy group, an alkoxycarbonyl group, or a heterocyclic group, and $R^{B3}$ and $R^{B4}$ each independently represent a hydroxy group, an amino group, an acylamino group, an alkylsulfonylamino group, an arylsulfonylamino group, an alkoxycarbonylamino group, or a mercapto group.

The alkyl group as $R^{B1}$ and $R^{B2}$ preferably has 1 to 10 carbon atoms. The alkyl group is preferably methyl, ethyl, or t-butyl.

The alkenyl group as $R^{B1}$ and $R^{B2}$ preferably has 2 to 10 carbon atoms. The alkenyl group is preferably vinyl or allyl, and more preferably vinyl.

The cycloalkyl group as $R^{B1}$ and $R^{B2}$ preferably has 3 to 10 carbon atoms. The cycloalkyl group is preferably cyclopropyl, cyclopentyl, or cyclohexyl.

These alkyl group, alkenyl group, and cycloalkyl group may have a substituent, and the substituent is preferably at least one selected from a hydroxy group, a carboxyl group, and a sulfo group.

In a case where the alkenyl group is vinyl, a vinyl group substituted with a carboxyl group is also preferable.

The aryl group as $R^{B1}$ and $R^{B2}$ preferably has 6 to 12 carbon atoms. The aryl group may have a substituent, and the substituent is preferably at least one selected from an alkyl group, a hydroxy group, a carboxyl group, a sulfo group, a halogen atom, a nitro group, and a cyano group.

The acyl group as $R^{B1}$ and $R^{B2}$ is preferably formyl, acetyl, isobutyryl, or benzoyl.

The amino group as $R^{B1}$ and $R^{B2}$ includes an amino group, an alkylamino group, an arylamino group, and is preferably amino, methylamino, dimethylamino, ethylamino, diethylamino, dipropylamino, phenylamino, and N-methyl-N-phenylamino.

The alkoxy group as $R^{B1}$ and $R^{B2}$ preferably has 1 to 10 carbon atoms. The alkoxy group is preferably methoxy or ethoxy.

The alkoxycarbonyl group as $R^{B1}$ and $R^{B2}$ is preferably methoxycarbonyl.

In the heterocyclic group as $R^{B1}$ and $R^{B2}$, the ring-constituting heteroatom is preferably an oxygen atom, a sulfur atom, or a nitrogen atom, and the ring structure is preferably a 5-membered ring or a 6-membered ring. The heterocyclic group may be an aromatic heterocyclic group or a saturated heterocyclic group, and it may be fused.

The heterocyclic ring in the heterocyclic group is preferably a pyridine ring, a pyrimidine ring, a pyrrole ring, a furan ring, a thiophene ring, a pyrazole ring, a piperidine ring, a piperazine ring, or a morpholine ring.

$R^{B1}$ and $R^{B2}$ are more preferably an alkyl group having 1 to 6 carbon atoms or an aryl group having 6 to 12 carbon atoms.

The amino group as $R^{B3}$ and $R^{B4}$ includes an amino group, an alkylamino group, an arylamino group, and is preferably an amino group, or an alkylamino group such as methylamino, ethylamino, n-butylamino, and hydroxyethylamino.

The acylamino group as $R^{B3}$ and $R^{B4}$ is preferably acetylamino or benzoylamino.

The alkylsulfonylamino group as $R^{B3}$ and $R^{B4}$ is preferably methylsulfonylamino.

The arylsulfonylamino group as $R^{B3}$ and $R^{B4}$ is preferably benzenesulfonylamino or p-toluenesulfonylamino.

The alkoxycarbonylamino group as $R^{B3}$ and $R^{B}$S is preferably methoxycarbonylamino.

$R^{B3}$ and $R^{B}$ are more preferably a hydroxy group, an amino group, an alkylsulfonylamino group, or an arylsulfonylamino group.

The electron-donating type antifading agent that is used in the present invention is more preferably a reductone compound, and specific examples thereof include compounds exemplified in paragraphs 0014 to 0034 of JP1994-27599A (JP-H6-27599A), compounds exemplified in paragraphs 0012 to 0020 of JP1994-110163A (JP-H6-110163A), and compounds exemplified in paragraphs 0022 to 0031 of JP1996-114899A (JP-H8-114899A).

Among these, a myristic acid ester, palmitic acid ester, or stearic acid ester of L-ascorbic acid is particularly preferable.

A hydroquinone compound, an aminophenol compound, an aminonaphthol compound, a 3-pyrazolidinone compound, and saccharin, as well as precursors thereof and a picolinium compound are also preferable as the electron-donating type antifading agent that is used in the present invention. Examples thereof are shown below.

S-1

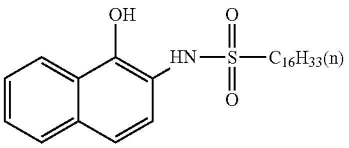

S-2

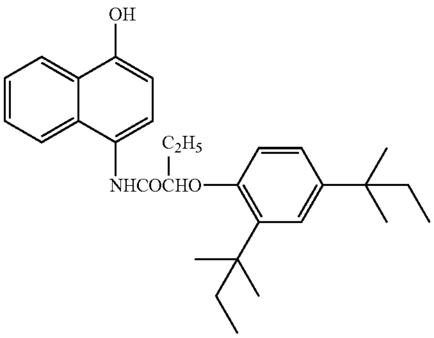

S-3

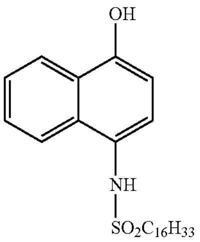

S-4

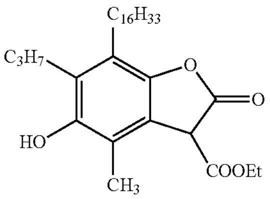

S-5

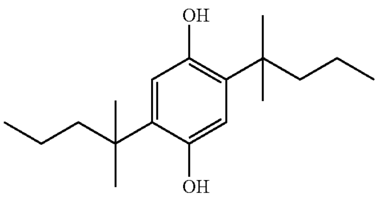

S-6

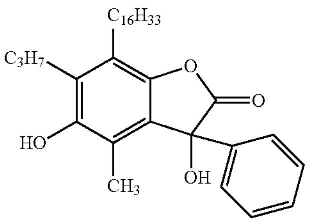

S-7
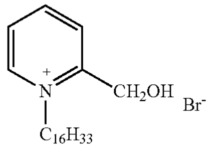
S-8
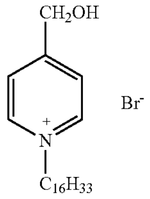
S-9
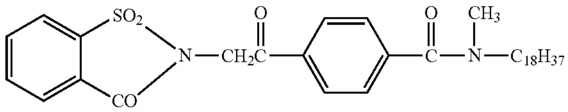
S-10
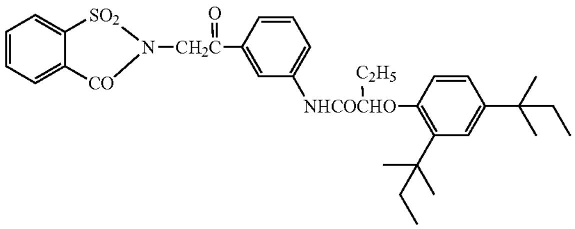
S-11
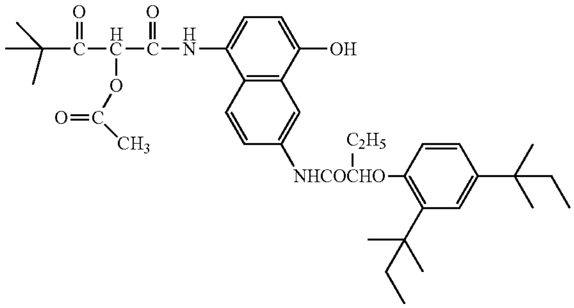
S-12
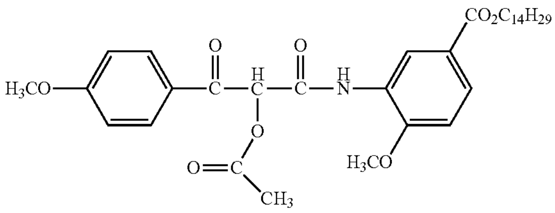
S-13
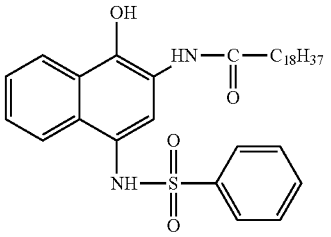
S-14
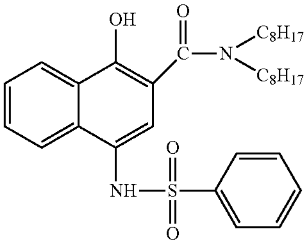
S-15
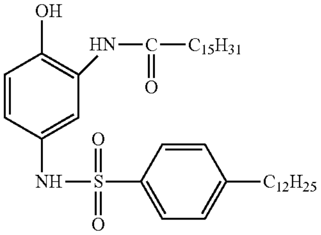
S-16
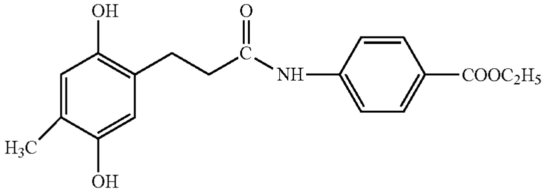
S-17
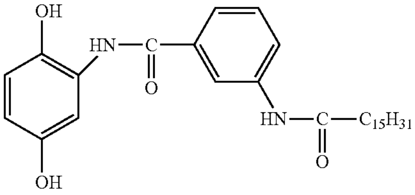
S-18
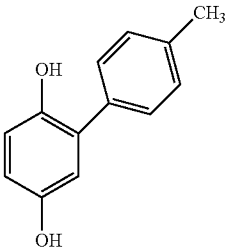
S-19
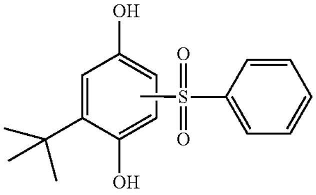
S-20
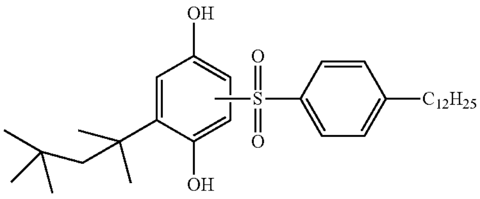

-continued
S-21
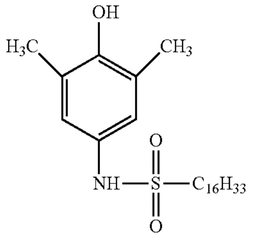
S-22
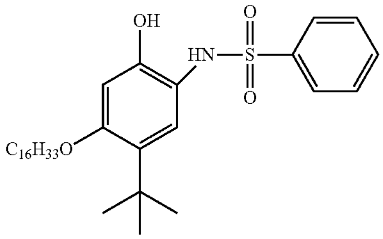
S-23
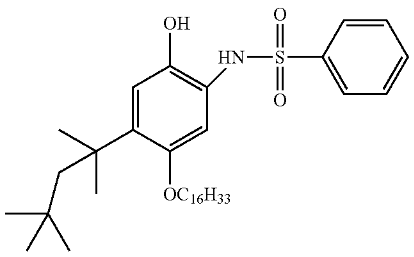
S-24
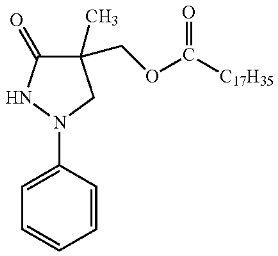
S-25
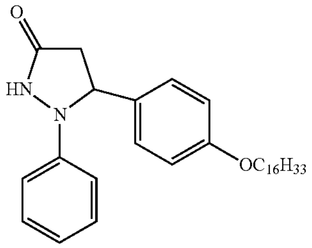
S-26
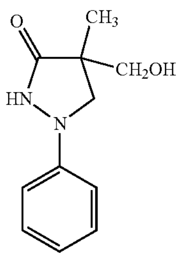
-continued
S-27
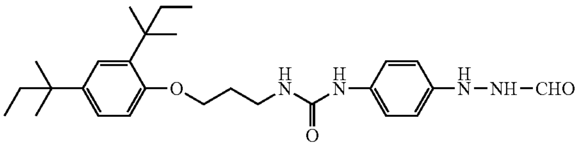
S-28
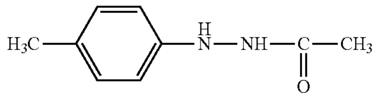
S-29
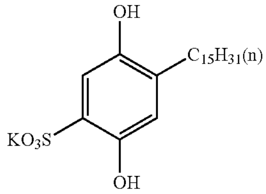
S-30
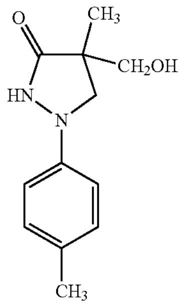
S-31
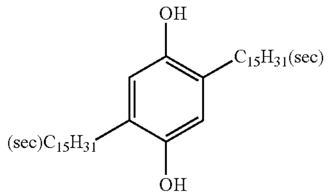
S-32
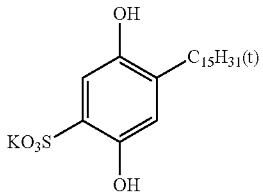
S-33
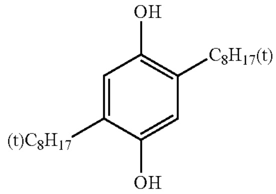
—Electron-Receiving Type Antifading Agent—
The phthalimide-based compound represented by General Formula (E) can be preferably used as an electron-receiving type antifading agent.

General Formula (E)

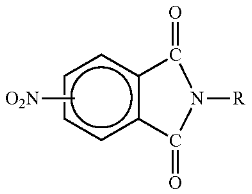

In General Formula (E), R represents a monovalent organic group having 1 to 14 carbon atoms and selected from the group consisting of an alkyl group, an aromatic hydrocarbon group, and an aromatic hydrocarbon group substituted with a halogen atom, a nitro group, and/or an alkyl group.

Specific examples of the compound represented by General Formula (E) are shown below.

E-1

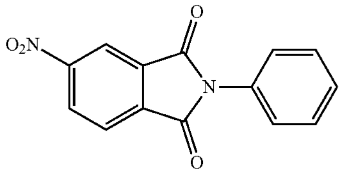

E-2

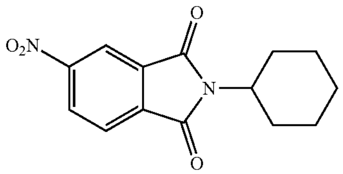

E-3

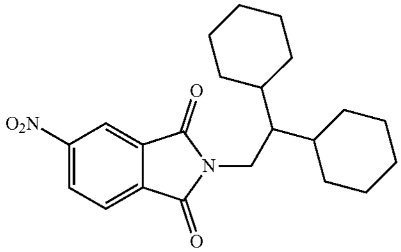

E-4

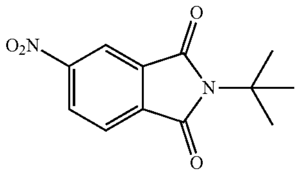

E-5

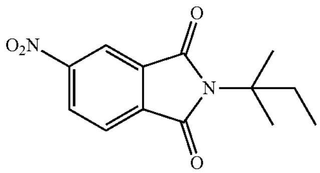

-continued

E-6

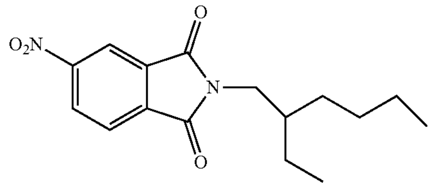

The naphthalimide compound represented by General Formula (IB) can also be preferably used as the electron-receiving type antifading agent that is used in the present invention.

General Formula (IB)

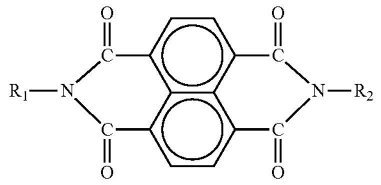

In General Formula (IB), $R_1$ and $R_2$ represent an alkyl group having 20 or fewer carbon atoms, a substituted alkyl group, or an aryl group with or without a substituent, and they may be the same or different from each other. Examples of the substituted alkyl group include a hydroxyethyl group and a benzyl group. Examples of the aryl group include a phenyl group and a naphthyl group, and examples of the substituent include a halogen, a lower alkyl group, a nitro group, and an amino group.

The phthalimide compound represented by General Formula (IIB) can also be preferably used the electron-receiving type antifading agent that is used in the present invention.

General Formula (IIB)

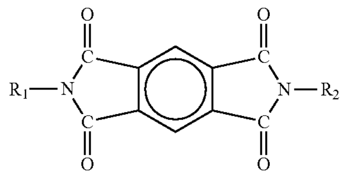

In General Formula (IIB), $R_1$ and $R_2$ represent an alkyl group (including a cycloalkyl group) having 20 or fewer carbon atoms, a substituted alkyl group, or an aryl group with or without a substituent, and they may be the same or different from each other. Examples of the substituted alkyl group include a hydroxyethyl group and a benzyl group. Examples of the aryl group include a phenyl group and a naphthyl group, and examples of the substituent include a halogen, a (lower) alkyl group, a nitro group, and an amino group.

Specific examples thereof are shown below.

1
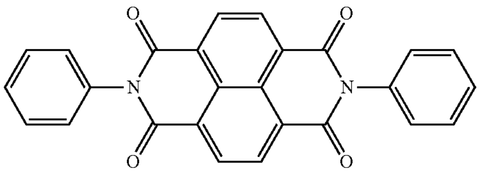
2
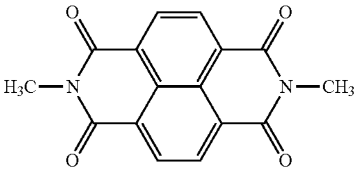
3
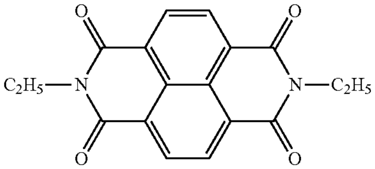
4
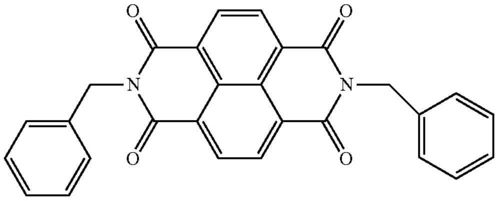
5
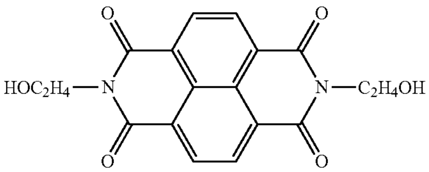
6
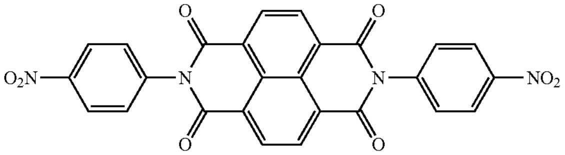
7
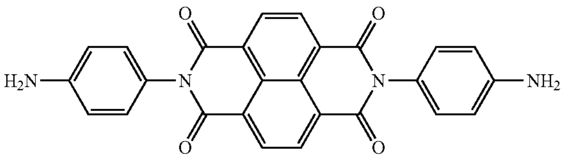
8
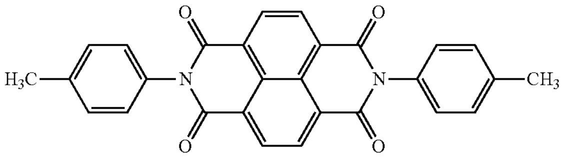
-continued
9
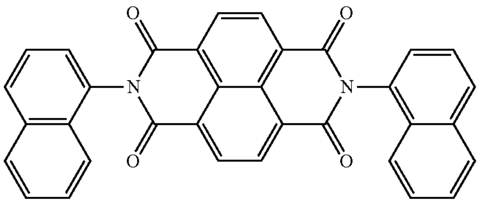
10
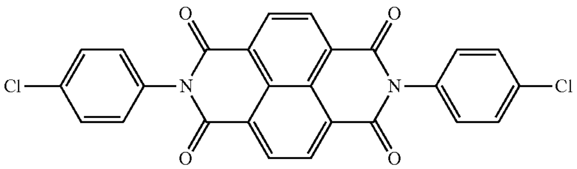
11
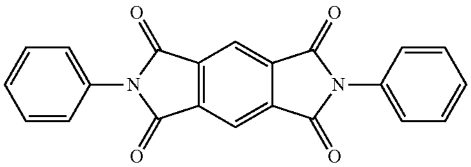
12
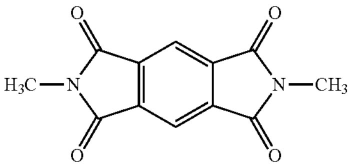
13
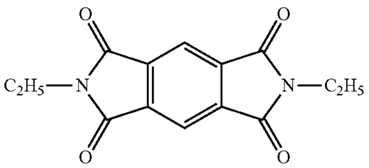
14
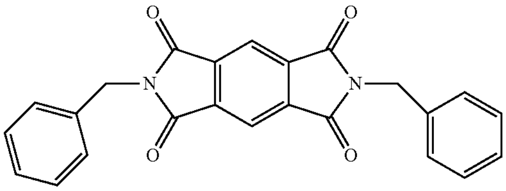
16
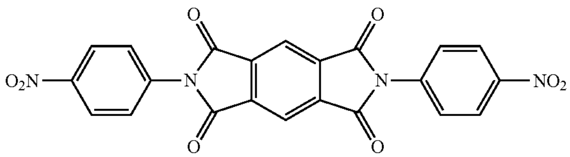
17
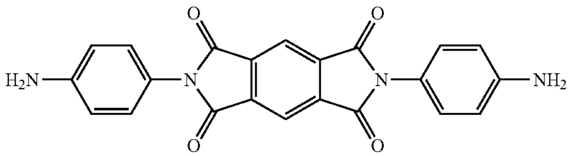

-continued

18

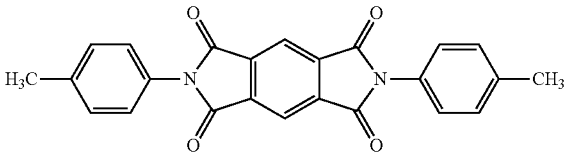

19

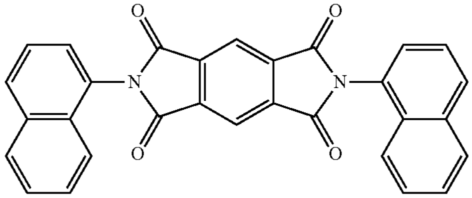

20

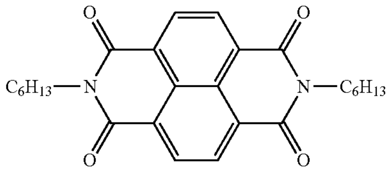

21

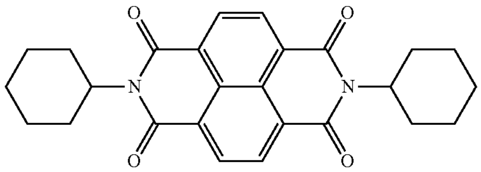

The quinone compound represented by General Formula (IIC) can also be preferably used the electron-receiving type antifading agent that is used in the present invention.

General Formula (IIC)

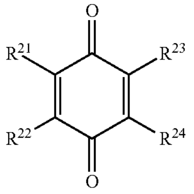

In General Formula (IIC), each of $R^1$, $R^2$, $R^{23}$, and $R^{24}$ represents a hydrogen atom, a substituted or unsubstituted alkyl group having 1 to 10 carbon atoms, a substituted or unsubstituted alkoxy group having 1 to 10 carbon atoms, a substituted or unsubstituted alkylthio group having 1 to 10 carbon atoms, a substituted or unsubstituted aryl group, a substituted or unsubstituted arylthio group, a substituted or unsubstituted aryloxy group, a halogen atom, or a cyano group. In addition, $R^{21}$ and $R^{22}$, or $R^{23}$ and $R^{24}$ may be linked to each other to form a ring.

Specific examples thereof are shown below.

IIC-1

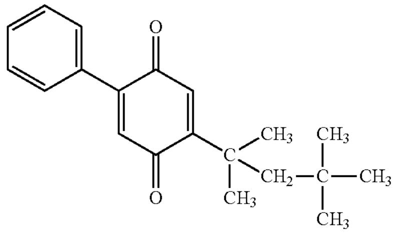

IIC-2

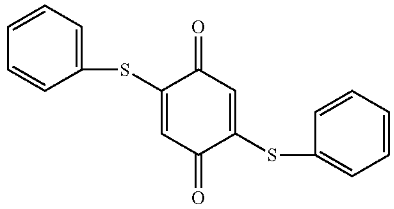

IIC-3

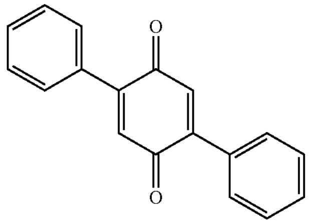

IIC-4

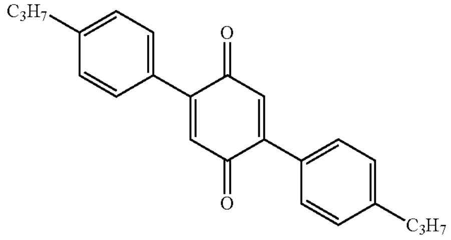

IIC-5

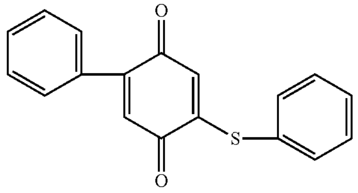

IIC-6

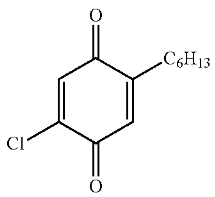

IIC-7

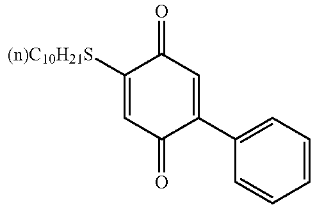

-continued

IIC-8

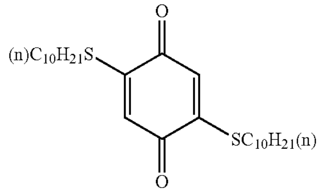

IIC-9

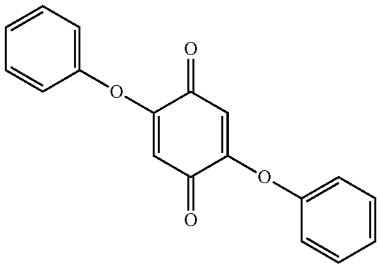

IIC-10

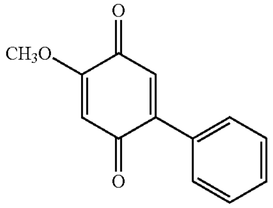

IIC-11

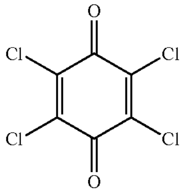

IIC-12

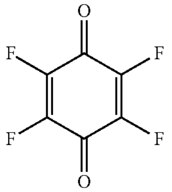

The total content of the electron migration-type antifading agent in the wavelength selective absorption layer is preferably 0.02% by mass or more, more preferably 0.05% by mass or more, still more preferably 0.10% by mass or more, particularly preferably 0.15% by mass or more, and especially preferably 0.20% by mass or more. In a case where the content of the electron migration-type antifading agent in the wavelength selective absorption layer is equal to or larger than the above-described preferred lower limit value, the light resistance can be improved.

The total content of the electron migration-type antifading agent in the wavelength selective absorption layer is generally 50% by mass or less, preferably 40% by mass or less, and more preferably 20% by mass or less.

In the wavelength selective absorption layer, the formulation ratio of the electron migration-type antifading agent to the dye is preferably 1:0.1 to 25, more preferably 1:0.1 to 20, still more preferably 1:1 to 20, and particularly preferably 1:5 to 20 in terms of the mole basis.

[Laminate According to Embodiment of Present Invention]

In the present invention, a laminate described below is also preferable as the laminate according to the embodiment of the present invention. The above-described laminate that is used in the present invention shall be referred to as a first embodiment, and the laminate according to the embodiment of the present invention described below is referred to as a second embodiment.

The laminate according to the embodiment of the present invention includes a wavelength selective absorption layer containing a resin, a dye, and an electron migration-type antifading agent that satisfies Relational Expression [A-1] or [A-2], and a gas barrier layer directly arranged on at least one surface of the wavelength selective absorption layer.

$E_{Hd}>E_{Hq}>E_{Ld}$, or Relational Expression [A-1]:

$E_{Hd}>E_{Lq}>E_{Ld}$ Relational Expression [A-2]:

where $E_{Hd}$, $E_{Hq}$, $E_{Ld}$, and $E_{Lq}$ respectively represent the following values, $E_{Hd}$: an energy level of a highest occupied molecular orbital of the dye.

$E_{Hq}$: an energy level of a highest occupied molecular orbital of the electron migration-type antifading agent, $E_{Ld}$: an energy level of a lowest unoccupied molecular orbital of the dye, and $E_{Lq}$: an energy level of a lowest unoccupied molecular orbital of the electron migration-type antifading agent.

The gas barrier layer in the laminate according to an embodiment of the present invention contains a crystalline resin, has a layer thickness of 0.1 μm to 10 μm, and has a layer oxygen permeability of 60 cc/$m^2$·day·atm or less.

In the laminate according to the embodiment of the present invention, the gas barrier layer is directly provided on at least one surface of the wavelength selective absorption layer containing a resin, a dye, and an electron migration-type antifading agent that satisfies Relational Expression [A-1] or [A-2], and thus the light resistance of the dye contained in the wavelength selective absorption layer can be improved. The presumable reason for this is thought to be as follows.

The absorbance of the dye contained in the wavelength selective absorption layer in the laminate according to the embodiment of the present invention may decrease due to light irradiation. The main cause of this phenomenon is that a singlet oxygen generated by a transfer of excitation energy due to the light irradiation to oxygen molecules decomposes molecules of the dye. In the according to the embodiment of the present invention, the gas barrier layer is provided at least at a place near an air interface in the wavelength selective absorption layer, and thus the permeation of the oxygen molecules (oxygen gas) can be suppressed, and as a result, the decomposition of the dye in the wavelength selective absorption layer can be suppressed.

Further, one of the causes of the decrease in absorbance is conceived to be that the dye excited due to light irradiation is decomposed by radical decomposition or the like. Since the laminate according to the embodiment of the present invention contains an electron migration-type antifading agent that satisfies the specific Relational Expression [A-1] or [A-2] in the wavelength selective absorption layer, it is conceived that the dye is deexcited from an excited state to a ground state through electron migration between the dye and the electron migration-type antifading agent. That is, it is conceived that a pathway of returning to a ground state through electron migration between the molecule excited due to light irradiation and the electron migration-type antifading agent is favored over the above-described decomposition pathway, and as a result, the decomposition of the dye can be suppressed.

Further, in addition to the above configuration, in the laminate according to the embodiment of the present invention, the gas barrier layer directly provided on at least one surface of the wavelength selective absorption layer contains a crystalline resin and exhibits a specific oxygen permeability. The laminate according to the embodiment of the present invention having such a configuration can suppress the permeation of oxygen molecules at a desired level and is excellent in productivity as well. However, in a case where the gas barrier layer is too thick, the amount of the electron migration-type antifading agent that migrates to an amorphous portion in the crystalline resin increases. As a result, although the oxygen permeability of the gas barrier layer can be reduced by thickening the gas barrier layer, a problem that the desired effect of improving the light resistance cannot be obtained, or conversely, the effect of improving the light resistance is reduced occurs due to the increase in the thickness of the gas barrier layer. It is conceived that the laminate according to the embodiment of the present invention can realize the effect of suppressing the decrease in light resistance, due to the electron migration-type antifading agent and the gas barrier layer, at an excellent level by allowing the gas barrier layer to have a specific thickness. Moreover, the laminate according to the embodiment of the present invention is also preferable in that it is possible to suppress the cost such as material cost and time, which are related to the manufacture of the gas barrier layer.

<Wavelength Selective Absorption Layer>

The wavelength selective absorption layer in the laminate according to the embodiment of the present invention contains a resin, a dye, and an electron migration-type antifading agent satisfying Relational Expression [A-1] or [A-2].

In the wavelength selective absorption layer, the "dye" is dispersed (preferably dissolved) in the resin to make the wavelength selective absorption layer a layer exhibiting a specific absorption spectrum derived from the dye. Further, the above-described "electron migration-type antifading agent" can effectively suppress the fading of the dye by being dispersed (preferably dissolved) in the resin.

(Dye)

The dye (also simply referred to as a "dye" in the following description) contained in the wavelength selective absorption layer in the laminate according to the embodiment of the present invention is not particularly limited as long as the wavelength selective absorption layer can be made to be a layer that exhibits a specific absorption spectrum derived from the dye.

For example, the dye preferably contains at least one of the following dyes A to D. However, a dye other than the following dyes A to D may be contained.

The dye A: A dye having a main absorption wavelength band at a wavelength of 390 to 435 nm The dye B: A dye having a main absorption wavelength band at a wavelength of 480 to 520 nm The dye C: a dye having a main absorption wavelength band at a wavelength of 580 to 620 nm The dye D: a dye having a main absorption wavelength band at a wavelength of 670 to 780 nm Any form of the wavelength selective absorption layer in the laminate according to the embodiment of the present invention may be adopted as long as the dye in the wavelength selective absorption layer can exhibit an absorption spectrum. The form thereof is such a form that preferably, both suppression of external light reflection and suppression of brightness decrease can be realized, and more preferably, it hardly affects the original tint of the display image. Examples of one form of the wavelength selective absorption layer include a form in which the dye is dispersed (preferably dissolved) in the resin. The dispersion may be any type of dispersion, such as a random type or a regular type.

In the wavelength selective absorption layer, the dyes A to D have main absorption wavelength bands in 390 to 435 nm, 480 to 520 nm, 580 to 620 nm, and 670 to 780 nm, which are wavelength ranges other than B (Blue, 460 nm), G (Green, 520 nm), and R (Red, 620 nm) which are used as light emitting sources of the OLED display device, respectively. As a result, in a case of containing at least one of these dyes A to D, the wavelength selective absorption layer can suppress the external light reflection without impairing the color reproduction range of light emitted from the OLED.

Unless otherwise specified, the above-described descriptions for the dyes A to D described in the wavelength selective absorption layer in the laminate that is used in the present invention can be applied to the dyes A to D, respectively.

Regarding the specific examples A-1 to A-52 of the coloring agent represented by any of General Formulae (1) to (5) in the dyes B and C, among these, A-1 to A-18, A-26, A-28, and A-31 to A-51 are preferably mentioned.

Regarding the dye D, the described general formula can be applied as it is, except that the main absorption wavelength band is widened from a wavelength of 680 to 780 nm to a wavelength of 670 to 780 nm.

Further, the laminate according to the embodiment of the present invention can reduce the frequency of radical generation by the deexcitation due to electron migration by providing a specific gas barrier layer described later and containing dyes and an electron migration-type antifading agent in the wavelength selective absorption layer, and thus it is possible to exhibit an excellent level of light resistance that exceeds the decrease in light resistance due to the mixing of dyes.

The total content of the dye in the wavelength selective absorption layer of the laminate according to the embodiment of the present invention is not particularly limited as long as the laminate according to the embodiment of the present invention exhibits excellent light resistance, and it can be appropriately adjusted. The lower limit value thereof is, for example, preferably 0.05% by mass or more, more preferably 0.10% by mass or more, and still more preferably 0.20% by mass or more. The upper limit value thereof is, for example, preferably 40% by mass or less and more preferably 20% by mass or less.

In a case where the wavelength selective absorption layer contains four dyes A to D, the content proportions of the respective dyes A to D in terms of the mass ratio (the dye A:the dye B:the dye C:the dye D) in the wavelength selective absorption layer are preferably 1:0.1 to 10:0.1 to 20:0.1 to 10, and more preferably 1:0.2 to 5:0.2 to 10:0.2 to 5.

In a case where the dye is an electron migration-type antifading agent-embedded coloring agent, the content of the electron migration-type antifading agent-embedded coloring agent in the wavelength selective absorption layer is preferably 0.1% by mass in terms of the antireflection effect. The upper limit value thereof is preferably 45% by mass or less.

(Resin)

The resin contained in the wavelength selective absorption layer in the laminate according to the embodiment of the present invention (hereinafter, also referred to as a "matrix resin") is not particularly limited as long as it can disperse (preferably dissolve) the dye and the electron migration-type antifading agent and has the desired light transmittance (the light transmittance is preferably 80% or more in the visible range having a wavelength of 400 to 800 nm). It is possible to satisfy the suppression of external light reflection and the suppression of brightness decrease, and moreover, it is possible to maintain the original tint of an image of the OLED display device at an excellent level, which are preferable.

Unless otherwise specified, the description for the matrix resin contained in the wavelength selective absorption layer in the laminate that is used in the present invention can be applied to the matrix resin contained in the wavelength selective absorption layer in the laminate according to the embodiment of the present invention.

In a case where a squarine-based coloring agent represented by General Formula (1) is contained as the dye, the matrix resin is preferably a low-polarity matrix resin in which the squarine-based coloring agent can exhibit sharper absorption. In a case where the squarine-based coloring agent exhibits the sharper absorption, Relational Expressions (I) to (VI) can be satisfied at a preferred level, and the original tint of the image of the OLED display device can be maintained at a more excellent level. Here, the low polarity means that an fd value defined by Relational Expression I described above is preferably 0.50 or more.

(Electron Migration-Type Antifading Agent)

The description for the electron migration-type antifading agent contained in the wavelength selective absorption layer in the above-described laminate that is used in the present invention can be applied to the electron migration-type antifading agent contained in the wavelength selective absorption layer in the laminate according to the embodiment of the present invention.

(Other Components)

In addition to the dye, the matrix resin, and the electron migration-type antifading agent described above, the wavelength selective absorption layer in the laminate according to the embodiment of the present invention may contain an antifading agent for a dye (a singlet oxygen quencher), described in the wavelength selective absorption layer in the above-described laminate that is used in the present invention, in order to prevent the fading of the dye due to the singlet oxygen, and may contain other components such as a matting agent and a leveling agent (a surfactant).

In the description for the dye, the matrix resin, the electron migration-type antifading agent, and the other components described in the wavelength selective absorption layer in the above-described laminate that is used in the present invention, "the laminate that is used in the present invention" is applied by being read as "the laminate according to the embodiment of the present invention", "the self-luminous display device" is applied by being read as "the OLED display device", and "the antifading agent for a dye" is applied by being read as "the electron migration-type antifading agent". Further, in the description for the antifading agent for a dye described in the wavelength selective absorption layer in the above-described laminate that is used in the present invention, "the laminate that is used in the present invention" is applied by being read as "the laminate according to the embodiment of the present invention", and "the self-luminous display device" is applied by being read as "the OLED display device".

<Manufacturing Method for Wavelength Selective Absorption Layer>

The wavelength selective absorption layer can be produced, according to a conventional method, by a solution film forming method, a melt extrusion method, or a method (a coating method) of forming a coating layer on a base material film (a release film) according to a predetermined method, and stretching can also be appropriately combined. The wavelength selective absorption layer is preferably produced by a coating method.

(Solution Film Forming Method)

In the solution film forming method, a solution in which a material constituting the wavelength selective absorption layer is dissolved in an organic solvent or water is prepared, a concentration step, a filtration step, and the like are appropriately carried out, and then the solution is uniformly cast on a support. Next, the raw dry film is peeled off from the support, both ends of a web are appropriately held by clips or the like, and the solvent is dried in the drying zone. In addition, stretching can be carried out separately while or after the film is dried.

(Melt Extrusion Method)

In the melt extrusion method, a material constituting the wavelength selective absorption layer (hereinafter, also simply referred to as a "material of the wavelength selective absorption layer") is melted by heat, a filtration step or the like is appropriately carried out, and then the material is uniformly casted on a support. Next, a film solidified by cooling or the like can be peeled off and appropriately stretched. In a case where the main material of the wavelength selective absorption layer is a thermoplastic polymer resin, a thermoplastic polymer resin can be selected as the main material of the release film, and the polymer resin in a molten state can be formed into a film by a known co-extrusion method. In this case, by adjusting the polymer type of the wavelength selective absorption layer and the release film and the additives mixed in each layer, or by adjusting the stretching temperature, the stretching speed, the stretching ratio, and the like of the co-extruded film, the adhesive force between the wavelength selective absorption layer and the release film can be controlled.

Examples of the co-extrusion method include a co-extrusion T-die method, a co-extrusion inflation method, and a co-extrusion lamination method. Among these, the co-extrusion T-die method is preferable. The co-extrusion T-die method includes a feed block method and a multi-manifold method. Among these, the multi-manifold method is particularly preferable from the viewpoint that a variation in thickness can be reduced.

In a case where the co-extrusion T-die method is adopted, the melting temperature of the resin in an extruder having a T-die is set to be a temperature higher than the glass transition temperature (Tg) of each resin by preferably 80° C., or higher and more preferably 100° C. or higher, and it is set to be a temperature higher than the glass transition temperature (Tg) of each resin by preferably 180° C., or lower and more preferably 150° C., or lower. In a case where the melting temperature of the resin in the extruder is set to be equal to or larger than the lower limit value of the above-described preferred range, the fluidity of the resin can be sufficiently enhanced, and in a case where the melting temperature is set to the upper limit value or less of the above-described preferred range, the resin can be prevented from being deteriorated.

In general, the sheet-shaped molten resin extruded from the opening portion of the die is brought into close contact with the cooling drum. The method of bringing the molten resin into close contact with the cooling drum is not particularly limited, and examples thereof include an air knife method, a vacuum box method, and an electrostatic contact method.

The number of cooling drums is not particularly limited: however, it is generally 2 or more. In addition, the method of arranging the cooling drum is not particularly limited, and examples of the disposition form include a linear form, a Z form, and an L form. Further, the method of passing the molten resin extruded from the opening portion of the die through the cooling drum is not particularly limited.

The degree of close contact of the extruded sheet-shaped resin with the cooling drum changes depending on the temperature of the cooling drum. In a case where the temperature of the cooling drum is raised, the intimate attachment is improved, but in a case where the temperature is raised too much, the sheet-shaped resin may not be peeled off from the cooling drum and may be wound around the drum. Therefore, the temperature of the cooling drum is preferably (Tg+30°) C or lower, and still more preferably in a range of (Tg−5°) C to (Tg−45°) C in a case where Tg is the glass transition temperature of the resin of the layer that is brought into contact with the drum in the resin extruded from the die. In a case where the cooling drum temperature is set within the above-described preferred range, problems such as sliding and scratches can be prevented.

Here, it is preferable to reduce the content of the residual solvent in the film before stretching. Examples of the method of reducing the content include methods of (1) reducing the amount of the residual solvent of the resin as the raw material; and (2) predrying the resin before forming the film before stretching. Predrying is carried out, for example, by making the resin into a form of a pellet or the like and using a hot air dryer or the like. The drying temperature is preferably 100° C., or higher, and the drying time is preferably 2 hours or longer. In a case of carrying out predrying, it is possible to reduce the residual solvent in the film before stretching and to prevent the extruded sheet-shaped resin from foaming.

(Coating Method)

In the coating method, a solution of a material of the wavelength selective absorption layer is applied to a release film to form a coating layer. A release agent or the like may be appropriately applied to the surface of the release film in advance in order to control the adhesiveness to the coating layer. The coating layer can be used by peeling off the release film after being laminated with another member while interposing an adhesive layer in a later step. Any adhesive can be appropriately used as the adhesive constituting the adhesive layer. The release film can be appropriately stretched together with the release film coated with the solution of the material of the wavelength selective absorption layer or with the coating layer laminated.

The solvent used for the solution of the material of the wavelength selective absorption layer can be appropriately selected from the viewpoint that the material of the wavelength selective absorption layer can be dissolve or dispersed, a uniform surface shape can be easily achieved during the coating step and drying step, liquid storability can be secured, an appropriate saturated vapor pressure is provided.

—Addition of Dye (Coloring Agent) and Antifading Agent or Electron Migration-Type Antifading Agent—

The timing of adding the dye and the antifading agent or electron migration-type antifading agent to the material of the wavelength selective absorption layer is not particularly limited as long as the dye and the antifading agent are added at the time of film formation. For example, the dye may be added at the time of synthesizing the matrix resin or may be mixed with the material of the wavelength selective absorption layer at the time of preparing the coating liquid for the material of the wavelength selective absorption layer. In addition, the same applies to various additives.

—Release Film—

The release film used for forming the wavelength selective absorption layer according to the embodiment of the present invention by a coating method or the like preferably has a film thickness of 5 to 100 μm, more preferably 10 to 75 μm, and still more preferably 15 to 55 μm. In a case where the film thickness is equal to or larger than the above-described preferred lower limit value, sufficient mechanical strength can be easily secured, and failures such as curling, wrinkling, and buckling are less likely to occur. In addition, in a case where the film thickness is equal to or smaller than the preferred upper limit value, in the storage of a multi-layer film of the release film and the wavelength selective absorption layer, for example, in the form of a long roll, the surface pressure applied to the multi-layer film is easily adjusted to be in an appropriate range, and adhesion defect is less likely to occur.

The surface energy of the release film is not particularly limited, and by adjusting the relationship between the surface energy of the material of the wavelength selective absorption layer or the coating solution and the surface energy of the surface of the release film on which the wavelength selective absorption layer is to be formed, the adhesive force between the wavelength selective absorption layer and the release film can be adjusted. In a case where the surface energy difference is reduced, the adhesive force tends to increase, and in a case where the surface energy difference is increased, the adhesive force tends to decrease, and thus the surface energy can be set appropriately.

The surface energy of the release film can be calculated from the contact angle value between water and methylene iodide using the Owen's method. For the measurement of the contact angle, for example, DM901 (contact angle meter, manufactured by Kyowa Interface Science Co., Ltd.) can be used.

The surface energy of the surface of the release film on which the wavelength selective absorption layer is to be formed is preferably 41.0 to 48.0 mN/m and more preferably 42.0 to 48.0 mN/m. In a case where the surface energy is equal to or more than the preferred lower limit value, the evenness of the thickness of the wavelength selective absorption layer is increased. In a case where the surface energy is equal to or smaller than the preferred upper limit value, it is easy to control the peeling force of the wavelength selective absorption layer from the release film within an appropriate range.

The surface unevenness of the release film is not particularly limited, and depending on the relationship between the surface energy of the wavelength selective absorption layer surface, the hardness, and the surface unevenness, and the surface energy and hardness of the surface of the release film opposite to the side on which the wavelength selective absorption layer is formed, for example, in order to prevent adhesion defect in a case where the multi-layer film of the release film and the wavelength selective absorption layer is stored in the form of a long roll, the surface unevenness of the release film can be adjusted. In a case where the surface unevenness is increased, adhesion defect tends to be suppressed, and in a case where the surface unevenness is reduced, the surface unevenness of the wavelength selective absorption layer tends to decrease and the haze of the wavelength selective absorption layer tends to be small. Thus, the surface unevenness can be set appropriately.

For such a release film, any material and film can be appropriately used. Specific examples of the material include a polyester-based polymer (including polyethylene terephthalate-based film), an olefin-based polymer, a cycloolefin-based polymer, a (meth)acrylic polymer, a cellulose-based polymer, and a polyamide-based polymer. In addition, a surface treatment can be appropriately carried out for the intended purpose of adjusting the surface properties of the release film. For example, a corona treatment, a room temperature plasma treatment, or a saponification treatment can be carried out to decrease the surface energy, and a silicone treatment, a fluorine treatment, an olefin treatment, or the like can be carried out to raise the surface energy.

—Peeling Force Between Wavelength Selective Absorption Layer and Release Film—

In a case where the wavelength selective absorption layer is formed by a coating method, the peeling force between the wavelength selective absorption layer and the release film can be controlled by adjusting the material of the wavelength selective absorption layer, the material of the release film, the internal strain of the wavelength selective absorption layer. The peeling force can be measured by, for example, a test of peeling off the release film in a direction of 90°, and the peeling force in a case of being measured at a rate of 300 mm/min is preferably 0.001 to 5 N/25 mm, more preferably 0.01 to 3 N/25 mm, and still more preferably 0.05 to 1 N/25 mm. In a case where the peeling force is equal to or greater than at least the above preferable lower limit value, peeling off the release film in a step other than the peeling step can be prevented, and in a case where the peeling force is equal to or smaller than the above preferable upper limit value, peeling failure in the peeling step (for example, zipping and cracking of the wavelength selective absorption layer) can be prevented.

<Film Thickness of Wavelength Selective Absorption Layer>

The film thickness of the wavelength selective absorption layer is not particularly limited, and is preferably 1 to 18 μm, more preferably 1 to 12 μm, and still more preferably 2 to 8 μm. In a case where the film thickness is equal to or smaller than the above-described preferred upper limit value, the decrease in the degree of polarization due to the fluorescence emitted by a dye (a coloring agent) can be suppressed by adding the dye to the thin film at a high concentration. Further, in the first embodiment, the effects of the quencher and the antifading agent are also easily exhibited, and in the second embodiment, the effects of the electron migration-type antifading agent and the singlet oxygen quencher are also easily exhibited. On the other hand, in a case where the film thickness is equal to or larger than the above-described preferred lower limit value, it becomes easy to maintain the evenness of the in-plane absorbance.

In the present invention, the film thickness of 1 to 18 μm means that the thickness of the wavelength selective absorption layer is within a range of 1 to 18 μm at any portion. The same applies to the film thicknesses of 1 to 12 μm and 2 to 8 μm. The film thickness can be measured with an electronic micrometer manufactured by Anritsu Corporation.

<Absorbance of Wavelength Selective Absorption Layer>

In the wavelength selective absorption layer of the first embodiment, the absorbance at a wavelength of 450 nm is preferably 0.05 or more and 6.0 or less, and more preferably 0.1 or more and 6.0 or less.

The absorbance at a wavelength of 590 nm is preferably 0.1 or more and 6.0 or less, more preferably 0.2 or more and 6.0 or less, and still more preferably 0.3 or more and 6.0 or less.

In a case where the wavelength selective absorption layer of the first embodiment is incorporated into the self-luminous display device, where the absorbance of the wavelength selective absorption layer has been adjusted to the above range, the original tint of the image of the self-luminous display device can be maintained at an excellent level, and display performance in which the brightness is higher and the external light reflection is further suppressed can be obtained.

In the wavelength selective absorption layer of the second embodiment, an absorbance at a wavelength of 450 nm is preferably 0.05 or more and 3.0 or less, more preferably 0.1 or more and 2.0 or less, and still more preferably 0.1 or more and 1.0 or less.

The absorbance at a wavelength of 590 nm is preferably 0.1 or more and 3.0 or less, more preferably 0.2 or more and 2.0 or less, and still more preferably 0.3 or more and 1.5 or less.

In a case where the wavelength selective absorption layer of the second embodiment is incorporated into the OLED display device, where the absorbance of the wavelength selective absorption layer has been adjusted to the above range, the original tint of the image of the OLED display device can be maintained at an excellent level, and display performance in which the brightness is higher and the external light reflection is further suppressed can be obtained.

The absorbance of the wavelength selective absorption layer can be adjusted by the kind or adding amount of the dye.

<Moisture Content of Wavelength Selective Absorption Layer>

From the viewpoint of the durability, the moisture content of the wavelength selective absorption layer is preferably 0.5% by mass or less, and more preferably 0.3% by mass or less, in conditions of 25° C., and 80% relative humidity, regardless of the film thickness.

In the present specification, the moisture content of the wavelength selective absorption layer can be measured by using a sample having a thick film thickness as necessary. The moisture content can be calculated according to humidity-conditioning the sample for 24 hours or longer, then measuring a moisture content (g) by the Karl Fischer method with a water measuring instrument and a sample drying apparatus "CA-03" and "VA-05" (both manufactured by Mitsubishi Chemical Corporation), and dividing the moisture content (g) by the sample mass (g, including the moisture content).

<Glass Transition Temperature (Tg) of Wavelength Selective Absorption Layer>

The glass transition temperature of the wavelength selective absorption layer is preferably 50° C., or higher and 140° C., or lower. The glass transition temperature is more preferably 60° C., or higher and 130° C., or lower, and still more preferably 70° C., or higher and 120° C., or lower. In a case where the glass transition temperature is equal to or higher than the above preferable lower limit value, deterioration of the polarizer in a case of being used at a high temperature can be suppressed, and in a case where the glass transition temperature is equal to or lower than the above preferable upper limit value, it is possible to suppress that the organic solvent used in the coating liquid easily remains in the wavelength selective absorption layer.

The glass transition temperature of the wavelength selective absorption layer can be measured according to the following method.

With a differential scanning calorimetry device (X-DSC7000 (manufactured by IT Measurement Control Co., Ltd.)), 20 mg of a wavelength selective absorption layer is placed in a measurement pan, and the temperature of the pan is raised from 30° C. to 120° C. in a nitrogen stream at a speed of 10° C./min, and held for 15 minutes, and then cooled to 30° C. at −20° C./min. Thereafter, the temperature was raised again from 30° C. to 250° C. at a rate of 10° C./min, and the temperature at which the baseline began to deviate from the low temperature side was defined as the glass transition temperature Tg.

The glass transition temperature of the wavelength selective absorption layer can be adjusted by mixing two or more kinds of polymers having different glass transition temperatures, or by changing the amount of a small molecule compound such as an antifading agent added.

<Treatment of Wavelength Selective Absorption Layer>

It is preferable that the wavelength selective absorption layer is subjected to, for example, a hydrophilic treatment by a predetermined glow discharge treatment, corona discharge treatment, alkali saponification treatment, or the like, and a corona discharge treatment is most preferably used. It is also preferable to apply the method disclosed in JP1994-94915A (JP-H6-94915A) and JP1994-118232A (JP-H6-118232A).

As necessary, the obtained film may be subjected to a heat treatment step, a superheated steam contact step, an organic solvent contact step, or the like. In addition, a surface treatment may be appropriately carried out.

Further, as the pressure sensitive adhesive layer, a layer consisting of a pressure sensitive adhesive composition in which a (meth)acrylic resin, a styrene-based resin, a silicone-based resin, or the like is used as a base polymer, and a crosslinking agent such as an isocyanate compound, an epoxy compound, or an aziridine compound is added thereto can be applied.

Preferably, the description for the pressure sensitive adhesive layer in the self-luminous display device or OLED display device described later can be applied.

<<Gas Barrier Layer>>

The laminate that is used in the present invention (the first embodiment) and the laminate according to the embodiment of the present invention (the second embodiment) include a gas barrier layer on at least one surface of the wavelength selective absorption layer, and the gas barrier layer thereof contains the crystalline resin, has a layer thickness of 0.1 μm to 10 μm, and has a layer oxygen permeability of 60 cc/m$^2$·day·atm or less.

In the gas barrier layer, the "crystalline resin" is a resin having a melting point that undergoes a phase transition from a crystal to a liquid in a case where the temperature is raised, and can impart gas barrier properties related to oxygen gas to the gas barrier layer.

The laminate that is used in the present invention and the laminate according to the embodiment of the present invention has the gas barrier layer at least on a surface on which the wavelength selective absorption layer comes into contact with air in a case where the laminate is used, and thus it is possible to suppress a decrease in absorption intensity of a dye in the wavelength selective absorption layer. As long as the gas barrier layer is provided at an interface of the wavelength selective absorption layer in contact with air, the gas barrier layer may be provided on only one surface of the wavelength selective absorption layer, or may be provided on both surfaces.

(Crystalline Resin)

The crystalline resin contained in the gas barrier layer is a crystalline resin having gas barrier properties, and it can be used without particular limitation as long as a desired oxygen permeability can be imparted to the gas barrier layer.

Examples of the crystalline resin include polyvinyl alcohol and polyvinylidene chloride, and the polyvinyl alcohol is preferable from the viewpoint that a crystalline portion can effectively suppress the permeation of gas.

The polyvinyl alcohol may be modified or may not be modified. Examples of the modified polyvinyl alcohol include modified polyvinyl alcohol into which a group such as an acetoacetyl group and a carboxyl group is introduced.

The saponification degree of the polyvinyl alcohol is preferably 80.0% by mol or more, more preferably 90.0% by mol or more, still more preferably 97.0% by mol or more, and particularly preferably 98.0% by mol or more, from the viewpoint of further enhancing the oxygen gas barrier properties. The upper limit value thereof is not particularly limited, and it is practically 99.99% by mol or less. The saponification degree of the polyvinyl alcohol is a value calculated based on the method described in JIS K 6726 1994.

The gas barrier layer may contain any component usually contained in the gas barrier layer, as long as the effects of the present invention are not impaired. For example, in addition to the above crystalline resin, organic-inorganic hybrid materials such as an amorphous resin material and a sol-gel material, and inorganic materials such as $SiO_2$, $SiO_x$, SiON, $SiN_x$, and $Al_2O_3$ may be contained.

Further, the gas barrier layer may contain a solvent such as water and an organic solvent derived from a manufacturing step, as long as the effects of the present invention are not impaired.

The content of the crystalline resin in the gas barrier layer is, for example, preferably 90% by mass or more, and more preferably 95% by mass or more, in 100% by mass of the total mass of the gas barrier layer. The upper limit value thereof is not particularly limited, and it can be set to 100% by mass.

The oxygen permeability of the gas barrier layer is 60 cc/m$^2$·day·atm or less, preferably 50 cc/m$^2$·day·atm or less, more preferably 30 cc/m$^2$·day·atm or less, still more preferably 10 cc/m$^2$·day·atm or less, particularly preferably 5 cc/m$^2$·day·atm or less, and most preferably 1 cc/m$^2$·day·atm or less. The practical lower limit value thereof is 0.001 cc/m$^2$·day·atm or more, and it is preferably, for example, more than 0.05 cc/m$^2$·day·atm. In a case where the oxygen permeability is within the above-described preferred range, the light resistance can be further improved.

The oxygen permeability of the gas barrier layer is a value measured based on the gas permeability test method based on JIS K 7126-2 2006. As the measuring device, for example, an oxygen permeability measuring device OX-TRAN2/21 (product name) manufactured by MOCON can be used. The measurement conditions are set to a temperature of 25° C., and a relative humidity of 50%.

For the oxygen permeability, (fm)/(s·Pa) can be used as the SI unit. It is possible to carry out the conversion by (1 fm)/(s·Pa)=8.752 (cc)/(m$^2$·day·atm). fm is read as femtometer and represents 1 fm=$10^{-15}$ m.

The thickness of the gas barrier layer is preferably 0.5 μm to 5 μm, and more preferably 1.0 μm to 4.0 μm, from the viewpoint of further improving the light resistance. The thickness of the gas barrier layer is measured according to a method described in Examples to be described later.

The degree of crystallinity of the crystalline resin contained in the gas barrier layer is preferably 25% or more, more preferably 40% or more, and still more preferably 45% or more. The upper limit value thereof is not particularly limited, and it is practically 55% or less and preferably 50% or less.

The degree of crystallinity of the crystalline resin contained in the gas barrier layer is a value measured and calculated according to the following method based on the method described in J. Appl. Pol. Sci., 81, 762 (2001).

Using a differential scanning calorimeter (DSC), a temperature of a sample peeled from the gas barrier layer is raised at 10° C./min over the range of 20° C. to 260° C., and a heat of fusion 1 is measured. Further, as a heat of fusion 2 of the perfect crystal, the value described in J. Appl. Pol. Sci., 81, 762 (2001) is used. Using the obtained heat of fusion 1 and heat of fusion 2, the degree of crystallinity is calculated according to the following expression.

[Degree of crystallinity (%)]=([heat of fusion 1]/[heat of fusion 2])×100

Specifically, the degree of crystallinity is a value measured and calculated according to the method described in Examples to be described later. The heat of fusion 1 and heat of fusion 2 may have the same unit, which is generally $Jg^{-1}$.

<Manufacturing Method for Gas Barrier Layer>

The method of forming the gas barrier layer is not particularly limited, and examples thereof include a forming method according to a conventional method, according to a casting method such as spin coating or slit coating. In addition, examples thereof include a method of bonding a commercially available resin gas barrier film or a resin gas barrier film produced in advance to the wavelength selective absorption layer.

<Optical Film>

In addition to the wavelength selective absorption layer and the gas barrier layer, the laminate that is used in the present invention and the laminate according to the embodiment of the present invention may appropriately include an optional optical film as long as the effect of the present invention is not impaired.

The optional optical film is not particularly limited in terms of any of optical properties and materials, and a film containing (or containing as a main component) at least any of a cellulose ester resin, an acrylic resin, a cyclic olefin resin, and a polyethylene terephthalate resin can be preferably used. It is noted that an optically isotropic film or an optically anisotropic phase difference film may be used.

For the above-described optional optical film, for example, Fujitac TD80UL, Fujitac TG60UL, Fujitac Tλ/40UL (all manufactured by FUJIFILM Corporation), or the like can be used as a film containing a cellulose ester resin.

Regarding the optional optical film, as those containing an acrylic resin, an optical film containing a (meth)acrylic resin containing a styrene-based resin described in JP4570042B, an optical film containing a (meth)acrylic resin having a glutarimide ring structure in a main chain described in JP5041532B, an optical film containing a (meth)acrylic resin having a lactone ring structure described in JP2009-122664A, and an optical film containing a (meth)acrylic resin having a glutaric anhydride unit described in JP2009-139754A can be used.

Further, regarding the optional optical films, as those containing a cyclic olefin resin, cyclic olefin-based resin film described in paragraphs [0029] and subsequent paragraphs of JP2009-237376A, and cyclic olefin resin film containing an additive reducing Rth described in JP4881827B, JP2008-063536B can be used.

In addition, the above-described optional optical film may contain an ultraviolet absorbing agent. In the laminate that is used in the present invention and the laminate according to the embodiment of the present invention, hereinafter, the layer or optical film containing the ultraviolet absorbing agent is also referred to as an ultraviolet absorption layer. As the ultraviolet absorbing agent, a commonly used compound can be used without particular limitation. Examples thereof include a hindered phenol-based compound, a hydroxybenzophenone-based compound, a benzotriazole-based compound, a salicylic acid ester-based compound, a benzophenone-based compound, a cyanoacrylate-based compound, and a nickel complex salt-based compound.

Examples of the hindered phenol-based compound include 2,6-di-tert-butyl-p-cresol, pentaerythrityl-tetrakis[3-(3,5-di-tert-butyl-4-hydroxyphenyl)propionate], N,N'-hexamethylene bis(3,5-di-tert-butyl-4-hydroxy-hydrocinnamide), 1,3,5-trimethyl-2,4,6-tris(3,5-di-tert-butyl-4-hydroxybenzyl)benzene, and tris-(3,5-di-tert-butyl-4-hydroxybenzyl)-isocyanurate.

Examples of the benzotriazole-based compound include 2-(2'-hydroxy-5'-methylphenyl) benzotriazole, 2,2-methylene bis(4-(1,1,3,3-tetramethylbutyl)-6-(2H-benzotriazole-2-yl) phenol), (2,4-bis-(n-octylthio)-6-(4-hydroxy-3,5-di-tert-butylanilino)-1,3,5-triazine, triethyleneglycol-bis[3-(3-tert-butyl-5-methyl-4-hydroxyphenyl)propionate], N,N'-hexamethylene bis(3,5-di-tert-butyl-4-hydroxy-hydrocinnanide), 1,3,5-trimethyl-2,4,6-tris(3,5-di-tert-butyl-4-hydroxybenzyl)benzene, 2-(2'-hydroxy-3',5'-di-tert-butylphenyl)-5-chlorbenzotriazole, (2-(2'-hydroxy-3',5'-di-tert-amylphenyl)-5-chlorbenzotriazole, 2,6-di-tert-butyl-p-cresol, 2-[5-chloro-2H-benzotnazole-2-yl]-4-methyl-6-(tert-butyl)phenol, and pentaerythrityl-tetrakis[3-(3,5-di-tert-butyl-4-hydroxyphenyl)propionate].

The content of the ultraviolet absorbing agent in the ultraviolet absorption layer is appropriately adjusted according to the intended purpose.

<<Manufacturing Method for Laminate>>

The laminate that is used in the present invention and the laminate according to the embodiment of the present invention can be produced by using the above-described manufacturing method for a wavelength selective absorption layer and the manufacturing method for a gas barrier layer.

Examples thereof include a method of directly producing the above-described gas barrier layer on the wavelength selective absorption layer produced according to the above-described production method. In this case, it is also preferable to apply a corona treatment to the surface of the wavelength selective absorption layer, on which the gas barrier layer is provided.

Further, in a case where the above-described optional optical film is provided, it is also preferable to carry out bonding by interposing a pressure sensitive adhesive layer. For example, it is also preferable to provide the gas barrier layer on the wavelength selective absorption layer, and then bond an optical film containing an ultraviolet absorbing agent by interposing a pressure sensitive adhesive layer.

[Display Device According to Embodiment of Present Invention]

The display device according to the embodiment of the present invention includes the laminate that is used in the present invention, and a wavelength conversion material.

As the display device according to the embodiment of the present invention, a configuration of a commonly used display device can be used without particular limitation as another configuration as long as the laminate that is used in the present invention is included as a configuration in which the gas barrier layer is positioned at least on the external light side from the wavelength selective absorption layer and preferably as long as the laminate that is used in the present invention is included as a configuration in which it is positioned at least on the external light side from the wavelength conversion material.

It is possible to use display devices without particular limitation, and among them, it is possible to preferably use a self-luminous display device that does not have a polarizing plate as an essential configuration, for example, an OLED display device, a micro LED display device, or the like.

The configuration example of the self-luminous display device according to the embodiment of the present invention is not particularly limited, and examples thereof include a display device including glass, a layer containing a thin film transistor (TFT), a light emitting element, a barrier film, a color filter, glass, a pressure sensitive adhesive layer, the laminate that is used in the present invention, and a surface film, in order from the opposite side to external light.

As the light source of the display light of the self-luminous display device according to the embodiment of the present invention, that is, as the light emitting element, a light emitting diode (LED), a laser diode, an electroluminescent element, or the like can be used. It is preferably a quantum dot (preferably a quantum dot having an electroluminescence function) or a micro LED, and more preferably the micro LED disclosed in WO2014/204694A or the like, or the quantum dot disclosed in JP2019-119831A or the like.

For the light source according to the embodiment of the present invention, a single blue color may be used, or the three primary colors of blue, green, and red may be used. In a case where a single blue color is used for the light source, the blue light can be converted into green light and red light by a wavelength conversion material such as a phosphor or a quantum dot.

The wavelength conversion material means a material that absorbs light having a specific wavelength and emits light having a different wavelength on the long wavelength side with respect to the absorption wavelength, thereby converting the wavelength, and specific examples thereof include a phosphor containing quantum dots or the like.

In the display device according to the embodiment of the present invention, the wavelength conversion material may be installed so that it is incorporated in the LED light source or may be installed as a wavelength conversion sheet at a position other than the light source. In a case of being installed at a position other than the light source, it can be provided as a sheet on the viewer side with respect to the light emitting element. Among the above, a method of stacking a color filter on a layer consisting of a wavelength conversion material such as a quantum dot is preferable in that light transmittance is high and high-purity display light can be obtained as compared with the method in the related art, in which white light is caused to be incident on the color filter.

Hereinafter, the wavelength conversion material will be described.

(Green Phosphor)

The green phosphor is a wavelength conversion material that absorbs a part of the emitted light of the blue LED, and it emits green light having an emission peak in a wavelength range of 500 to 595 nm. Examples of the green phosphor include $Y_3Al_5O_{12}:Ce^{3+}$, $Tb_3Al_5O_{12}:Ce^{3+}$, $BaY_2SiAl_4O_2:Ce^{3+}$, $Ca_3Sc_2Si_3O_2:Ce^{3+}$, $(Ba,Sr)_2SiO_4:Eu^{2+}$, $CaSc_2O_4:Ce^{3+}$, $Ba_3Si_6O_{12}N_2:Eu^{2+}$, β-SiAlON:$Eu^{2+}$, $SrGa_2S_4:Eu^{2+}$, LaSiN:$Ce^{3+}$, $CaSi_2O_2N_2:Eu^{2+}$, $Lu_3Al_5O_{12}:Ce^{3+}$ (LAG), and $SrSi_2O_2N_2:Eu^{2+}$.

(Red Phosphor)

The red phosphor is a wavelength conversion material that absorbs at least one of a part of the emitted light of the blue LED or a part of the emitted light of the green phosphor, and emits red light having an emission peak in a wavelength range of 600 to 690 nm. Examples of the red phosphor include Ca-α-SiAlON:$Eu^{2+}$, $CaAlSiN_3:Eu^{2+}$, (Sr,Ca)$AlSiN_3:Eu^{2+}$, $Sr_2Si_5Na:Eu^{2+}$, $Sr_2(Si,Al)_5(N,O):Eu^{2+}$, CaS:$Eu^{2+}$, $La_2O_2S:Eu^{3+}$, and $K_2SiF_6:Mn^{4+}$.

(Quantum Dot)

As the wavelength conversion material, a quantum dot is particularly preferable in that it provides a sharp emission spectrum. The quantum dots are particles having a major axis of about 1 to 100 nm, and they have discrete energy levels. Since the energy state of a quantum dot depends on the size of the quantum dot, the luminescence wavelength can be freely selected by changing the size. Examples of the quantum dot include a compound of a Group 12 element and a Group 16 element, a compound of a Group 13 element and a Group 16 element, and a compound of a Group 14 element and a Group 16 element, and include CdSe, CdTe, ZnS, CdS, InP, PbS, PbSe, and CdHgTe. As quantum nanomaterials, quantum rods and the like can be used in addition to the quantum dot.

[OLED Display Device According to Embodiment of Present Invention]

The organic electroluminescent display device according to the embodiment of the present invention includes the laminate according to the embodiment of the present invention. The organic electroluminescent display device is referred to as an organic electroluminescence (EL) display device or an organic light emitting diode (OLED) display device, and it is abbreviated as an OLED display device in the present invention.

As the OLED display device according to the embodiment of the present invention, a configuration of a commonly used OLED display device can be used without particular limitation as another configuration as long as the laminate according to the embodiment of the present invention is included in a configuration in which the gas barrier layer is positioned at least on the external light side from the wavelength selective absorption layer. The configuration example of the OLED display device according to the embodiment of the present invention is not particularly limited, and examples thereof include a display device including glass, a layer containing a thin film transistor (TFT), an OLED display element, a barrier film, a color filter, glass, a pressure sensitive adhesive layer, the laminate according to the embodiment of the present invention, and a surface film, in order from the opposite side to external light.

The OLED display element has a configuration in which an anode electrode, a light emitting layer, and a cathode electrode are laminated in this order. In addition to the light emitting layer, a hole injection layer, a hole transport layer, an electron transport layer, an electron injection layer, and the like are included between the anode electrode and the cathode electrode. In addition, for example, the description in JP2014-132522A can also be referenced.

Further, as the color filter, in addition to a typical color filter, a color filter in which quantum dots are laminated can also be used.

A resin film can be used instead of the above glass.

The self-luminous display device according to the embodiment of the present invention can maintain an excellent level of absorbance of the dye contained in the wavelength selective absorption layer even in a case where the laminate that is used in the present invention is provided as an antireflection unit instead of the circularly polarizing plate. In addition, the OLED display device according to the embodiment of the present invention can maintain an excellent level of absorbance of the dye contained in the wavelength selective absorption layer even in a case where the laminate according to the embodiment of the present invention is provided as an antireflection unit instead of the circularly polarizing plate.

Furthermore, in a case where the dye contained in the wavelength selective absorption layer is in the form of containing four dyes A to D in combination as described above, it is possible to exhibit an excellent level of light resistance that exceeds the decrease in light resistance due to the mixing of the dyes. In particular, by containing the four dyes A to D so that they satisfy Relational Expressions (I) to (VI) described above, both the suppression of external light reflection and the suppression of brightness decrease can be achieved at a sufficient level, and moreover, the original tint of the image formed by the light emitted from the light emitting layer (light source) can be maintained at an excellent level.

That is, the circularly polarizing plate having the antireflection function is usually used as the surface film. However, by adopting the laminate that is used in the present invention or the laminate according to the embodiment of the present invention, the self-luminous display device or OLED display device according to the embodiment of the present invention can each exhibit the excellent effect without using the circularly polarizing plate. It is noted that it does not interfere the combination use of the antireflection film, as the configuration of the self-luminous display device or OLED display device according to the embodiment of the present invention, within the range not impairing the effects of the present invention.

The method of forming an OLED color image applicable to the self-luminous display device according to the embodiment of the present invention and the method of forming an OLED color image applicable to the OLED display device according to the embodiment of the present invention are not particularly limited, and any of a three-color painting method, a color conversion method, and a color filter method of red (R), green (G), and blue (B) can be used, where a three-color painting method can be suitably used.

As a result, as the light source of the OLED display device according to the embodiment of the present invention, each light emitting layer corresponding to the above image forming method can be applied.

<Pressure Sensitive Adhesive Layer>

In the self-luminous display device or OLED display device according to the embodiment of the present invention, it is preferable that the laminate that is used in the present invention or the laminate according to the embodiment of the present invention is bonded to glass (a base material) with a pressure sensitive adhesive layer being interposed, on a surface positioned on an opposite side of external light.

The composition of the pressure sensitive adhesive composition that is used for forming the pressure sensitive adhesive layer is not particularly limited, and for example, a pressure sensitive adhesive composition containing a base resin having a mass average molecular weight (MW) of 500,000 or more may be used. In a case where the mass average molecular weight of the base resin is less than 500,000, the durability reliability of the pressure sensitive adhesive may decrease due to a decrease in cohesive force causing bubbles or peeling phenomenon under at least one of the high temperature condition or the high humidity condition. The upper limit of the mass average molecular weight of the base resin is not particularly limited. However, in a case where the mass average molecular weight is excessively increased, the coating property may deteriorate due to the increase in viscosity, and thus the upper limit thereof is preferably 2,000,000 or less.

The specific kind of the base resin is not particularly limited, and examples thereof include an acrylic resin, a silicone-based resin, a rubber-based resin, and an ethylene-vinyl acetate (EVA)-based resin. In a case of being applied to an optical device such as a liquid crystal display device, an acrylic resin is mainly used in that the acrylic resin is excellent in transparency, oxidation resistance, and resistance to yellowing, and it is not limited thereto.

Examples of the acrylic resin include a polymer of monomer mixture containing 80 to 99.8 parts by mass of the (meth)acrylic acid ester monomer; and 0.02 to 20 parts by mass (preferably 0.2 to 20 parts by mass) of another crosslinkable monomer.

The kind of the (meth)acrylic acid ester monomer is not particularly limited, and examples thereof include alkyl (meth)acrylate. In this case, in a case where the alkyl group contained in the monomer becomes an excessively long chain, the cohesive force of the pressure sensitive adhesive may decrease, and it may be difficult to adjust the glass transition temperature ($T_g$) or the adhesiveness. Therefore, it is preferable to use a (meth)acrylic acid ester monomer having an alkyl group having 1 to 14 carbon atoms. Examples of such a monomer include methyl (meth)acrylate, ethyl (meth)acrylate, n-propyl (meth)acrylate, isopropyl (meth)acrylate, n-butyl (meth)acrylate, t-butyl (meth) acrylate, sec-butyl (meth)acrylate, pentyl (meth)acrylate, 2-ethylhexyl (meth)acrylate, 2-ethylbutyl (meth)acrylate, n-octyl (meth)acrylate, isooctyl (meth)acrylate, isononyl (meth)acrylate, lauryl (meth)acrylate, isobornyl (meth)acrylate, and tetradecyl (meth)acrylate. In the present invention, the above-described monomers may be used alone, or two or more kinds thereof may be used in combination. The (meth) acrylic acid ester monomer is preferably contained in an amount of 80 to 99.8 parts by mass in 100 parts by mass of the monomer mixture. In a case where the content of the (meth)acrylic acid ester monomer is less than 80 parts by mass, the initial adhesive force may decrease, and in a case where the content exceeds 99.8 parts by mass, the durability may decrease due to the decrease in cohesive force.

The other crosslinkable monomer contained in the monomer mixture reacts with a polyfunctional crosslinking agent described later to impart a cohesive force to the pressure sensitive adhesive, and can impart a crosslinking functional group having a role of adjusting the pressure sensitive adhesive force and durability reliability to the polymer. Examples of such a crosslinkable monomer include a hydroxy group-containing monomer, a carboxyl group-containing monomer, and a nitrogen-containing monomer. Examples of the hydroxy group-containing monomer include 2-hydroxyethyl (meth)acrylate, 2-hydroxypropyl (meth)acrylate, 4-hydroxybutyl (meth)acrylate, 6-hydroxyhexyl (meth)acrylate, and 8-hydroxyoctyl (meth)acrylate, 2-hydroxyethylene glycol (meth)acrylate, and 2-hydroxypropylene glycol (meth)acrylate. Examples of the carboxyl group-containing monomer include acrylic acid, methacrylic acid, 2-(meth)acryloyloxyacetic acid, 3-(meth)acryloyloxypropyl acid, 4-(meth)acryloyloxybutyl acid, an acrylic acid dimer, itaconic acid, maleic acid, and a maleic acid anhydride. Examples of the nitrogen-containing monomer include (meth)acrylamide, N-vinylpyrrolidone, and N-vinylcaprolactam. In the present invention, these crosslinkable monomers may be used alone, or two or more kinds thereof may be used in combination.

The other crosslinkable monomer may be contained in an amount of 0.02 to 20 parts by mass in 100 parts by mass of the monomer mixture. In a case where the content is less than 0.02 parts by mass, the durability reliability of the pressure sensitive adhesive may decrease, and in a case where the content exceeds 20 parts by mass, at least one of the adhesiveness or the peelability may decrease.

The monomer mixture may further contain a monomer represented by General Formula (10). Such a monomer can be added for the intended purpose of adjusting the glass transition temperature of the pressure sensitive adhesive and imparting other functionality.

General Formula (10)

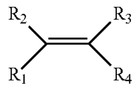

In the formula, $R_1$ to $R_3$ each independently represent a hydrogen atom or an alkyl group, and $R^4$ represents a cyano group; a phenyl group which may be substituted with an alkyl group; an acetyloxy group; or —C(═O)$R_5$ (here, $R_5$ represents an amino group which may be substituted with alkyl or alkoxyalkyl or a glycidyloxy group).

The numbers of carbon atoms of the alkyl group and the alkoxy group in terms of the definition of $R_1$ to $R_5$ in the above formula each independently mean 1 to 12, and they are preferably 1 to 8 and more preferably 1 to 12. Specific examples thereof include methyl, ethyl, methoxy, ethoxy, propoxy, and butoxy.

Examples of the monomer represented by General Formula (10) include one or two or more of nitrogen-containing monomers such as (meth)acrylonitrile, (meth)acrylamide, N-methyl (meth)acrylamide, and N-butoxymethyl (meth) acrylamide: styrene-based monomers such as styrene or methylstyrene; epoxy group-containing monomer such as glycidyl (meth)acrylate; or a carboxylic acid vinyl ester such as vinyl acetate, which are not limited thereto. The monomer represented by General Formula (10) can be contained in an amount of 20 parts by mass or less with respect to 100 parts by mass in total of the (meth)acrylic acid ester monomer and other crosslinkable monomers. In a case where the content exceeds 20 parts by mass, at least one of the flexibility or the peelability of the pressure sensitive adhesive may decrease.

The method of producing a polymer using a monomer mixture is not particularly limited, and the polymer can be produced, for example, through a general polymerization method such as solution polymerization, photopolymerization, bulk polymerization, suspension polymerization, or emulsion polymerization. In the present invention, it is particularly preferable to use a solution polymerization method, and solution polymerization is preferably carried out at a polymerization temperature of 50° C. to 140° C. by mixing an initiator in a state where each monomer is uniformly mixed. In this case, examples of the initiator used include azo-based polymerization initiators such as azobisisobutyronitrile and azobiscyclohexanecarbonitrile: and ordinary initiators such as peroxides such as benzoyl peroxide and acetyl peroxide.

The pressure sensitive adhesive composition may further contain 0.1 to 10 parts by mass of a crosslinking agent with respect to 100 parts by mass of the base resin. Such a crosslinking agent can impart cohesive force to the pressure sensitive adhesive through a crosslinking reaction with the base resin. In a case where the content of the crosslinking agent is less than 0.1 parts by mass, the cohesive force of the pressure sensitive adhesive may decrease. On the other hand, in a case where the content exceeds 10 parts by mass, durability reliability may decrease due to delamination and floating phenomenon.

The kind of the crosslinking agent is not particularly limited, and for example, any crosslinking agent such as an isocyanate-based compound, an epoxy-based compound, an aziridine-based compound, and a metal chelate-based compound can be used.

Examples of the isocyanate-based compound include tolylene diisocyanate, xylene diisocyanate, diphenylmethane diisocyanate, hexamethylene diisocyanate, isophorone diisocyanate, tetramethylxylene diisocyanate, and naphthalene diisocyanate, and a reactant of any one of these compounds and polyol (for example, trimethylolpropane); examples of the epoxy-based compound include ethylene glycol diglycidyl ether, triglycidyl ether, trimethylolpropane triglycidyl ether, N,N,N',N'-tetraglycidyl ethylenediamine, and glycerin diglycidyl ether: and examples of aziridine-based compounds include N,N'-toluene-2,4-bis(1-aziridine carboxamide), N,N'-diphenylmethane-4,4'-bis(1-aziridine carboxamide), triethylene melamine, bisprothaloyl-1-(2-methylaziridine), and tri-1-aziridinylphosphine oxide. Examples of the metal chelate-based compound include compounds in which at least any one of polyvalent metals such as aluminum, iron, zinc, tin, titanium, antimony, magnesium, and vanadium is coordinated with acetylacetone or ethyl acetoacetate.

The pressure sensitive adhesive composition may further contain 0.01 to 10 parts by mass of a silane-based coupling agent with respect to 100 parts by mass of the base resin. The silane-based coupling agent can contribute to the improvement of adhesive reliability in a case where the pressure sensitive adhesive is left for a long time under high temperature or high humidity conditions, particularly improve the adhesive stability in a case where adhering to a glass base material, and improve heat resistance and moisture resistance. Examples of the silane-based coupling agent include γ-glycidoxypropyltrimethoxysilane, γ-glycidoxypropylmethyldiethoxysilane, γ-glycidoxypropyltriethoxysilane, 3-mercaptopropyltrimethoxysilane, vinyltrimethoxysilane, vinyl triethoxysilane, γ-methacryloxypropyltrimethoxysilane, γ-methacryloxypropyltriethoxysilane, γ-aminopropyltriethoxysilane, 3-isocyanuppropyltriethoxysilane, γ-acetoacetatepropyltrimethoxysilane. These silane-based coupling agents may be used alone, or two or more kinds thereof may be used in combination.

The silane-based coupling agent is preferably contained in an amount of 0.01 to 10 parts by mass, and more preferably contained in an amount of 0.05 to 1 part by mass, with respect to 100 parts by mass of the base resin. In a case where the content is less than 0.01 parts by mass, the effect of increasing the pressure sensitive adhesive force may not be sufficient, and in a case where the content exceeds 10 parts by mass, durability reliability may decrease, which includes the occurrence of bubbling or peeling phenomenon.

The above-described pressure sensitive adhesive composition can further contain an antistatic agent. As the antistatic agent, any compound can be used, as long as the antistatic agent has excellent compatibility with other components contained in the pressure sensitive adhesive composition such as an acrylic resin, not adversely affect the transparency of the pressure sensitive adhesive, workability, and durability and can impart the antistatic performance to the pressure sensitive adhesive. Examples of the antistatic agent include inorganic salts and organic salts.

The inorganic salt is a salt containing an alkali metal cation or an alkaline earth metal cation as a cation component. Examples of the cation include one or two or more of a lithium ion ($Li^+$), a sodium ion ($Na^+$), a potassium ion ($K^+$), a rubidium ion ($Rb^+$), a cesium ion ($Cs^+$), a beryllium ion ($Be^{2+}$), a magnesium ion ($Mg^{2+}$), a calcium ion ($Ca^{2+}$), a strontium ion ($Sr^{2+}$), and a barium ion ($Ba^{2+}$), and preferred examples thereof include a lithium ion (Li*), a sodium ion ($Na^+$), a potassium ion ($K^+$), a cesium ion ($Cs^+$), a beryllium ion ($Be^{2+}$), a magnesium ion ($Mg^{2+}$), a calcium ion ($Ca^{2+}$), and a barium ion ($Ba^{2+}$). The inorganic salt may be used alone, or two or more kinds thereof may be used in combination. A lithium ion ($Li^+$) is particularly preferable in terms of ion safety and mobility within the pressure sensitive adhesive.

The organic salt is a salt containing onium cations as a cation component. The term “onium cation” means ion charged to the cation (+), where at least some of the charge is unevenly distributed on one or more of the nitrogen atom (N), the phosphorus atom (P), and the sulfur atom (S).

The onium cation may be a cation of either a cyclic compound or acyclic compound. In a case of being a cyclic compound, it can be a non-aromatic or aromatic compound. That is, it may be either an alicyclic compound or an aromatic compound. Further, in a case of being a cyclic compound, it can contain one or more heteroatoms (for example, oxygen atoms) other than the nitrogen atom, the phosphorus atom, or the sulfur atom.

Further, the cyclic or acyclic compound may be optionally substituted with a substituent such as a halogen atom, an alkyl group, or an aryl group. In a case of being an acyclic compound, it may be substituted with one or more, preferably four or more substituents, where the substituent(s) may be either cyclic or acyclic, and the cyclic substituent may be either aromatic or alicyclic.

The onium cation is preferably a cation containing a nitrogen atom and more preferably an ammonium ion. The ammonium ion is preferably a quaternary ammonium ion or an aromatic ammonium ion.

Specifically, the quaternary ammonium ion is preferably a cation represented by General Formula 11.

General Formula 11

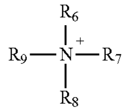

In General Formula 11, $R_6$ to $R_9$ each independently represent an alkyl group, an alkoxy group, an alkenyl group, an alkynyl group, an aryl group, or a heteroaryl group.

The numbers of carbon atoms of the above-described alkyl group and alkoxy group each independently mean 1 to 12, and they are preferably 1 to 8.

The number of carbon atoms of the alkenyl group and the alkynyl group described above each independently mean 2 to 12, and they are preferably 2 to 8.

Examples of the aryl group include phenyl, biphenyl, naphthyl, and anthracenyl.

It suffices that the heteroaryl group is a heteroaryl group having the number of ring members of 5 to 12 (preferably 5 and 6), which contains one or more heteroatoms of O, N, and S as ring-constituting atoms, and it may be a monocyclic ring a fused ring. Examples thereof include puryl, pyrrolyl, pyrrolidinyl, thienyl, pyridinyl, piperidyl, indolyl, quinolyl, thiazole, benzothiazole, and triazole.

The alkyl group, the alkoxy group, the alkenyl group, the alkynyl group, the aryl group, and the heteroaryl group, which can be employed as R to $R_9$, may be unsubstituted or may have a substituent.

Examples of the substituent which may be contained in these groups include a hydroxy group, a halogen atom, an alkyl group having 1 to 12 carbon atoms, or an alkoxy group (preferably having 1 to 8 carbon atoms and more preferably 1 to 4 carbon atoms).

Regarding the cation represented by General Formula 11, $R_6$ to $R_9$ are each independently preferably an alkyl group having 1 to 12 carbon atoms, and more preferably an alkyl group having 1 to 8 carbon atoms.

Examples of the quaternary ammonium ion represented by General Formula 11 include N-ethyl-N,N-dimethyl-N-(2-methoxyethyl) ammonium ion, N,N-diethyl-N-methyl-N-(2-methoxyethyl) ammonium ion, N-ethyl-N,N-dimethyl-N-propylammonium ion, N-methyl-N,N,N-trioctylammonium ion, N,N,N-trimethyl-N-propylammonium ion, tetrabutylammonium ion, tetramethylammonium ion, tetrahexylammonium ion, N-methyl-N,N,N-tributylammonium ion.

Examples of the aromatic ammonium ion include one or more ions of pyridinium, pyridadinium, pyrimidinium, pyrazinium, imidazolium, pyrazolium, thiazolium, oxazolium, and triazolium. Preferred examples thereof are an N-alkylpyridinium ion substituted with an alkyl group having 4 to 16 carbon atoms, a 1-alkyl-3-methylimidazolium ion substituted with an alkyl group having 2 to 10 carbon atoms, and a 1,2-dimethyl-3-alkylimidazolium ion substituted with an alkyl group having 2 to 10 carbon atoms. These aromatic ammonium ions may be used alone, or two or more kinds thereof may be used in combination.

In addition, the aromatic ammonium ion is preferably a cation represented by General Formula 12.

General Formula 12

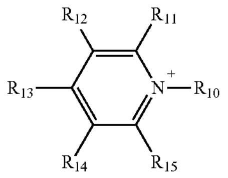

In General Formula 12, $R_{10}$ to $R_{15}$ each independently represent a hydrogen atom, an alkyl group, an alkoxy group, an alkenyl group, an alkynyl group, an aryl group, or a heteroaryl group.

The alkyl group, the alkoxy group, the alkenyl group, the alkynyl group, the aryl group, and the heteroaryl group, which can be employed as $R_{10}$ to $R_{15}$, are respectively the same as the alkyl group, the alkoxy group, the alkenyl group, the alkynyl group, the aryl group, and the heteroaryl group, which can be employed as $R_6$ to $R_9$ in General Formula 11.

Regarding the cation represented by General Formula 12, it is preferable that $R_{11}$ to $R_{15}$ are each independently a hydrogen atom or an alkyl group, where $R_{10}$ is an alkyl group.

Preferred examples of the anion contained in the cation-containing inorganic salt or organic salt as described above in the antistatic agent include fluoride ($F^-$), chloride ($C^-$), bromide ($Br^-$), iodide ($I^-$), perchlorate ($ClO_4^-$), hydroxide ($OH^-$), carbonate ($CO_3^{2-}$), nitrate ($NO_3^-$), sulfonate ($SO_4^-$), methylbenzene sulfonate ($CH_3(C_6H_4)SO_3^-$), p-toluene sulfonate ($CH_3C_6H_4SO_3^-$), carboxybenzene sulfonate ($COOH(C_6H_4)SO_3^-$), trifluoromethane sulfonate ($CF_3SO_2^-$), benzoate ($C_6HSCOO^-$), acetate ($CH_3COO^-$), trifluoroacetate ($CF_3COO^-$), tetrafluoroborate ($BF_4^-$), tetrabenzyl borate (B ($C_6H_5)_4^-$), hexafluorophosphate ($PF_6^{31}$), trispentafluoroethyl trifluorophosphate ($P(C_2F_5)_3F_3^-$), bistrifluoromethane sulfonimide ($N(SO_2CF_3)^-$), bispentafluoroethane sulfonimide ($N(SOC_2F_5)_2^-$), bispentafluoroethane carbonylimide ($N(COC_2F_5)_2^-$), bisperfluorobutane sulfoneimide ($N(SO_2C_4F_9)_2^-$), bisperfluorobutane carbonylimide ($N(COC_4F_9)_2^-$), tristrifluoromethane sulfonylmethide ($C(SO_2CF_3)_3^-$ and tristrifluoromethane carbonylmethide ($C(SO_2CF_3)_3^-$), which are not limited thereto.

Among the anions, the anion is preferably an imide-based anion which can exhibit an electron withdrawing function, is substituted with a fluorine atom having good hydrophobicity, and has high ionic stability.

An antistatic agent having a quaternary ammonium ion represented by General Formula 11 is particularly preferable from the viewpoint of increasing the durability of the dye contained in the wavelength selective absorption filter according to the embodiment of the present invention.

The pressure sensitive adhesive composition contains an antistatic agent in an amount of 0.01 to 5 parts by mass, preferably 0.01 to 2 parts by mass, more preferably 0.1 to 2 parts by mass, with respect to 100 parts by mass of the base resin. In a case where the content is less than 0.01 parts by mass, the desired antistatic effect may not be obtained, and in a case where the content exceeds 5 parts by mass, the compatibility with other components is reduced and the durability reliability of the pressure sensitive adhesive or the transparency may be deteriorated.

The pressure sensitive adhesive composition further includes a compound capable of forming a coordinate bond with an antistatic agent, specifically, with a cation contained in the antistatic agent (hereinafter, referred to as a "coordinate-bonding compound"). In a case where a coordinate-bonding compound is properly contained, it is possible to effectively impart antistatic performance by increasing the anion concentration inside the pressure sensitive adhesive layer even in a case where a relatively small amount of antistatic agent is used.

The kind of the coordinate-bonding compound that can be used is not particularly limited as long as it has a functional group capable of coordinating with the antistatic agent in the molecule, and examples thereof include alkylene oxide-based compounds.

The alkylene oxide-based compound is not particularly limited, and it is preferable to use an alkylene oxide-based compound in which an alkylene moiety in the alkylene oxide unit that is a basic unit has 2 or more carbon atoms, preferably 3 to 12 carbon atoms, and more preferably 3 to 8 carbon atoms.

The alkylene oxide-based compound preferably has a molecular weight of 5,000 or less. The term "molecular weight" that is used in the present invention means the molecular weight or mass average molecular weight of a compound. In the present invention, in a case where the molecular weight of the alkylene oxide-based compound exceeds 5,000, the viscosity may be excessively increased and the coating property may be deteriorated, or the complex forming ability with the metal may be lowered. On the other hand, the lower limit of the molecular weight of the alkylene oxide compound is not particularly limited: however, it is preferably 500 or more, and more preferably 4,000 or more.

The alkylene oxide-based compound is not particularly limited as long as the compound exhibits the above-described characteristics, and for example, a compound represented by General Formula 13 can be used.

General Formula 13

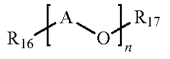

In General Formula 13, A represents an alkylene group having 2 or more carbon atoms, n is 1 to 120, $R_{16}$ and $R_{17}$ each independently represent a hydrogen atom, a hydroxy group, an alkyl group, or $C(=O)R_{18}$, where $R_{18}$ represents a hydrogen atom or an alkyl group.

In General Formula 13, the alkylene group preferably has 3 to 12 carbon atoms and more preferably 3 to 8 carbon atoms. Specifically, it represents ethylene, propylene, butylene, or pentylene.

In General Formula 13, the alkyl group preferably has 1 to 12 carbon atoms, more preferably 1 to 8 carbon atoms, and still more preferably 1 to 4 carbon atoms, n is preferably 1 to 80 and more preferably 1 to 40.

Examples of the compound represented by General Formula 13 include a polyalkylene oxide, a fatty acid-based alkyl ester of the polyalkylene oxide, and a carboxylic acid ester of the polyalkylene oxide, which are not limited thereto.

Examples of the polyalkylene oxide include polyethylene oxide, polypropylene oxide, polybutylene oxide, and polypentylene oxide.

In the present invention, in addition to the above-described alkylene oxide-based compound, various coordinate-bonding compounds such as an ester compound having one or more ether bonds disclosed in KR2006-0018495A, an oxalate group-containing compound disclosed in KR2006-0128659A, a diamine group-containing compound, a polyvalent carboxyl group-containing compound, or a ketone group-containing compound can be appropriately selected and used as necessary.

The coordinate-bonding compound is preferably contained in the pressure sensitive adhesive composition at a ratio of 3 parts by mass or less with respect to 100 parts by mass of the base resin, more preferably 0.1 to 3 parts by mass, and still more preferably, 0.5 to 2 parts by mass. In a case where the content exceeds 3 parts by mass, the pressure sensitive adhesive physical properties such as peelability may deteriorate.

From the viewpoint of adjusting the adhesive performance, the pressure sensitive adhesive composition may further contain 1 to 100 parts by mass of a tackifying resin with respect to 100 parts by mass of the base resin. In a case where the content of the tackifying resin is less than 1 part by mass, the addition effect may not be sufficient, and in a case where the exceeds 100 parts by mass, at least one of the compatibility or the cohesive force improving effect may be lowered.

Such a tackifying resin is not particularly limited, and examples thereof include a hydrocarbon resin, a rosin resin, a rosin ester resin, a terpene resin, a terpene phenol resin, a polymerized rosin resin, and a polymerized rosin ester resin. The above-described hydrocarbon resin, rosin resin, rosin ester resin, terpene resin, and terpene phenol resin may be hydrogenated.

These tackifying resins may be used alone, or two or more kinds thereof may be used in combination.

The pressure sensitive adhesive composition may contain one or more additives as long as the effect of the present invention is not affected, a polymerization initiator such as a thermal polymerization initiator and a photopolymerization initiator: an epoxy resin; a curing agent: an ultraviolet stabilizer; an antioxidant: a toning agent, a reinforcing agent; a filler: an antifoaming agent: a surfactant; a photopolymerizable compound such as a polyfunctional acrylate: and a plasticizer.

<Base Material>

In the self-luminous display device or OLED display device according to the embodiment of the present invention, it is preferable that the laminate that is used in the present invention or the laminate according to the embodiment of the present invention is bonded to glass (a base material) with a pressure sensitive adhesive layer being interposed, on a surface positioned on an opposite side of external light.

The method of forming the pressure sensitive adhesive layer is not particularly limited, and it is possible to use, for example, a method of applying the pressure sensitive adhesive composition to the wavelength selective absorption layer by a usual means such as a bar coater, drying, and curing the pressure sensitive adhesive composition; and a method of applying the pressure sensitive adhesive composition first to the surface of a peelable base material, and drying the composition, and then transferring the pressure sensitive adhesive layer using the peelable base material to the wavelength selective absorption layer and then aging and curing the composition.

The peelable base material is not particularly limited, and a predetermined peelable base material can be used. For example, the release film in the manufacturing method for the wavelength selective absorption layer described above is exampled.

In addition, the conditions of application, drying, aging, and curing can be appropriately adjusted based on a conventional method.

<Refractive Index of Each Layer in Laminate>

In the self-luminous display device according to the embodiment of the present invention, it is preferable that in the laminate that is used in the present invention (the first embodiment), the difference in the refractive index of each layer with respect to the adjacent layer of each layer is adjusted within a certain range, from the viewpoint of reducing the reflection of the external light. The adjacent layer means a layer which is in direct contact with another layer. The difference in the refractive index between the adjacent layers is preferably 0.15 or less, more preferably 0.10 or less, still more preferably 0.06 or less, particularly preferably 0.05 or less, and among them, it is preferably particularly preferably 0.04 or less. That is, it is preferable that all the layers forming the laminate that is used in the present invention satisfy the difference in the refractive index between the adjacent layers.

The laminate that is used in the present invention, which satisfies the difference in the refractive index between the adjacent layers preferably includes an ultraviolet absorption layer arranged on a side of the gas barrier layer opposite to the wavelength selective absorption layer, in addition to the wavelength selective absorption layer and the gas barrier layer. Furthermore, it is also preferable to include at least one layer of the pressure sensitive adhesive layer or the adhesive layer. The above-described pressure sensitive adhesive layer or adhesive layer may be used in any space other than the space between the wavelength selective absorption layer and the gas barrier layer in a case where any layers are laminated with each other. For example, the above-described pressure sensitive adhesive layer or adhesive layer can be arranged between the gas barrier layer and the ultraviolet absorption layer.

In addition, in a case where the laminate that is used in the present invention is used by being incorporated into the self-luminous display device, it is preferable to satisfy the difference in the refractive index between the adjacent layers even in the layers in which the laminate that is used in the present invention and the self-luminous display device are in contact with each other. In a case where the surface (for example, the surface on the opposite side to the gas barrier layer with respect to the wavelength selective absorption layer) of the laminate that is used in the present invention positioned on the opposite side to the external light is bonded to glass (a base material) with a pressure sensitive adhesive layer or an adhesive layer being interposed, it is preferable that the surface of the laminate that is used in the present invention on the opposite side to the external light, the pressure sensitive adhesive layer or the adhesive layer, and the glass satisfy the difference in the refractive index between the adjacent layers.

The sum of the interfacial reflectivity of the laminate that is used in the present invention is preferably 0.30 or less, more preferably 0.20 or less, still more preferably 0.10 or less, particularly preferably 0.06 or less, and among them, it is preferably 0.03 or less and most preferably 0.02 or less. The lower limit value thereof is not particularly limited. The sum of the above interfacial reflectivity is calculated using the refractive index and film thickness of each layer according to the method of Chapter 5, pages 173 to 174 of the 7th edition of "Applied Physical Engineering Selection Book 3, Thin Film" by Sadafumi Yoshida, and it is a value rounded to the third decimal place. The refractive index and the film thickness of each layer can be measured according to the method described in Examples to be described later.

For example, in a case of a configuration obtained by carrying out lamination in an order of a surface antireflection layer/a support/an adhesive (pressure sensitive adhesive) layer/a gas barrier layer/a wavelength selective absorption layer/an adhesive (pressure sensitive adhesive) layer/glass, in a case of being viewed from the viewer side, it is preferable to adjust the refractive index of each layer from the support to the glass in the following range. However, in the laminate that is used in the present invention, an excellent antireflection effect can be obtained even in a case where the surface antireflection layer is not provided.

Support: 1.45 to 1.55
Adhesive (pressure sensitive adhesive) layer: 1.47 to 1.57
Gas barrier layer: 1.49 to 1.59
Wavelength selective absorption layer: 1.51 to 1.61
Adhesive (pressure sensitive adhesive) layer: 1.47 to 1.57
Glass: 1.45 to 1.55

The refractive index of each layer can be adjusted by the structure of the resin used for each layer (increasing the refractive index due to the addition of an aromatic ring group or a sulfur atom, reducing the refractive index due to addition of a fluorine atom), the addition of high-refractive index fine particles such as titanium oxide or zirconium oxide or nanoparticles, the addition of a high refractive index material containing a sulfur atom, a nitrogen atom, and the like, the addition of a low refractive index material containing a fluorine atom.

The refractive index of each layer can be measured by spectroscopic microscopy or ellipsometry, and can be easily measured by, for example, a reflection spectroscopic film thickness meter FE3000 (product name) manufactured by Otsuka Electronics Co., Ltd. Specifically, the refractive index can be measured according to the method described in Examples to be described later.

As the surface antireflection layer, a surface film having an antireflection function used in a self-luminous display device can be used without particular limitation, and examples thereof include a circularly polarizing plate.

As the support, the above-described optical film can be used, and among the above, the ultraviolet absorption layer is preferable.

The adhesive (pressure sensitive adhesive) layer means an adhesive layer composed of an adhesive or a pressure sensitive adhesive layer composed of a pressure sensitive adhesive.

(Pressure Sensitive Adhesive Layer)

As the pressure sensitive adhesive layer, the description for the pressure sensitive adhesive layer in the self-luminous display device described above can be applied.

Examples of the high refractive index material that increases the refractive index of the pressure sensitive adhesive layer by addition to the pressure sensitive adhesive layer include a benzodithiol compound and a triazine compound.

i) Benzodithiol Compound

The benzodithiol compound is preferably, for example, a compound represented by General Formula (A).

General Formula (A)

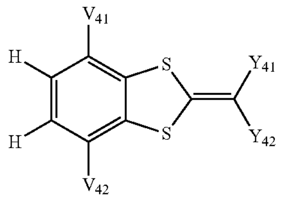

In the formula. $Y_{41}$ and $Y_{42}$ each independently represent a hydrogen atom or a monovalent substituent, and $V_{41}$ and $V_{42}$ each independently represent a hydrogen atom or a monovalent substituent.

The compound represented by General Formula (A) is described in paragraphs [0037] to [0062] of JP2009-096972A, and the same applies to the present invention. In the present invention, the compound represented by General Formula (A) preferably does not have a linear alkyl group having 8 or more carbon atoms.

In General Formula (A), it is preferable that one of $Y_{41}$ or $Y_{42}$ is a cyano group, and the other is a substituted or unsubstituted alkylcarbonyl group, a substituted or unsubstituted arylcarbonyl group, a substituted or unsubstituted heterocyclic carbonyl group, a substituted or unsubstituted alkylsulfonyl group, or a substituted or unsubstituted arylsulfonyl group, it is more preferable that one of $Y_{41}$ or $Y_{42}$ is a cyano group, and the other is a substituted or unsubstituted alkylcarbonyl group, a substituted or unsubstituted arylcarbonyl group, or a substituted or unsubstituted heterocyclic carbonyl group, and it is still more preferable that the one is a cyano group and the other is a substituted or unsubstituted alkylcarbonyl group or a substituted or unsubstituted arylcarbonyl group.

In General Formula (A), in a case where $V_{41}$ and $V_{42}$ represent a monovalent substituent, as the monovalent substituent, a halogen atom, a mercapto group, a cyano group, a carboxyl group, a phosphate group, a sulfo group, a hydroxy group, a carbamoyl group, a sulfamoyl group, a nitro group, an alkoxy group, an aryloxy group, an acyl group, an acyloxy group, an acylamino group, an alkylaminocarbonyloxy group, a sulfonyl group, a sulfinyl group, a sulfonylamino group, an amino group, a substituted amino group, an ammonium group, a hydrazino group, a ureido group, an imide group, an alkyl or arylthio group, an unsubstituted or substituted alkenylthio group, an alkoxycarbonyl group, an aryloxycarbonyl group, an alkoxycarbonyloxy group, an unsubstituted alkyl group, a substituted alkyl group, a substituted or unsubstituted aryl group, or a substituted or unsubstituted heterocyclic group is preferable, a cyano group, an acyl group, an acyloxy group, or an alkylaminocarbonyloxy group is more preferable, and an acyloxy group or an alkylaminocarbonyloxy group is still more preferable. The number of carbon atoms in $Y_{41}$ and $Y_{42}$ is preferably 1 to 18 and more preferably 1 to 10.

Specific examples of the compound represented by General Formula (A) are shown below. However, the compound represented by General Formula (A) is not limited to the following specific examples.

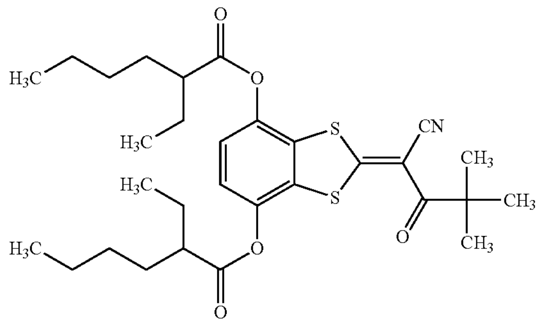

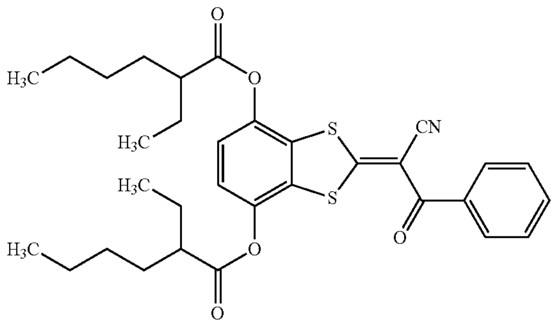

(S-03)

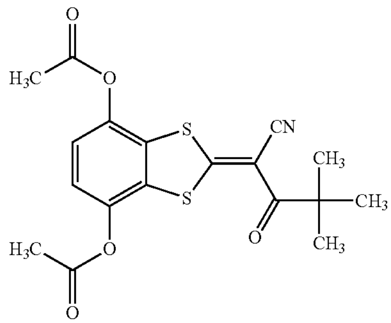

-continued
(S-04)
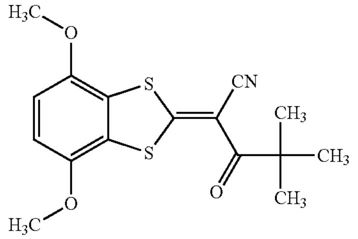
(S-05)
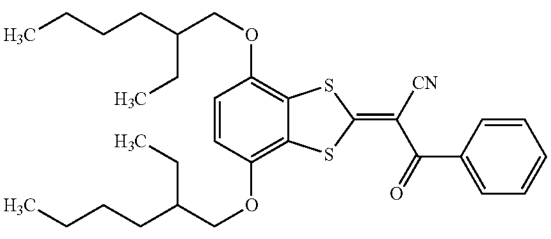
(S-06)
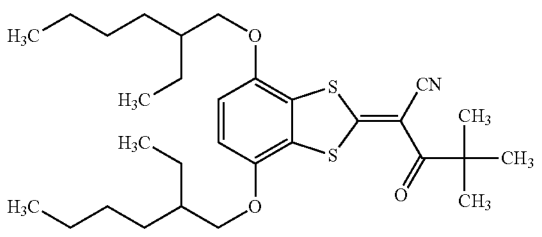
(S-11)
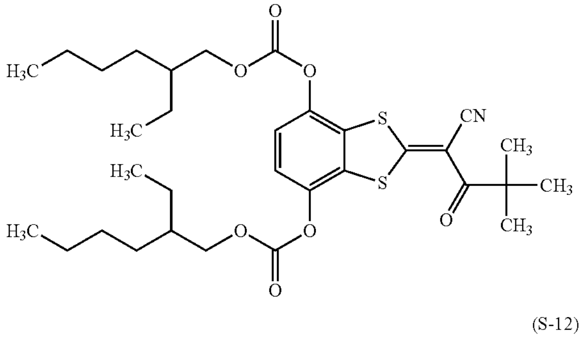
(S-12)
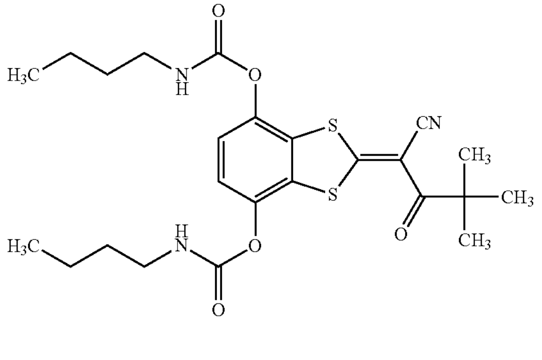
-continued
(S-13)
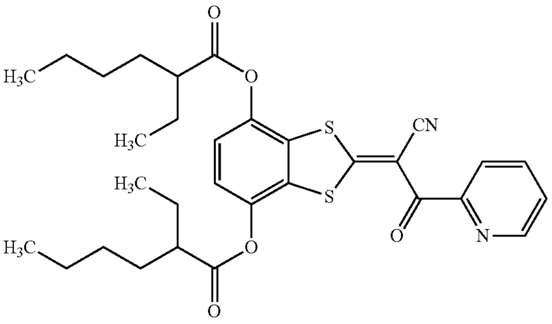
(S-14)
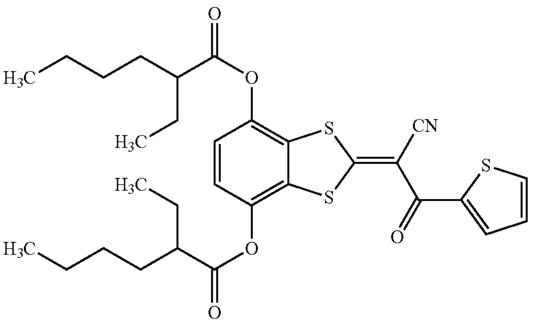
(S-15)
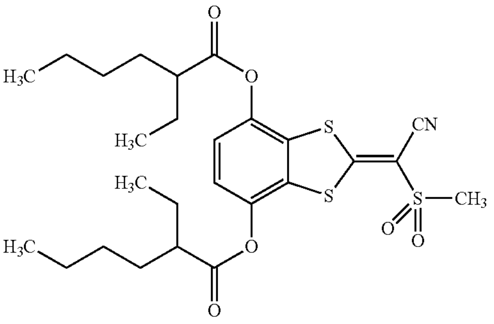
(S-16)
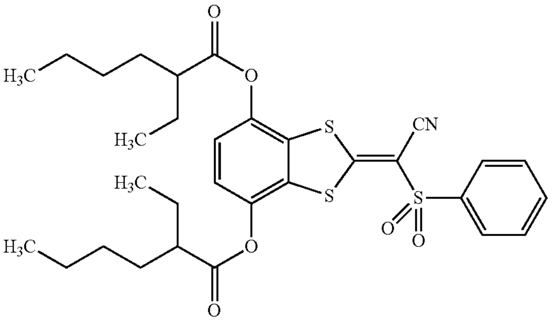
ii) Triazine Compound
Preferred examples of the triazine compound include a compound represented by General Formula (I).

(I)

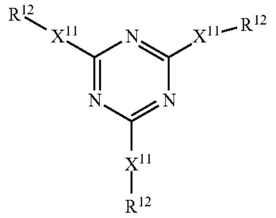

In the formula, $R^{12}$'s each independently represent an aryl group or a heterocyclic group, which has a substituent at least any one of the ortho-position, meta-position, or para-position thereof.

$X^{11}$'s each independently represent a single bond or $—NR^{13}—$. Here, $R^{13}$'s each independently represent a hydrogen atom, a substituted or unsubstituted alkyl group, an alkenyl group, an aryl group, or a heterocyclic group.

The aryl group that can be employed as $R^{12}$ is preferably phenyl or naphthyl, and particularly preferably phenyl Examples of the substituent contained in the aryl group that can be employed as $R^{12}$ include a halogen atom, a hydroxy group, a cyano group, a nitro group, a carboxy group, an alkyl group, an alkenyl group, an aryl group, an alkoxy group, an alkenyloxy group, an aryloxy group, an acyloxy group, an alkoxycarbonyl group, an alkenyloxycarbonyl group, an aryloxycarbonyl group, a sulfamoyl group, an alkyl-substituted sulfamoyl group, an alkenyl-substituted sulfamoyl group, an aryl-substituted sulfamoyl group, a sulfonamide group, a carbamoyl group, an alkyl-substituted carbamoyl group, an alkenyl-substituted carbamoyl group, an aryl-substituted carbamoyl group, an amide group, an alkylthio group, an alkenylthio group, an arylthio group, and an acyl group.

The heterocyclic group that can be employed as $R^{12}$ preferably has aromaticity. The heterocycle in the heterocyclic group is preferably a 5-membered ring, a 6-membered ring, or a 7-membered ring, more preferably a 5-membered ring or a 6-membered ring, and most preferably a 6-membered ring. The ring-constituting heteroatom of the heterocycle is preferably a nitrogen atom, a sulfur atom, or an oxygen atom, and more preferably a nitrogen atom. The heterocycle having the aromaticity is particularly preferably a pyridine ring (2-pyridyl or 4-pyridyl as the heterocyclic group). The heterocyclic group may have a substituent. Examples of the substituent contained in the heterocyclic group that can be employed as $R^{12}$ include the substituent contained in the aryl group.

In a case where $X^{11}$ is a single bond, the heterocyclic group that can be employed as $R^{12}$ is preferably a heterocyclic group having a free valence in the nitrogen atom. The heterocycle in the heterocyclic group with a free valence in the nitrogen atom is preferably a 5-membered ring, a 6-membered ring, or a 7-membered ring, more preferably a 5-membered ring or a 6-membered ring, and most preferably a 5-membered ring. The heterocycle in the heterocyclic group may have a plurality of nitrogen atoms as ring-constituting atoms. In addition, the ring-constituting atom in the heterocyclic group may have a heteroatom (for example, an oxygen atom or a sulfur atom) other than the nitrogen atom.

The following is an example of the heterocyclic group with a free valence in the nitrogen atom. In the following structural formula, * indicates a free valence.

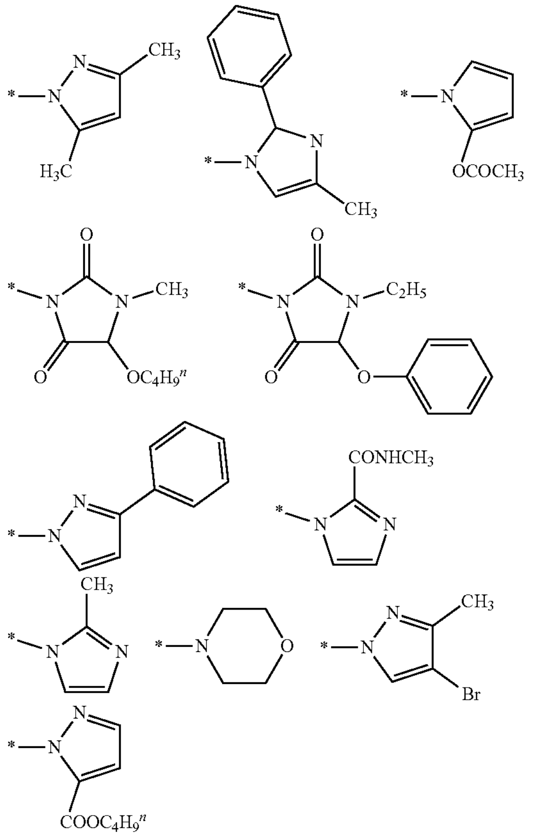

The alkyl group that can be employed as $R^{13}$ may be a cyclic alkyl group or a chain alkyl group, and a chain alkyl group is preferable, and a linear alkyl group having no branch is more preferable. The number of carbon atoms of the alkyl group is preferably 1 to 30, more preferably 1 to 20, still more preferably 1 to 10, particularly preferably 1 to 8, and most preferably 1 to 6. The alkyl group may have a substituent. Examples of the substituent include a halogen atom, an alkoxy group (for example, methoxy and ethoxy), and an acyloxy group (for example, acryloyloxy and methacryloyloxy).

The alkenyl group that can be employed as $R^{13}$ may be a cyclic alkenyl group or a chain alkenyl group, and a chain alkenyl group is preferable, and a linear alkenyl group having no branch is more preferable. The number of carbon atoms of the alkenyl group is preferably 2 to 30, more preferably 2 to 20, still more preferably 2 to 10, particularly preferably 2 to 8, and most preferably 2 to 6. The alkenyl group may have a substituent. Examples of the substituent include a substituent which may be contained in the above-described alkyl group.

An aryl group and a heterocyclic group that can be employed as $R^{13}$ have the same meaning as the aryl group and the heterocyclic group that can be employed as $R^{12}$. The aryl group and the heterocyclic group may further have a substituent, and examples of the substituent include a substituent which may be contained in the aryl group and the heterocyclic group, which can be employed as $R^{12}$.

The molecular weight of the compound represented by General Formula (I) is preferably 300 to 800.

Further, an ultraviolet absorbing agent may be used in combination with the compound represented by General Formula (I). The amount of the ultraviolet absorbing agent used is preferably 10 parts by mass or less, and more preferably 3 parts by mass or less, with respect to 100 parts by mass of the compound represented by General Formula (I).

Specific examples of the triazine compound represented by Formula (I) preferably include the compound described as a specific example of the retardation expressing agent represented by General Formula (I) in paragraphs 0084 to 0094 of JP2008-239786A.

In a case where the high refractive index material is incorporated in the pressure sensitive adhesive layer, the content thereof can be appropriately adjusted, for example, can be set to 0.1 to 40 parts by mass, and is preferably 0.5 to 30 parts by mass, and more preferably 1.0 to 25 parts by mass, with respect to 100 parts by mass of the solid content (component other than the solvent) of the pressure sensitive adhesive.

(Adhesive Layer)

Examples of the adhesive used in the adhesive layer include polyvinyl alcohol-based adhesives such as polyvinyl alcohol and polyvinyl butyral, and vinyl-based latexs such as butyl acrylate.

As the polyvinyl alcohol that is used in the adhesive layer, the degree of saponification of the polyvinyl alcohol is preferably 30% by mole or more and more preferably 50% by mole or more in terms of the refractive index. In a case where the adhesive layer is composed of two or more kinds of polyvinyl alcohols, it is preferable that at least one kind of the polyvinyl alcohol satisfies the degree of saponification, and it is more preferable that any one of the polyvinyl alcohols satisfies the degree of saponification.

As the polyvinyl alcohol-based adhesive according to the embodiment of the present invention, commercially available polyvinyl alcohol can be used. For example, Kuraray Poval 5-98, 11-98, 28-98, 60-98, 5-88, 9-88, 2-88, and CP-1220T10 (all, product names) manufactured by Kuraray Co., Ltd., Denka Poval K-05, K-17C, K-17E, H-12, H-17, B-05, and B-17 (all, product names) manufactured by Denka Corporation, and the like can be preferably used.

In a case where the laminate that is used in the present invention includes a layer I further in contact with the gas barrier layer arranged on at least one surface of the wavelength selective absorption layer, and in a case where this layer I satisfies the specification (containing the crystalline resin and having an oxygen permeability of a specific value or less) of the gas barrier layer in the laminate that is used in the present invention, the gas barrier layer in the laminate that is used in the present invention means a layer composed of the gas barrier layer and the layer I.

Examples of the layer I understood as the gas barrier layer in the laminate that is used in the present invention include the corresponding adhesive layer among the above-described adhesive layers. In this case, the thickness of the gas barrier layer according to the embodiment of the present invention, the oxygen permeability of the layer, and the degree of crystallinity of the crystalline resin contained in the layer are measured and calculated according to the methods described in Examples to be described later.

In the laminate that is used in the present invention, which is obtained by carrying out lamination in an order of a surface antireflection layer/an ultraviolet absorption layer/an adhesive (pressure sensitive adhesive) layer/a gas barrier layer/a wavelength selective absorption layer/an adhesive (pressure sensitive adhesive) layer/glass, it is preferable to have a configuration satisfying at least a condition that a layer provided between the ultraviolet absorption layer and the gas barrier layer is used as the adhesive layer, a condition that the resin in the wavelength selective absorption layer contains the above-described cyclic polyolefin resin, or a condition that the layer provided between the wavelength selective absorption layer and the glass is the pressure sensitive adhesive layer containing a high refractive index material, it is preferable to have a configuration satisfying at least two conditions thereof, and it is still more preferable to have a configuration satisfying all the conditions, from the viewpoint of decreasing the difference in the refractive index between adjacent layers and reducing the external light reflection. However, in the laminate that is used in the present invention, an excellent antireflection effect can be obtained even in a case where the surface antireflection layer is not provided.

EXAMPLES

Hereinafter, the present invention will be described in more detail based on Examples. The materials, using amount, ratio, details of treatment, procedures of treatment, and the like described in Examples below can be appropriately changed without departing from the spirit of the present invention. Therefore, it is to be understood that the scope of the present invention is not limited to Examples described below.

It is noted that "parts" and "%" that indicate the composition in Examples below are based on mass unless otherwise specified. In addition, km in each dye means the maximal absorption wavelength at which the maximum absorbance is exhibited in the measurement of the absorbance of the light resistance evaluation film to be described later.

In addition, from the preparation of the wavelength selective absorption filter forming liquid to the production of the laminate and the use thereof in the light resistance test, all the operations were carried out under a yellow lamp to avoid irradiation with an ultraviolet ray.

Example 1: A Display Device Including a Laminate and a Wavelength Conversion Material

[Production of Wavelength Selective Absorption Layer]

The materials used in the production of the wavelength selective absorption layer are shown below.

<Matrix Resin>

(Resin 1)

A polystyrene resin (PSJ-polystyrene GPPS SGP-10 (product name), manufactured by PS Japan Corporation).

(Resin 2)

A polyphenylene ether resin (manufactured by Asahi Kasei Corporation, Zylon S201A (product name), poly(2,6-dimethyl-1,4-phenylene oxide), Tg: 210° C.)

(Peelability Control Resin Component 1)

Byron 550 (product name, manufactured by Toyobo Co., Ltd., a polyester-based additive)

<Dye>

The above-described E-14 or E-27 was used as the dye A, the above-described A-52 was used as the dye B, the above-described C-73 was used as the dye C, and the above-described D-36 or F-30 was used as the dye D.

In the above, Ph represents a phenyl group.

<Additive>

(Antifading Agent 1)

IV-8

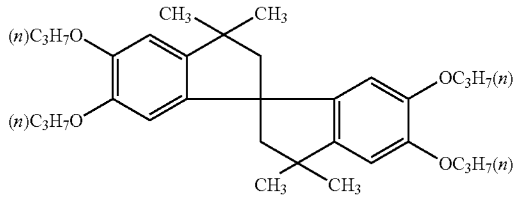

(Leveling Agent 1)

A polymer surfactant composed of the following constitutional components was used as a leveling agent 1. In the following structural formulae, the proportion of each constitutional component is in terms of a molar ratio, and t-Bu means a tert-butyl group.

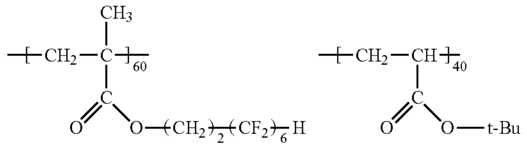

(Base Material 1)

A Polyethylene Terephthalate Film

LUMIRROR XD-5eyP (product name, film thickness: 50 μm, manufactured by Toray Industries, Inc.) was used as a base material 1.

Example 1-1

<Production of Base Material-Attached Wavelength Selective Absorption Layer 1>

(1) Preparation of Wavelength Selective Absorption Layer Forming Liquid 1

Each component was mixed according to the composition shown below to prepare a wavelength selective absorption layer forming liquid 1.

| Composition of wavelength selective absorption layer forming liquid 1 | |
|---|---|
| Resin 1 | 66.4 parts by mass |
| Resin 2 | 17.5 parts by mass |
| Peelability control resin component 1 | 0.20 parts by mass |
| Leveling agent 1 | 0.08 parts by mass |
| Dye E-14 | 1.06 parts by mass |
| Dye D-36 | 2.29 parts by mass |
| Antifading agent 1 | 12.4 parts by mass |
| Toluene (a solvent) | 1710.0 parts by mass |
| Cyclohexanone (a solvent) | 190.0 parts by mass |

Subsequently, the obtained wavelength selective absorption layer forming liquid 1 was filtered using a filter having an absolute filtration precision of 5 μm (product name: Hydrophobic Fluorepore Membrane, manufactured by Millex).

(2) Production of Base Material-Attached Wavelength Selective Absorption Layer 1

The above-described wavelength selective absorption layer forming liquid 1 after the filtration treatment was applied onto the base material 1 by using a bar coater so that the film thickness after drying was 2.5 μm, and dried at 120° C. to produce a base material-attached wavelength selective absorption layer 1.

<Production of Base Material-Attached Wavelength Selective Absorption Layers 2, 3, 4A1, 4a2, 4b, 4c, 4d1, 4d2, 5, and 6>

Base material-attached wavelength selective absorption layers 2, 3, 4a1, 4a2, 4b, 4c, 4d1, 4d2, 5, and 6 were produced in the same manner as in the production of the base material-attached wavelength selective absorption layer 1, except that the kind and the formulation amount of the dye were changed to the contents shown in Table 1 to be described later.

[Production of Laminate of Gas Barrier Layer and Wavelength Selective Absorption Layer]

The materials used in the production of the laminate of the gas barrier layer and the wavelength selective absorption layer (hereinafter, simply referred to as the laminate) are shown below.

<Resin>

(1) Crystalline Resin (Resin 3) PVA105 (manufactured by Kuraray Co., Ltd., Kuraray Poval PVA-105 (product name), polyvinyl alcohol, saponification degree: 98% to 99% by mole)

(Resin 4) AQ-4104 (manufactured by Kuraray Co., Ltd., Exceval AQ-4104 (product name), modified polyvinyl alcohol, saponification degree: 98% to 99% by mole)

(Resin 5) PVA403 (manufactured by Kuraray Co., Ltd., Kuraray Poval PVA-403 (product name), polyvinyl alcohol, saponification degree: 80% by mole)

(Resin 6) PVA117H (manufactured by Kuraray Co., Ltd., Kuraray Poval PVA-117H (product name), polyvinyl alcohol, saponification degree: 99% by mole)

(2) Amorphous Resin (Resin 7) Estyrene AS-70 (manufactured by Nippon Steel & Sumitomo Metal Corporation, Estyrene AS-70 (product name), an acrylonitrile-styrene copolymer)

(Base Material 2)

The wavelength selective absorption layer side of the base material-attached wavelength selective absorption layer 1 is subjected to a corona treatment using a corona treatment device (product name: Corona-Plus, manufactured by VETAPHONE), at a discharge amount of 1,000 W min/$m^2$, and at a processing speed of 3.2 m/min and used as a base material 2.

<Production of Laminate No. L101>

(1) Preparation of Resin Solution

Each component was mixed according to the composition shown below, and the mixture was stirred in a constant-temperature tank at 90° C. for 1 hour to dissolve the resin 3 to prepare a gas barrier layer forming liquid 1.

| Composition of gas barrier layer forming liquid 1 | |
|---|---|
| Resin 3 | 4.0 parts by mass |
| Pure water | 96.0 parts by mass |

Subsequently, the obtained gas barrier layer forming liquid 1 was filtered using a filter having an absolute filtration precision of 5 μm (product name: Hydrophobic Fluorepore Membrane, manufactured by Millex).

(2) Production of Laminate

The gas barrier layer forming liquid 1 after the filtration treatment was applied to the corona-treated surface side of the base material 2 using a bar coater so that the film thickness after drying was 1.1 μm, and dried at 120° C. for 60 seconds, and the laminate No. L101 was produced.

This laminate No. L101 has a structure in which the base material 1, the wavelength selective absorption layer, and the gas barrier layer are laminated in this order.

<Production of Laminate Nos. L102 to L116, Lc001 to Lc008, and Lc101 to Lc111>

Laminate Nos. L102 to L116, Lc001 to Lc008, and Lc101 to Lc111 were produced in the same manner as in the production of the laminate No. L101, except that the composition of the gas barrier layer forming liquid, the kind of the base material-attached wavelength selective absorption layer, and the thickness of the gas barrier layer were changed as shown in Table 2 below.

The laminate Nos. L101 to L116 are the laminate that is used in the present invention, and the laminate Nos. Lc001 to Lc008 are comparative laminates, and the laminate Nos. Lc101 to Lc111 are reference examples.

<Light Resistance>

(Production of Light Resistance Evaluation Film)

A triacetyl cellulose film (hereinafter, referred to as a "TAC film containing a UV absorbing agent") (thickness: 80 μm) containing a UV absorbing agent 1 (product name: TINUVIN328, manufactured by Ciba Geiki (currently Novartis Pharma), concentration with respect to TAC: 0.98 phr) and a UV absorbing agent 2 (product name: TINUVIN326, manufactured by Ciba Geiki (currently Novartis Pharma), concentration with respect to TAC: 0.24 phr) was bonded to the gas barrier layer side of the laminate with a pressure sensitive adhesive 1 having a thickness of about 20 μm (product name: SK2057, manufactured by Soken Chemical Co., Ltd.) being interposed. Subsequently, the base material 1 was peeled off, and glass was bonded to the wavelength selective absorption layer side to which the base material 1 was bonded with the pressure sensitive adhesive 1 being interposed, thereby producing a light resistance evaluation film.

(Maximal Absorption Value of Light Resistance Evaluation Film)

Using a UV3150 spectrophotometer (product name) manufactured by Shimadzu Corporation, the absorbance of the light resistance evaluation film in a wavelength range of 200 nm to 1,000 nm was measured for every 1 nm. The absorbance difference between the absorbance of the light resistance evaluation film at each wavelength and the absorbance of the light resistance evaluation film having the same configuration except that it does not contain the dye was calculated, and the maximum value of this absorbance difference was defined as the maximal absorption value.

(Light Resistance)

The light resistance evaluation film was irradiated with light for 200 hours in an environment of 60° C., and 50% relative humidity with Super Xenon Weather Meter SX75 (product name) manufactured by Suga Test Instruments Co., Ltd., and the maximal absorption value before and after this irradiation was measured, and the light resistance was calculated according to the following expression.

[Light resistance (%)]=([maximal absorption value after light irradiation for 200 hours]/[maximal absorption value before light irradiation])×100

The results are shown in Table 3.

<Evaluation of Physical Properties of Gas Barrier Layer>

The degree of crystallinity, oxygen permeability, and thickness of the gas barrier layer were evaluated according to the following methods. The results are shown in Table 3.

(Degree of Crystallinity)

The gas barrier layer was peeled off by 2 to 3 mg from the laminate produced as described above, and the temperature was raised at 10° C./min in the range of 20° C. to 260° C. using DSC7000X (product name) manufactured by Hitachi High-Tech Science Co., Ltd, and heat of fusion 1 was measured.

The degree of crystallinity of the gas barrier layer was calculated based on the method described in J. Appl. Pol. Sci., 81, 762 (2001). Specifically, the degree of crystallinity was calculated according to the following expression using the above-described heat of fusion 1 and the heat of fusion 2 of the perfect crystal described in J. Appl. Pol. Sci., 81, 762 (2001).

[Degree of crystallinity (%)]=([heat of fusion 1]/[heat of fusion 2])−100

(Oxygen Permeability)

A light resistance evaluation film was produced in the same manner, except that in the above-described production of the light resistance evaluation film, the wavelength selective absorption layer was not subjected to corona treatment, and the base material 1 corresponding to the base material 2 and the wavelength selective absorption layer were peeled off, thereby preparing an oxygen permeability evaluation film obtained by laminating a TAC film containing a UV absorbing agent, a pressure sensitive adhesive 1, and a gas barrier layer in this order to produce. In addition, for Nos. Lc101 to Lc111, the TAC film containing a UV absorbing agent used in the production of the light resistance evaluation film was used as the oxygen permeability evaluation film.

Using OX-TRAN 2/21 (product name) manufactured by MOCON as an oxygen permeability determination device, the oxygen permeability of the oxygen permeability evaluation film was measured by an isobaric method (JIS K 7126-2) under the condition of 25° C., relative humidity 50%, oxygen partial pressure 1 atm, and measurement area 50 $cm^2$.

In this test, the difference in oxygen permeability near 600 $cc/m^2$·day·atm, is considered to be within the error range due to the variation in the measurement test.

(Thickness)

A cross-sectional image of the laminate was taken using a field emission scanning electron microscope S-4800 (product name) manufactured by Hitachi High-Technologies Corporation, and the thickness was read.

TABLE 1

| Base material-attached wavelength selective absorption layer | Dye A Kind | Dye A $\lambda_{max}$ | Dye A Formulation amount | Dye B Kind | Dye B $\lambda_{max}$ | Dye B Formulation amount | Dye C Kind | Dye C $\lambda_{max}$ | Dye C Formulation amount | Dye D Kind | Dye D $\lambda_{max}$ | Dye D Formulation amount |
|---|---|---|---|---|---|---|---|---|---|---|---|---|
| 1 | E-14 | 427 | 1.06 | — | — | — | — | — | — | D-36 | 752 | 2.29 |
| 2 | E-14 | 427 | 1.06 | A-52 | 508 | 0.85 | C-73 | 593 | 1.57 | — | — | — |
| 3 | E-14 | 427 | 1.06 | A-52 | 508 | 0.85 | C-73 | 593 | 1.57 | D-36 | 752 | 2.29 |
| 4a1 | E-14 | 427 | 1.06 | — | — | — | — | — | — | — | — | — |
| 4b | — | — | — | A-52 | 508 | 0.85 | — | — | — | — | — | — |
| 4c | — | — | — | — | — | — | C-73 | 593 | 1.57 | — | — | — |
| 4d1 | — | — | — | — | — | — | — | — | — | D-36 | 752 | 2.29 |
| 4a2 | E-27 | 409 | 0.97 | — | — | — | — | — | — | — | — | — |
| 4d2 | — | — | — | — | — | — | — | — | — | F-30 | 698 | 2.55 |
| 5 | E-27 | 409 | 0.97 | A-52 | 508 | 0.85 | C-73 | 593 | 1.57 | — | — | — |
| 6 | E-27 | 409 | 0.97 | A-52 | 508 | 0.85 | C-73 | 593 | 1.57 | F-30 | 698 | 2.55 |

The formulation amount of the dye is an formulation amount (in terms of parts by mass) with respect to the formulation amount (in terms of parts by mass) of each component described in the wavelength selective absorption layer forming liquid 1. The notation of "—" indicates that the dye is not contained.

TABLE 2

| No. | Gas barrier layer forming liquid: Resin Kind | Resin Formulation amount | Pure water Formulation amount | 2-propanol Formulation amount | Methyl acetate Formulation amount | Acetonitrile Formulation amount | Methanol Formulation amount | Base material-attached wavelength selective absorption layer | Thickness of gas barrier layer [μm] |
|---|---|---|---|---|---|---|---|---|---|
| L101 | PVA105 | 4.0 | 96.0 | 0 | 0 | 0 | 0 | 1 | 1.1 |
| L102 | PVA105 | 4.0 | 96.0 | 0 | 0 | 0 | 0 | 1 | 1.6 |
| L103 | AQ-4104 | 4.0 | 88.8 | 7.2 | 0 | 0 | 0 | 1 | 1.6 |
| L104 | PVA105 | 4.0 | 96.0 | 0 | 0 | 0 | 0 | 1 | 2.5 |
| L105 | PVA105 | 4.0 | 96.0 | 0 | 0 | 0 | 0 | 2 | 1.6 |
| L106 | PVA105 | 4.0 | 96.0 | 0 | 0 | 0 | 0 | 3 | 1.6 |
| L107 | PVA105 | 4.0 | 96.0 | 0 | 0 | 0 | 0 | 4a1 | 1.6 |
| L108 | PVA105 | 4.0 | 96.0 | 0 | 0 | 0 | 0 | 4b | 1.6 |
| L109 | PVA105 | 4.0 | 96.0 | 0 | 0 | 0 | 0 | 4c | 1.6 |
| L110 | PVA105 | 4.0 | 96.0 | 0 | 0 | 0 | 0 | 4d1 | 1.6 |
| L111 | AQ-4104 | 4.0 | 88.8 | 7.2 | 0 | 0 | 0 | 4a2 | 1.6 |
| L112 | AQ-4104 | 4.0 | 88.8 | 7.2 | 0 | 0 | 0 | 4b | 1.6 |
| L113 | AQ-4104 | 4.0 | 88.8 | 7.2 | 0 | 0 | 0 | 4c | 1.6 |
| L114 | AQ-4104 | 4.0 | 88.8 | 7.2 | 0 | 0 | 0 | 4d2 | 1.6 |
| L115 | AQ-4104 | 4.0 | 88.8 | 7.2 | 0 | 0 | 0 | 5 | 1.6 |
| L116 | AQ-4104 | 4.0 | 88.8 | 7.2 | 0 | 0 | 0 | 6 | 1.6 |

The formulation amount of each component in the gas barrier forming liquid is described in terms of parts by mass in a case where the total amount of components are set to 100 parts by mass.

TABLE 2-1

| No. | Gas barrier layer forming liquid: Resin Kind | Resin Formulation amount | Pure water Formulation amount | 2-propanol Formulation amount | Methyl acetate Formulation amount | Acetonitrile Formulation amount | Methanol Formulation amount | Base material-attached wavelength selective absorption layer | Thickness of gas barrier layer [μm] |
|---|---|---|---|---|---|---|---|---|---|
| Lc001 | PVA403 | 4.0 | 96.0 | 0 | 0 | 0 | 0 | 1 | 1.1 |
| Lc002 | PVA403 | 4.0 | 96.0 | 0 | 0 | 0 | 0 | 1 | 1.6 |
| Lc003 | PVA403 | 8.0 | 92.0 | 0 | 0 | 0 | 0 | 1 | 3.7 |
| Lc004 | PVA105 | 4.0 | 96.0 | 0 | 0 | 0 | 0 | 1 | 0.1 |

TABLE 2-1-continued

| | Gas barrier layer forming liquid | | | | | | | Base material-attached | Thickness |
|---|---|---|---|---|---|---|---|---|---|
| | Resin | | Pure water | 2-propanol | Methyl acetate | Acetonitrile | Methanol | wavelength selective | of gas barrier |
| No. | Kind | Formulation amount | Formulation amount | Formulation amount | Formulation amount | Formulation amount | Formulation amount | absorption layer | layer [μm] |
| Lc005 | PVA117H | 10.0 | 90.0 | 0 | 0 | 0 | 0 | 1 | 40 |
| Lc006 | Estyrene AS-70 | 3.8 | 0 | 0 | 48.1 | 43.3 | 4.8 | 1 | 1.1 |
| Lc007 | Estyrene AS-70 | 3.8 | 0 | 0 | 48.1 | 43.3 | 4.8 | 1 | 1.6 |
| Lc008 | Estyrene AS-70 | 7.4 | 0 | 0 | 46.3 | 41.7 | 4.6 | 1 | 3.7 |
| Lc101 | — | — | — | — | — | — | — | 1 | — |
| Lc102 | — | — | — | — | — | — | — | 2 | — |
| Lc103 | — | — | — | — | — | — | — | 3 | — |
| Lc104 | — | — | — | — | — | — | — | 4a1 | — |
| Lc105 | — | — | — | — | — | — | — | 4b | — |
| Lc106 | — | — | — | — | — | — | — | 4c | — |
| Lc107 | — | — | — | — | — | — | — | 4d1 | — |
| Lc108 | — | — | — | — | — | — | — | 4a2 | — |
| Lc109 | — | — | — | — | — | — | — | 4d2 | — |
| Lc110 | — | — | — | — | — | — | — | 5 | — |
| Lc111 | — | — | — | — | — | — | — | 6 | — |

The formulation amount of each component in the gas barrier forming liquid is described in terms of parts by mass in a case where the total amount of components are set to 100 parts by mass. The notation of "—" in Nos. Lc101 to Lc111 indicates that the gas barrier layer is not included.

TABLE 3

| | Gas barrier layer | | | | Light resistance | | | | | |
|---|---|---|---|---|---|---|---|---|---|---|
| | | Thickness | Degree of | Oxygen permeability of gas barrier layer | Dye A | | Dye B | Dye C | Dye D | |
| No. | Resin | [μm] | crystallinity | [cc/$m^2$ · day · atm] | E-14 | E-27 | A-52 | C-73 | D-36 | F-30 |
| L101 | PVA105 | 1.1 | 49% | 0.5 | 83% | — | — | — | 91% | — |
| L102 | PVA105 | 1.6 | 49% | 0.5 | 84% | — | — | — | 91% | — |
| L103 | AQ-4104 | 1.6 | 53% | 0.4 | 86% | — | — | — | 91% | — |
| L104 | PVA105 | 2.5 | 50% | 0.3 | 78% | — | — | — | 87% | — |
| L105 | PVA105 | 1.6 | 49% | 0.6 | 90% | — | 93% | 92% | — | — |
| L106 | PVA105 | 1.6 | 49% | 0.6 | 86% | — | 91% | 87% | 91% | — |
| L107 | PVA105 | 1.6 | 49% | 0.6 | 86% | — | — | — | — | — |
| L108 | PVA105 | 1.6 | 49% | 0.6 | — | — | 96% | — | — | — |
| L109 | PVA105 | 1.6 | 49% | 0.6 | — | — | — | 92% | — | — |
| L110 | PVA105 | 1.6 | 49% | 0.6 | — | — | — | — | 88% | — |
| L111 | AQ-4104 | 1.6 | 53% | 0.4 | — | 94% | — | — | — | — |
| L112 | AQ-4104 | 1.6 | 53% | 0.4 | — | — | 95% | — | — | — |
| L113 | AQ-4104 | 1.6 | 53% | 0.4 | — | — | — | 92% | — | — |
| L114 | AQ-4104 | 1.6 | 53% | 0.4 | — | — | — | — | — | 95% |
| L115 | AQ-4104 | 1.6 | 53% | 0.4 | — | 96% | 95% | 93% | — | — |
| L116 | AQ4104 | 1.6 | 53% | 0.4 | — | 96% | 95% | 93% | — | 94% |
| Lc001 | PVA403 | 1.1 | 21% | 157 | 48% | — | — | — | 82% | — |
| Lc002 | PVA403 | 1.6 | 22% | 123 | 51% | — | — | — | 82% | — |
| Lc003 | PVA403 | 3.7 | 23% | 68 | 55% | — | — | — | 82% | — |
| Lc004 | PVA105 | 0.1 | 49% | 330 | 55% | — | — | — | 85% | — |
| Lc005 | PVA117H | 40 | 40% | 0.05 | 75% | — | — | — | 86% | — |
| Lc006 | Estyrene AS-70 | 1.1 | 0% | 640 | 55% | — | — | — | 80% | — |
| Lc007 | Estyrene AS-70 | 1.6 | 0% | 640 | 56% | — | — | — | 84% | — |
| Lc008 | Estyrene AS-70 | 3.7 | 0% | 640 | 61% | — | — | — | 87% | — |
| Lc101 | | 0 | — | 640 | 53% | — | — | — | 83% | — |
| Lc102 | | 0 | — | 640 | 76% | — | 82% | 70% | — | — |
| Lc103 | | 0 | — | 640 | 28% | — | 48% | 20% | 53% | — |
| Lc104 | | 0 | — | 640 | 77% | — | — | — | — | — |
| Lc105 | | 0 | — | 640 | — | — | 92% | — | — | — |
| Lc106 | | 0 | — | 640 | — | — | — | 71% | — | — |
| Lc107 | | 0 | — | 640 | — | — | — | — | 80% | — |

TABLE 3-continued

| | | Gas barrier layer | | | Light resistance | | | | | |
|---|---|---|---|---|---|---|---|---|---|---|
| | | Thickness | Degree of | Oxygen permeability of gas barrier layer | Dye A | | Dye B | Dye C | Dye D | |
| No. | Resin | [μm] | crystallinity | [cc/m$^2$ · day · atm] | E-14 | E-27 | A-52 | C-73 | D-36 | F-30 |
| Lc108 | | 0 | — | 640 | — | 90% | — | — | — | — |
| Lc109 | | 0 | — | 640 | — | — | — | — | — | 69% |
| Lc110 | | 0 | — | 640 | — | 79% | 84% | 71% | — | — |
| Lc111 | | 0 | — | 640 | — | 67% | 71% | 58% | — | 60% |

The notation of "—" in the column of the light resistance evaluation indicates that the corresponding dye is not contained. In the laminate Nos. Lc101 to Lc111, the notation of "—" in the column of Degree of crystallinity indicates the measurement is not carried out since they do not include the gas barrier layer. In the laminate Nos. Lc101 to Lc111, the oxygen permeability indicates the oxygen permeability of the TAC film containing a UV absorber.

(Note in Table 3)

The unit of oxygen permeability is cc/m$^2$·day·atm.

As shown in Table 3, the laminate Nos. Lc006 to Lc008 of the comparative examples having a gas barrier layer containing an amorphous resin had little or a small effect of improving the light resistance with respect to the laminate No. Lc101 of the reference example having no gas barrier layer, and they were inferior in light resistance. In addition, the laminate Nos. Lc001 to Lc004 are gas barrier layers containing a crystalline resin, and although the laminates are equipped with a gas barrier layer having a specific film thickness specified in the present invention, the oxygen permeability of the gas barrier layer is higher than the specific range specified in the present invention. The laminate Nos. Lc001 to Lc004 of the comparative examples had almost no effect of improving the light resistance with respect to the laminate No. Lc101 of the reference example having no gas barrier layer, and they were inferior in light resistance.

In addition, the laminate No. Lc005 includes a gas barrier layer containing a crystalline resin, has the oxygen permeability of the gas barrier layer within the specific range specified in the present invention, but has the film thickness of the gas barrier layer of 40 μm, which is thicker than the film thickness of a specific range specified in the present invention. This laminate No. Lc005 of the comparative example had no difference in the effect of improving the light resistance from the laminate No. L104 that is used in the present invention in which the film thickness of the gas barrier layer was 2.5 μm. Even in a case where the gas barrier layer contains a crystalline resin and has a specific range of oxygen permeability, in a case where the film thickness of the gas barrier layer is thicker than the specific range specified in the present invention, the gas barrier layer should be made thicker. It was found that even in a case where the oxygen permeability of the gas barrier layer could be reduced, the desired light resistance improving effect could not be obtained.

On the other hand, it was found that the laminate Nos. L101 to L116 that are used in the present invention had a large effect of improving the light resistance with respect to the laminate Nos. Lc101 to Lc111 of the reference example having no gas barrier layer, and had excellent light resistance. Specifically, it was found that the effect of improving light resistance can be obtained at an excellent level, by individually comparing No. Lc101 of the reference example with Nos. L101 to 104 for the laminate containing the two dyes A and B; by comparing No. Lc102 of the reference example with No. L105, or by comparing No. Lc110 of the reference example with No. L115, for the laminate containing the three dyes A to C; and by comparing No. Lc103 of the reference example with No. L106 or No. Lc111 of the reference example with No. L116 for the laminate containing the four dyes A to D. Further, regarding the laminates containing any one of the dyes A to D, it was found to have entirely an excellent effect of improving light resistance by individually comparing the No. Lc104 of the reference example with No. L107. No. Lc105 of the reference example with No. L108. No. Lc106 of the reference example with No. L109, No. Lc107 of the reference example with No. L110, No. Lc108 of the reference example with No. L111, and No. Lc109 of the reference example with No. L114.

As described above, since the laminate that is used in the present invention has excellent light resistance, the display device according to the embodiment of the present invention which is obtained by applying this laminate to a display device having a wavelength conversion material can also exhibit excellent light resistance.

Reference Example: Wavelength Selective Absorption Filter Containing Four Dyes A to D A self-luminous display device equipped with a wavelength selective absorption filter (a wavelength selective absorption layer) containing four kinds of dyes A to D each having a main absorption wavelength band in a different wavelength range achieves both suppression of external light reflection and suppression of brightness decrease. In addition, the fact that the original tint of the display image can be sufficiently expressed will be described in detail below.

[Production of Wavelength Selective Absorption Filter]

The materials used in the production of the wavelength selective absorption filter are Shown Below.

<Matrix Resin>

(Resin 8)

A polystyrene resin (PSJ-polystyrene GPPS SGP-10 (product name), Tg: 100° C., fd: 0.56) manufactured by PS Japan Corporation was heated at 110° C., allowed to cool to room temperature (23° C.), and used as a resin 8.

(Resin 2)

A polyphenylene ether resin (manufactured by Asahi Kasei Corporation, Zylon S201A (product name), poly(2,6-dimethyl-1,4-phenylene oxide), Tg: 210° C.)

(Extensible Resin Component 1)

ASAFLEX 810 (product name, manufactured by Asahi Kasei Corporation, a styrene-butadiene resin)

(Peelability Control Resin Component 1)

Byron 550 (product name, manufactured by Toyobo Co., Ltd., a polyester-based additive)

<Dye>

C-80

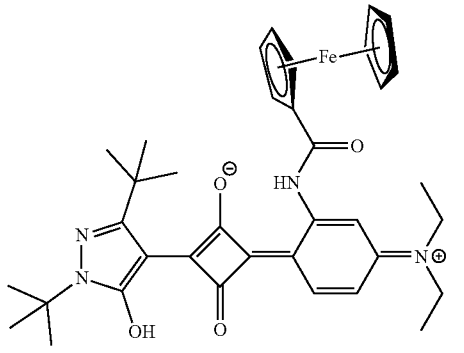

$\lambda_{max}$ 594nm 7-21

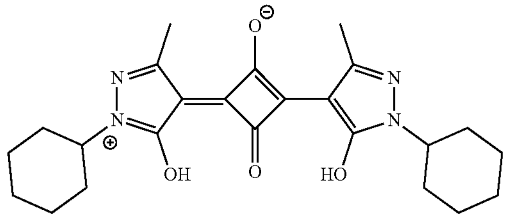

$\lambda_{max}$ 495nm

E-13

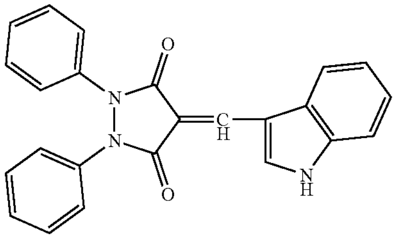

$\lambda_{max}$ 426nm

D-35

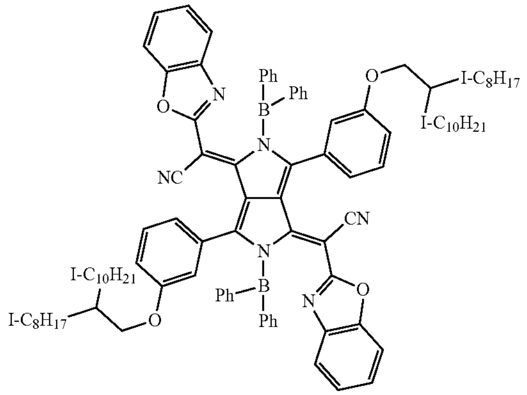

$\lambda_{max}$ 742nm

FDG007: product name, manufactured by Yamada Chemical Co., Ltd., tetraazaporphyrin-based coloring agent, $\lambda_{max}$: 594 nm The following dyes that are used in Example 3 of JP2017-203810A.

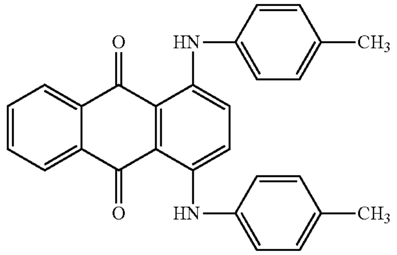

C. 1. Solvent Green 3
$\lambda_{max}$ $645_{nm}$

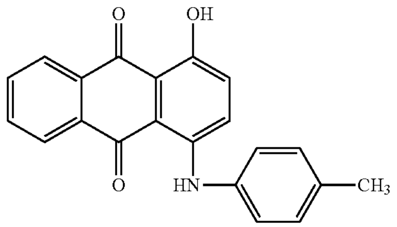

C. 1. Solvent Violet 13
$\lambda_{max}$ $561_{nm}$

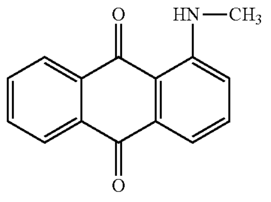

C. 1. Solvent Red 111
$\lambda_{max}$ $507_{nm}$

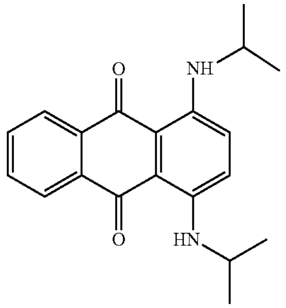

C. 1. Solvent Blue 36
$\lambda_{max}$ $646_{nm}$

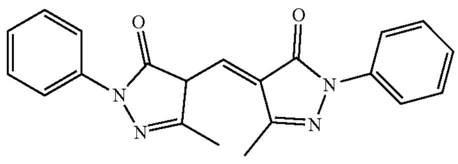

C. 1. Solvent Yellow 93
$\lambda_{max}$ $400_{nm}$

It is noted that $\lambda_{max}$ described in the above-described section of <Dye> means the maximal absorption wavelength at which the highest absorbance is exhibited, which is measured under the following conditions.

That is, the above dye was dissolved in chloroform to prepare a measurement solution having a concentration of $1\times10^{-6}$ mol/L. For the measurement solution, the maximal absorption wavelength $\lambda_{max}$ at 23° C. was measured using a cell having an optical path length of 10 mm and a spectrophotometer UV-1800PC (manufactured by Shimadzu Corporation).

<Additive>

(Antifading Agent 1)

An exemplary compound IV-8 in the above antifading agent (Leveling Agent 1)

A polymer surfactant composed of the following constitutional components was used as a leveling agent 1. In the following structural formulae, the proportion of each constitutional component is in terms of a molar ratio, and t-Bu means a tert-butyl group.

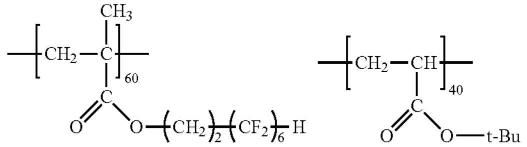

(Base Material 1)

A polyethylene terephthalate film, LUMIRROR XD-510P (product name, film thickness: 50 μm, manufactured by Toray Industries, Inc.) was used as a base material 1.

<Production of Base Material-Attached Wavelength Selective Absorption Filter No. 101>

(1) Preparation of Toluene Solution of Extensible Resin Component 1

2.75 parts by mass of the extensible resin component 1 was dissolved in 89.0 parts by mass of toluene. Next, 8.26 parts by mass of KYOWADO 700 SEN-S (product name, manufactured by Kyowa Chemical Industry Co., Ltd.) was added to the obtained solution, and the mixture was stirred at room temperature (23° C.) for 1 hour, and then subjected to filtration using a metal sintered filter (product name: Pall filter PMF, media code: FH025, manufactured by Pall) with an absolute filtration precision of 2.5 μm to remove KYOWADO 700 SEN-S, thereby preparing a toluene solution of an extensible resin component 1 from which a base component was removed.

(2) Preparation of Resin Solution

Each component was mixed according to the composition shown below to prepare a wavelength selective absorption filter forming liquid (a composition) Ba-1.

| Composition of wavelength selective absorption filter forming liquid Ba-1 | |
|---|---|
| Resin 8 | 59.2 parts by mass |
| Resin 2 | 17.5 parts by mass |
| Toluene solution of extensible resin component 1 prepared above | 667.3 parts by mass |
| Peelability control resin component 1 | 0.20 parts by mass |
| Leveling agent 1 | 0.16 parts by mass |
| Coloring agent 7-21 | 0.50 parts by mass |
| Dye C-80 | 0.44 parts by mass |
| Coloring agent E-13 | 0.86 parts by mass |
| Dye D-35 | 1.12 parts by mass |
| Antifading agent 1 | 12.4 parts by mass |
| Toluene (a solvent) | 872.7 parts by mass |
| Cyclohexanone (a solvent) | 380.0 parts by mass |

Subsequently, the obtained wavelength selective absorption filter forming liquid Ba-1 was filtered using a filter paper (#63, manufactured by Toyo Filter Paper Co., Ltd.) having an absolute filtration precision of 10 μm, and further subjected to filtration using a metal sintered filter (product name: Pall filter PMF, media code: FH025, manufactured by Pall) with an absolute filtration precision of 2.5 μm.

(3) Production of Base Material-Attached Wavelength Selective Absorption Filter

The above-described wavelength selective absorption filter forming liquid Ba-1 after the filtration treatment was applied onto the base material 1 by using a bar coater so that the film thickness after drying was 2.5 μm, and dried at 120° C. to produce a base material-attached wavelength selective absorption filter No. 101.

<Production of Base Material-Attached Wavelength Selective Absorption Filter Nos. 102 to 108 and c11 to c15>

The base material-attached wavelength selective absorption filter Nos. 102 to 108 and c11 to c15 were produced in the same manner as in the production of the wavelength selective absorption filter No. 101, except that the kind and the formulation amount of the dye were changed to the contents shown in Table 4.

Here, Nos. 101 to 108 are wavelength selective absorption filters satisfying Relational Expression (1) to (VI) described above, and Nos. c11 to c15 are the wavelength selective absorption filters for comparison, which do not satisfy Relational Expression (I) to (VI) described above.

<Maximal Absorption Value of Wavelength Selective Absorption Filter>

Using a UV3150 spectrophotometer (product name) manufactured by Shimadzu Corporation, the absorbance of a base material-attached wavelength selective absorption filter in the wavelength range of 380 nm to 800 nm was measured every 1 nm. An absorbance difference $Ab_x(\lambda)-Ab_0(\lambda)$ between an absorbance $Ab_x(\lambda)$ at each wavelength λ nm of the base material-attached wavelength selective absorption filter containing no dyes and an absorbance $Ab_0(\lambda)$ of the base material-attached wavelength selective absorption filter (that is, the wavelength selective absorption filter No. c11) was calculated, and the maximum value of the absorbance difference was defined as the maximal absorption value.

<Simulation of Brightness, Reflectivity, and Tint>

For the self-luminous display device equipped with the wavelength selective absorption filter produced as described above, the external light reflection was simulated, and the brightness, reflectivity, and tint (a and b) were calculated.

(1) Configuration of Self-Luminous Display Device

Figure 2:
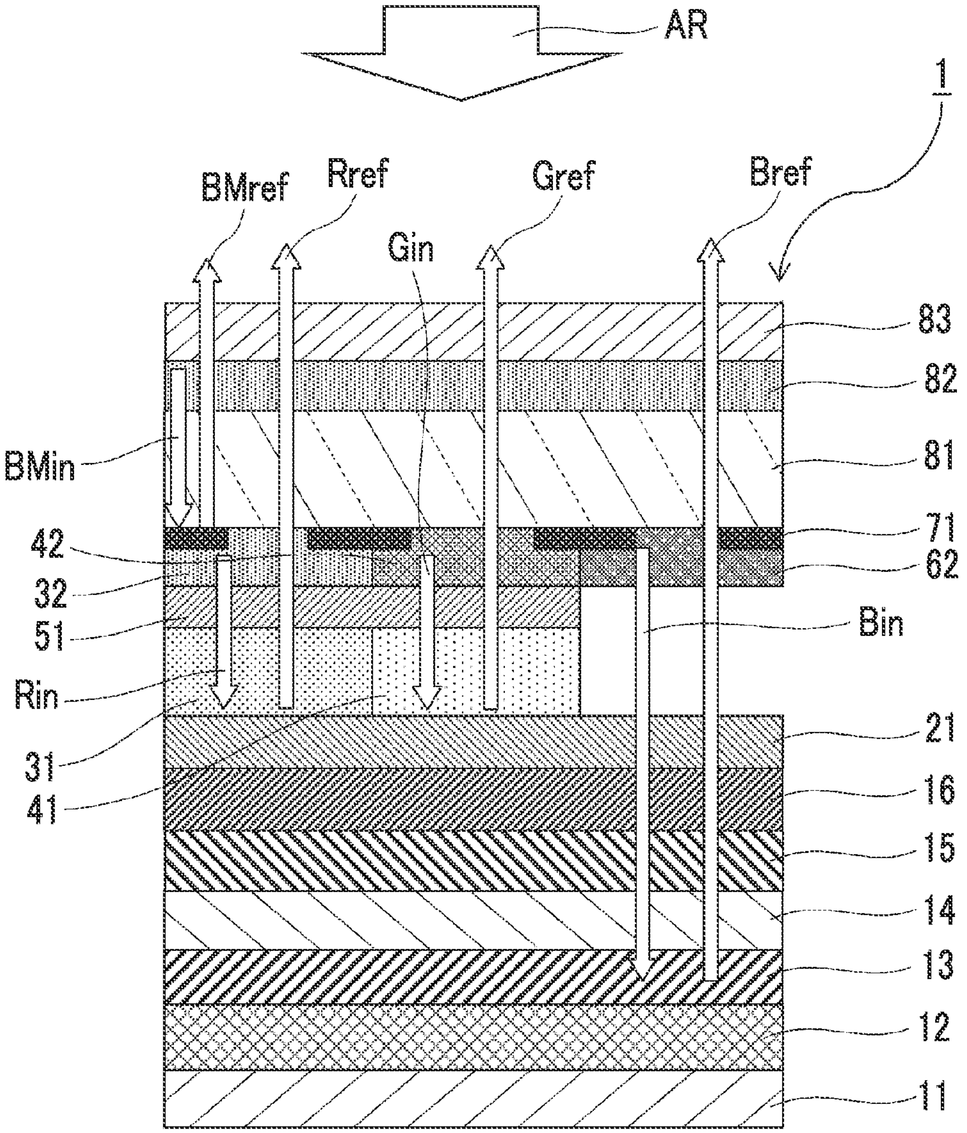
FIG. 2 is a vertical cross-sectional view schematically showing a configuration of a self-luminous display device or OLED display device assumed for simulating external light reflection in Reference Example.

As the self-luminous display device for carrying out the simulation, a device for displaying an image by a color filter including a blue light emitting element and quantum dots (QDs) illustrated in FIG. 2 was assumed.

That is, the self-luminous display device 1 illustrated in FIG. 2 includes a blue light emitting element, an RG selective reflective layer 21, a color filter (CF) including quantum dots (QD), a black matrix 71, and a wavelength selective absorption filter 82 produced in the above, on a TFT substrate in order. The wavelength selective absorption filter 82 is located on the external light side (the visible side).

The TFT substrate has a configuration in which a TFT 12 is provided on a substrate 11. The blue light emitting element has a configuration in which an anode 13, a blue light emitting layer 14, and a cathode 15 are laminated in order from the TFT substrate side. The blue light emitting layer 14 means a layer sandwiched between the anode 13 and the cathode 15 among the layers constituting the blue light emitting element, and specifically, it includes an electron injection layer, a blue light emitting layer, and a hole transport layer. In addition to these layers, it is possible to include, without particular limitation, a layer which is included between the anode and the cathode and which constitutes a generally used blue light emitting element. A barrier film 16 is arranged between the blue light emitting element and the RG selective reflective layer 21.

A color filter containing quantum dots includes quantum dots as red and green light emitting parts. The color filter corresponding to red has a configuration in which a layer 31 containing the red quantum dots and a light diffusing body, a B selective reflective layer 51, and a red color filter 32 are arranged in this order on RG selective reflective layer 21. The color filter corresponding to green has a configuration in which a layer 41 containing a green quantum dot and a light diffusing body, a B selective reflective layer 51, and a green color filter 42 are arranged in this order on the RG selective reflective layer 21. The layer 31 containing the red quantum dots and the light diffusing body is a color conversion unit that converts light in the blue wavelength range into light in the red wavelength range, and the layer 41 containing the green quantum dots and the light diffusing body is a color conversion unit that converts light in the wavelength range of blue into light in the green wavelength range. The color filter corresponding to blue has a configuration in which the blue color filter 62 is arranged on the RG selective reflective layer 21.

A glass 81 is provided between the color filter and the black matrix 71 containing the quantum dots and the wavelength selective absorption filter 82, and a low reflection surface film 83 is provided on the wavelength selective absorption filter 82.

(2) Simulation Conditions

In the self-luminous display device 1 illustrated in FIG. 2, the reflectivity, transmission spectrum, and reflection spectrum of each constitutional member were defined as follows in the simulation of the reflectivity and the reflected tint related to the external light AR irradiation.

(i) The red-green selective reflective layer is assumed to have a reflectivity of 0% in a region having a wavelength of less than 500 nm and a reflectivity of 100% having a wavelength of 500 nm or more and 800 nm or less.

(ii) The transmission spectrum of the color filter was calculated by measuring the panel spectrum and the backlight spectrum and calculating the panel spectrum/backlight spectrum.

(iii) As the transmission spectrum of the wavelength selective absorption filter, the results of measuring the transmission spectra of the base material-attached wavelength selective absorption filter produced as described above and the base material used in the above production were used.

(iv) As the reflectivity of the black matrix, the reflection spectrum of carbon black was used.

(v) As the reflectivity of the light emitting element substrate, the reflection spectrum of the substrate measured by disassembling a commercially available TV OLED55B7P (product name) manufactured by LG Electronics and peeling off the circularly polarizing plate was used.

(vi) The area ratio between the blue pixel, the green pixel, the red pixel, and the black matrix were calculated assuming that the area rates of the blue pixel, the green pixel, and the red pixel were each 17%, and the area rate of the black matrix was 49%.

In the above description, the transmission spectrum and the reflection spectrum were measured using a UV3150 spectrophotometer (product name) manufactured by Shimadzu Corporation.

(3) Calculation of Reflectivity and Reflected Tint

The reflectivity and the reflected tint were calculated by calculating a reflection spectrum of each of the blue pixel, the green pixel, the red pixel, and the black matrix, and multiplying it by the area rate thereof. Specifically, it is as follows.

First, the reflection spectra of the blue pixel, the green pixel, the red pixel, and the black matrix were denoted as $R_{blue}$, $R_{green}$, $R_{red}$, and $R_{black}$, respectively, and calculated based on the following expression.

As the reflection $B_{ref}$ of the external light in the blue pixel, the reflection at the anode 13 in the blue light emitting element is defined as the external light reflection $G_{ref}$ in the green pixel and the external light reflection $R_{ref}$ in the red pixel is assumed to be reflected by the RG selective reflective layer 21 (see FIG. 2).

In the following expressions, the transmission spectrum of the wavelength selective absorption filter is denoted as $T_{dye}$, the transmission spectra of color filters are respectively denoted as $CF_{blue}$, $CF_{green}$, and $CF_{red}$, the reflectivity of the green-red selective reflective layer is denoted as $R_{sel}$, the reflectivity of the OLED substrate is denoted as $R_{sub}$, and the reflectivity of the black matrix is denoted as $R_{BM}$.

$$R_{blue}=(T_{dye})^2\times CF_{blue}\times R_{sub}$$

$$R_{green}=(T_{dye})^2\times CF_{green}\times R_{sel}$$

$$R_{red}=(T_{dye})^2\times CF_{red}\times R_{sel}$$

$$R_{black}=(T_{dye})^2\times R_{BM}$$

Next, the area rates of the blue pixel, green pixel, red pixel, and black matrix were denoted as $A_{blue}$, $A_{green}$, $A_{red}$, and $A_{black}$, respectively, and the reflection spectrum of the self-luminous display device was calculated according to the following expression.

$$\text{Reflection spectrum of self-luminous display device}=R_{blue}\times A_{blue}+R_{green}\times A_{green}+R_{red}\times A_{red}+R_{black}\times A_{black}$$

Based on the reflection spectrum of the self-luminous display device calculated as described above, the reflectivity (in terms of the luminous efficiency correction) and a* and b* were calculated.

(4) Calculation of Relative Brightness

The relative brightness in a case where the wavelength selective absorption filter produced as described above was used was calculated as follows.

The emission spectrum S (λ) of the display was calculated using each of the blue, green, and red emission spectra shown below.

In a case where the blue emission spectrum of a light emitting element A was used, the maximum luminescence intensity of the green emission spectrum was set to be 0.92, and the maximum luminescence intensity of the red emission spectrum was set to be 0.92 in a case where the maximum luminescence intensity of the emission spectrum of the light emitting element A was 1.00, and then the spectra were added.

In addition, in a case where the blue emission spectrum of the light emitting element B was used, the maximum luminescence intensity of the green emission spectrum was set to be 0.97, and the maximum luminescence intensity of the red emission spectrum was set to be 0.89 in a case where the maximum luminescence intensity of the emission spectrum of a light emitting element B was 1.00, and then the spectra were added.

Blue:

The light emitting element A: An emission spectrum in blue display of Magnolia (product name) manufactured by SiliconCore Technology using a micro LED The light emitting element B: An emission spectrum of the quantum dot disclosed in FIG. 4 in JP2019-119831A Green: Emission spectrum in green display of a commercially available monitor (BenQ, product name: SW2700PT) that converts blue LED light to green by quantum dots.

Red: An emission spectrum in red display of a commercially available monitor (manufactured by BenQ Corporation, product name: SW2700PT) in which blue LED light is converted to red by quantum dots It is noted that in the present invention, the blue LED means a blue inorganic LED and thus is different from the blue OLED.

Further, the transmission spectrum of the wavelength selective absorption filter was denoted as T (λ).

The brightness in a case where the wavelength selective absorption filter was not used was calculated by carrying out luminous efficiency correction on the spectrum S (λ), and this brightness was set to 100. The brightness of the spectrum S (λ)×T (λ) in a case where the wavelength selective absorption filter was used was calculated as the relative brightness with respect to the brightness in a case where the above wavelength selective absorption filter was not used.

In the evaluation column of "Brightness decrease" in Table 4, the evaluation results in a case where the blue emission spectrum of the light emitting element A was used in the calculation of the emission spectrum S (λ) are shown in the column of "Light emitting element A", and the evaluation results in a case where the blue emission spectrum of the light emitting element B was used in the calculation thereof are shown in the column of "Light emitting element B", respectively.

<Evaluation of Effect of Suppressing Brightness Decrease>

Using the relative brightness values obtained in the above simulation, the effect of suppressing the brightness decrease was evaluated based on the following evaluation standards. In this test, "A" and "B" indicate the pass level.

(Evaluation Standard)

A: 80<relative brightness≤100

B: 60<relative brightness≤80

C: 0≤relative brightness≤60

<Evaluation of Effect of Suppressing External Light Reflection>

Using the reflectivity value obtained in the above simulation, the reflectivity reduction rate was calculated according to the following expression, and the effect of suppressing external light reflection was evaluated based on the following evaluation standards. In this test, "A" and "B" indicate the pass level.

$$\text{Reflectivity reduction rate}=(R_0-R_1)/R_0\times 100\%$$

$R_1$: Reflectivity in a case of using a wavelength selective absorption filter containing a dye $R_0$: Reflectivity of No. c11 in a case where a base material-attached wavelength selective absorption filter that does not contain dye is used (Evaluation Standard)

A: 50%<reflectivity reduction rate≤80%

B: 20%<reflectivity reduction rate≤50%

C: 0%<reflectivity reduction rate≤20%

<Evaluation of Tint>

Using the values of a* and b* calculated in the above simulation, the color difference was calculated according to the following expression.

$$(\text{Color difference})=[(a^*_1-a^*_0)^2+(b^*_1-b^*_0)^2]^{1/2}$$

The meaning of each reference numeral in the above expression is as follows.

$a^*_1$: a* in a case of using a base material-attached wavelength selective absorption filter containing a dye $a^*_0$: a* of No. c11 in a case of using a base material-attached wavelength selective absorption filter that does not contain dye $b^*_1$: b* in a case of using a base material-attached wavelength selective absorption filter containing a dye $b^*_0$: b* of No. c11 in a case of using a base material-attached wavelength selective absorption filter that does not contain dye The color difference calculated from the above expression is 16.0 or less in terms of the practical level, 15.0 or less is a preferred level, and 5.0 or less is a more preferred level.

The results are shown in Table 4.

TABLE 4-1

| | Dye A | | | | | | Dye B | | |
|---|---|---|---|---|---|---|---|---|---|
| No. | Kind | $\lambda_{max}$ | Formulation amount | Kind | $\lambda_{max}$ | Formulation amount | Kind | $\lambda_{max}$ | Formulation amount |
| 101 | E-13 | 425 | 0.89 | — | — | — | 7-21 | 500 | 0.52 |
| 102 | E-13 | 425 | 2.87 | — | — | — | 7-21 | 500 | 1.03 |
| 103 | E-13 | 425 | 4.85 | — | — | — | 7-21 | 500 | 2.06 |
| 104 | E-13 | 425 | 0.44 | — | — | — | R111 | 503 | 2.78 |
| 106 | E-13 | 425 | 2.87 | — | — | — | 7-21 | 500 | 1.03 |
| 107 | E-13 | 425 | 4.85 | — | — | — | 7-21 | 500 | 2.06 |
| 108 | E-13 | 425 | 1.32 | — | — | — | R111 | 503 | 3.17 |
| c11 | — | — | — | — | — | — | — | — | — |
| c12 | Y93 | 400 | 0.84 | G3 | 409 | 5.60 | R111 | 503 | 0.84 |
| c13 | Y93 | 400 | 0.42 | G3 | 409 | 2.80 | R111 | 503 | 0.42 |
| c14 | Y93 | 400 | 0.17 | G3 | 409 | 1.12 | R111 | 503 | 0.17 |
| c15 | — | — | — | — | — | — | 7-21 | 500 | 0.52 |

TABLE 4-1-continued

| | Dye C | | | | | | Dye D | | |
|---|---|---|---|---|---|---|---|---|---|
| No. | Kind | $\lambda_{max}$ | Formulation amount | Kind | $\lambda_{max}$ | Formulation amount | Kind | $\lambda_{max}$ | Formulation amount |
| 101 | C-80 | 599 | 0.46 | — | — | — | D-35 | 750 | 1.15 |
| 102 | C-80 | 599 | 0.92 | — | — | — | D-35 | 750 | 2.30 |
| 103 | C-80 | 599 | 1.53 | — | — | — | D-35 | 750 | 3.82 |
| 104 | C-80 | 599 | 0.23 | — | — | — | D-35 | 750 | 0.58 |
| 106 | FDG007 | 594 | 1.38 | — | — | — | D-35 | 750 | 2.30 |
| 107 | FDG007 | 594 | 2.30 | — | — | — | D-35 | 750 | 3.82 |
| 108 | FDG007 | 594 | 1.73 | — | — | — | D-35 | 750 | 1.74 |
| c11 | — | — | — | — | — | — | — | — | — |
| c12 | V13 | 582 | 2.25 | B36 | 599 | 1.45 | — | — | — |
| c13 | V13 | 582 | 1.12 | B36 | 599 | 0.72 | — | — | — |
| c14 | V13 | 582 | 0.45 | B36 | 599 | 0.29 | — | — | — |
| c15 | C-80 | 599 | 0.46 | — | — | — | — | — | — |

TABLE 4-2

| | Absorbance ratio | | | | | | Effect of | Brightness decrease | | |
|---|---|---|---|---|---|---|---|---|---|---|
| No. | Ab (450)/ Ab (430) | Ab (450)/ Ab (500) | Ab (540)/ Ab (500) | Ab (540)/ Ab (600) | Ab (630)/ Ab (600) | Ab (630)/ Ab (700) | suppressing external light reflection | Light emitting element A | Light emitting element B | Color difference |
| 101 | 0.48 | 0.41 | 0.13 | 0.12 | 0.12 | 0.62 | B | A | A | 1.7 |
| 102 | 0.54 | 0.73 | 0.14 | 0.12 | 0.12 | 0.60 | B | B | B | 3.6 |
| 103 | 0.58 | 0.66 | 0.12 | 0.12 | 0.12 | 0.59 | A | B | B | 1.2 |
| 104 | 0.81 | 0.65 | 0.72 | 0.85 | 0.12 | 0.63 | B | B | B | 12.1 |
| 106 | 0.54 | 0.72 | 0.16 | 0.22 | 0.12 | 0.38 | B | B | B | 6.8 |
| 107 | 0.57 | 0.66 | 0.14 | 0.22 | 0.12 | 0.37 | A | B | B | 8.2 |
| 108 | 0.58 | 0.89 | 0.99 | 0.49 | 0.09 | 0.47 | A | B | B | 15.4 |
| c11 | — | — | — | — | — | — | C | A | A | — |
| c12 | 0.64 | 1.01 | 1.95 | 0.5 | 0.69 | 5.34 | A | C | C | 21.1 |
| c13 | 0.64 | 1.01 | 1.95 | 0.5 | 0.69 | 5.34 | A | B | B | 23.2 |
| c14 | 0.64 | 1.01 | 1.95 | 0.5 | 0.69 | 5.34 | B | A | A | 24.9 |
| c15 | 1.72 | 0.13 | 0.11 | 0.12 | 0.07 | 64.0 | A | B | B | 19.9 |

The formulation amount of the dye is described in terms of parts by mass with respect to 100 parts by mass of the matrix resin.

The notation of "-" in the column of "Dye" indicates that the dye is not contained.

In the notation of "-" in the columns of "Absorbance ratio" and "Dye" of No. c11, a value is not described since No. c11 is a base material-attached wavelength selective absorption filter that does not contain a dye and corresponds to a reference filter of each wavelength selective absorption filter.

$\lambda_{max}$ in the column of "Dye" means the wavelength (the maximal absorption wavelength) at which the largest maximal absorption value is exhibited among the maximal absorption values measured for the wavelength selective absorption filter.

Some of the dyes used are described using the following abbreviations.

Y93: C. I. Solvent Yellow 93

G3: C. I. Solvent Green 3

R111: C. I. Solvent Red 111

V13: C. I. Solvent Violet 13

B36: C. I. Solvent Blue 36

As shown in Table 4, the comparative wavelength selective absorption filter No. c12 to c14 containing a combination of dyes in the related art do not satisfy Relational Expressions (II), (III), (V), and (VI) described above. The comparative wavelength selective absorption filter Nos. c12 to c04 have a large color difference of 20 or more from the wavelength selective absorption filter (No. c11) that does not contain a dye, resulting in a large change in tint, and thus it was not possible to suppress the change in tint while both achieving the suppression of external light reflection and suppression of brightness decrease. In addition, the comparative wavelength selective absorption filter No. c15 which does not contain the dyes A and D specified in the present invention does not satisfy Relational Expressions (I) and (VI) described above. The comparative wavelength selective absorption filter No. c15 also has a large color difference of 19.9 from the wavelength selective absorption filter (No. c11) that does not contain a dye, resulting in a large change in tint, and thus it was not possible to suppress the change in tint while both achieving the suppression of external light reflection and suppression of brightness decrease.

On the other hand, in the wavelength selective absorption filter Nos. 101 to 108 of the reference examples satisfying Relational Expressions (I) to (VI) described above, the change in tint was sufficiently suppressed while both the external light reflection and the brightness decrease were suppressed, and thus they were at a practical level. These showed an excellent effect of suppressing the change in tint while realizing the suppression of the external light reflection and suppression of the brightness decrease at the same level of the wavelength selective absorption filter Nos. c12 to c14 containing a combination of dyes of the related art. Further, the wavelength selective absorption filter Nos. 101 to 107 using a squarine-based coloring agent represented by General Formula (1) as at least one of the dyes B or C were found that both suppressing the external light reflection and the brightness decrease and further suppressing the change in tint at a more excellent level can be achieved.

Example 1-2

<Production of Base Material-Attached Wavelength Selective Absorption Layer 21>

(1) Preparation of Wavelength Selective Absorption Layer Forming Liquid 21

Each component was mixed according to the composition shown below to prepare a wavelength selective absorption layer forming liquid 21.

| Composition of wavelength selective absorption layer forming liquid 21 | |
|---|---|
| Resin 1 | 78.9 parts by mass |
| Resin 2 | 17.5 parts by mass |
| Peelability control resin component 1 | 0.20 parts by mass |
| Leveling agent 1 | 0.08 parts by mass |
| Dye C-73 | 0.97 parts by mass |
| Antifading agent 1 | 2.4 parts by mass |
| Toluene (a solvent) | 1710.0 parts by mass |
| Cyclohexanone (a solvent) | 190.0 parts by mass |

Subsequently, the obtained wavelength selective absorption layer forming liquid 21 was filtered using a filter having an absolute filtration precision of 5 μm (product name: Hydrophobic Fluorepore Membrane, manufactured by Millex).

(2) Production of Base Material-Attached Wavelength Selective Absorption Layer 211

The above-described wavelength selective absorption layer forming liquid 1 after the filtration treatment was applied onto the base material 21 by using a bar coater so that the film thickness after drying was 2.5 μm, and dried at 130° C. to produce a base material-attached wavelength selective absorption layer 211.

<Production of Base Material-Attached Wavelength Selective Absorption Layers 212 to 215>

Base material-attached wavelength selective absorption layers 212 to 215 were produced in the same manner as in the production of the base material-attached base material-attached wavelength selective absorption layer 211, except that the formulation amount of the dye C-73 was changed to the contents shown in Table 5 below.

<Production of Laminate Nos. L211 to L215>

Laminate Nos. L211 to L215 that are used in the present invention were produced in the same manner as in the production of the laminate No. L111 described above, except that the kind of the base material-attached wavelength selective absorption layer was changed as shown in Table 6 below.

<Light Resistance>

(Production of Light Resistance Evaluation Film)

An evaluation film was produced in the same manner as in the light resistance evaluation of the laminate No. L101, except that the laminate No. L101 was changed to the laminate Nos. L211 to L215, and the absorbance was measured. Next, the xenon irradiation was carried out in the same manner as in the light resistance test of the laminate No. L101, and the absorbance after 200 hours of the xenon irradiation was measured at a shorter wavelength of the two wavelengths at which an absorbance of 0.5 is exhibited before the xenon irradiation, and the light resistance was evaluated according to the following expression. The results are summarized in Table 7.

[Light resistance (%)]=([absorbance after 200 hours of light irradiation])/0.5×100

TABLE 5

| Base material-attached wavelength selective absorption layer | Dye C | | |
|---|---|---|---|
| | Kind | $\lambda_{max}$ | Formulation amount |
| 211 | C-73 | 593 | 0.97 |
| 212 | C-73 | 593 | 1.57 |
| 213 | C-73 | 593 | 4.71 |
| 214 | C-73 | 593 | 7.85 |
| 215 | C-73 | 593 | 12.6 |

The formulation amount of the dye is an formulation amount (in terms of parts by mass) with respect to the formulation amount (in terms of parts by mass) of each component described in the wavelength selective absorption layer forming liquid 21.

TABLE 6

| | Gas barrier layer forming liquid | | | | Base material-attached wavelength selective absorption layer | Thickness of gas barrier layer [μm] |
|---|---|---|---|---|---|---|
| | Resin | | Pure water | 2-propanol | | |
| No. | Kind | Formulation amount | Formulation amount | Formulation amount | | |
| L211 | AQ-4104 | 4 | 88.8 | 7.2 | 211 | 1.6 |
| L212 | AQ-4104 | 4 | 88.8 | 7.2 | 212 | 1.6 |
| L213 | AQ-4104 | 4 | 88.8 | 7.2 | 213 | 1.6 |
| L214 | AQ-4104 | 4 | 88.8 | 7.2 | 214 | 1.6 |
| L215 | AQ-4104 | 4 | 88.8 | 7.2 | 215 | 1.6 |

The formulation amount of each component in the gas barrier forming liquid is described in terms of parts by mass in a case where the total amount of components are set to 100 parts by mass.

TABLE 7

| | | Gas barrier layer | | | | |
|---|---|---|---|---|---|---|
| No. | Resin | Thickness [μm] | Degree of crystallinity | Oxygen permeability of gas barrier layer [cc/m$^2$ · day · atm] | Wavelength at which absorbance of 0.5 exhibited | Resistance |
| L211 | AQ-4104 | 1.6 | 53% | 0.4 | 584 | 88% |
| L212 | AQ-4104 | 1.6 | 53% | 0.4 | 577 | 92% |
| L213 | AQ-4104 | 1.6 | 53% | 0.4 | 551 | 96% |
| L214 | AQ-4104 | 1.6 | 53% | 0.4 | 539 | 97% |
| L215 | AQ-4104 | 1.6 | 53% | 0.4 | 523 | 97% |

As shown in Table 7, it can be seen that all of the laminate Nos. L213 to L215 in which the formulation amount of the coloring agent is 4 parts by mass or more with respect to 100 parts by mass of the resin constituting the wavelength selective absorption layer have high light resistance as compared with Nos. L211 and L212 in which the formulation amount of the coloring agent is less than 4 parts by mass with respect to 100 parts by mass of the resin constituting the wavelength selective absorption layer, which are particularly preferable.

Example 2: A display device including a laminate in which the difference in the refractive index between the adjacent layers is adjusted and a wavelength conversion material.

<Production of Base Material-Attached Wavelength Selective Absorption Layer>

The materials used in the production of the wavelength selective absorption layer are shown below.

(Resin 9)

Apel APL6011T (product name, manufactured by Mitsui Chemicals, Inc., a copolymer of ethylene and norbornene, Tg: 105° C.), which is a cyclic polyolefin resin, was used as the resin 9.

(Dye)

The above-described E-24 was used as the dye A, the above-described A-33 or 7-22 was used as the dye B, the above-described C-73 or C-80 was used as the dye C, and the above-described F-44 was used as the dye D.

(Antifading Agent 1)

Antifading Agent 1 Used in Example 1

(Base Material A)

A cellulose acylate film (manufactured by FUJIFILM Corporation, product name: ZRD40SL) was used as a base material A.

(1) Preparation of Wavelength Selective Absorption Layer Forming Liquid A

Each component was mixed according to the composition shown below to prepare a wavelength selective absorption layer forming liquid A.

| Composition of wavelength selective absorption layer forming liquid A | |
|---|---|
| Resin 9 | 95.5 parts by mass |
| Peelability control resin component: TUFTEC H-1043 (product name, manufactured by Asahi Kasei Corporation) | 3.4 parts by mass |
| Leveling agent: MEGAFACE F-554 (manufactured by DIC Corporation, fluoropolymer) | 0.16 parts by mass |
| Dye E-24 | 0.39 parts by mass |
| Dye A-33 | 0.14 parts by mass |
| Dye C-80 | 0.15 parts by mass |
| Dye F-44 | 0.23 parts by mass |
| Antifading agent 1 | 10.4 parts by mass |
| Cyclohexane (a solvent) | 654.5 parts by mass |
| Ethyl acetate (a solvent) | 115.5 parts by mass |

Subsequently, the obtained wavelength selective absorption layer forming liquid A was filtered using a filter paper (#63, manufactured by Toyo Filter Paper Co., Ltd.) having an absolute filtration precision of 10 μm, and further filtered using a metal sintered filter (FH025, manufactured by Pall) with an absolute filtration precision of 2.5 μm.

(2) Production of Base Material-Attached Wavelength Selective Absorption Layer A The above-described wavelength selective absorption layer forming liquid A after the filtration treatment was applied onto the base material A by using a bar coater so that the film thickness after drying was 2.5 μm, and dried at 120° C. to produce a base material-attached wavelength selective absorption layer A.

(3) Production of Base Material-Attached Wavelength Selective Absorption Layers B to D Base material-attached wavelength selective absorption layers B to D were produced in the same manner as in the production of the base material-attached base material-attached wavelength selective absorption layer A, except that the kind and the adding amount of the dye were changed to the contents shown in Table A-1 below.

TABLE A-1

| | Dye A | | | Dye B | | | Dye C | | | Dye D | | |
|---|---|---|---|---|---|---|---|---|---|---|---|---|
| No. | Kind | $\lambda_{max}$ | Adding amount | Kind | $\lambda_{max}$ | Adding amount | Kind | $\lambda_{max}$ | Adding amount | Kind | $\lambda_{max}$ | Adding amount |
| A | E-24 | 409 | 0.39 | A-33 | 513 | 0.14 | C-80 | 595 | 0.15 | F-44 | 699 | 0.23 |
| B | E-24 | 409 | 0.39 | A-33 | 513 | 0.14 | C-73 | 590 | 0.18 | F-44 | 699 | 0.23 |
| C | E-24 | 409 | 0.39 | 7-22 | 503 | 0.12 | C-80 | 595 | 0.15 | F-44 | 699 | 0.23 |
| D | E-24 | 409 | 0.39 | 7-22 | 503 | 0.12 | C-73 | 590 | 0.18 | F-44 | 699 | 0.23 |

The adding amount of the dye is an adding amount (in terms of parts by mass) with respect to the formulation amount (in terms of parte by mass) of each component described in the wavelength selective absorption layer forming liquid A.

<Production of Laminate Nos. L502 to L511>

The light resistance evaluation film of the laminate No. L116 produced in Example 1 was set as the laminate No. L501, in order from the visible side, the TAC film containing a UV absorbing agent was the first layer, the layer consisting of the pressure sensitive adhesive 1 was the second layer, the gas barrier layer was the third layer, the wavelength selective absorption layer 6 was the fourth layer, and the layer consisting of the pressure sensitive adhesive 1 was the fifth layer, and the glass was the sixth layer.

Laminate Nos. L502 to L511 were produced in the same manner as in the laminate No. L501, except that in the laminate No. L501, the kinds of the pressure sensitive adhesive constituting the second layer and the fifth layer and the wavelength selective absorption layer of the fourth layer were changed as described in Table B below.

<Light Resistance>

The light resistance of the laminate Nos. L502 to L511 produced as described above was evaluated in the same manner as in the light resistance evaluation described in Example 1. The results are shown in Table A-2 below. It is noted that although the laminate Nos. L503, L504, and L508 to L511 are not described in the table, they exhibit the same light resistance as No. L502.

As described above, it was found that the laminate Nos. L502 to L511 that are used in the present invention have the same level of excellent light resistance as the laminate No. L501 that is used in the present invention.

It is noted that the dyes E-27, A-52, and F-30 in the table below are the above-described dyes E-27, A-52, and F-30, respectively.

TABLE A-2

| | Light resistance | | | | | | | | |
|---|---|---|---|---|---|---|---|---|---|
| | Dye A | | Dye B | | | Dye C | | Dye D | |
| No. | E-24 | E-27 | A-33 | A-52 | 7-22 | C-80 | C-73 | F-30 | F-44 |
| L501 | — | 96% | — | 95% | — | — | 93% | 94% | — |
| L502 | 95% | — | 95% | — | — | 94% | — | — | 93% |
| L505 | 94% | — | 94% | — | — | — | 92% | — | 92% |
| L506 | 94% | — | — | — | 91% | 93% | — | — | 92% |
| L507 | 93% | — | — | — | 90% | — | 91% | — | 91% |

<Evaluation of Physical Properties of Gas Barrier Layer>

The gas barrier layer of the third layer in the laminate Nos. L501 and L502, and the layer consisting of the adhesive of the second layer and the gas barrier layer of the third layer in the laminate Nos. L503 to L511 correspond to the gas barrier layer of the laminate that is used in the present invention.

Regarding the laminate Nos. L503 to L511, the degree of crystallinity and the oxygen permeability of the gas barrier layer were evaluated for the gas barrier layers in the present invention consisting of the second layer and the third layer in the same manner as in Example 1. The results are shown in Table B.

After applying the adhesive layer corresponding to the second layer on the gas barrier layer of the laminate L116, the degree of crystallinity was calculated by peeling 2 to 3 mg of the adhesive layer and the barrier layer together and carrying out DSC measurement.

The thickness of the layer composed of the second layer composed of the adhesive 1 or 2 was about 50 to 250 nm.

<Refractive Index>

The sum of the refractive index and thickness of each of the first to sixth layers constituting the laminate and the interfacial reflectivity was measured and calculated. The results are shown in Table B.

(Refractive Index)

The refractive indexes of the first layer and the sixth layer were calculated as follows.

Clear Mieru (product name, black laminated film) manufactured by Tomoegawa Paper Co., Ltd. was bonded to the surface opposite to the measurement surface of each sample (hereinafter referred to as the side surface of the substrate) so that interfacial reflection on the side surface of the substrate did not occur. Then, the reflectivity $R_1$ was measured in the range of 380 nm to 780 nm by irradiating the measurement surface side of the sample with light using a reflection spectroscopic film thickness meter FE3000 (product name) manufactured by Otsuka Electronics Co., Ltd.

The reflectivity $R_1$ is expressed by Expression (1) using the refractive index $n_1$ of the sample. Therefore, the refractive index $n_1$ of the sample at 380 nm to 780 nm was calculated from the measured value of the reflectivity.

$$R^1=(1-n_1)^2/(1+n_1)^2 \quad \text{Expression (1):}$$

The refractive indexes of the second layer, the third layer, the fourth layer, and the fifth layer were calculated as follows.

A liquid (a sample) for forming each layer was applied onto a support having a known refractive index and having a film thickness of 1 to 3 μm, thereby producing a laminate consisting of a support and the sample under the same conditions (the drying temperature and the like) as those in the case of forming the laminate consisting of the first layer to the sixth layer to produce. Clear Mieru (product name, black laminate film) manufactured by Tomoegawa Paper Co., Ltd. was bonded to the support side of this laminate so that interfacial reflection on the side surface of the substrate did not occur, and then the measurement surface side of the sample was irradiated with light using a reflection spectroscopic film thickness meter FE3000 (product name) manufactured by Otsuka Electronics Co., Ltd., whereby the reflectivity $R_2$ was measured in a range of 380 nm to 780 nm.

The reflectivity $R_2$ is expressed by Expression (2) using the refractive index $n_2$ of the sample and the refractive index $n_3$ of the support. Therefore, the refractive index $n_2$ in the sample from 380 nm to 780 nm was calculated from the measured value of the reflectivity and the refractive index $n_3$ of the support.

$$R_2=(n_2-n_3)^2/(n_2+n_3)^2 \quad \text{Expression (2):}$$

(Film Thickness)

The film thicknesses of the first to sixth layers were calculated as follows.

The cross section of the laminate was cut using a rotary microtome RM2265 (product name) manufactured by LEICA, and the film thickness of each layer was determined using a scanning electron microscope S-4800 (product name) manufactured by Hitachi High-Technologies Corporation.

<Sum of Interfacial Reflectivity>

The sum of the interfacial reflections of the laminate is calculated by using the refractive index and film thickness of each layer in the same manner as the method of Chapter 5, pages 173 to 174 of the 7th edition of "Applied Physical Engineering Selection Book 3 Thin Film" by Sadafumi Yoshida.

TABLE B

| No. | First layer n | Δn | Second layer Material | Second layer n | Δn | Third layer n | Δn | Fourth layer Wavelength selective absorption layer | n | Δn | Fifth layer Material |
|---|---|---|---|---|---|---|---|---|---|---|---|
| L501 | 1.48 | 0.01 | Pressure-sensitive adhesive 1 | 1.47 | 0.08 | 1.55 | 0.05 | 6 | 1.60 | 0.13 | Pressure-sensitive adhesive 1 |
| L502 | 1.48 | 0.01 | Pressure-sensitive adhesive 1 | 1.47 | 0.08 | 1.55 | 0.01 | A | 1.54 | 0.07 | Pressure-sensitive adhesive 1 |
| L503 | 1.48 | 0.05 | Pressure-sensitive adhesive 1 | 1.53 | 0.02 | 1.55 | 0.01 | A | 1.54 | 0.07 | Pressure-sensitive adhesive 1 |
| L504 | 1.48 | 0.05 | Pressure-sensitive adhesive 1 | 1.53 | 0.02 | 1.55 | 0.01 | A | 1.54 | 0.04 | Pressure-sensitive adhesive 2 |
| L505 | 1.48 | 0.05 | Pressure-sensitive adhesive 1 | 1.53 | 0.02 | 1.55 | 0.01 | B | 1.54 | 0.04 | Pressure-sensitive adhesive 2 |
| L506 | 1.48 | 0.05 | Pressure-sensitive adhesive 1 | 1.53 | 0.02 | 1.55 | 0.01 | C | 1.54 | 0.04 | Pressure-sensitive adhesive 2 |
| L507 | 1.48 | 0.05 | Pressure-sensitive adhesive 1 | 1.53 | 0.02 | 1.55 | 0.01 | D | 1.54 | 0.04 | Pressure-sensitive adhesive 2 |
| L508 | 1.48 | 0.05 | Pressure-sensitive adhesive 1 | 1.53 | 0.02 | 1.55 | 0.01 | A | 1.54 | 0.02 | Pressure-sensitive adhesive 3 |
| L509 | 1.48 | 0.05 | Pressure-sensitive adhesive 1 | 1.53 | 0.02 | 1.55 | 0.01 | A | 1.54 | 0.05 | Pressure-sensitive adhesive 4 |
| L510 | 1.48 | 0.03 | Pressure-sensitive adhesive 2 | 1.51 | 0.04 | 1.55 | 0.01 | A | 1.54 | 0.04 | Pressure-sensitive adhesive 2 |
| L511 | 1.48 | 0.03 | Pressure-sensitive adhesive 2 | 1.51 | 0.04 | 1.55 | 0.01 | A | 1.54 | 0.02 | Pressure-sensitive adhesive 3 |

| No. | Fifth layer n | Δn | Sixth layer n | Sum of interfacial reflectivity | Degree of crystal-linity | Oxygen perme-ability |
|---|---|---|---|---|---|---|
| L501 | 1.47 | 0.02 | 1.49 | 0.27% | 53% | 0.4 |
| L502 | 1.47 | 0.02 | 1.49 | 0.10% | 53% | 0.4 |
| L503 | 1.47 | 0.02 | 1.49 | 0.06% | 56% | 0.4 |
| L504 | 1.50 | 0.01 | 1.49 | 0.02% | 56% | 0.4 |
| L505 | 1.50 | 0.01 | 1.49 | 0.02% | 56% | 0.4 |
| L506 | 1.50 | 0.01 | 1.49 | 0.02% | 56% | 0.4 |
| L507 | 1.50 | 0.01 | 1.49 | 0.02% | 56% | 0.4 |
| L508 | 1.52 | 0.03 | 1.49 | 0.02% | 56% | 0.4 |
| L509 | 1.49 | 0 | 1.49 | 0.03% | 56% | 0.4 |
| L510 | 1.50 | 0.01 | 1.49 | 0.02% | 50% | 0.4 |
| L511 | 1.52 | 0.03 | 1.49 | 0.02% | 50% | 0.4 |

<Note in Table B>

As described above, the first layer is composed of the TAC film containing a UV absorbing agent, the third layer is composed of Excelval AQ-4104 (product name, manufactured by Kuraray Co., Ltd.), and the sixth layer is composed of glass. In the wavelength selective absorption layer of the fourth layer, the wavelength selective absorption layer 6 is composed of a polystyrene resin and a polyphenylene ether resin, and the wavelength selective absorption layers A to D are the wavelength selective absorption layers A to D in Table A-1 described above and are composed of a cyclic polyolefin resin.

“n” means the refractive index, and “An” means the difference in the refractive index between the two layers described on the left and right thereof.

The pressure sensitive adhesives and adhesives described in the table are as follows.

(Pressure Sensitive Adhesive)

Pressure sensitive adhesive 1: SK-2057 (product name, manufactured by Soken Chemical Co., Ltd.)

Pressure sensitive adhesive 2: Add 10 parts by mass of the following triazine compound to the pressure sensitive adhesive 1 with respect to 100 parts by mass of solid content.

Pressure sensitive adhesive 3: Add 20 parts by mass of the following triazine compound to the pressure sensitive adhesive 1 with respect to 100 parts by mass of solid content.

Pressure sensitive adhesive 4: Add 2.6 parts by mass of the following benzodithiol compound to the pressure sensitive adhesive 1 with respect to 100 parts by mass of solid content.

In the pressure sensitive adhesives 2 to 4, the solid content means a component other than the solvent in the pressure sensitive adhesive 1.

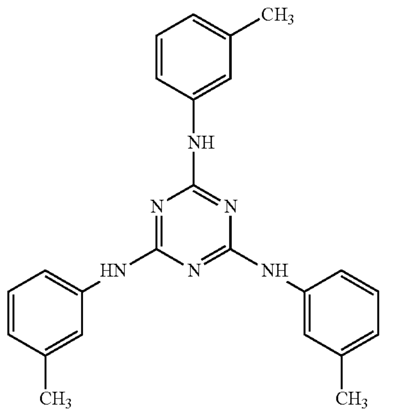

Triazine-based compound

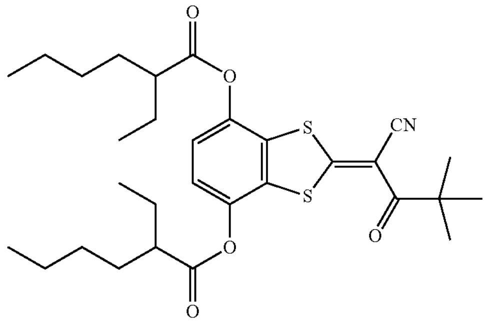

Benzodithiol-based compound (Adhesive)

Adhesive 1: Kuraray Poval 5-98 (product name, manufactured by Kuraray Co., Ltd., saponification degree: 98.0% to 99.0% by mole)

Adhesive 2: Kuraray Poval 5-88 (product name, manufactured by Kuraray Co., Ltd., saponification degree: 86.5% to 89.0% by mole)/Kuraray Poval CP-1220T10 (product name, manufactured by Kuraray Co., Ltd.)=½ mass ratio mixture As shown in Table B, the laminate Nos. L501 to L511 can suppress the sum of interfacial reflectivity to 0.30% or less, and among them, the laminate Nos. L502 to L511 in which all the differences in the refractive index between the adjacent layers were 0.10 or less can suppress the sum of interfacial reflectivity to 0.10% or less, and were more excellent from the viewpoint of suppressing external light reflection. In particular, the laminate Nos. L504 to L511 in which the difference in refractive index between adjacent layers are 0.05 or less can suppress the sum of interfacial reflectivity to 0.03% or less, and are particularly excellent from the viewpoint of suppressing external light reflection.

Example 3: A Laminate Equipped with a Wavelength Selective Absorption Layer Containing an Electron Migration-Type Antifading Agent

[Production of Laminate of Gas Barrier Layer and Wavelength Selective Absorption Layer]

The materials used in the production of the wavelength selective absorption layer are shown below.

<Matrix Resin>

(Resin 1)

A polystyrene resin (PSJ-polystyrene GPPS SGP-10 (product name), manufactured by PS Japan Corporation)

(Resin 2)

A polyphenylene ether resin (manufactured by Asahi Kasei Corporation. Zylon S201A (product name), poly (2,6-dimethyl-1,4-phenylene oxide), Tg: 210° C.)

(Peelability Control Resin Component 1)

Byron 550 (product name, manufactured by Toyobo Co., Ltd., a polyester-based additive)

<Dye>

Each of the following dyes 1 to 7 was used as the dye.

In the following structures, Ph represents a phenyl group.

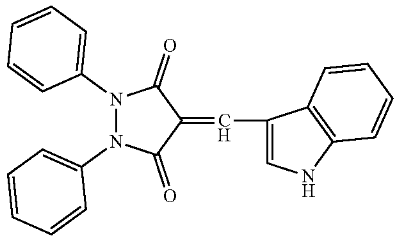

Dye 1

$\lambda_{max}$ = 425nm

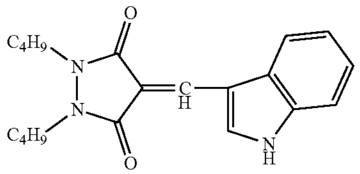

Dye 2

$\lambda_{max}$ = 408nm

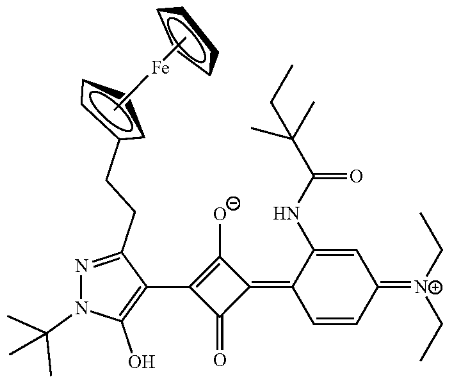

Dye 3

$\lambda_{max}$ = 593nm

-continued

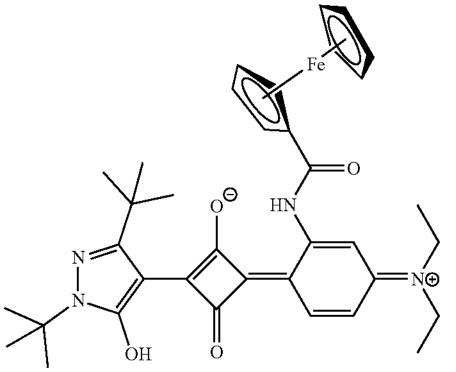

Dye 4

$\lambda_{max}$ = 599nm

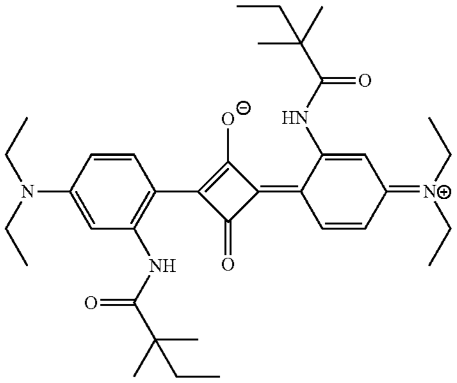

Dye 5

$\lambda_{max}$ = 677nm

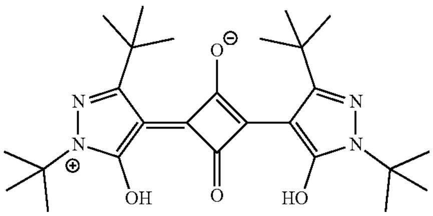

Dye 6

$\lambda_{max}$ = 513nm

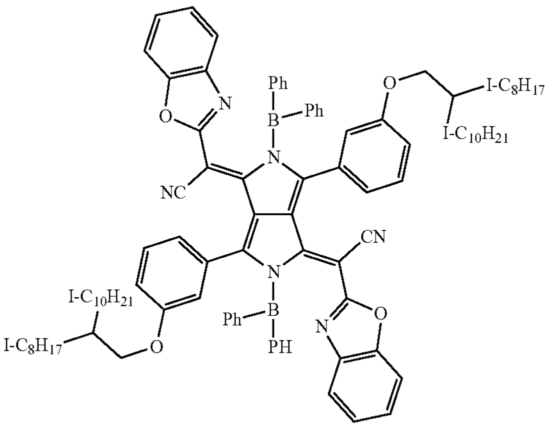

Dye 7

$\lambda_{max}$ = 752nm

<Additive>

(Electron Migration-Type Antifading Agent)

Each of the following electron migration-type antifading agents 1 to 4 was used as the electron migration-type antifading agent.

It is noted that all of the following electron migration-type antifading agents were purchased from Tokyo Chemical Industry Co., Ltd, and used.

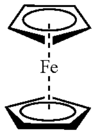

Electron migration-type antifading agent 1

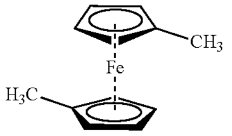

Electron migration-type antifading agent 2

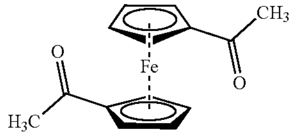

Electron migration-type antifading agent 3

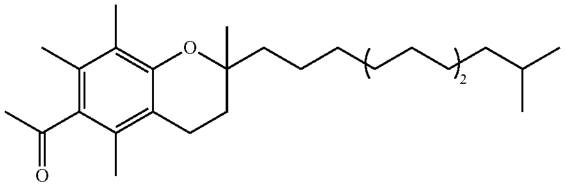

Electron migration-type antifading agent 3

(Singlet Oxygen Quencher 1)

IV-8

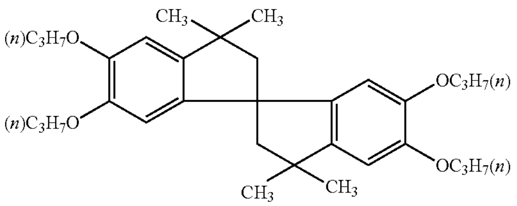

(Leveling Agent 1)

A polymer surfactant composed of the following constitutional components was used as a leveling agent 1. In the following structural formulae, the proportion of each constitutional component is in terms of a molar ratio, and t-Bu means a tert-butyl group.

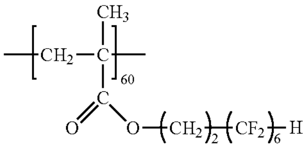

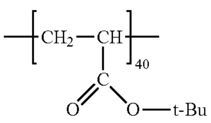

(Base Material 1)

A polyethylene terephthalate film, LUMIRROR XD-510P (product name, film thickness: 50 μm, manufactured by Toray Industries, Inc.) was used as a base material 1.

The materials used in the production of the gas barrier layer are shown below.

<Resin>

(Resin 3)

AQ-4104 (manufactured by Kuraray Co., Ltd., Exceval AQ-4104 (product name), modified polyvinyl alcohol, saponification degree: 98% to 99% by mole)

(Base Material 2)

The wavelength selective absorption layer side of the base material-attached wavelength selective absorption layer is subjected to a corona treatment using a corona treatment device (product name: Corona-Plus, manufactured by VETAPHONE), at a discharge amount of 1,000 W·min/$m^2$, and at a processing speed of 3.2 m/min and used as a base material 2.

[Production of Laminate No. L101]

<1> Production of Base Material-Attached Wavelength Selective Absorption Layer (1) Preparation of Wavelength Selective Absorption Layer Forming Liquid Each component was mixed according to the composition shown below to prepare a wavelength selective absorption layer forming liquid.

| Composition of wavelength selective absorption layer forming liquid | |
|---|---|
| Resin 1 | 66.9 parts by mass |
| Resin 2 | 17.5 parts by mass |
| Peelability control resin component 1 | 0.20 parts by mass |
| Leveling agent 1 | 0.08 parts by mass |
| Dye 1 | 0.86 parts by mass |
| Electron migration-type antifading agent 1 | 2.1 parts by mass |
| Singlet oxygen quencher 1 | 12.4 parts by mass |
| Toluene (a solvent) | 1710.0 parts by mass |
| Cyclohexanone (a solvent) | 190.0 parts by mass |

Subsequently, the obtained wavelength selective absorption layer forming liquid 1 was filtered using a filter having an absolute filtration precision of 5 μm (product name: Hydrophobic Fluorepore Membrane, manufactured by Millex).

(2) Production of Base Material-Attached Wavelength Selective Absorption Layer

The above-described wavelength selective absorption layer forming liquid 1 after the filtration treatment was applied onto the base material by using a bar coater so that the film thickness after drying was 2.5 μm, and dried at 120° C. to produce a base material-attached wavelength selective absorption layer.

<2> Production of Laminate (1) Preparation of Resin Solution

Each component was mixed according to the composition shown below, and the mixture was stirred in a constant-temperature tank at 90° C. for 1 hour to dissolve the resin 3 to prepare a gas barrier layer forming liquid.

| Composition of gas barrier layer forming liquid | |
|---|---|
| Resin 3 | 4.0 parts by mass |
| Pure water | 96.0 parts by mass |

Subsequently, the obtained gas barrier layer forming liquid was filtered using a filter having an absolute filtration precision of 5 μm (product name: Hydrophobic Fluorepore Membrane, manufactured by Millex).

(2) Production of Laminate

The gas barrier layer forming liquid after the filtration treatment was applied to the corona-treated surface side of the base material 2 using a bar coater so that the film thickness after drying was 1.6 μm, and dried at 120° C. for 60 seconds, and the laminate No. L101 was produced.

This laminate No. L101 has a structure in which the base material 1, the wavelength selective absorption layer, and the gas barrier layer are laminated in this order.

<Production of Laminate Nos. L102 to L115 and Lc101 to Lc121>

Laminate Nos. L102 to L115 and Lc101 to Lc121 were produced in the same manner as in the production of the laminate No. L101, except that the kind and the content of the dye, the kind and the content of the electron migration-type antifading agent, and the thickness of the gas barrier layer were changed to the contents shown in Table 8 below.

<Production of Laminate Nos. L101b and Lc101b>

In addition, a laminate No. L101b which was a laminate obtained by introducing a change in the laminate No. L101 so that the singlet oxygen quencher was not contained and a laminate No. Lc101b which was a laminate obtained by introducing a change in the laminate No. Lc101 so that the singlet oxygen quencher was not contained were produced in the same manner as in the production of the laminate No. L101.

It is noted that the laminate Nos. L101 to L115 and L101b are the laminates according to the embodiment of the present invention, and the laminate Nos. Lc101 to Lc121 and Lc101 b are comparative laminates.

[Evaluation]

The laminate Nos. L101 to L115, L101b, Lc101 to Lc121, and Lc101b produced as described above were evaluated according to the following description. The results are collectively shown in Table 8.

[1. Light Resistance]

(Production of Light Resistance Evaluation Film)

A triacetyl cellulose film (a TAC film, product name: Fujitac TD80UL, manufactured by FUJIFILM Corporation) was bonded on the side of the gas barrier layer of the laminate with a pressure sensitive adhesive 1 (product name: SK2057, manufactured by Soken Chemical Co., Ltd.) having a thickness of about 20 μm being interposed. Subsequently, the base material 1 was peeled off, and glass was bonded to the wavelength selective absorption layer side to which the base material 1 was bonded with the pressure sensitive adhesive 1 being interposed, thereby producing a light resistance evaluation film.

(Maximal Absorption Value of Light Resistance Evaluation Film)

Using a UV3150 spectrophotometer (product name) manufactured by Shimadzu Corporation, the absorbance of the light resistance evaluation film in a wavelength range of 200 nm to 1,000 nm was measured for every 1 nm. The absorbance difference between the absorbance of the light resistance evaluation film at each wavelength and the absorbance of the light resistance evaluation film having the same configuration except that it does not contain the dye was calculated, and the maximum value of this absorbance difference was defined as the maximal absorption value.

(Light Resistance)

The light resistance evaluation film was irradiated with light for 200 hours in an environment of 60° C., and 50% relative humidity with Super Xenon Weather Meter SX75 (product name, light source: 7.5 kW, a water-cooling type xenon lamp, irradiation illuminance: 150 W/m$^2$) manufactured by Suga Test Instruments Co., Ltd., and the maximal absorption value before and after this irradiation was measured, and the light resistance was calculated according to the following expression.

[Light resistance (%)]=([maximal absorption value after light irradiation for 200 hours]/[maximal absorption value before light irradiation])−100

[2. Energy Level]

The energy levels of the dye and the electron migration-type antifading agent, used in the production of the wavelength selective absorption layer, were calculated based on the following potential measurement as well as the absorption spectrum and the fluorescence spectrum. A value of the oxidation potential was used as the energy level of HOMO, and a value of the reduction potential, which was calculated from the oxidation potential and the HOMO-LUMO band gap, was used as the energy level of LUMO. Hereinafter, the measurement and calculation method for each potential will be described.

The oxidation potential of the dye and the oxidation potential of the electron migration-type antifading agent were measured by an electrochemical analyzer (for example, model number: 660A, manufactured by ALS Co., Ltd.) using each of a glassy carbon electrode (GC) as a working electrode, a platinum black electrode as a counter electrode, an Ag line as a reference electrode, tetrabutylammonium hexafluorophosphate as a supporting electrolyte, and dichloromethane as a solvent, and they were indicated as values using, as the standard potential, the ferrocene/ferrocinium ion system (Fc/Fc$^+$) measured under the same conditions. Regarding the electron migration-type antifading agent-embedded coloring agent, among the two detected oxidation potentials, the noble potential was assigned to the oxidation potential of the dye portion, and the base potential was assigned to the oxidation potential of the electron migration-type antifading agent portion.

The reduction potential of the dye was calculated as follows.

First, the absorption spectrum of the dye was measured by using an ultraviolet-visible spectrophotometer (model number: 8430, manufactured by HEWLETT PACKARD Company), and the fluorescence spectrum of the dye was measured by using a fluorescence meter (product name: Modula Spectrofluorometer Fluorog-3, manufactured by HORIBA, Ltd.). It is noted that the solvent used in the measurement was the same as the solvent used in the above-described potential measurement.

Next, the absorption spectrum and fluorescence spectrum obtained above are respectively standardized by the absorbance at the absorption maximum wavelength and the emission intensity at the emission maximum wavelength, a wavelength at the intersection point thereof is determined, and the value of this wavelength is converted into an energy unit (eV) to obtain a HOMO-LUMO band gap.

The reduction potential of the dye was calculated by adding the value of the HOMO-LUMO band gap to the value (eV) of the oxidation potential of the dye measured as described above.

[3. Evaluation of Physical Properties of Gas Barrier Layer]

The oxygen permeability and the thickness of the gas barrier layer were evaluated according to the following methods.

(Oxygen Permeability)

A light resistance evaluation film was produced in the same manner, except that in the above-described production of the light resistance evaluation film, the wavelength selective absorption layer was not subjected to corona treatment, and the base material 1 corresponding to the base material 2 and the wavelength selective absorption layer were peeled off, thereby preparing an oxygen permeability evaluation film obtained by laminating a TAC film, a pressure sensitive adhesive 1, and a gas barrier layer in this order to produce. Since the TAC film has almost no gas barrier properties, the oxygen permeability of the gas barrier layer can be substantially evaluated according to the above-described measurement method. It is noted that in a case where the laminate did not have a gas barrier layer, the TAC film used in the production of the light resistance evaluation film was used as the oxygen permeability evaluation film.

Using OX-TRAN 2/21 (product name) manufactured by MOCON as an oxygen permeability determination device, the oxygen permeability of the oxygen permeability evaluation film was measured by an isobaric method (JIS K 7126-2) under the condition of 25° C., relative humidity 50%, oxygen partial pressure 1 atm, and measurement area 50 cm$^2$.

(Thickness)

A cross-sectional image of the laminate was taken using a field emission scanning electron microscope S-4800 (product name) manufactured by Hitachi High-Technologies Corporation, and the thickness was read.

TABLE 8

| | Configuration | | | | | | | | |
|---|---|---|---|---|---|---|---|---|---|
| | Dye | | | | Electron migration-type antifading agent | | | Gas barrier layer | |
| No. | Kind | Content | $E_{Hd}$ | $E_{Ld}$ | Kind | $E_{Hq}$ | Content | Thickness | Oxygen permeability |
| L101 | 1 | 0.86 | 0.95 | −1.76 | 1 | 0.00 | 0.4 | 1.6 | 0.4 |
| L101b | 1 | 0.86 | 0.95 | −1.76 | 1 | 0.00 | 0.4 | 1.6 | 0.4 |
| L102 | 1 | 0.86 | 0.95 | −1.76 | 1 | 0.00 | 2.1 | 1.6 | 0.4 |
| L103 | 1 | 0.86 | 0.95 | −1.76 | 1 | 0.00 | 8.5 | 1.6 | 0.4 |
| L104 | 2 | 0.77 | 0.78 | −2.03 | 1 | 0.00 | 2.1 | 1.6 | 0.4 |
| L105 | 3 | 1.57 | 0.44 | −1.65 | 1 | 0.00 | 2.1 | 1.6 | 0.4 |
| L106 | 3 | 1.57 | 0.44 | −1.65 | 1 | 0.00 | 8.5 | 1.6 | 0.4 |
| L107 | 3 | 1.57 | 0.44 | −1.65 | 4 | 0.15 | 4.7 | 1.6 | 0.4 |
| L108 | 3 | 1.57 | 0.44 | −1.65 | 1 | 0.00 | 2.1 | 3.7 | 0.2 |
| L109 | 4 | 1.48 | 0.30 | −1.69 | 1 | 0.00 | 2.1 | 1.6 | 0.4 |

TABLE 8-continued

| | | | | | | | | | |
|---|---|---|---|---|---|---|---|---|---|
| L110 | 5 | 1.37 | 0.21 | −1.57 | 1 | 0.00 | 2.1 | 1.6 | 0.4 |
| L111 | 5 | 1.37 | 0.21 | −1.57 | 2 | −0.13 | 2.4 | 1.6 | 0.4 |
| L112 | 5 | 1.37 | 0.21 | −1.57 | 4 | 0.15 | 4.7 | 16 | 0.4 |
| L113 | 5 | 1.37 | 0.21 | −1.57 | 1 | 0.00 | 2.1 | 3.7 | 0.2 |
| L114 | 2, 4, 6, 7 | 0.77/1.48/ 1.04/2 23 | 0.78/0.30/ 0.63/0.52 | −2.03/−1.69/ −1.68/−1.09 | 1 | 0.00 | 2.1 | 1.6 | 0.4 |
| L115 | 2, 4, 6, 7 | 0.77/1.48/ 1.04/2.23 | 0.78/0.30/ 0.63/0.52 | −2.03/−1.69/ −1.68/−1.09 | 2 | −0.13 | 2.4 | 1.6 | 0.4 |
| Lc101 | 1 | 0.86 | 0.95 | −1.76 | — | — | — | 1.6 | 0.4 |
| Lc101b | 1 | 0.86 | 0.95 | −1.76 | — | — | — | 1.6 | 0.4 |
| Lc102 | 1 | 0.86 | 0.95 | −1.76 | — | — | — | — | 640 |
| Lc103 | 1 | 0.86 | 0.95 | −1.76 | 1 | 0.00 | 0.4 | — | 640 |
| Lc104 | 1 | 0.86 | 0.95 | −1.76 | 1 | 0.00 | 2.1 | — | 640 |
| Lc105 | 1 | 0.86 | 0.95 | −1.76 | 1 | 0.00 | 8.5 | — | 640 |
| Lc106 | 2 | 0.77 | 0.78 | −2.03 | — | — | — | 1.6 | 0.4 |
| Lc107 | 3 | 1.57 | 0.44 | −1.65 | — | — | — | 1.6 | 0.4 |
| Lc108 | 3 | 1.57 | 0.44 | −1.65 | 1 | 0.00 | 2.1 | 11.1 | 0.05 |
| Lc109 | 3 | 1.57 | 0.44 | −1.65 | 1 | 0.00 | 2.1 | 22.2 | 0.03 |
| Lc110 | 3 | 1.57 | 0.44 | −1.65 | — | — | — | — | 640 |
| Lc111 | 3 | 1.57 | 0.44 | −1.65 | 1 | 0.00 | 2.1 | — | 640 |
| Lc112 | 3 | 1.57 | 0.44 | −1.65 | 1 | 0.00 | 8.5 | — | 640 |
| Lc113 | 4 | 1.48 | 0.30 | −1.69 | — | — | — | 1.6 | 0.4 |
| Lc114 | 4 | 1.48 | 0.30 | −1.69 | 3 | 0.50 | 3.1 | 1.6 | 0.4 |
| Lc115 | 5 | 1.37 | 0.21 | −1.57 | — | — | — | 1.6 | 0.4 |
| Lc116 | 5 | 1.37 | 0.21 | −1.57 | 1 | 0.00 | 2.1 | 11.1 | 0.05 |
| Lc117 | 5 | 1.37 | 0.21 | −1.57 | 1 | 0.00 | 2.1 | 22.2 | 0.03 |
| Lc118 | 2, 4, 6, 7 | 0.77/1.48/ 1.04/2.23 | 0.78/0.30/ 0.63/0.52 | −2.03/−1.69/ −1.68/−1.09 | — | — | — | 1.6 | 0.4 |
| Lc119 | 2, 4, 6, 7 | 0.77/1.48/ 1.04/2.23 | 0,78/0.30/ 0.63/0.52 | −2.03/−1.69/ −1.68/−1.09 | 3 | 0.50 | 3.1 | 1.6 | 0.4 |
| Lc120 | 2, 4, 6, 7 | 0.77/1.48/ 1.04/2.23 | 0.78/0.30/ 0.63/0.52 | −2.03/−1.69/ −1.68/−1.09 | — | — | — | — | 640 |
| Lc121 | 2, 4, 6, 7 | 0.77/1.48/ 1.04/2.23 | 0.78/0.30/ 0.63/0.52 | −2.03/−1.69/ −1.687−1.09 | 1 | 0.00 | 2.1 | — | 640 |

| | Light resistance (Xe irradiation for 200 hours) | | | | | | |
|---|---|---|---|---|---|---|---|
| No. | Dye 1 | Dye 2 | Dye 3 | Dye 4 | Dye 5 | Dye 6 | Dye 7 |
| L101 | 87.2 | | | | | | |
| L101b | 86.9 | | | | | | |
| L102 | 89.8 | | | | | | |
| L103 | 91.8 | | | | | | |
| L104 | | 96.7 | | | | | |
| L105 | | | 94.9 | | | | |
| L106 | | | 93.1 | | | | |
| L107 | | | 92.0 | | | | |
| L108 | | | 96.2 | | | | |
| L109 | | | | 96.1 | | | |
| L110 | | | | | 84.4 | | |
| L111 | | | | | 85.7 | | |
| L112 | | | | | 71.1 | | |
| L113 | | | | | 83.9 | | |
| L114 | | 88.4 | | 92.3 | | 89.5 | 88.5 |
| L115 | | 87.9 | | 92.0 | | 89.7 | 89.0 |
| Lc101 | 84.0 | | | | | | |
| Lc101b | 82.2 | | | | | | |
| Lc102 | 79.1 | | | | | | |
| Lc103 | 77.9 | | | | | | |
| Lc104 | 74.5 | | | | | | |
| Lc105 | 65.7 | | | | | | |
| Lc106 | | 93.1 | | | | | |
| Lc107 | | | 91.3 | | | | |
| Lc108 | | | 95.3 | | | | |
| Lc109 | | | 94.7 | | | | |
| Lc110 | | | 63.5 | | | | |
| Lc111 | | | 59.8 | | | | |
| Lc112 | | | 43.2 | | | | |
| Lc113 | | | | 94.7 | | | |
| Lc114 | | | | 86.8 | | | |
| Lc115 | | | | | 68.5 | | |
| Lc116 | | | | | 83.2 | | |
| Lc117 | | | | | 82.9 | | |
| Lc118 | | 83.6 | | 91.0 | | 86.9 | 87.7 |
| Lc119 | | 82.2 | | 72.9 | | 71.5 | 85.7 |
| Lc120 | | 30.9 | | 57.3 | | 29.3 | 52.5 |
| Lc121 | | 40.3 | | 42.9 | | 21.0 | 42.6 |

(Note in Table)

The content of the dye means the content proportion of the dye in the wavelength selective absorption filter in terms of the mass ratio, and the unit thereof is % by mass.

The content of the electron migration-type antifading agent means the content proportion of the electron migration-type antifading agent in the wavelength selective absorption filter in terms of the mass ratio, and the unit thereof is % by mass. The content of the electron migration-type antifading agent is a value adjusted so that the substance amount thereof becomes approximately 1 time, 5 times, or 20 times the amount of the dye.

$E_{Hd}$ indicates an energy level of HOMO of a dye. $E_{Ld}$ indicates an energy level of LUMO of the dye, and $E_{Hq}$ indicates an energy level of HOMO of an electron migration-type antifading agent, and all of them have a unit of eV.

In Nos. L114, L115, and Lc118 to Lc121, the descriptions of the four values in the columns of the content of the dye, $E_{Hd}$, $E_{Ld}$, and $E_{Hq}$ correspond to the descriptions related to the dyes 2, 4, 6, and 7, respectively, in the order of upper left, upper right, lower left, and lower right.

Nos. L101b and Lc101b do not contain the singlet oxygen quencher.

The empty space in the column of the light resistance evaluation indicates that the corresponding dye is not contained.

The notation of "-" in the column of "Electron migration-type antifading agent" indicates that the electron migration-type antifading agent is not present, and the notation of "-" in the column of "Thickness" in the column of "Gas barrier layer" indicates that the gas barrier layer is not present, and Oxygen permeability indicates the oxygen permeability of the TAC film.

In the column of "Gas barrier layer", the unit of Thickness is μm, and the unit of Oxygen permeability is cc/$m^2$·day·atm.

From the results in Table 8, the following facts can be seen. It has been found that the laminate according to the embodiment of the present invention has excellent light resistance as compared with the laminate of the comparative example in which the electron migration-type antifading agent is not contained in the wavelength selective absorption layer and only the gas barrier layer is provided. This can be grasped by comparing No. Lc101 with Nos. 101 to L103; by comparing No. Lc106 with No. L104; by comparing No. Lc107 with Nos. L105 to L108; by comparing No. Lc113 with No. L109: by comparing No. Lc115 with Nos. L110 to L113; by comparing No. Lc118 with Nos. L114 and L115; and by comparing No. Lc101b with No. L101b.

In a case where a laminate was allowed to have a configuration having a gas barrier layer in which the above-described electron migration-type antifading agent that satisfies Relational Expression [A-1] or [A-2] was incorporated in the wavelength selective absorption layer, it exhibited excellent light resistance as compared with the laminate having only the gas barrier layer, which was an unexpected effect. In fact, in the laminate of the comparative example which contained the electron migration-type antifading agent in the wavelength selective absorption layer but did not have the gas barrier layer, the light resistance was deteriorated as compared with the laminate which did not have the gas barrier layer. This can be grasped by comparing No. Lc102 with Nos. Lc103 to Lc105; by comparing No. Lc110 with Nos. Lc111 and Lc112: and by comparing No. Lc120 with No. Lc121.

Further, it has been found that in a case where an electron migration-type antifading agent that does not satisfy Relational Expression [A-1] or [A-2] specified in the present invention is used, the light resistance is deteriorated as compared with the laminate of the comparative example, in which the electron migration-type antifading agent is not contained in the wavelength selective absorption layer and only the gas barrier layer is provided. This can be grasped by comparing No. Lc113 with No. Lc114; and by comparing No. Lc118 with No. Lc119.

Further, in a case where the thickness of the gas barrier layer was outside the range of 0.1 to 10 μm, specified in the present invention, and it is as thick as 11.1 or 22.2 μm, although the oxygen permeability can be reduced by providing the gas barrier layer, the effect of improving the light resistance due to thickening the gas barrier layer was low. This can be grasped by comparing Nos. L105 and L108 with Nos. Lc108 and Lc109; and by comparing No. L110 and L113 with Nos. Lc116 and Lc117.

Reference Example; Wavelength Selective Absorption Filter Containing Four Dyes 1, 4, 7, and 8

An OLED display device equipped with a wavelength selective absorption filter (wavelength selective absorption layer) containing four types of dyes 1, 4, 7, and 8 each having a main absorption wavelength band in a different wavelength range achieves both suppression of external light reflection and suppression of brightness decrease. In addition, the fact that the original tint of the display image can be sufficiently expressed will be described in detail below.

<Dye>

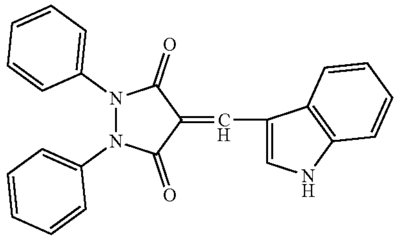

Dye 1
$\lambda_{max}$ = 425nm

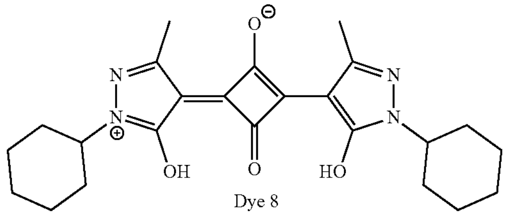

Dye 8
$\lambda_{max}$ = 500nm

-continued

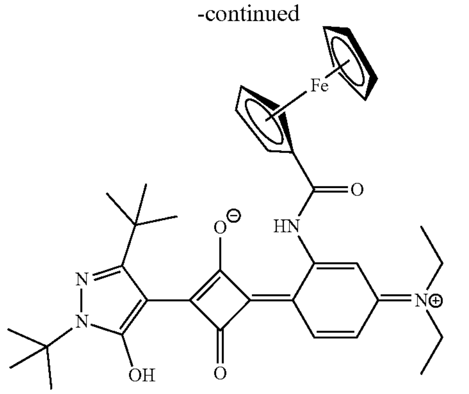

Dye 4
$\lambda_{max}$ = 599nm

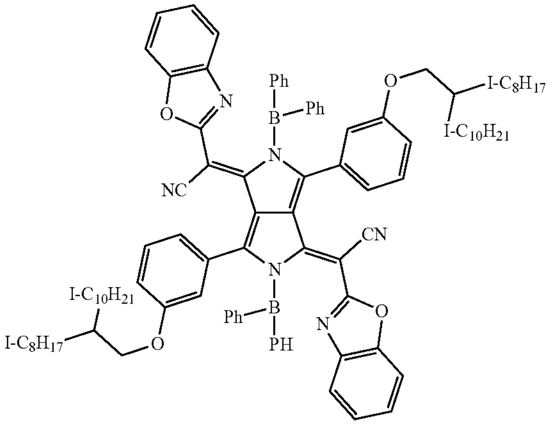

Dye 7
$\lambda_{max}$ = 752nm

<Production of Base Material-Attached Wavelength Selective Absorption Layer Nos. 101 to 103 and c11>

Base material-attached wavelength selective absorption layer Nos. 101 to 103 and c11 were produced in the same manner as in the production of the base material-attached wavelength selective absorption layer in the laminate No. L101 of Example 3 described above, except that the kind and the content of the dye and the kind and the content of the electron migration-type antifading agent were changed to the contents shown in Table 9 below.

[Evaluation]

The base material-attached wavelength selective absorption filter Nos. 101-103 and c11 produced as above were evaluated according to the following description. The results are collectively shown in Table 9.

<Maximal Absorption Value of Wavelength Selective Absorption Filter>

Using a UV3150 spectrophotometer (product name) manufactured by Shimadzu Corporation, the absorbance of a base material-attached wavelength selective absorption filter in the wavelength range of 380 nm to 800 nm was measured every 1 nm. An absorbance difference $Ab_x$ (λ)−$Ab_0$ (λ) between an absorbance $Ab_x$ (λ) at each wavelength λ nm of the base material-attached wavelength selective absorption filter containing no dyes and an absorbance $Ab_0$ (λ) of the base material-attached wavelength selective absorption filter (that is, the wavelength selective absorption filter No. c11) was calculated, and the maximum value of the absorbance difference was defined as the maximal absorption value.

<Simulation of Brightness, Reflectivity, and Tint>

For the OLED display device equipped with the wavelength selective absorption filter produced as described above, the external light reflection was simulated, and the brightness, reflectivity, and tint (a* and b) were calculated.

(1) Configuration of OLED Display Device

As the OLED display device for carrying out the simulation, a device for displaying an image by a color filter including a blue OLED element and quantum dots (QDs) illustrated in FIG. 2 was assumed.

That is, the OLED display device 1 illustrated in FIG. 2 includes a blue OLED element, an RG selective reflective layer 21, a color filter (CF) including quantum dots (QDs), a black matrix 71, and a wavelength selective absorption filter 82 produced in the above, on a TFT substrate in order. The wavelength selective absorption filter 82 is located on the external light side (the visible side).

The TFT substrate has a configuration in which a TFT 12 is provided on a substrate 11. The blue OLED element has a configuration in which the anode 13, the blue OLED layer 14, and the cathode 15 are laminated in order from the TFT substrate side. The blue OLED layer 14 means a constitutional member sandwiched between the anode 13 and the cathode 15 among the components of the blue OLED element, and specifically, it includes an electron injection layer, a blue light emitting layer, and a hole transport layer. In addition to these layers, it is possible to include, without particular limitation, a constitutional member which is included between the anode and the cathode and which constitutes a generally used blue OLED element. The barrier film 16 is arranged between the blue OLED element and the RG selective reflective layer 21.

A color filter containing quantum dots includes quantum dots as red and green light emitting parts. The color filter corresponding to red has a configuration in which a layer 31 containing the red quantum dots and a light diffusing body, a B selective reflective layer 51, and a red color filter 32 are arranged in this order on RG selective reflective layer 21. The color filter corresponding to green has a configuration in which a layer 41 containing a green quantum dot and a light diffusing body, a B selective reflective layer 51, and a green color filter 42 are arranged in this order on the RG selective reflective layer 21. The layer 31 containing the red quantum dots and the light diffusing body is a color conversion unit that converts light in the blue wavelength range into light in the red wavelength range, and the layer 41 containing the green quantum dots and the light diffusing body is a color conversion unit that converts light in the wavelength range of blue into light in the green wavelength range. The color filter corresponding to blue has a configuration in which the blue color filter 62 is arranged on the RG selective reflective layer 21.

A glass 81 is provided between the color filter and the black matrix 71 containing the quantum dots and the wavelength selective absorption filter 82, and a low reflection surface film 83 is provided on the wavelength selective absorption filter 82.

(2) Simulation Conditions

In the OLED display device 1 illustrated in FIG. 2, the reflectivity, transmission spectrum, and reflection spectrum of each constitutional member were defined as follows in the simulation of the reflectivity and the reflected tint related to the external light AR irradiation.

(i) The red-green selective reflective layer is assumed to have a reflectivity of 0% in a region having a wavelength of less than 500 nm and a reflectivity of 100% having a wavelength of 500 nm or more and 800 nm or less.

(ii) The transmission spectrum of the color filter was calculated by measuring the panel spectrum and the backlight spectrum and calculating the panel spectrum/backlight spectrum.

(iii) As the transmission spectrum of the wavelength selective absorption filter, the results of measuring the transmission spectra of the base material-attached wavelength selective absorption filter produced as described above and the base material used in the above production were used.

(iv) As the reflectivity of the black matrix, the reflection spectrum of carbon black was used.

(v) As the reflectivity of the OLED substrate, the reflection spectrum of the substrate measured by disassembling a commercially available TV OLED55B7P (product name) manufactured by LG Electronics and peeling off the circularly polarizing plate was used.

(vi) The area ratio between the blue pixel, the green pixel, the red pixel, and the black matrix were calculated assuming that the area rates of the blue pixel, the green pixel, and the red pixel were each 17%, and the area rate of the black matrix was 49%.

In the above description, the transmission spectrum and the reflection spectrum were measured using a UV3150 spectrophotometer (product name) manufactured by Shimadzu Corporation.

(3) Calculation of Reflectivity and Reflected Tint

The reflectivity and the reflected tint were calculated by calculating a reflection spectrum of each of the blue pixel, the green pixel, the red pixel, and the black matrix, and multiplying it by the area rate thereof. Specifically, it is as follows.

First, the reflection spectra of the blue pixel, the green pixel, the red pixel, and the black matrix were denoted as $R_{blue}$, $R_{green}$, $R_{red}$, and $R_{black}$, respectively, and calculated based on the following expression.

As the reflection $B_{ref}$ of the external light in the blue pixel, the reflection at the anode 13 in the blue OLED element is defined as the external light reflection $G_{ref}$ in the green pixel and the external light reflection $R_{ref}$ in the red pixel is assumed to be reflected by the RG selective reflective layer 21 (see FIG. 2).

In the following expressions, the transmission spectrum of the wavelength selective absorption filter is denoted as $T_{dye}$, the transmission spectra of color filters are respectively denoted as $CF_{blue}$, $CF_{green}$, and $CF_{red}$, the reflectivity of the green-red selective reflective layer is denoted as $R_{sel}$, the reflectivity of the OLED substrate is denoted as $R_{sub}$, and the reflectivity of the black matrix is denoted as $R_{BM}$.

$$R_{blue}=(T_{dye})^2\times CF_{blue}\times R_{sub}$$

$$R_{green}=(T_{dye})^2\times CF_{green}\times R_{sel}$$

$$R_{red}=(T_{dye})^2\times CF_{red}-R_{sel}$$

$$R_{Black}=(T_{dye})^2\times R_{BM}$$

Next, the area rates of the blue pixel, green pixel, red pixel, and black matrix were denoted as $A_{blue}$, $A_{green}$, $A_{red}$, and $A_{black}$, respectively, and the reflection spectrum of the OLED display device was calculated according to the following expression.

$$\text{Reflection spectrum of OLED display device}=R_{blue}\times A_{blue}+R_{green}\times A_{green}+R_{red}\times A_{red}+R_{black}\times A_{black}$$

Based on the reflection spectrum of the OLED display device calculated as described above, the reflectivity (in terms of the luminous efficiency correction) and a and b* were calculated.

(4) Calculation of Relative Brightness

The relative brightness in a case where the wavelength selective absorption filter produced as described above was used was calculated as follows.

The emission spectrum S (λ) of the display was calculated using the backlight spectrum of Samsung 55 "Q7F (quantum dot type liquid crystal television, product name). Further, the transmission spectrum of the wavelength selective absorption filter was denoted as T (λ).

The brightness in a case where the wavelength selective absorption filter was not used was calculated by carrying out luminous efficiency correction on the spectrum S (λ), and this brightness was set to 100. The brightness of the spectrum S (λ)×T (λ) in a case where the wavelength selective absorption filter was used was calculated as the relative brightness with respect to the brightness in a case where the above wavelength selective absorption filter was not used.

<Evaluation of Effect of Suppressing Brightness Decrease>

Using the relative brightness values obtained in the above simulation, the effect of suppressing the brightness decrease was evaluated based on the following evaluation standards. In this test, "A" and "B" indicate the pass level.

(Evaluation Standard)

A: 80<relative brightness≤100

B: 60<relative brightness≤80

C: 0≤relative brightness≤60

<Evaluation of Effect of Suppressing External Light Reflection>

Using the reflectivity value obtained in the above simulation, the reflectivity reduction rate was calculated according to the following expression, and the effect of suppressing external light reflection was evaluated based on the following evaluation standards. In this test, "A" and "B" indicate the pass level.

$$\text{Reflectivity reduction rate}=(R_0-R_1)/R_0\times 100\%$$

$R_1$: Reflectivity in a case of using a wavelength selective absorption filter containing a dye $R_0$: Reflectivity of No. c11 in a case where a base material-attached wavelength selective absorption filter that does not contain dye is used (Evaluation Standard)

A: 50%<reflectivity reduction rate≤80%

B: 20%<reflectivity reduction rate≤50%

C: 0%<reflectivity reduction rate≤20%

<Evaluation of Tint>

Using the values of a and b* calculated in the above simulation, the color difference was calculated according to the following expression.

$$(\text{Color difference})=[(a^*_1-a^*_0)^2+(b^*_1-b^*_0)^2]^{1/2}$$

The meaning of each reference numeral in the above expression is as follows.

$a^*_1$: a* in a case of using a base material-attached wavelength selective absorption filter containing a dye $a^*_0$: a* of No. c11 in a case of using a base material-attached wavelength selective absorption filter that does not contain dye $b^*_1$: b* in a case of using a base material-attached wavelength selective absorption filter containing a dye $b^*_0$: b* of No. c11 in a case of using a base material-attached wavelength selective absorption filter that does not contain dye The color difference calculated from the above expression is 16.0 or less in terms of the practical level, 15.0 or less is a preferred level, and 5.0 or less is a more preferred level.

TABLE 9

| | Dye 1 | | | | Electron migration-type antifading agent 1 | Absorbance ratio | | | | | | Effect of suppressing external light reflection | Effect of suppressing brightness decrease | Color difference |
|---|---|---|---|---|---|---|---|---|---|---|---|---|---|---|
| No. | Dye 1 Content | Dye 2 Content | Dye 3 Content | Dye 4 Content | Content | Ab (450)/ Ab (430) | Ab (450)/ Ab (500) | Ab (540)/ Ab (500) | Ab (540)/ Ab (600) | Ab (630)/ Ab (600) | Ab (630)/ Ab (700) | | | |
| 101 | 0.89 | 0.52 | 0.46 | 1.15 | 2.1 | 0.48 | 0.47 | 0.12 | 0.13 | 0.12 | 0.72 | B | A | 1.8 |
| 102 | 2.87 | 1.03 | 0.92 | 2.30 | 2.1 | 054 | 0.48 | 0.12 | 0.13 | 0.12 | 0.72 | B | B | 3.7 |
| 103 | 4.85 | 2.06 | 1.53 | 3.82 | 2.1 | 0.58 | 0.48 | 0.12 | 0.13 | 0.12 | 0.72 | A | B | 1.2 |
| c11 | — | — | — | — | 0 | — | — | — | — | — | — | C | A | — |

(Note in Table)

The dyes 1, 4, 7, and 8 are as described above. The content of the dye means the content proportion of the dye in the wavelength selective absorption filter in terms of the mass ratio, and the unit thereof is % by mass.

The electron migration-type antifading agent 1 is as described above. The content of the electron migration-type antifading agent means the content proportion of the electron migration-type antifading agent in the wavelength selective absorption filter in terms of the mass ratio, and the unit thereof is % by mass.

In the notation of "-" in the columns of "Absorbance ratio", "Dye", and "Electron migration-type antifading agent" of No. c11, a value is not described since No. c11 is a base material-attached wavelength selective absorption filter that does not contain a dye and an electron migration-type antifading agent, 3105 and corresponds to a reference filter of each wavelength selective absorption filter.

As shown in Table 9, in the wavelength selective absorption filter Nos. 101 to 103 of the reference examples, containing a dye and an electron migration-type antifading agent satisfying Relational Expression [A-1] or [A-2] described above, the change in tint was sufficiently suppressed while both the external light reflection and the brightness decrease were suppressed, and thus they were at a practical level.

Although the present invention has been described with reference to the embodiments, it is the intention of the inventors of the present invention that the present invention should not be limited by any of the details of the description unless otherwise specified and rather be construed broadly within the spirit and scope of the invention appended in WHAT IS CLAIMED IS.

1 self-luminous display device or OLED display device
11: substrate
12: thin film transistor (TFT)
13: anode
14: blue light emitting layer or blue OLED layer (BOLED layer)
15: cathode
16: barrier film
21: red-green selective reflective layer (RG selective reflective layer)
31: layer containing red quantum dots (red QD) and light diffusing body
32: red color filter
41: layer containing green quantum dots (green QD) and light diffusing body
42: green color filter
51: blue selective reflective layer (B selective reflective layer)
62: blue color filter
71: black matrix
81: glass
82: wavelength selective absorption filter (wavelength selective absorption layer)
83: surface film
91: wavelength selective absorption layer
92: gas barrier layer
93: laminate
AR: external light
$BM_{in}$: incidence of external light on black matrix
$R_{in}$: incidence of external light on red pixel
$G_{in}$: Incidence of external light on green pixel
$B_{in}$: Incidence of external light on blue pixel
$BM_{ref}$: reflection of external light in black matrix
$R_{ref}$: reflection of external light in red pixel
$G_{ref}$: reflection of external light in green pixel
$B_{ref}$: reflection of external light in blue pixel

What is claimed is:

1. A display device comprising:
a laminate; and
a wavelength conversion material,
wherein the laminate includes a wavelength selective absorption layer containing a resin, a dye including at least one of the following dyes A to D, and an antifading agent for a dye, and includes a gas barrier layer directly arranged on at least one surface of the wavelength selective absorption layer,
wherein the gas barrier layer contains a crystalline resin,
wherein a thickness of the gas barrier layer is 0.1 μm to 10 μm,
wherein an oxygen permeability of the gas barrier layer is 60 cc/m2·day·atm or less,
wherein the laminate is included as a configuration in which it is positioned at least on an external light side of a layer including the wavelength conversion material, the external light side being a visible side;
wherein,
the dye A: a dye having a main absorption wavelength band at a wavelength of 390 to 435 nm;
the dye B: a dye having a main absorption wavelength band at a wavelength of 480 to 520 nm;
the dye C: a dye having a main absorption wavelength band at a wavelength of 580 to 620 nm; and
the dye D: a dye having a main absorption wavelength band at a wavelength of 680 to 780 nm.

2. The display device according to claim 1,
wherein a degree of crystallinity of the crystalline resin contained in the gas barrier layer is 25% or more.

3. The display device according to claim 1,
wherein the oxygen permeability of the gas barrier layer is 0.001 $cc/m^2$·day·atm or more and 60 $cc/m^2$·day·atm or less.

4. The display device according to claim 1, wherein at least one of the dyes B or C is a squarine-based coloring agent represented by General Formula (1), General Formula (1)

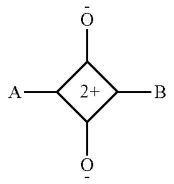

in the formula, A and B each independently represent an aryl group which may have a substituent, a heterocyclic group which may have a substituent, or —CH=G, and G represents a heterocyclic group which may have a substituent.

5. The display device according to claim 1, wherein the dye A is a coloring agent represented by General Formula (A1), General Formula (A1)

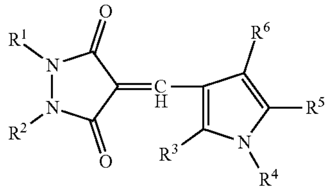

in the formula, $R^1$ and $R^2$ each independently represent an alkyl group or an aryl group, $R^3$ to $R^6$ each independently represent a hydrogen atom or a substituent, and $R^5$ and $R^6$ may be bonded to each other to form a 6-membered ring.

6. The display device according to claim 1, wherein the dye D is at least one of a coloring agent represented by General Formula (D1) or a coloring agent represented by General Formula (1), General Formula (D1)

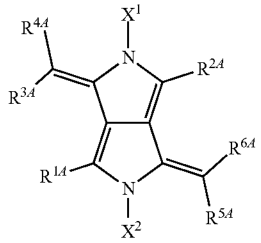

in the formula, $R^{1A}$ and $R^{2A}$ each independently represent an alkyl group, an aryl group, or a heteroaryl group, $R^{4A}$ and $R^{5A}$ each independently represent a heteroaryl group, and $R^{3A}$ and $R^{6A}$ each independently represent a substituent, $X^1$ and $X^2$ each independently represent $—BR^{21a}R^{22a}$, where $R^{21a}$ and $R^{22a}$ each independently represent a substituent, and $R^{21a}$ and $R^{22a}$ may be bonded to each other to form a ring, General Formula (1)

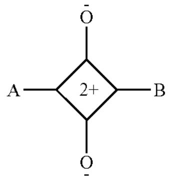

in the formula, A and B each independently represent an aryl group which may have a substituent, a heterocyclic group which may have a substituent, or —CH=G, and G represents a heterocyclic group which may have a substituent.

7. The display device according to claim 1, wherein the antifading agent is represented by General Formula (IV), General Formula (IV)

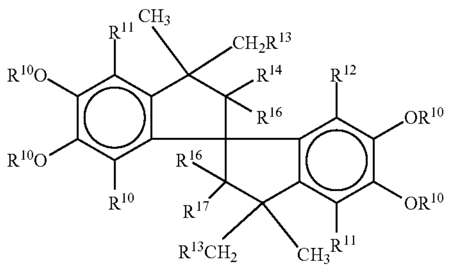

in the formula, $R^{10}$'s each independently represent an alkyl group, an alkenyl group, an aryl group, a heterocyclic group, or a group represented by $R^{18}CO—$, $R^{19}SO_2—$, or $R^{20}NHCO—$, where $R^{18}$, $R^{19}$, and $R^{20}$ each independently represent an alkyl group, an alkenyl group, an aryl group, or a heterocyclic group, $R^{11}$ and $R^{12}$ each independently represent a hydrogen atom, a halogen atom, an alkyl group, an alkenyl group, an alkoxy group, or an alkenyloxy group, and $R^3$ to $R^{17}$ each independently represent a hydrogen atom, an alkyl group, an alkenyl group, or an aryl group.

8. The display device according to claim 1, wherein the resin in the wavelength selective absorption layer includes a polystyrene resin.

9. The display device according to claim 1, wherein the resin in the wavelength selective absorption layer includes a cyclic polyolefin resin.

10. The display device according to claim 1, wherein the wavelength selective absorption layer contains all of the four dyes A to D.

11. The display device according to claim 1, wherein the laminate includes an ultraviolet absorption layer arranged on a side of the gas barrier layer opposite to the wavelength selective absorption layer and at least one layer of a pressure sensitive adhesive layer or an adhesive layer, and any difference in a refractive index between adjacent layers in the laminate is 0.05 or less.

12. The display device according to claim 1, wherein the wavelength conversion material is a quantum dot.

13. The display device according to claim 1, wherein the display device includes a light emitting element, and the light emitting element is a micro light emitting diode.

14. The display device according to claim 1, wherein the display device includes a light emitting element, and the light emitting element is a quantum dot having an electroluminescence function.

15. A display device comprising:

a laminate; and a wavelength conversion material, wherein the laminate includes a wavelength selective absorption layer containing a resin, a dye including at least one of the following dyes A to D, and an antifading agent for a dye, and includes a gas barrier layer directly arranged on at least one surface of the wavelength selective absorption layer, wherein the gas barrier layer contains a crystalline resin, wherein a thickness of the gas barrier layer is 0.1 m to 10 m, wherein an oxygen permeability of the gas barrier layer is 60 cc/$m^2$·day·atm or less, wherein the wavelength selective absorption layer contains all of the four dyes A to D;

wherein, the dye A: a dye having a main absorption wavelength band at a wavelength of 390 to 435 nm;

the dye B: a dye having a main absorption wavelength band at a wavelength of 480 to 520 nm;

the dye C: a dye having a main absorption wavelength band at a wavelength of 580 to 620 nm; and the dye D: a dye having a main absorption wavelength band at a wavelength of 680 to 780 nm.

* * * * *